United States Patent
Girolami et al.

(10) Patent No.: US 11,253,846 B2
(45) Date of Patent: Feb. 22, 2022

(54) METAL COMPLEXES FOR DEPOSITING FILMS AND METHOD OF MAKING AND USING THE SAME

(71) Applicant: The Board of Trustees of the University of Illinois, Urbana, IL (US)

(72) Inventors: Gregory S. Girolami, Champaign, IL (US); Sumeng Liu, Nanjin (CN)

(73) Assignee: The Board of Trustees of the University of Illinois, Urbana, IL (US)

(*) Notice: Subject to any disclaimer, the term of this patent is extended or adjusted under 35 U.S.C. 154(b) by 0 days.

(21) Appl. No.: 16/817,858

(22) Filed: Mar. 13, 2020

(65) Prior Publication Data

US 2020/0346197 A1 Nov. 5, 2020

Related U.S. Application Data

(63) Continuation-in-part of application No. 16/035,348, filed on Jul. 13, 2018, now Pat. No. 11,008,353.

(60) Provisional application No. 62/532,452, filed on Jul. 14, 2017.

(51) Int. Cl.
*B01J 31/16* (2006.01)

(52) U.S. Cl.
CPC ........ *B01J 31/1641* (2013.01); *B01J 2531/11* (2013.01); *B01J 2531/827* (2013.01); *B01J 2531/828* (2013.01)

(58) Field of Classification Search
None
See application file for complete search history.

(56) References Cited

U.S. PATENT DOCUMENTS

| | | |
|---|---|---|
| 3,969,386 A | 7/1976 | Ballard et al. |
| 6,099,903 A | 8/2000 | Kaloyeros et al. |
| 6,110,529 A | 8/2000 | Gardiner et al. |
| 6,126,996 A | 10/2000 | Kirlin et al. |
| 7,838,329 B2 | 11/2010 | Hunks et al. |
| 8,362,220 B2 | 1/2013 | Girolami et al. |
| 2012/0245300 A1 | 9/2012 | Crowther et al. |
| 2014/0179946 A1 | 6/2014 | Bunquin et al. |
| 2016/0009747 A1 | 1/2016 | Parker et al. |
| 2019/0077819 A1 | 3/2019 | Girolami et al. |

OTHER PUBLICATIONS

Nakajima et al. RSC Adv., 2015, 5, 20603-20616.*
"Allyltrimethylsilane(762-72-1) $^1$H NMR," https://www.chemicalbook.com/SpectrumEN_762-72-1_1HNMR.htm, downloaded Jul. 2, 2020.

(Continued)

*Primary Examiner* — Clinton A Brooks
(74) *Attorney, Agent, or Firm* — Leydig, Voit & Mayer, Ltd.

(57) ABSTRACT

Provided herein are methods of catalytic hydrosilylation, including triggerable methods, using metal-ligand complexes as catalysts, characterized by formula $ML_xD_y$; wherein: M is a metal; x is equal to the oxidation state of M; each D is independently a neutral coordinating ligand; y is zero or an integer selected from the range of 1 to 4; and each L is independently a mono-anionic ligand. L may be a $\eta^1,\eta^2$-β,β-disubstituted-ω-alkenyl ligand.

22 Claims, 27 Drawing Sheets

(56) References Cited

OTHER PUBLICATIONS

Austin et al., "Atomic Layer Deposition of Ruthenium and Ruthenium Oxide Using a Zero-Oxidation State Precursor", Chemistry of Materials, 29(3): 1107-1115 (2017).
Baily et al. (2000) "Asymmetric Cyclization of Achiral Olefinic Organolithiums Controlled by a Stereogenic Lithium: Intramolecular Carbolithiation in the Presence of (−)-Sparteine," J. Am. Chem. Soc. 122(28):6787-6788.
Bottrill et al., "Reactions of co-ordinated ligands. Part 20. Insertion and ring-forming reactions of fluorinated olefins with $\eta^3$-allylcobalt species; molecular and crystal structure of dicarbonyl[4-5-$\eta$-1,2-difluoro-1,2-bis(trifluoromethyl)pent-4-enyl](trimethyl phosphite)cobalt", J. Chem. Soc., Dalton Trans., 0(11): 1671-1678 (1979).
Brandow et al., "Ancillary Ligand and Olefin Substituent Effects on Olefin Dissociation for Cationic Zirconocene Complexes Bearing a Coordinated Pendant Olefin", Organometallics, 20(20): 4253-4261 (2001).
Burns et al. (2004) "The Actinides," in Comprehensive Coordination Chemistry II, vol. 3, Ch. 3.3, published by Elsevier Ltd., Amsterdam, pp. 189-192.
CAS No. 81069-81-0 (1984), 1 pp.
Casey et al. (1995) "Synthesis and Spectroscopic Characterization of the $d^0$ Transition Metal-Alkyl-Alkene Complex $Cp*_2YCH_2CH_2C(CH_3)_2CH=CH_2$," J. Am. Chem. Soc. 117(38):9770-9771.
Casey et al. (2000) "Measurement of Barriers for Alkene Dissociation and for Inversion at Zirconium in a $d^0$ Zirconium-Alkyl-Alkene Complex," Organometallics 19(19):3970-3977.
Casey et al. (2001) "Models for Intermediates in Metallocene-Catalyzed Alkene Polymerization: Alkene Dissociation from $Cp_2Zr[\eta^1,\eta^2-CH_2Si(CH_3)_2CH_2CH=CH_2][B(C_6F_5)_4]$," Organometallics 20, 4262-4265.
Collier et al. (1973) "Silylmethyl and Related Complexes. Part I. Kinetically Stable Alkyls of Titanium(iv), Zirconium(iv), and Hafnium(iv)," J. Chem. Soc., Dalton Trans., pp. 445-451.
Collman et al. (1980) "Principles and Applications of Organotransition Metal Chemistry," University Science Books, Mill Valley, California: p. 27.
Cotton et al. (1980), "Advanced Inorganic Chemistry," excerpt only, John Wiley & Sons, Inc., p. 693.
Ermer et al., "Kinetics and conformation in the reversible insertion of an alkene into a platinum-carbon bond in a chelated (pentenyl)platinum complex", Organometallics, 12(7): 2634-2643 (1993).
Fischer, "Reduction of Platinum Corrosion in Molten Glass", Platinum Metal Rev., 36(1): 14-25 (1992).
Flood et al., "Reversible formal alkene insertion into a chelated platinum-alkyl bond", J. Am. Chem. Soc., 106(20): 6076-6077 (1984).
Green et al., "Reactions of co-ordinated ligands. Part VII. Tetrafluoroethylene with $\pi$-allyliridium(I) complexes", J. Chem. Soc., Dalton Trans., 0(12): 1128-1137 (1975).
Keitoku et al., "Preparation of Co—Cr—Pt alloy film with high perpendicular coercivity and large negative nucleation field", Journal of Magnetism and Magnetic Materials, 235(1-3): 34-39 (2001).
Kelly et al. (1989) "Synthesis and spectroscopic characteristics of bis(ethenyldimethylsilylmethyl)platinum(II) complexes containing tertiary phosphine ligands," Polyhedron 8(4):433-445.
Lehmkuhl et al., "Stabilisierung von $\eta^1,\eta^2$-4-Alkenylnickel-Komplexen", J. Organomet. Chem., 216(3): C41-C44 (1981).
Liu et al. (Apr. 2019) "Lithium-Olefin $\pi$-Complexes and the Mechanism of Carbolithiation: Synthesis, Solution Behavior, and Crystal Structure of (2,2-Dimethylpent-4-en-1-yl)lithium," Organometallics 38(9):2199-2210.
Maudez et al., "New Dimethyl(norbornadienyl)platinum(II) Precursors for Platinum MOCVD", Chemical Vapor Deposition, 20(1-2-3): 59-68 (2014).

Oganessian et al. (2006) "Synthesis of the isotopes of elements 118 and 116 in the $^{249}Cf$ and $^{245}Cm+^{48}Ca$ fusion reactions," Physical Review C 74: 044602-1-044602-9.
Omae, "Organometallic Intramolecular $\pi$-Olefin-Metal Coordination Compounds", Angew. Chem. Int. Ed. Engl., 21(12): 889-902 (1982).
Rausch et al. (2015), "One ligand fits all: lanthanide and actinide sandwich complexes comprising the 1,4-bis(trimethylsilyl)cyclooctatetraenyl (=COT") ligand," New J. Chem., 39,7656-7666.
Schneider et al., "Minimizing the Carbon Content of Thin Ruthenium Films by MOCVD Precursor Complex Design and Process Control", Chemical Vapor Deposition, 13(8): 389-395 (2007).
Solomon et al. (2010), "The coordination chemistry of silyl-substituted allyl ligands," Dalton Trans., 39, 2469-2483.
Tagge et al., "Synthesis of a Novel Volatile Platinum Complex for Use in CVD and a Study of the Mechanism of Its Thermal Decomposition in Solution", J. Am. Chem. Soc., 118(11): 2634-2643 (1996).
Thurier et al., "Platinum OMCVD processes and precursor chemistry", Coordination Chemistry Reviews, 252(1-2): 155-169 (2008).
Weatherhead et al. (2004) "Mo-catalyzed asymmetric olefin metathesis in target-oriented synthesis: Enantioselective synthesis of (+)−aficanol," Proceedings of the National Academy of Sciences of the United States of America 101(16):5805-5809.
Wu et al., "Iridium Coating: Processes, Properties and Application. Part I", Johnson Matthey Technology Review, 61(1): 16-28 (2017).
Alabugin (Oct. 2016) "General Stereoelectronic Trends—Donors, Acceptors, and Chameleons," In Stereoelectronic Effects: a bridge between structure and reactivity: 62-96.
Ammann et al. (1982) "A Simple Multinuclear NMR Thermometer," J. Magn. Reson. 46: 319-321.
Anderson et al. (1992) "Photochemical reactions of diphosphineplatinum(II) oxalate complexes," Organomet. Chem. 434(2): 253-259.
Ankianiec et al. (1994) "Mechanisms of Thermolytic Rearrangement of cis-Bis(silylmethyl)platinum(II) Complexes: $\beta$-Carbon Transfer Predominates over Hydrogen Transfer," J. Am. Chem. Soc. 116(22): 9963-9978.
Blake et al. (1970) "Photochemical reactions of oxalatobis(triphenylphosphine)platinum(II) and related complexes," J. Am. Chem. Soc. 92(18): 5359-5364.
Brainard et al. (1985) "The mechanism of thermal decomposition of trans-chloroethylbis(triethylphosphine)platinum(II)," Organometallics. 4(9): 1550-1557.
Brinkman et al. (1994) "$\alpha$-Silyl-Substituent Stabilization of Carbanions and Silyl Anions," J. Am. Chem. Soc. 116(18):8304-8310.
Carpentier et al. (2000) "$d^0$ Metal Olefin Complexes. Synthesis, Structures, and Dynamic Properties of $(C_5R_5)_2Zr(OCMe_2CH_2CH_2CH=CH_2)^+$ Complexes: Models for the Elusive $(C_5R_5)_2Zr(R)(Olefin)^+$ Intermediates in Metallocene-Based Olefin Polymerization Catalysis," J. Am. Chem. Soc. 122(32): 7750-7767.
Carpentier et al. (2001) "Solution Structures and Dynamic Properties of Chelated $d^0$ Metal Olefin Complexes $\{\eta^5:\eta^1-C_5R_4SiMe_2N^1Bu\}Ti(OCMe_2CH_2CH_2CH=CH_2)^+$ (R=H, Me): Models for the $\{\eta^5: \eta^1-C_5R_4SiMe_2N^1Bu\}Ti(R')(olefin)^+$ Intermediates in 'Constrained Geometry' Catalysts," J. Am. Chem. Soc. 123(5): 898-909.
Chalk et al. (1965) "Homogeneous Catalysis. II. The Mechanism of the Hydrosilation of Olefins Catalyzed by Group VIII Metal Complexes," J. Am. Chem. Soc. 87(1): 16-21.
Chianese et al. (2007) "Electrophilic Activation of Alkenes by Platinum(II): So Much More Than a Slow Version of Palladium(II)," Angew. Chem. Int. Ed. 46(22): 4042-4059.
Chisholm et al. (1975) "Carbon-13 Nuclear Magnetic Resonance Studies of Organometallic Compounds. VII. 1,5-Cyclooctadieneplatinum(II) Derivatives," J. Am. Chem. Soc. 97(4): 721-727.
Dickinson (2005) "Trispyrazolylborate and Tetramethylcyclopentadienyl Osmium Chemistry: Toward Methane Coordination Complexes," PhD Dissertation, University of Illinois at Urbana-Champaign, Urbana, IL, 144 pages.

(56) References Cited

OTHER PUBLICATIONS

Dierick et al. (2015) "User-Friendly Platinum Catalysts for the Highly Stereoselective Hydrosilylation of Alkynes and Alkenes," Chem. Eur. J. 21(47): 17073-17078.
Faglioni et al. (2002) "Heterogeneous Inhibition of Homogeneous Reactions: Karstedt Catalyzed Hydrosilylation," J. Phys. Chem. B 106(7): 1714-1721.
Fulmer et al. (2010) "NMR Chemical Shifts of Trace Impurities: Common Laboratory Solvents, Organics, and Gases in Deuterated Solvents Relevant to the Organometallic Chemist," Organometallics 29(9): 2176-2179.
Gross et al. (1998) "Metal-Alkane Complexes. Rapid Exchange of Hydrogen Atoms between Hydride and Methyl Ligands in $[(C_5Me_5)Os(dmpm)(CH_3)H^+]$," J. Am. Chem. Soc. 120(26): 6605-6606.
Hall et al. (1971) "Complexes with Six-Membered Chelate Rings. III. Factors Influencing the Values of the Platinum-Proton Coupling Constants $^3J_{Pt-N-C-H}$ and $_4J_{Pt-N-C-CH_3}$ in Diamine Complexes of Platinum(II) and -(IV)," Inorg. Chem. 10(8): 1717-1725.
Happer et al. (2002) "Carbon-silicon hyperconjugation: X-ray structural study of N-methyl-4-trimethylsilylmethylpyridinium triflate," J. Organomet. Chem. 659(1-2):10-14.
Hassall et al. (2005) "Comparison of Carbon-Silicon Hyperconjugation at the 2-and 4-Positions of the N-Methylpyridinium Cation," J. Org. Chem 70(6):1993-1997.
Hassall et al. (2007) "Carbon-Silicon Hyperconjugation and Strain-Enhanced Hyperconjugation: Structures of N-Methyl 2- and 4-tert-Butyldimethylsilylmethyl Pyridinium Cations," Organometallics 26(6):1361-1364.
Hassall et al. (2007) "Solution and Solid-State Structure of 2- and 4-Bis(trimethylsilyl)methylpyridinium Cations," Organometallics 26(13):3094-3099.
Hill et al. (1998) "Platinum(II) Complexes of Dimethyl Sulfide," Inorg. Synth. 32: 149-153.
Jagadeesh et al. (2002) "Hydrosilylation with Bis(alkynyl)(1,5-cyclooctadiene)platinum Catalysts: A Density Functional Study of the Initial Activation," Organometallics 21(10): 2076-2087.
Jensen (1953) "Platinum Compounds of Alkadienes (Diolefins)," Acta Chem. Scand. 7(5): 866-868.
Karplus (1959) "Contact Electron-Spin Coupling of Nuclear Magnetic Moments," J. Chem. Phys. 30(1): 11-15.
Kelly et al. (1989) "Synthesis and Spectroscopic Characteristics of Bis(ethenyldimethylsilylmethyl)platinium(II) Complexes Containing Nitrogen Donor Ligands," J. Organomet. Chem. 361: 123-138.
Lambert et al. (1990) "Tetrahedron report No. 273: The interaction of silicon with positively charged carbon," Tetrahedron 46(8): 2677-2689.
Lambert et al. (1999) "The β Effect of Silicon and Related Manifestations of σ Conjugation," Acc. Chem. Res. 32(2): 183-190.
Lewis et al. (1995) "Mechanism of Formation of Platinum(0) Complexes Containing Silicon-Vinyl Ligands," Organometallics 14(5): 2202-2213.
Lewis et al. (1997) "Platinum Catalysts Used in the Silicones Industry. Their Synthesis and Activity in Hydrosilylation," Platinum Metals Rev. 41(2): 66-75.
Marko et al. (2002) "Selective and Efficient Piatinum(0)-Carbene Complexes As Hydrosilylation Catalysts," Science 298(5591): 204-206.
McDermott et al. (1976) "Thermal Decomposition of Bis(phosphine)platinum(II) Metallocycles," J. Am. Chem. Soc. 98(21): 6521-6528.
Meister et al. (Jan. 2016) "Platinum Catalysis Revisited—Unraveling Principles of Catalytic Olefin Hydrosilylation," ACS Catal. 6(2):1274-1284.
Miller et al. (1988) "Heterogeneous, Platinum-Catalyzed Hydrogenation of (Diolefin)dialkylplatinum(II) Complexes: Kinetics," J. Am. Chem. Soc. 110: 3146-3156.
Morse et al. (1994) "A Static α-CH•••M Interaction Observable by NMR Spectroscopy: Synthesis of the Chromium(II) Alkyl $[Cr_2(CH_2SiMe_3)6^{2-}]$ and its Conversion to the Unusual 'Windowpane' Bis(metallacycle) Complex $[Cr(\kappa^2CC'\text{-}CH_2SiMe_2CH_2)_2^{2-}]$," Organometallics 13(5): 1646-1655.
Neugebauer et al. (Nov. 2018) "Reactions of the organoplatinum complex [Pt(cod) (neoSi)Cl] (neoSi=trimethylsilylmethyl) with the non-coordinating anions $SbF_6^-$ and $BPh_4^-$," Open Chem. 16(1): 1214-1226.
Paonessa et al. (1985) "Photochemical generation of bis(phosphine)palladium and bis(phosphine)platinum equivalents," Organometallics 4(4): 647-657.
Plasson et al. (2011) "Autocatalyses," J. Phys. Chem. A 115(28): 8073-8085.
Prignano et al. (1987) "Silica-supported bis(trialkylphosphine)platinum oxalates. Photogenerated catalysts for hydrosilylation of olefins," J. Am. Chem. Soc. 109(12): 3586-3595.
Reich (1995) "WinDNMR: Dynamic NMR Spectra for Windows," J. Chem. Educ. 72(12): p. 1086.
Roy et al. (2002) "The First Alkene-Platinum-Silyl Complexes: Lifting the Hydrosilation Mechanism Shroud with Long-Lived Precatalytic Intermediates and True Pt Catalysts," J. Am. Chem. Soc. 124(32):9510-9524.
Seeman (1983) "Effect of conformational change on reactivity in organic chemistry. Evaluations, applications, and extensions of Curtin-Hammett Winstein-Holness kinetics," Chem. Rev. 83(2): 83-134.
Stein et al. (1999) "In Situ Determination of the Active Catalyst in Hydrosilylation Reactions Using Highly Reactive Pt(0) Catalyst Precursors," J. Am. Chem. Soc. 121(15): 3693-3703.
Stoebenau et al. (2006) "Nonchelated Alkene and Alkyne Complexes of $d^0$ Zirconocene Pentafluorophenyl Cations," J. Am. Chem. Soc. 128(26): 8638-8650.
Thomson et al. (1989) "Thermolytic Rearrangement of cis-Bis(ph osphine)bis((trimethylsilyl)methyl)platinum(II) Complexes via β-Alkyl Transfer," Organometallics 8(8): 2068-2070.
Traylor et al. (1971) "Vertical stabilization of cations by neighboring .sigma. bonds. General considerations," J. Am. Chem. Soc. 93(22): 5715-5725.
Traylor et al. (1972) "σ-π Conjugation: occurrence and magnitude," Pure Appl. Chem. 30: 599-606.
Troegel et al. (2011) "Recent Advances and Actual Challenges in Late Transition Metal Catalyzed Hydrosilylation of Olefins from an Industrial Point of View," Coord. Chem. Rev. 255(13-14):1440-1459.
Wang et al. (2005) "Maleimido-Terminated Self-Assembled Monolayers," Chem. Eur. J. 11(13): 3968-3978.
Weidner et al. (1972) "Theory and application of photoelectron spectroscopy: V. The nature of bonding in vinyl- and allylsilanes: The effects of σ-π (hyperconjugation) and pπ-dπ conjugation in these compounds," J. Organomet. Chem. 39(2): 261-266.
Wetzel et al. (1988) "Quantitative measure of α-silyl carbanion stabilization. The electron affinity of (trimethylsilyl)methyl radical," J. Am. Chem. Soc. 110(25):8333-8336.
White (1995) "Reactivity and Ground State Effects of Silicon in Organic Chemistry," Aust. J. Chem. 48(7): 1227-1251.
White et al. (1999) "Stereoelectronic Effects of the Group 4 Metal Substituents in Organic Chemistry," In Topics in Stereochemistry 22: 137-200.
Whitesides et al. (1985) "Suppression of Unwanted Heterogeneous Piatinum(0)-Catalyzed Reactions by Poisoning with Mercury(0) in Systems Involving Competing Homogeneous Reactions of Soluble Organoplatinum Compounds: Thermal Decomposition of Bis(triethylphosphine)-3,3,4,4-tetramethylplatinacyclopentane," Organometallics 4(10): 1819-1830.
Wierschke et al. (1985) "Magnitude and origin of the β-silicon effect on carbenium ions," J. Am. Chem. Soc. 107(6):1496-1500.
Wyrwa et al. (1997) "Massenspektrometrische und Röntgenstrukturanalytische Untersuchungen an Komplexen des Typs $(COD)PtX_2$ (X=Cl, Br, I, $CH_3$, $CH_2CMe_3$, $CH_2SiMe_3$)," Z. Anorg. Allg. Chem. 623(1-6): 649-653.
International Search Report and Written Opinion dated May 20, 2021, corresponding to International Patent Application No. PCT/US2021/021746, 9 pages.

\* cited by examiner

METAL COMPLEXES FOR DEPOSITING FILMS AND METHOD OF MAKING AND USING THE SAME

CROSS-REFERENCE TO RELATED APPLICATIONS

This application claims the benefit of and priority to U.S. patent application Ser. No. 16/035,348, filed Jul. 13, 2018, which claims the benefit of priority to Provisional application U.S. Provisional Patent Application No. 62/532,452, filed Jul. 14, 2017, each of which are hereby incorporated by reference in its entirety.

STATEMENT REGARDING FEDERALLY SPONSORED RESEARCH OR DEVELOPMENT

This invention was made with government support under Award Number CHE 13-62931 awarded by the National Science Foundation. The government has certain rights in the invention.

BACKGROUND OF INVENTION

The fabrication of conformal films such as metals, metal oxides, metal nitrides, and other metal-containing substances is becoming increasingly important in the microelectronics industry, as device feature sizes continue to become smaller. In particular, thin films of insulators and conductors need to be conformally deposited inside narrow, deep holes and trenches, in order to serve as wires, diffusion barriers, adhesion layers, encapsulating layers, and other functions. Physical vapor deposition (PVD) methods such as evaporation and sputtering are currently used to deposit such films, but the high sticking coefficients of the PVD flux leads to "line of sight" depositions that cannot afford conformal coatings in very small features. Chemical vapor deposition (CVD), on the other hand, often affords conformal films owing to the smaller surface reaction probabilities of CVD precursors, which enables the precursors to reach the bottoms of deep features.

In CVD, a precursor or set of precursors that contain the desired elements is vaporized and passed over a hot substrate. Subsequent decomposition of the precursor, sometimes in the presence of a reactant gas, affords thin films of the desired material on the substrate. A variant of CVD is known as atomic layer deposition (ALD); in this method, two or more reactant gases are passed alternately over the heated substrate, with intervening evacuation steps. The precursors used in CVD and ALD processes should be volatile enough to be deliverable to the substrate, and thermally stable enough to be storable at (and preferably slightly above) room temperature for long periods. Decomposition reactions on the substrate surface should also occur to give a film with the desired composition, and should afford reaction byproducts that are volatile and thus can be swept away without leaving contaminants in the film.

Thin films of metals or metal-containing solid materials are very useful as protective coatings, conductive materials in microelectronics, catalysts, data storage media, and other applications owing to their outstanding properties. For example, because of their high melting point, high strength, and resistance to corrosion, platinum and platinum alloys can withstand the abrasive action of molten glass and thus are used in glass molding components (Fisher, *Platinum Metal Reviews* 1992, 36, 14-25). Co—Cr—Pt thin films, which have perpendicular magnetic coercivities, $H_c(\perp)$, greater than 5000 Oe are used in data storage (Keitoku et al., *Journal of Magnetism and Magnetic Materials* 2001, 235, 34-39). Due to its high melting point (2447° C.) and resistance to chemical attack, iridium coatings are used for crucibles for the synthesis of high purity metal oxide single crystals (Wu et al., *Johnson Matthey Technology Review* 2017, 61(1), 16-28). Palladium and platinum are widely used in electronics applications because of their high electrical conductivities and durability. Ruthenium metal has a low bulk resistivity (7.1 μΩ·cm), a high work function (4.7 eV), and low solid solubility with strong adhesion to Cu, making it an attractive barrier metal and seed layer for Cu electroplating (Keitoku et al., *Journal of Magnetism and Magnetic Materials* 2001, 235, 34-39; Wu et al., *Johnson Matthey Technology Review* 2017, 61, 16-28; and Austin et al., *Chemistry of Materials* 2017, 29, 1107-1115).

As seen in PVD of other materials, PVD of metals or metal-containing solid materials has limited ability to provide conformal coatings inside holes and trenches with high aspect ratios, although it works well for coatings on flat surfaces. For example, deposition of Co—Cr—Pt alloy thin films by magnetron sputtering has been reported (Keitoku et al., *Journal of Magnetism and Magnetic Materials* 2001, 235, 34-39).

CVD and ALD methods for depositing films of metals or metal-containing solid materials have been reported. However, the precursors employed generally suffer from one or more shortcomings, such as low volatility, inappropriate decomposition temperature, air sensitivity, or generation of hazardous byproducts. In addition, many thin films of late transition metals suffer from excess carbon impurities in the films. For example, the most widely used Pt CVD and ALD precursor, (MeCp)PtMe$_3$ is an air sensitive solid which leaves carbon impurities in the Pt film if no reactive gas is used. Carrying out the depositions in the presence of a reactive gas such as O$_2$ or H$_2$ reduces the carbon impurities, but film oxidation and/or gas phase precipitation become problematic (Thurier et al., *Coordination Chemistry Reviews* 2008, 252, 155-169; Schneider, et al., *Chemical Vapor Deposition* 2007, 13, 389-395; Maudez, et al., *Chemical Vapor Deposition* 2014, 20, 59-68).

One CVD precursor of particular relevance to the invention below is cis-bis(pent-4-en-1-yl)platinum (Tagge, C. D.; Simpson, R. D.; Bergman, R. G.; Hostetler, M. J.; Girolami, G. S.; Nuzzo, R. G., "Synthesis of a novel volatile platinum complex for use in CVD and a study of the mechanism of its thermal decomposition in solution." *J. Am. Chem. Soc.* 1996, 118, 2634-2643). This compound is an air and moisture-stable, low melting (40-41° C.), volatile solid. Unfortunately, it is not particularly robust thermally: it decomposes within 2 weeks at room temperature with formation of pentadienes and pentenes, owing to its susceptibility to beta-hydrogen elimination. This compound affords films that contain Pt under appropriate CVD conditions, but it would be far more useful if it could be stored indefinitely at room temperature.

Provided herein are new volatile complexes and associated methods, which address these and other challenges, for the deposition of metals and other solids, such as metal oxides (MO$_x$), metal nitrides (MN$_x$), metal carbides (MC$_x$), metal borides (MB$_x$) and other binary and higher-order phases of superior quality and performance characteristics.

SUMMARY OF THE INVENTION

Provided herein is a new class of metal-ligand complexes. The metal-ligand complexes disclosed herein may be vaporto-solid precursors for the deposition of solid materials. For example, the metal-ligand complexes may be CVD precursors. The metal-ligand complexes address challenges associated with conventional CVD precursors, such as low volatility, too high or too low decomposition temperatures, air sensitivity, toxicity or toxicity of decomposition products, and poor shelf life. For example, the metal-ligand complexes may have a shelf-life of at least two weeks or at least a year. The metal-ligand complexes disclosed herein may be used for the deposition of solid materials, such as films or nanostructures, including those comprising metals that are difficult to deposit using conventional complexes, such as Pt. Provided herein are also vapor-to-solid precursors, which comprise any of the metal-ligand complexes disclosed herein. The vapor-to-solid precursors disclosed herein provide for a wide range of operating conditions and solid materials that may be deposited. Provided herein are also associated methods, including methods for depositing solid material on a substrate, via metal-ligand complexes disclosed herein, and methods for forming the metal-ligand complexes disclosed herein. Provided herein are also metal-ligand complexes and methods for hydrosilylation of starting compounds.

In some aspects, a metal-ligand complex is characterized by formula (FX1): $ML_xD_y$ (FX1), wherein: M is a metal; x is equal to the oxidation state of M; each D is independently a neutral coordinating ligand; y is zero or an integer selected from the range of 1 to 4; and each L is a mono-anionic ligand independently characterized by the formula FX2:

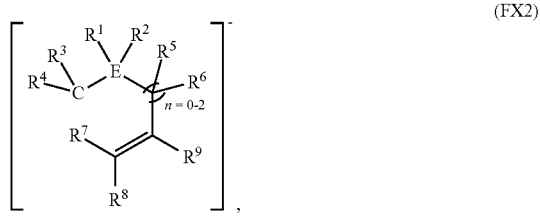

and wherein: n is 0, 1, or 2; each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and E is C or Si. In some embodiments of these metal-ligand complexes, at least one of $R^1$ and $R^2$ is not a fluoride (F—) or a trifluoromethyl ($CF_3$—) group. In some embodiments of these metal-ligand complexes, at least one of $R^1$ and $R^2$ is not a fluoride or a $C_1$-$C_6$ fluoroalkyl. In some embodiments of these metal-ligand complexes, each of both $R^1$ and $R^2$ is not a fluoride or a trifluoromethyl. In some embodiments of these metal-ligand complexes, each of both $R^1$ and $R^2$ is not a fluoride or a $C_1$-$C_6$ fluoroalkyl. In an embodiment of this aspect, the metal-ligand complex is in a substantially purified form, such as at least 95% pure, optionally at least 99% pure, optionally at least 99.9% pure, optionally at least 99.99% pure, and optionally at least 99.999% pure.

The metal-ligand complexes disclosed herein are highly tunable. The specific chemistry of these metal-ligand complexes may be adjusted for a particular application or for a particular set of desired parameters. For example, M may be adjusted to deposit a desired solid material. For example, L may be tuned to make the metal-complex more (or less) volatile, as needed for a particular CVD process.

In some embodiments of the metal-ligand complexes disclosed herein, M is selected from the group consisting of Li, Be, Mg, Ca, Sr, Ba, Al, Sc, Ga, Sn, Ti, Zr, Hf, V, Nb, Ta, Cr, Mo, W, Mn, Re, Fe, Ru, Os, Co, Rh, Ir, Ni, Pd, Pt, Cu, Ag, Au, Zn, a lanthanide metal, and an actinide metal. In some embodiments of the metal-ligand complexes disclosed herein, M is selected from the group consisting of Li, Be, Mg, Ca, Sr, Ba, Al, Sc, Ga, Sn, Ti, Zr, Hf, V, Nb, Ta, Cr, Mo, W, Mn, Re, Fe, Ru, Os, Rh, Ir, Ni, Pd, Pt, Cu, Ag, Au, Zn, a lanthanide metal, and an actinide metal. In some embodiments of the metal-ligand complexes disclosed herein, M is selected from the group consisting of Li, Mg, Rh, Ir, Pt, Ru, and Os. In some embodiments of the metal-ligand complexes disclosed herein, M is selected from the group consisting of Pt, Li, Rh, and Ir. In some embodiments of the metal-ligand complexes disclosed herein, M is Pt. In some embodiments of the metal-ligand complexes disclosed herein, a coordination number of M is 4 or 6. In some embodiments of the metal-ligand complexes disclosed herein, a coordination number of M is 4. In some embodiments of the metal-ligand complexes disclosed herein, M has an oxidation number (also referred to as oxidation state) of at least +2.

In some embodiments of the metal-ligand complexes disclosed herein, L is a $\eta^1,\eta^2$-β,β-disubstituted-ω-alkenyl ligand. In some embodiments of the metal-ligand complexes disclosed herein, when x is greater than 1, each L is identical. In some embodiments of the metal-ligand complexes disclosed herein, when x is greater than 1, each L is different from each other L. In some embodiments of the metal-ligand complexes disclosed herein, the total number of carbon atoms in each L excluding $R^1$, $R^2$, $R^3$, $R^4$, $R^5$, $R^6$, $R^7$, $R^8$, and $R^9$ is independently 4 or 5. In some embodiments of the metal-ligand complexes disclosed herein, n is 0 or 1. In some embodiments of the metal-ligand complexes disclosed herein, the total number of carbon atoms in each L excluding functional groups $R^1$, $R^2$, $R^3$, $R^4$, $R^5$, $R^6$, $R^7$, $R^8$, and $R^9$ is 5. In some embodiments of the metal-ligand complexes disclosed herein, n is 1. In some embodiments of the metal-ligand complexes disclosed herein, M is associated with each L via metal-carbon sigma bond and a metal-olefin pi bond. In some embodiments of the metal-ligand complexes disclosed herein, when x is greater than 1, the metal-carbon sigma bonds in said metal-ligand complex are cis with respect to each other. In some embodiments of the metal-ligand complexes disclosed herein, each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, or any combination thereof. In some embodiments of the metal-ligand complexes disclosed herein, each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, or any combination thereof. In some embodiments of the metal-ligand complexes disclosed herein, $R^1$, $R^2$, $R^3$, $R^4$, $R^5$, $R^6$, $R^7$, $R^8$, and $R^9$ are directly or indirectly connected to each other via alkyl groups and/or fluoroalkyl groups. In some embodiments of the metal-ligand complexes disclosed herein, $R^1$, $R^2$, $R^3$, $R^4$, $R^5$, $R^6$, $R^7$, $R^8$, and $R^9$ are indirectly connected to each other via alkyl groups and/or fluoroalkyl groups. In some embodiments of the metal-ligand complexes disclosed herein, L is a bidentate ligand.

In some embodiments of the metal-ligand complexes disclosed herein, E is Si. In some embodiments of the metal-ligand complexes disclosed herein, E is C.

In some embodiments of the metal-ligand complexes disclosed herein, each D independently comprises an ether group ($R^{10}_2$O), an amine group ($R^{10}_3$N), a nitrile group ($R^{10}$CN), an isonitrile group ($R^{10}$NC), a phosphine group ($R^{10}_3$P), a phosphite group (($R^{10}$O)$_3$P), an arsine group ($R^{10}_3$As), a stibene group ($R^{10}_3$Sb), a sulfide group (CS), a linear, branched, or cyclic monoalkene, a linear, branched, or cyclic diene, a linear, branched, or cyclic triene, bicyclic alkene, bicyclic dienes bicyclic triene, tricyclic diene, tricyclic triene, alkyne, and any combination thereof; wherein each $R^{10}$ is independently selected from the group consisting of a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, and any combination thereof. In some embodiments of the metal-ligand complexes disclosed herein, each D is independently selected from the group consisting of a linear mono-ether, a linear polyether, a cyclic monoether, a cyclic polyether, a monoamine, a linear polyamine, a cyclic monoamines, a cyclic polyamine, and any combination thereof. In some embodiments of the metal-ligand complexes disclosed herein, each D is independently selected from the group consisting of 1,5-cyclooctadiene, bicyclo[2.2.1]hepta-2,5-diene, 1,5-hexadiene, ethylene, dibenzo[a,e]cyclooctene, N,N,N',N'-tetramethylethylenediamine, and acetonitrile.

In some embodiments of the metal-ligand complexes disclosed herein, the metal-ligand complex is a neutral metal-ligand complex. In some embodiments of the metal-ligand complexes disclosed herein is y is 0. In some embodiments of the metal-ligand complexes disclosed herein, the metal-ligand complex is selected from the group consisting of (2,2-dimethylpent-4-en-1-yl)lithium, cis-bis($\eta^1$,$\eta^2$-2,2-dimethylbut-3-en-1-yl)platinum, cis-bis($\eta^1$,$\eta^2$-2,2-dimethylpent-4-en-1-yl)platinum, cis-bis($\eta^1$,$\eta^2$-2,2-dimethylhex-5-en-1-yl)platinum,[(1,2,5,6-$\eta$)-1,5-cyclooctadiene]($\eta^1$,$\eta^2$-2,2-dimethylpent-4-en-1-yl)iridium,[(1,2,5,6-$\eta$)-1,5-cyclooctadiene]($\eta^1$,$\eta^2$-2,2-dimethylpent-4-en-1-yl) rhodium, and [(2,3,5,6-$\eta$)-bicyclo[2.2.1]hepta-2,5-diene] ($\eta^1$,$\eta^2$-2,2-dimethyl-pent-4-en-1-yl)rhodium.

In some embodiments of the metal-ligand complexes disclosed herein, the metal-ligand complex is characterized by the formula FX5:

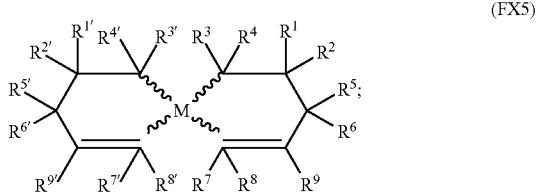

(FX5)

wherein: each $R^1$, $R^{1'}$, $R^2$, and $R^{2'}$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; each of $R^3$, $R^4$, $R^5$, $R^6$, $R^7$, $R^8$, $R^9$, $R^{3'}$, $R^{4'}$, $R^{5'}$, $R^{6'}$, $R^{7'}$, $R^{8'}$, and $R^{9'}$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof.

In some embodiments of the metal-ligand complexes disclosed herein, the metal-ligand complex is characterized by the formula FX6:

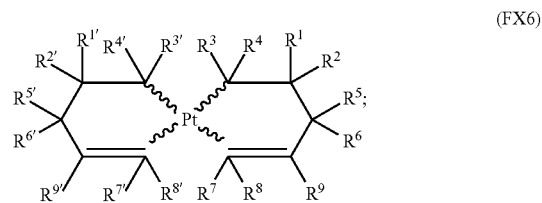

(FX6)

wherein: each $R^1$, $R^{1'}$, $R^2$, and $R^{2'}$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; each of $R^3$, $R^4$, $R^5$, $R^6$, $R^7$, $R^8$, $R^9$, $R^{3'}$, $R^{4'}$, $R^{5'}$, $R^{6'}$, $R^{7'}$, $R^{8'}$, and $R^{9'}$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof.

In some embodiments of the metal-ligand complexes disclosed herein, the metal-ligand complex is characterized by the formula FX3:

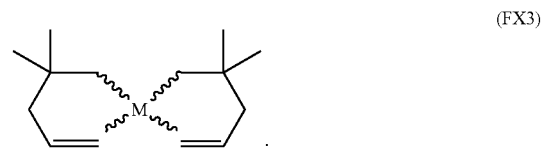

(FX3)

In some embodiments of the metal-ligand complexes disclosed herein, the metal-ligand complex is characterized by the formula FX4:

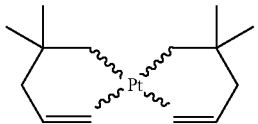

(FX4)

The metal-ligand complexes disclosed herein may be highly stable. For example, the metal-ligand complexes disclosed herein may have a long shelf life (e.g., greater than two weeks at room temperature) if stored under an inert gas atmosphere and/or if stored under an atmosphere comprising oxygen and/or water vapor. In contrast, some convention complexes usable for CVD, particularly for metal such as Pt, have a short shelf life (e.g., less than two weeks at room temperature) and/or a high degree of moisture and oxygen sensitivity.

In some embodiments of the metal-ligand complexes disclosed herein, less than 10 mass % of said metal-ligand complex decomposes after two weeks when stored under at least 1 atm of one or more inert gases at room temperature. In some embodiments of the metal-ligand complexes disclosed herein, less than 5 mass %, less than 1 mass %, less than 0.5 mass %, or less than 0.1 mass % of said metal-ligand complex decomposes after two weeks when stored under at least 1 atm of one or more inert gases at room temperature. In some embodiments of the metal-ligand complexes disclosed herein, less than 10 mass % of said metal-ligand complex decomposes after two weeks of exposure to an oxygen partial pressure of at least 10 mTorr and/or a water vapor partial pressure of at least 10 mTorr at 20° C. In some embodiments of the metal-ligand complexes disclosed herein, less than 20%, less than 5 mass %, less than 1 mass %, less than 0.5 mass %, or less than 0.1 mass % of said metal-ligand complex decomposes after two weeks of exposure to an oxygen partial pressure of at least 10 mTorr and/or a water vapor partial pressure of at least 10 mTorr at 20° C. In some embodiments of the metal-ligand complexes disclosed herein, less than 20%, less than 10 mass %, less than 5 mass %, less than 1 mass %, less than 0.5 mass %, or less than 0.1 mass % of said metal-ligand complex decomposes after two weeks, after 1 month, after 6 months, after 1 year, or after 2 years of exposure to an oxygen partial pressure of at least 10 mTorr and/or a water vapor partial pressure of at least 10 mTorr at 20° C. In some embodiments of the metal-ligand complexes disclosed herein, less than 20%, less than 10 mass %, less than 5 mass %, less than 1 mass %, less than 0.5 mass %, or less than 0.1 mass % of said metal-ligand complex decomposes after two weeks, after 1 month, after 6 months, after 1 year, or after 2 years of exposure to dry air. In some embodiments of the metal-ligand complexes disclosed herein, less than 20%, less than 10 mass %, less than 5 mass %, less than 1 mass %, less than 0.5 mass %, or less than 0.1 mass % of said metal-ligand complex decomposes after two weeks, after 1 month, after 6 months, after 1 year, or after 2 years of exposure to air having a water vapor partial pressure selected from the range of 10 mTorr to 17.5 Torr, 10 mTorr to 10 Torr, 10 mTorr to 5 Torr, 10 mTorr to 1 Torr, or 10 mTorr to 100 mTorr at 20° C. In some embodiments of the metal-ligand complexes disclosed herein, the metal-ligand complex has a thermolysis onset temperature selected from the range of 50° C. to 300° C., wherein said thermolysis onset temperature is measured using thermogravimetric analysis with a temperature increase rate of 10° C./min and under approximately 1 atm of N2. In some embodiments of the metal-ligand complexes disclosed herein, the metal-ligand complex has a thermolysis onset temperature selected from the range of 50° C. to 300° C.; wherein said thermolysis onset temperature is measured using thermogravimetric analysis under an atmosphere that is substantially 1 atm of N2. In some embodiments of the metal-ligand complexes disclosed herein, the metal-ligand complex has a thermolysis onset temperature selected from the range of 50° C. to 100° C., 50° C. to 200° C., 50° C. to 150° C., 50° C. to 100° C., 80° C. to 100° C., or 80° C. to 150° C.; wherein said thermolysis onset temperature is measured under an atmosphere that is substantially one or more inert gases. In some embodiments of the metal-ligand complexes disclosed herein, the metal-ligand complex has a shelf-life of at least 2 weeks, at least 1 month, at least 6 months, at least 1 year, at least 2 years, at least 5 years, or at least 10 years. In some embodiments of the metal-ligand complexes disclosed herein, said metal-ligand complex does not decompose via beta-hydrogen elimination at NTP.

In some embodiments of the metal-ligand complexes disclosed herein, the metal-ligand complex is a hydrosilylation catalyst or a hydrosilylation catalyst precursor. In some embodiments of the metal-ligand complexes disclosed herein, the metal-ligand complex is a vapor-to-solid precursor.

Provided here are also vapor-to-solid precursors. These vapor-to-solid precursors are useful for deposition of a solid material via a vapor-to-solid process. These vapor-to-solid precursors may comprise any one or more of the metal-ligand complexes disclosed herein. As such, the vapor-to-solid precursors disclosed herein are highly tunable. These vapor-to-solid precursors may be used to deposit a wide variety of solid materials, including solid materials comprising metals that are conventionally difficult or otherwise challenging to deposit via CVD, such as Pt. The vapor-to-solid precursors have a wide range of volatilities, making them suitable for a wide range of deposition processes.

In some aspects, a vapor-to-solid precursor comprises any of the metal-ligand complexes disclosed herein. In some aspects, a vapor-to-solid precursor comprises a metal-ligand complexes according to any one or more embodiments of metal-ligand complexes disclosed herein. In some embodiments of the vapor-to-solid precursors disclosed herein, the metal-ligand complex is characterized by formula (FX1): $ML_xD_y$ (FX1), wherein: M is a metal; x is equal to the oxidation state of M; each D is independently a neutral coordinating ligand; y is zero or an integer selected from the range of 1 to 4; and each L is a mono-anionic ligand independently characterized by the formula FX2:

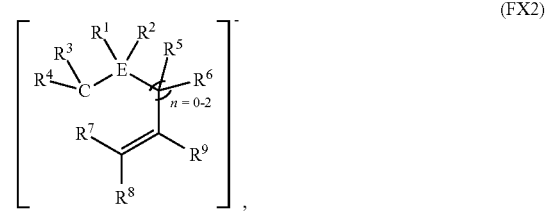

(FX2)

and wherein: n is 0, 1, or 2; each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and E is C or Si. In some embodiments of the vapor-to-solid precursors disclosed herein, at least one of $R^1$ and $R^2$ is not a fluoride or a trifluoromethyl. In some embodiments of the vapor-to-solid precursors disclosed herein, at least one of $R^1$ and $R^2$ is not a fluoride or a $C_1$-$C_6$ fluoroalkyl. In some embodiments of the vapor-to-solid precursors disclosed herein, each of both $R^1$ and $R^2$ is not a fluoride or a trifluoromethyl. In some embodiments of the vapor-to-solid precursors disclosed herein, each of both $R^1$ and $R^2$ is not a fluoride or a $C_1$-$C_6$ fluoroalkyl. In some embodiments of the vapor-to-solid precursors disclosed herein, the vapor-to-solid precursor comprises two or more metal-ligand complexes, each of the two or more metal-ligand complexes being a metal-ligand complex according to any one or more of the embodiments of metal-ligand complexes disclosed herein. In an embodiment of this aspect, the metal-ligand complex is in a substantially purified form, such as at least 95% pure, optionally at least 99% pure, optionally at least 99.9% pure, optionally at least 99.99% pure, and optionally at least 99.999% pure.

In some embodiments of the vapor-to-solid precursors disclosed herein, the vapor-to-solid precursor is configured to decompose into solid material on a substrate during a vapor-to-solid process, said solid material comprising M and being a metal, a metal oxide, a metal nitride, a metal carbide, a metal boride, a metal sulfide, a metal phosphide, or a combination thereof. In some embodiments of the vapor-to-solid precursors disclosed herein, said solid material is in the form of a film, a nanostructure, or a combination thereof. In some embodiments of the vapor-to-solid precursors disclosed herein, said vapor-to-solid process is selected from the group consisting of CVD, ALD, and MBE. In some embodiments of the vapor-to-solid precursors disclosed herein, the vapor-to-solid precursor is configured to decompose on a substrate via thermal decomposition, plasma-induced decomposition, radiation-induced decomposition, photolytic decomposition, or any combination thereof. In some embodiments of the vapor-to-solid precursors disclosed herein, said vapor-to-solid precursor is decomposed in the presence of water vapor, oxygen, ozone, carbon dioxide, nitrogen dioxide, or any combination thereof; and wherein the solid material comprises a metal oxide. In some embodiments of the vapor-to-solid precursors disclosed herein, said vapor-to-solid precursor is decomposed in the presence of a gas comprising an amine, ammonia, hydrazine, or any combination thereof; and wherein the solid material comprises a metal nitride.

In some embodiments of the vapor-to-solid precursors disclosed herein, the vapor-to-solid precursor comprises a solvent. In some embodiments of the vapor-to-solid precursors disclosed herein, the solvent comprises a non-coordinating solvent. In some embodiments of the vapor-to-solid precursors disclosed herein, the solvent comprises a coordinating solvent. In some embodiments of the vapor-to-solid precursors disclosed herein, the solvent is a nonaqueous solvent. In some embodiments of the vapor-to-solid precursors disclosed herein, the solvent is an aprotic solvent. In some embodiments of the vapor-to-solid precursors disclosed herein, the said nonaqueous solvent comprises one or more compounds selected from the group consisting of a hydrocarbon solvent, an oxygenated solvent, a halogenated solvent, an alcohol solvent, an amide solvent, an amine solvent, an aromatic solvent, a deuterated solvent, an ester solvent, an ether solvent, a ketone solvent, a nitrosolvent, and any combination thereof. In some embodiments of the vapor-to-solid precursors disclosed herein, the solvent comprises one or more compounds selected from the group consisting of hexane, pentane, nonane, decane, dodecane, tetradecane, octadecane, 1-octadecene, heptane, acetonitrile, acetone, butane, butanone, carbon tetrachloride, chlorobenzene, chloroform, cyclohexane, 1,2-dichloroethane, dichloromethane, propylene carbonate, diethylene glycol, 1,2-dimethylformamide, 1,2-dimethoxyethane, dimethylsulfoxide, 1,4-dioxane, ethanol, ethyl acetate, ethylene glycol, glycerin, hexamethylphosphoramide, hexamethylphosphorous triamide, nitromethane, petroleum ether, propanol, pyridine, triethyl amine, xylene, mesitylene, diethylether, tetrahydrofuran, benzene, toluene, and any combination thereof. In some embodiments of the vapor-to-solid precursors disclosed herein, said vapor-to-solid precursor is decomposed in the presence of hydrogen, methanol, ethanol, hydroquinone, other reductant, or a combination thereof; and wherein said solid material comprises a metal.

Provided herein are also methods for depositing a solid material on a substrate. These methods are highly versatile and may be used to deposit a solid material that is difficult or otherwise challenging to deposit using convention vapor-to-solid depositing processes.

In some aspects, a method for depositing a solid material on a substrate comprises steps of: exposing a receiving surface of said substrate to a vapor of a vapor-to-solid precursor; wherein said vapor-to-solid precursor comprises a metal-ligand complex; and decomposing said metal-ligand complex at said receiving surface of said substrate; thereby forming said solid material, wherein said solid material comprises M. In any of the methods for depositing a solid material, the vapor-to-solid precursor may be any of the vapor-to-solid precursors disclosed herein. In any of the methods for depositing a solid material, the vapor-to-solid precursor may be a vapor-to-solid precursor according to any one or more of the embodiments of vapor-to-solid precursors disclosed herein. In any of the methods for depositing a solid material, the metal-ligand complex may be any of the metal-ligand complexes disclosed herein. In any of the methods for depositing a solid material, the metal-ligand complex may be a metal-ligand complex according to any one or more of the embodiments of metal-ligand complexes disclosed herein. In any of the methods for depositing a solid material, the metal-ligand complex is characterized by formula (FX1): $ML_xD_y$ (FX1), wherein: M is a metal; x is equal to the oxidation state of M; each D is independently a neutral coordinating ligand; y is zero or an integer selected from the range of 1 to 4; and each L is a mono-anionic ligand independently characterized by the formula FX2:

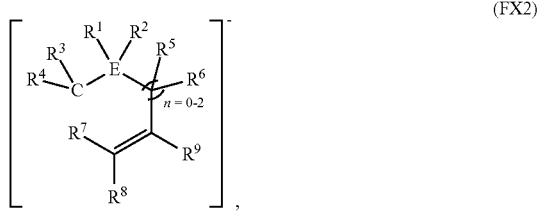

(FX2)

and wherein: n is 0, 1, or 2; each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and E is C or Si. In some embodiments of the methods for depositing a solid material, at least one of $R^1$ and $R^2$ is not a fluoride or a trifluoromethyl. In some embodiments of the methods for depositing a solid material, at least one of $R^1$ and $R^2$ is not a fluoride or a $C_1$-$C_6$ fluoroalkyl. In some embodiments of the methods for depositing a solid material, each of both $R^1$ and $R^2$ is not a fluoride or a trifluoromethyl. In some embodiments of the methods for depositing a solid material, each of both $R^1$ and $R^2$ is not a fluoride or a $C_1$-$C_6$ fluoroalkyl. In some embodiments of the methods for depositing a solid material, the vapor-to-solid precursor comprises two or more metal-ligand complexes, each of the two or more metal-ligand complexes being a metal-ligand complex according to any one or more of the embodiments of metal-ligand complexes disclosed herein. In an embodiment of this aspect, the metal-ligand complex is in a substantially purified form, such as at least 95% pure, optionally at least 99% pure, optionally at least 99.9% pure, optionally at least 99.99% pure, and optionally at least 99.999% pure.

In some embodiments of the methods for depositing a solid material, the solid material is in the form of a film, a nanostructure, a microstructure, or a combination thereof. In some embodiments of the methods for depositing a solid material, the solid material is a metal, a metal oxide, a metal nitride, a metal carbide, a metal boride, a metal sulfide, a metal phosphide, or a combination thereof. In some embodiments of the methods for depositing a solid material, the solid material is a metal.

In some embodiments of the methods for depositing a solid material, the step of decomposing comprises decomposition of said metal-ligand complex via thermal decomposition, plasma-induced decomposition, radiation-induced decomposition, photolytic decomposition, or any combination thereof. In some embodiments of the methods for depositing a solid material, the step of decomposing comprises a step of exposing said receiving surface to a plasma. In some embodiments of the methods for depositing a solid material, the step of decomposing comprises a step of exposing said receiving surface to ultraviolet-light radiation. In some embodiments of the methods for depositing a solid material, a temperature of the substrate is selected from the range of 50° C. to 1200° C., 50° C. to 600° C., 50° C. to 300° C., 50° C. to 250° C., 50° C. to 100° C., 100° C. to 250° C., or 100° C. to 500° C. during said step of decomposing.

In some embodiments of the methods for depositing a solid material, the step of exposing further comprises exposing said substrate to a secondary reagent. In some embodiments of the methods for depositing a solid material, the method further comprises a step of decomposing said secondary reagent; wherein said solid material comprises at least a portion of said secondary reagent. In some embodiments of the methods for depositing a solid material, the secondary reagent comprises at least one oxygen atom; and wherein said solid material comprises a metal oxide. In some embodiments of the methods for depositing a solid material, the secondary reagent is water vapor, oxygen, ozone, carbon dioxide, or nitrogen dioxide, or a gas mixture comprising any combination of these. In some embodiments of the methods for depositing a solid material, the secondary reagent comprises at least one nitrogen atom; and wherein said solid material comprises a metal nitride. In some embodiments of the methods for depositing a solid material, the secondary reagent comprises an amine group. In some embodiments of the methods for depositing a solid material, the secondary reagent is hydrazine, ammonia, or a gas mixture comprising a combination of these. In some embodiments of the methods for depositing a solid material, the step of exposing further comprises a step of vaporizing said vapor-to-solid precursor. In some embodiments of the methods for depositing a solid material, the step of vaporizing comprises direct injection, spraying, atomizing, bubbling, evaporating, or any combination thereof. In some embodiments of the methods for depositing a solid material disclosed herein, said vapor-to-solid precursor is decomposed in the presence of hydrogen, methanol, ethanol, hydroquinone, other reductant, or a combination thereof; and wherein said solid material comprises a metal.

In some embodiments of the methods for depositing a solid material, the vapor-to-solid precursor further comprises a carrier gas. In some embodiments of the methods for depositing a solid material, the carrier gas is inert with respect to said metal-ligand complex. In some embodiments of the methods for depositing a solid material, the carrier gas is selected from the group consisting of helium, nitrogen, argon, any combination thereof.

In some embodiments of the methods for depositing a solid material, the method is part of a CVD, ALD, or MBE process for depositing said solid material.

Provided herein are also methods for forming a metal-ligand complex. In any of the methods for forming a metal-ligand complex, the metal-ligand complex may be any of the metal-ligand complexes disclosed herein. In any of the methods for forming a metal-ligand complex, the metal-ligand complex may be a metal-ligand complex according to any one or more of the embodiments of metal-ligand complexes disclosed herein. In any of the methods for forming a metal-ligand complex, the metal-ligand complex is characterized by formula (FX1): $ML_xD_y$ (FX1), wherein: M is a metal; x is equal to the oxidation state of M; each D is independently a neutral coordinating ligand; y is zero or an integer selected from the range of 1 to 4; and each L is a mono-anionic ligand independently characterized by the formula FX2:

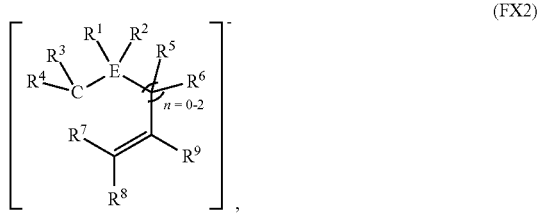

(FX2)

and wherein: n is 0, 1, or 2; each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and E is C or Si. In some embodiments of methods for forming a metal-ligand complex, at least one of $R^1$ and $R^2$ is not a fluoride or a trifluoromethyl. In some embodiments of the methods for forming a metal-ligand complex, at least one of $R^1$ and $R^2$ is not a fluoride or a $C_1$-$C_6$ fluoroalkyl. In some embodiments of the methods for forming a metal-ligand complex, each of both $R^1$ and $R^2$ is not a fluoride or a trifluoromethyl. In some embodiments of the methods for forming a metal-ligand complex, each of both $R^1$ and $R^2$ is not a fluoride or a $C_1$-$C_6$ fluoroalkyl. In some embodiments of the methods for forming a metal-ligand complex, the method comprises combining a starting compound and a Grignard reagent or an organolithium. In some embodiments of the methods for forming a metal-ligand complex, the starting compound comprises the metal M. In some embodiments of the methods for forming a metal-ligand complex, the starting compound is a metal halide or a Lewis base adduct of a metal halide, said metal halide comprising the metal M. In some embodiments of the methods for forming a metal-ligand complex, the Grignard reagent comprises the ligand L. In some embodiments of the methods for forming a metal-ligand complex, the organolithium reagent comprises the ligand L. In some embodiments of the methods for forming a metal-ligand complex, the method further comprises extracting and/or subliming the one or more products of said step of combining.

Also provided herein are methods for catalytic hydrosilylation of a starting compound. These methods are highly versatile. These hydrosilylation methods may further provide greater opportunities for performing hydrosilylation reactions under a wider variety of conditions, including outside of a laboratory setting. These methods may include the ability to activate, or trigger, the hydrosilylation reaction(s) such that the process may be performed only when desired.

In some aspects, a method for catalytic hydrosilylation of a starting compound, comprises steps of: hydrosilylating said starting compound in the presence of a hydrosilylation catalyst; wherein said hydrosilylation catalyst comprises a metal-ligand complex or wherein said hydrosilylation catalyst is formed by conversion of a hydrosilylation precatalyst that comprises said metal-ligand complex. In any of the methods for catalytic hydrosilylation of a starting compound, the metal-ligand complex may be any of the metal-ligand complexes disclosed herein. In any of the methods for catalytic hydrosilylation of a starting compound, the metal-ligand complex may be a metal-ligand complex according to any one or more of the embodiments of metal-ligand complexes disclosed herein. In any of the methods for catalytic hydrosilylation of a starting compound, the metal-ligand complex is characterized by formula (FX1): $ML_xD_y$ (FX1), wherein: M is a metal; x is equal to the oxidation state of M; each D is independently a neutral coordinating ligand; y is zero or an integer selected from the range of 1 to 4; and each L is a mono-anionic ligand independently characterized by the formula FX2:

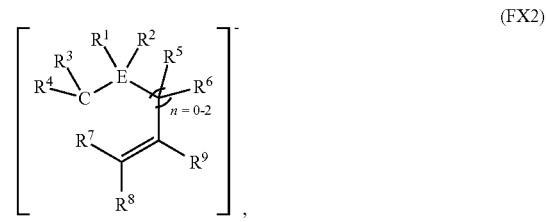

(FX2)

and wherein: n is 0, 1, or 2; each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and E is C or Si. In some embodiments of the methods for depositing a solid material, at least one of $R^1$ and $R^2$ is not a fluoride or a trifluoromethyl. In some embodiments of the methods for depositing a solid material, at least one of $R^1$ and $R^2$ is not a fluoride or a $C_1$-$C_6$ fluoroalkyl. In some embodiments of the methods for catalytic hydrosilylation of a starting compound, each of both $R^1$ and $R^2$ is not a fluoride or a trifluoromethyl. In some embodiments of the methods for catalytic hydrosilylation of a starting compound, each of both $R^1$ and $R^2$ is not a fluoride or a $C_1$-$C_6$ fluoroalkyl. In some embodiments of the methods for catalytic hydrosilylation of a starting compound, the hydrosilylation catalyst or hydrosilylation precatalyst may comprise two or more metal-ligand complexes, each of the two or more metal-ligand complexes being a metal-ligand complex according to any one or more of the embodiments of metal-ligand complexes disclosed herein. In some embodiments of the methods for catalytic hydrosilylation of a starting compound, the method comprises a step of activating said hydrosilylation precatalyst. In some embodiments of the methods for catalytic hydrosilylation of a starting compound, the step of activating comprises exposing said hydrosilylation precatalyst to at least one of ultraviolet-light radiation and a co-reactant. In an embodiment of this aspect, the metal-ligand complex is in a substantially purified form, such as at least 95% pure, optionally at least 99% pure, optionally at least 99.9% pure, optionally at least 99.99% pure, and optionally at least 99.999% pure. In an embodiment, n is 0 or an integer selected from the range of 1 to 6. In an embodiment, n is 0 or an integer selected from the range of 1 to 5. In an embodiment, n is 0 or an integer selected from the range of 1 to 3.

In an aspect, a method for catalytic hydrosilylation of a starting compound comprising steps of: contacting the starting compound with a hydrosilylation reagent in the presence of a hydrosilylation catalyst; and activating hydrosilylation of the starting compound; wherein the hydrosilylation catalyst comprises a metal-ligand complex or wherein the hydrosilylation catalyst is formed by conversion of a hydrosilylation precatalyst that comprises the metal-ligand complex; and wherein the metal-ligand complex is characterized by formula (FX1): $ML_xD_y$ (FX1), where: M is a metal; x is equal to the oxidation state of M; each D is independently a neutral coordinating ligand; y is zero or an integer selected from the range of 1 to 4; and each L is a mono-anionic ligand independently characterized by the formula FX2:

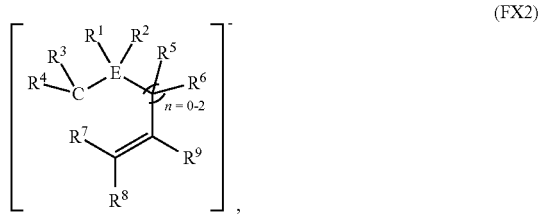

(FX2)

where: each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and E is C or Si. In some embodiments, the step of activating initiates a catalytic hydrosilylation reaction between the starting compound and the hydrosilylation reagent. In some embodiments, the step of activating increases the rate of a catalytic hydrosilylation reaction between the starting compound and the hydrosilylation reagent. In some embodiments, the step of activating comprises converting the hydrosilylation precatalyst to the hydrosilylation catalyst. In some embodiments, the step of activating hydrosilylation is performed in the presence of a hydrosyilation inhibitor. In some embodiments, the step of activating comprises converting the hydrosilylation precatalyst to the hydrosilylation catalyst. In some embodiments, the hydrosilylation inhibitor is chemically bound to the hydrosilylation precatalyst. In some embodiments, the step of converting comprises dissociating the hydrosilylation inhibitor from the hydrosilylation precatalyst, chemically consuming the hydrosilylation inhibitor, decomposing the hydrosilylation inhibitor, and/or deactivating the hydrosilylation inhibitor. In some embodiments, the step of converting comprises dissociating the hydrosilylation inhibitor from the hydrosilylation precatalyst.

In an embodiment, the step of activating initiates a catalytic hydrosilylation reaction between the starting compound and the hydrosilylation reagent. In an embodiment, the step of activating increases the rate of a catalytic hydrosilylation reaction between the starting compound and the hydrosilylation reagent. In an embodiment, hydrosilylation occurs at a rate less than or equal to 1000 turnovers $h^{-1}$ prior to the step of activation. In an embodiment, hydrosilylation occurs at a rate less than or equal to 700 turnovers $h^{-1}$, less than or equal to 500 turnovers $h^{-1}$, less than or equal to 100 turnovers $h^{-1}$, or preferably for some applications less than or equal to 50 turnovers $h^{-1}$ prior to the step of activation. In an embodiment, the step of activating increases the rate of a hydrosilylation reaction between the starting compound and the hydrosilylation reagent by a factor of 10 or greater. In an embodiment, the step of activating increases the rate of a hydrosilylation reaction between the starting compound and the hydrosilylation reagent by a factor selected over the range of 10 to 1,000,000. In an embodiment, the step of activating increases the rate of a hydrosilylation reaction between the starting compound and the hydrosilylation reagent by a factor selected over the range of 10 to 1000, optionally 10 to 10,000, optionally, 10 to 100,000, optionally 100 to 1,000,000, optionally 1,000 to 1,000,000, and optionally 10,000 to 1,000,000. In an embodiment, the step of activating results in catalytic hydrosilylation characterized by a turnover number greater than or equal to 100. In an embodiment, the step of activating results in catalytic hydrosilylation characterized by a turnover number greater than or equal to 100, preferably greater than or equal to 1,000, more preferably greater than or equal to 10,000, more preferably greater than or equal to 20,000, more preferably greater than or equal to 100,000, and still more preferably greater than or equal to 200,000. In an embodiment, the step of activating results in catalytic hydrosilylation characterized by a turnover number greater than or equal to 100, preferably greater than or equal to 1,000, more preferably greater than or equal to 10,000, more preferably greater than or equal to 20,000, more preferably greater than or equal to 100,000, and still more preferably greater than or equal to 200,000 after 4 hours or less, preferably after 2 hours or less, more preferably after 1 hour or less, further more preferably after 30 minutes or less of hydrosilylation. In an embodiment, the step of activating results in catalytic hydrosilylation characterized by a turnover number greater than or equal to 100, preferably greater than or equal to 1,000, more preferably greater than or equal to 10,000, more preferably greater than or equal to 20,000, more preferably greater than or equal to 100,000, and still more preferably greater than or equal to 200,000 after 4 hours or less, preferably after 2 hours or less, more preferably after 1 hour or less, further more preferably after 30 minutes or less of hydrosilylation, at a temperature selected from the range of 50° C. to 80° C., optionally at 50° C. In an embodiment, the step of activating results in catalytic hydrosilylation characterized by a turnover number selected from the range of 1,000 to 200,000, preferably, optionally 10,000 to 200,000, 20,000 to 200,000, optionally 100,000 to 200,000, preferably 1,000 to 300,000, more preferably 10,000 to 300,000, still more preferably 20,000 to 300,000, further more preferably 100,000 to 300,000, after 4 hours or less, preferably after 2 hours or less, more preferably after 1 hour or less of hydrosilylation, further more preferably after 30 minutes or less at a temperature selected from the range of 50° C. to 80° C., optionally at 50° C. In an embodiment, the step of activating results in catalytic hydrosilylation characterized by a turnover number selected from the range of 10,000 to 200,000 after 4 hours or less at a temperature of 50° C. In an embodiment, the step of activating is carried out for a time period selected from the range of 1 second to 24 hours. In an embodiment, the step of activating is carried out for a time period selected from the range of 1 minute to 4 hours, optionally 1 hour to 24 hours, optionally 1 minute to 30 minutes, optionally 1 minute to 1 hour, optionally 1 minute to 24 hours, optionally 30 minutes to 24 hours, optionally 1 second to 1 hour. In an embodiment, the method further comprises stopping the activating step after the hydrosilylation of the starting compound.

In an embodiment, the starting compound, the hydrosilylation and the hydrosilylation catalyst are provided in a solution, wherein the step of activating comprising providing energy to the solution. In an embodiment, the energy provided to the solution is thermal energy, radiant energy, acoustic energy, mechanical energy, chemical energy, or any combination of these. In an embodiment, the energy is provided to the solution by one or more processes selected from heating the solution, illuminating the solution with electromagnetic radiation, exposing the solution to a sheer force, exposing the solution to acoustic waves, chemical reactions or any combination of these. In an embodiment, the energy is provided to the solution by illuminating the solution with electromagnetic radiation, such as ultraviolet light. In an embodiment, the energy is provided to the solution by heating the solution. In an embodiment, the method further comprises stopping the step of providing energy to the solution and/or energy from the solution removing after the hydrosilation of the starting compound.

In an embodiment, the step of activating comprises increasing the temperature of the starting compound and the hydrosilylation reagent in the presence of a hydrosilylation catalyst. In an embodiment, the starting compound, the hydrosilylation and the hydrosilylation catalyst are provided in a solution, wherein the step of activating comprises heating the solution. In an embodiment, the step of activating comprises increasing the temperature of the starting compound and the hydrosilylation reagent in the presence of a hydrosilylation catalyst by at least 10° C. In an embodiment, the step of activating comprises increasing the temperature of the starting compound and the hydrosilylation reagent in the presence of a hydrosilylation catalyst by at least 20° C., optionally at least 30° C. In an embodiment, the step of activating comprises increasing the temperature of the starting compound and the hydrosilylation reagent in the presence of a hydrosilylation catalyst by 10° C. to 200° C. In an embodiment, the step of activating comprises increasing the temperature of the starting compound and the hydrosilylation reagent in the presence of a hydrosilylation catalyst by 10° C. to 100° C., optionally 10° C. to 50° C., optionally 30° C. to 60° C.

In an embodiment, the step of activating comprises increasing the temperature of the starting compound and the hydrosilylation reagent in the presence of a hydrosilylation catalyst at a rate equal to or greater than 0.1° C. $s^{-1}$. In an embodiment, the step of activating comprises increasing the temperature of the starting compound and the hydrosilylation reagent in the presence of a hydrosilylation catalyst at a rate selected from the range of 0.1° C. $s^{-1}$ to 100° C. $s^{-1}$. In an embodiment, the step of activating comprises increasing the temperature of the starting compound and the hydrosilylation reagent in the presence of a hydrosilylation catalyst at a rate equal to or greater than 0.5° C. $s^{-1}$, optionally equal to or greater than 1° C. $s^{-1}$, optionally equal to or greater than 5° C. $s^{-1}$. In an embodiment, the step of activating comprises increasing the temperature of the starting compound and the hydrosilylation reagent in the presence of a hydrosilylation catalyst at a rate selected from the range of 0.1° C. $s^{-1}$ to 100° C. $s^{-1}$, optionally selected from the range of 0.1° C. $s^{-1}$ to 10° C. $s^{-1}$, optionally selected from the range of 0.1° C. $s^{-1}$ to 5° C. $s^{-1}$, optionally selected from the range of 1° C. $s^{-1}$ to 100° C. $s^{-1}$. In an embodiment, the step of activating comprises increasing the temperature of the starting compound and the hydrosilylation reagent in the presence of a hydrosilylation catalyst from a starting temperature equal to or less than room temperature (20-25° C.) to an increased temperature equal to or greater than 35° C. In an embodiment, the step of activating comprises increasing the temperature of the starting compound and the hydrosilylation reagent in the presence of a hydrosilylation catalyst from a starting temperature equal to or less than room temperature (20-25° C.) to an increased temperature equal to or greater than 40° C., optionally equal to or greater than 45° C., optionally equal to or greater than 50° C., optionally equal to or greater than 60° C., optionally equal to or greater than 70° C. In an embodiment, the step of activating comprises increasing the temperature of the starting compound and the hydrosilylation reagent in the presence of a hydrosilylation catalyst from a starting temperature equal to or less than room temperature (20-25° C.) to an increased temperature selected from the range of 10° C.-200° C. In an embodiment, the step of activating comprises increasing the temperature of the starting compound and the hydrosilylation reagent in the presence of a hydrosilylation catalyst from a starting temperature equal to or less than room temperature (20-25° C.) to an increased temperature selected from the range of 35° C. to 200° C., optionally selected from the range of 40° C. to 200° C., optionally selected from the range of 45° C. to 200° C., optionally selected from the range of 35° C. to 100° C., optionally selected from the range of 35° C. to 85° C., optionally selected from the range of 45° C. to 85° C., optionally selected from the range of 50° C. to 80° C., optionally 30° C. to 60° C.

In some embodiments, the step of activating comprises converting the hydrosilylation precatalyst to the hydrosilylation catalyst. In some embodiments, the step of activating hydrosilylation is performed in the presence of a hydrosyliation inhibitor. In some embodiments, the step of activating comprises converting the hydrosilylation precatalyst to the hydrosilylation catalyst. In some embodiments, the hydrosilylation inhibitor is chemically bound to the hydrosilylation precatalyst. In some embodiments, the step of converting comprises dissociating the hydrosilylation inhibitor from the hydrosilylation precatalyst, chemically consuming the hydrosilylation inhibitor, decomposing the hydrosilylation inhibitor, and/or deactivating the hydrosilylation inhibitor. In some embodiments, the step of converting comprises dissociating the hydrosilylation inhibitor from the hydrosilylation precatalyst. In some embodiments, the hydrosyliation inhibitor increases a latency of the hydrosilylation compared to the hydrosilylation without the hydrosilylation inhibitor. In some embodiments, the hydrosyliation inhibitor increases a latency of the hydrosilylation by a factor of 1.5 to 10, preferably 2 to 10, more preferably 5 to 10, more preferably 1.5 to 100, more preferably 1.5 to 1,000, still more preferably 1.5 to 10,000, more preferably 1.5 to 100,000, further more preferably 1.5 to 1,000,000, yet more preferably 10 to 1,000,000, more preferably 1,000 to 1,000,000, compared to the hydrosilylation without the hydrosilylation inhibitor. In some embodiments, the hydrosilylation inhibitor is norbornadiene (NBD), 1,3-divinyl-1,1,3,3-tetramethyldisiloxane (DVTMS), 1,5-cyclooctadiene (COD), or alkyne dimethyl ethynylcarbinol (DMEC).

In some embodiments, said starting compound has one or more carbon-carbon double bond or carbon-carbon triple bound. In some embodiments, said starting compound has at least one alkenyl group. In some embodiments, said starting compound is an unsubstituted or substituted $C_3$-$C_{1000}$ alkene, $C_3$-$C_{1000}$ alkyne, $C_3$-$C_{1000}$ ether, $C_3$-$C_{1000}$ alcohol, or a combination of these. In some embodiments, said starting compound comprises an unsubstituted or substituted $C_3$-$C_{1000}$ alkene, $C_3$-$C_{1000}$ alkyne, $C_3$-$C_{1000}$ ether, $C_3$-$C_{1000}$ alcohol, or a combination of these. In some embodiments, said starting compound is allyl glycidyl ether (AGE), vinylcyclohexene oxide (VCE), 1-octene, vinyltrimethoxysilane (VTMOS), allyl methylmethacrylate (AMA), or $CH_2=CHSiMe_2(OSiMe_2)_5SiMe_2CH=CH_2$ ($M^{Vi}D_5M^{Vi}$). In some embodiments, said starting compound is allyl glycidyl ether (AGE), vinylcyclohexene oxide (VCE), 1-octene, vinyltrimethoxysilane (VTMOS), allyl methylmethacrylate (AMA), $CH_2=CHSiMe_2(OSiMe_2)_5SiMe_2CH=CH_2$ ($M^{Vi}D_5M^{Vi}$), or a polymer or oligomer. In some embodiments, the reaction mixture remains colorless even at full hydrosilylation. In some embodiments, said hydrosilylation reagent has at least one Si—H bond. In some embodiments, said hydrosilylation reagent is a $C_3$-$C_{1000}$ silane. In some embodiments, said hydrosilylation reagent is $HSiMe(OSiMe_3)_2$, triethyl silane, or $HSiMe_2(OSiMe_2)_{100}SiMe_2H$ (M'$D_{100}$M') In some embodiments, said hydrosilylation reagent is a $C_3$-$C_{1000}$ silane. In some embodiments, said hydrosilylation reagent is $HSiMe(OSiMe_3)_2$, triethyl silane, $HSiMe(OSiMe_3)_2$ (MD'M), or $HSiMe_2(OSiMe_2)_{100}SiMe_2H$ (M'$D_{100}$M'). In some embodiments, said hydrosilylation reagent is $HSiMe(OSiMe_3)_2$, triethyl silane, $HSiMe(OSiMe_3)_2$ (MD'M), $HSiMe_2(OSiMe_2)_{100}SiMe_2H$ (M'$D_{100}$M'), or a polymer or oligomer. In some embodiments, said starting compound is vinylcyclohexene oxide (VCE). In some embodiments, said hydrosilylation reagent has at least one Si—H bond. In some embodiments, said hydrosilylation reagent is a $C_3$-$C_{1000}$ silane. In some embodiments, said hydrosilylation reagent is $HSiMe(OSiMe_3)_2$, ortriethyl silane. In some embodiments, said hydrosilylation catalyst is provided at a concentration greater than or equal to $0.1 \times 10^{-6}$ mol %. In some embodiments, said hydrosilylation catalyst is provided at a concentration greater than or equal to $0.1 \times 10^{-5}$ mol %, optionally greater than or equal to $0.1 \times 10^{-5}$ mol %, optionally greater than or equal to $0.1 \times 10^{-4}$ mol %, optionally greater than or equal to $0.1 \times 10^{-3}$ mol %, optionally greater than or equal to $0.1 \times 10^{-2}$ mol %, optionally greater than or equal to $0.1 \times 10^{-1}$ mol %, optionally greater than or equal to 0.1 mol %. In some embodiments, said hydrosilylation catalyst is provided at a concentration selected from the range of $0.1 \times 10^{-6}$ mol % to 1 mol %. In some embodiments, said starting compound is provided at a concentration greater than or equal to 0.001 mol/L. In some embodiments, said starting compound is provided at a concentration selected from the range of 0.001 mol/L to 7 mol/L. In some embodiments, said hydrosilylation reagent is provided at a concentration greater than or equal to 0.5 mol/L. In some embodiments, said hydrosilylation reagent is provided at a concentration selected from the range of 0.5 mol/L to 7 mol/L. In some embodiments, said activating step is carried out at a temperature greater than or equal to 35° C. In some embodiments, said activating step is carried out at a temperature greater than or equal to 60° C. In some embodiments, said activating step is carried out at a temperature selected over the range of 60° C.-80° C. In some embodiments, said activating step is carried out for a duration greater than or equal to 0.1 sec. In some embodiments, activating step is carried out for a duration selected over the range of 0.1 sec to 24 hours. In some embodiments, said contacting and activating steps are carried out in nonaqueous solution. In some embodiments, said contacting and activating steps are carried out in a solvent selected from the group benzene, toluene, and a combination of these. Optionally, in some embodiments, the contacting and activating steps are carried out in the absence of a solvent. In some embodiments, said contacting and activating steps are carried out under an inert atmosphere.

In an embodiment, a metal-ligand complex characterized by the formula FX1 is in a substantially purified form, such as at least 95% pure, optionally at least 99% pure, optionally at least 99.9% pure, optionally at least 99.99% pure, and optionally at least 99.999% pure. In an embodiment, a metal-ligand complex comprising one or more ligands characterized by formula FX2, FX2a, FX2b, FX2c, FX3, FX4, FX5, FX6, or FX7 is in a substantially purified form, such as at least 95% pure, optionally at least 99% pure, optionally at least 99.9% pure, optionally at least 99.99% pure, and optionally at least 99.999% pure. In an embodiment, a vapor-to-solid precursor comprising a metal-ligand complex characterized by formula FX1 is in a substantially purified form, such as at least 95% pure, optionally at least 99% pure, optionally at least 99.9% pure, optionally at least 99.99% pure, and optionally at least 99.999% pure. In an embodiment, a vapor-to-solid precursor having a metal-ligand complex that comprises one or more ligands characterized by formula FX2, FX2a, FX2b, FX2c, FX3, FX4, FX5, FX6, or FX7 is in a substantially purified form, such as at least 95% pure, optionally at least 99% pure, optionally at least 99.9% pure, optionally at least 99.99% pure, and optionally at least 99.999% pure.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

BRIEF DESCRIPTION OF THE DRAWINGS

The features, objects and advantages other than those set forth above will become more readily apparent when consideration is given to the detailed description below. Such detailed description makes reference to the following drawings, wherein.

C./min. Onset temperature for thermolysis=144° C., final mass=45%. Pt percentage in original compound=50%.

Figure 5:
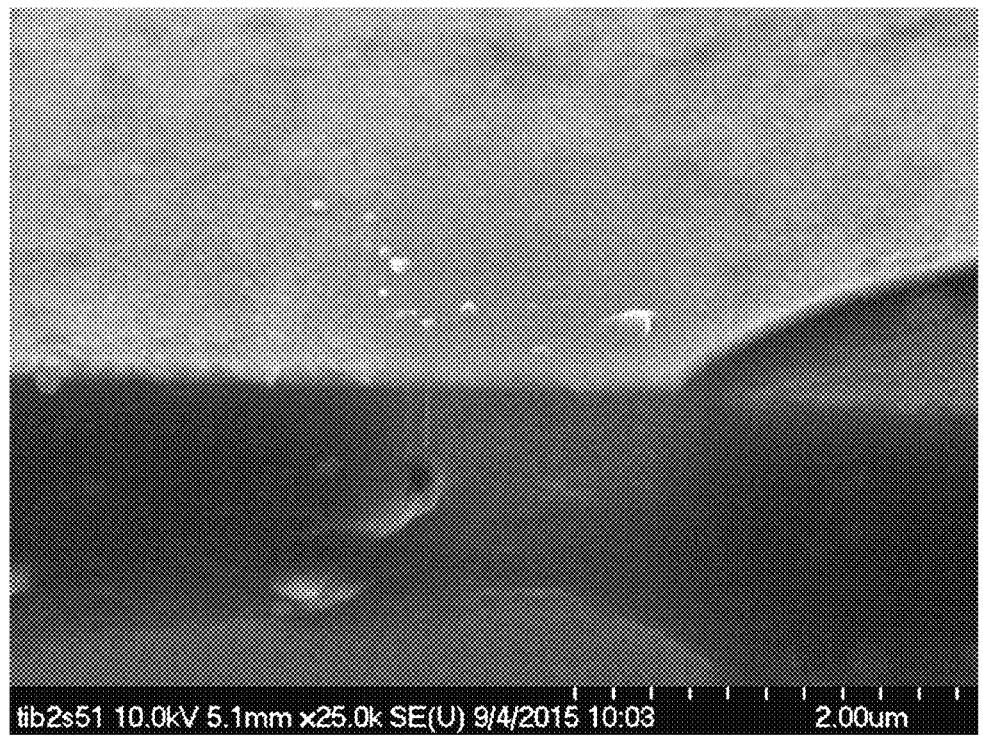

FIG. 5. 150 nm thick platinum film grown from cis-bis($\eta^1,\eta^2$-2,2-dimethylpent-4-en-1-yl)platinum on Si(100) under dynamic vacuum (10 mTorr) in a hot wall glass tube with no co-reactant gas. The precursor reservoir was heated to 80° C., the growth temperature was 250° C.

Figure 6:
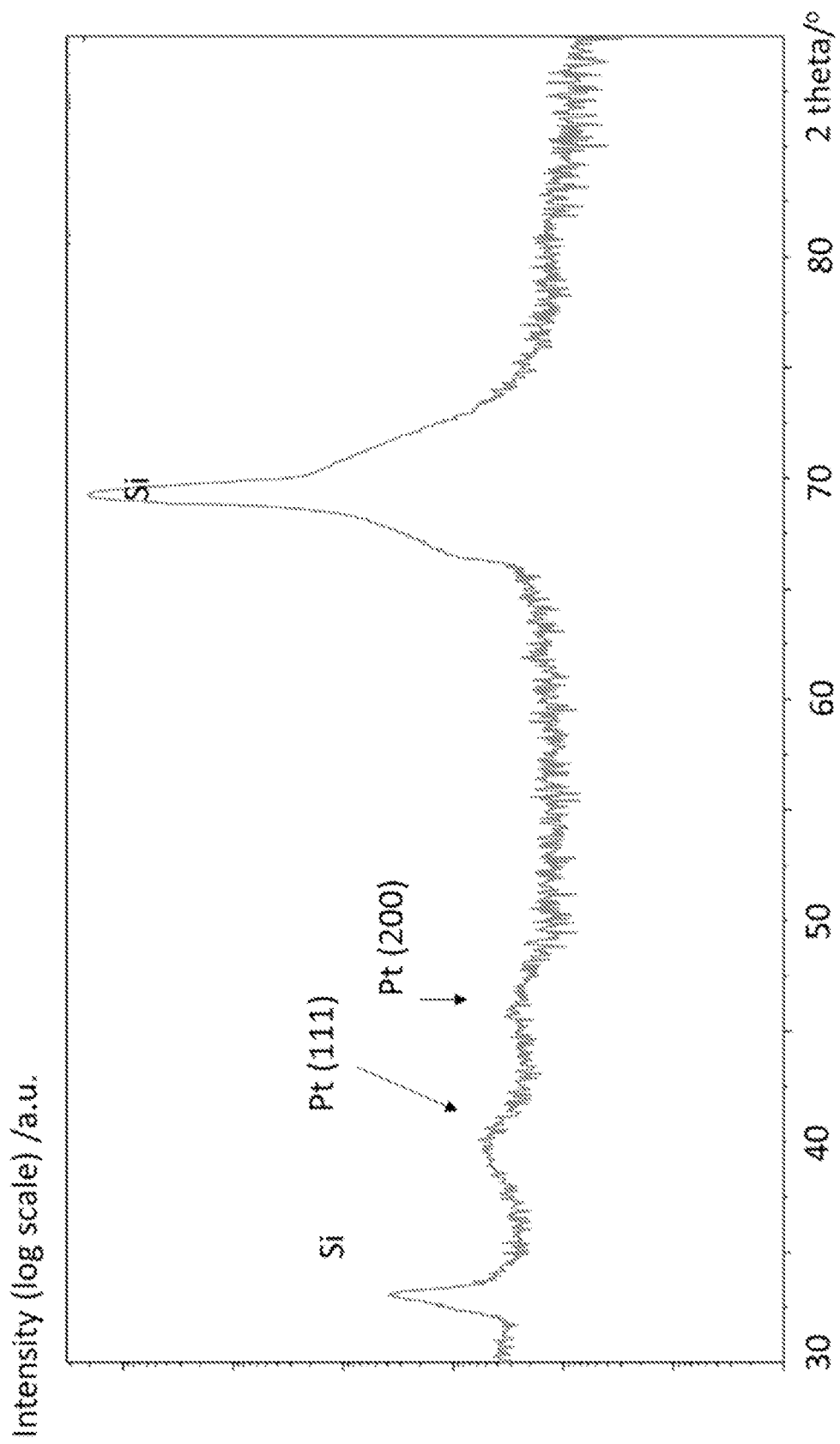

FIG. 6. X-ray diffractogram of the platinum film from FIG. 5, indicating that the film contains nanocrystalline platinum. The y-axis is on a log scale.

Figure 7:
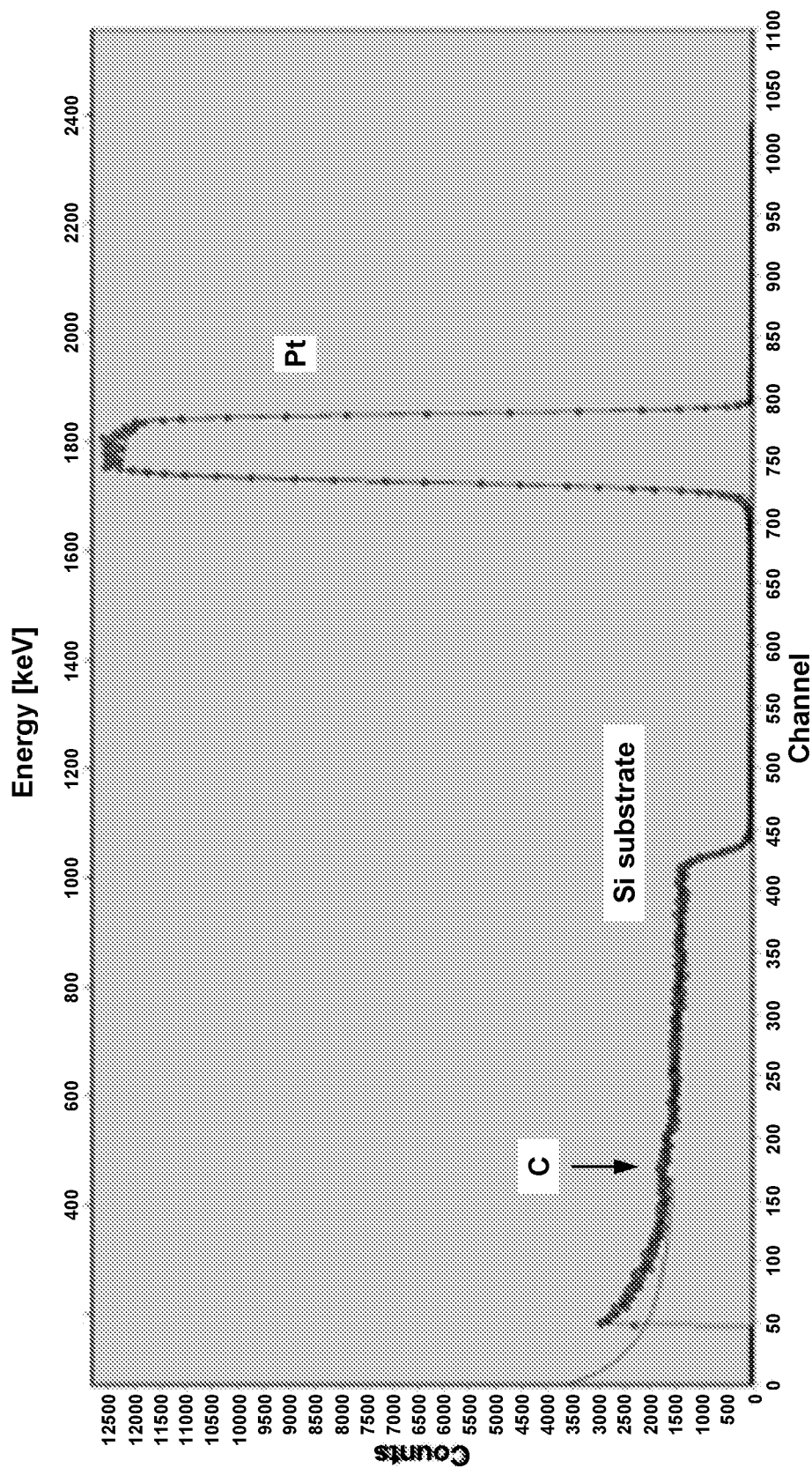

FIG. 7. Rutherford backscattering spectrum of the film from FIG. 5, showing that the film consists of platinum with some carbon contamination.

Figure 8:
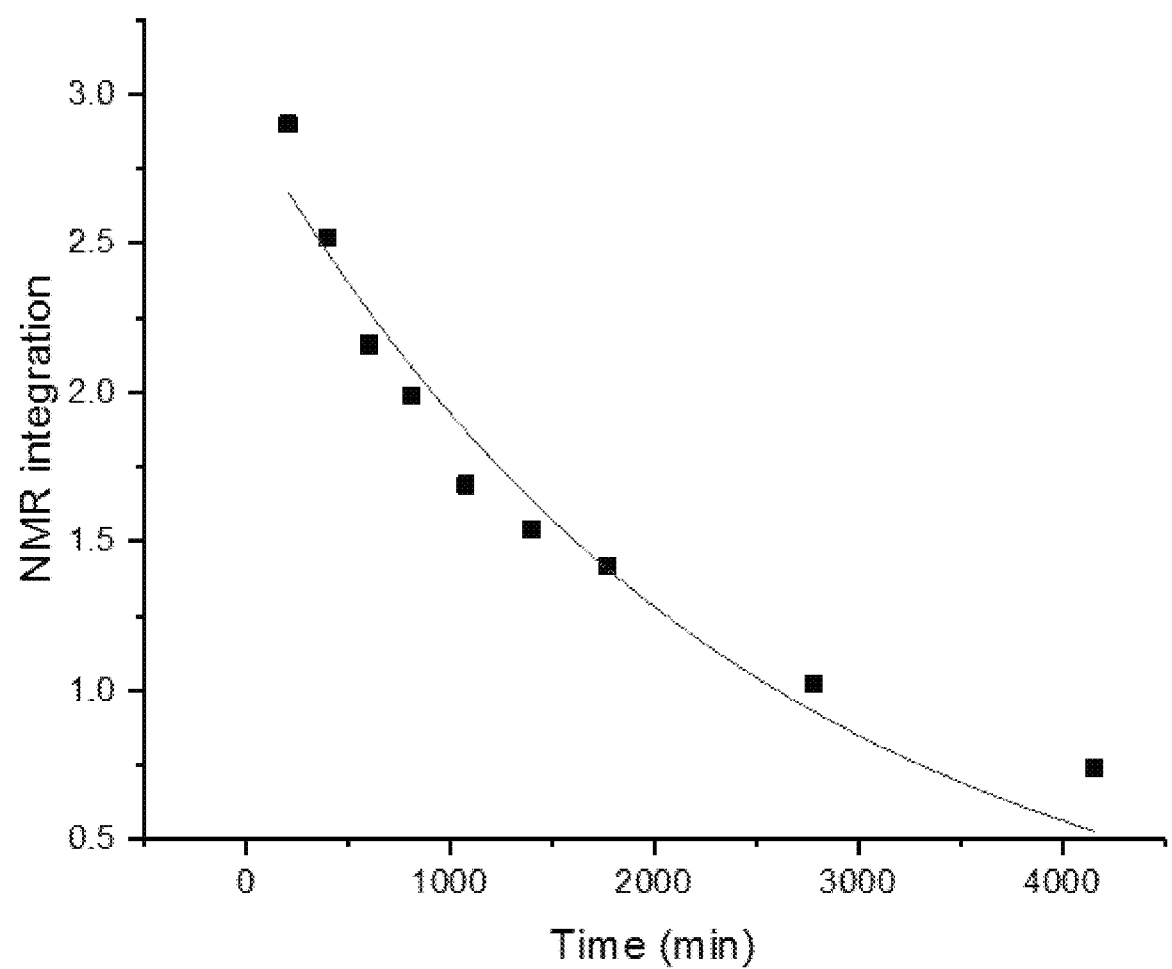

FIG. 8. Decomposition rate of cis-bis($\eta^1,\eta^2$-2,2-dimethylpent-4-en-1-yl)platinum in $C_6F_6$. Thermolysis of cis-bis($\eta^1,\eta^2$-2,2-dimethylpent-4-en-1-yl)platinum in benzene-$d_6$ follows first order kinetics ($I=I_0 e^{-kt}$) with $k=4.1(4)\times10^{-4}$ min$^{-1}$ at 111.5° C. For comparison, thermolysis of the unmethylated analogue bis($\eta^1,\eta^2$-pent-4-en-1-yl)-platinum takes place at a similar rate at much lower temperature: $k=4.15\times10^{-4}$ min$^{-1}$ at 85° C. in toluene-$d_8$. This result indicates that the cis-bis($\eta^1,\eta^2$-2,2-dimethylpent-4-en-1-yl) platinum complex is more stable thermally than the unmethylated complex cis-bis(pent-4-en-1-yl)platinum made by Tagge et al. (Tagge, C. D.; Simpson, R. D.; Bergman, R. G.; Hostetler, M. J.; Girolami, G. S.; Nuzzo, R. G., "Synthesis of a novel volatile platinum complex for use in CVD and a study of the mechanism of its thermal decomposition in solution." *J. Am. Chem. Soc.* 1996, 118, 2634-2643).

Figure 9A:
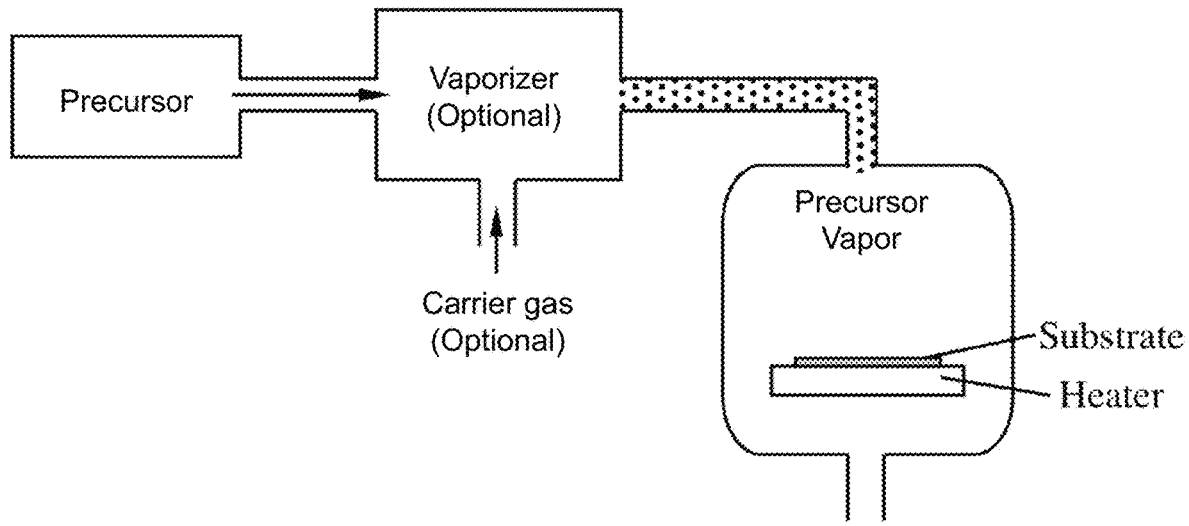
Figure 9B:
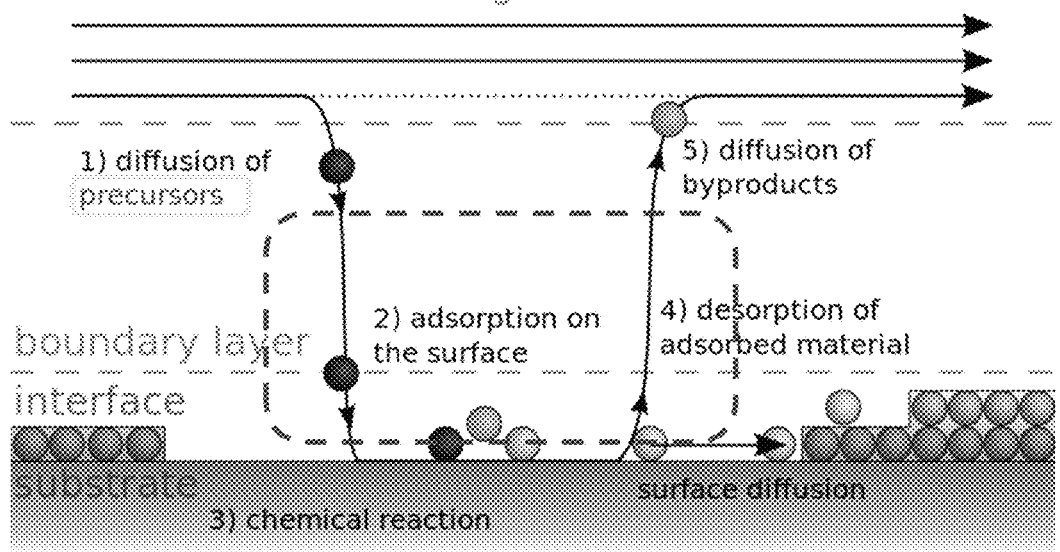

FIGS. 9A-9B. FIG. 9A is a schematic of an exemplary vapor-to-solid process comprising a vapor-to-solid precursor to deposit a solid material onto a heated substrate. Other vapor-to-solid processes may also be useful with the complexes, precursors, catalysts, and methods described herein, including processes that do not require or comprise a vaporizer, such as an atomizer, to deliver a vapor-to-solid precursor to the substrate. FIG. 9B is an illustration of a solid material deposition mechanism during CVD.

Figure 10:
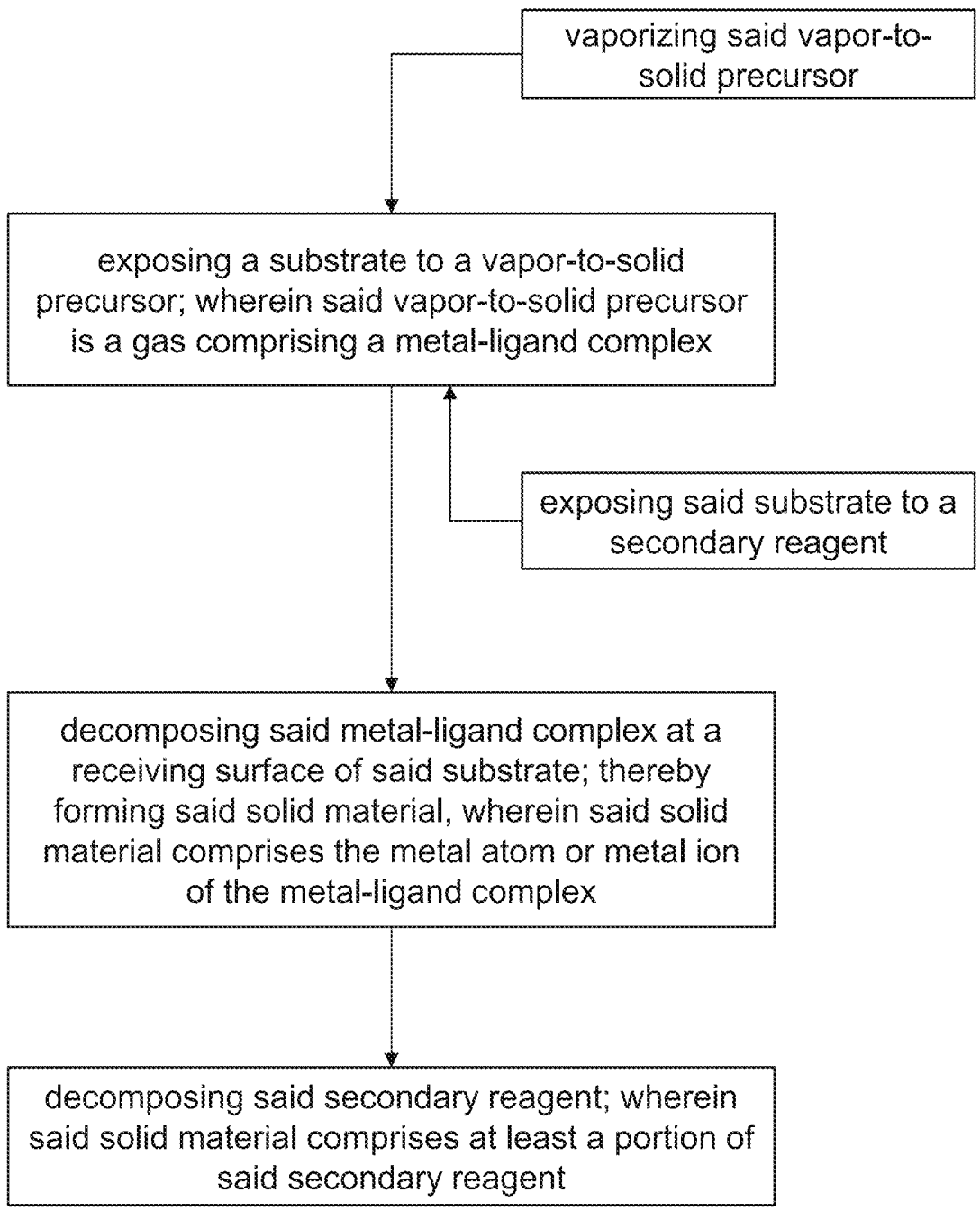

FIG. 10. Illustration of a method for depositing a solid material onto a substrate.

Figure 2:
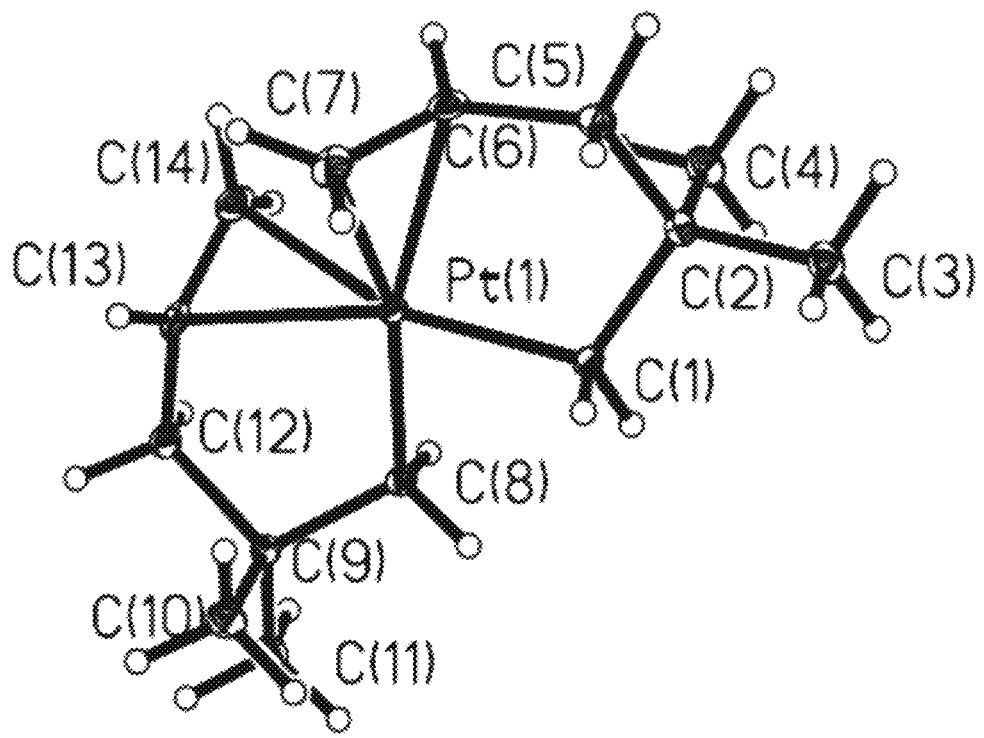
FIG. 2. Molecular structure of cis-bis($\eta^1,\eta^2$-2,2-dimethylpent-4-en-1-yl)platinum. Ellipsoids are drawn at the 35% probability level.
Figure 11:
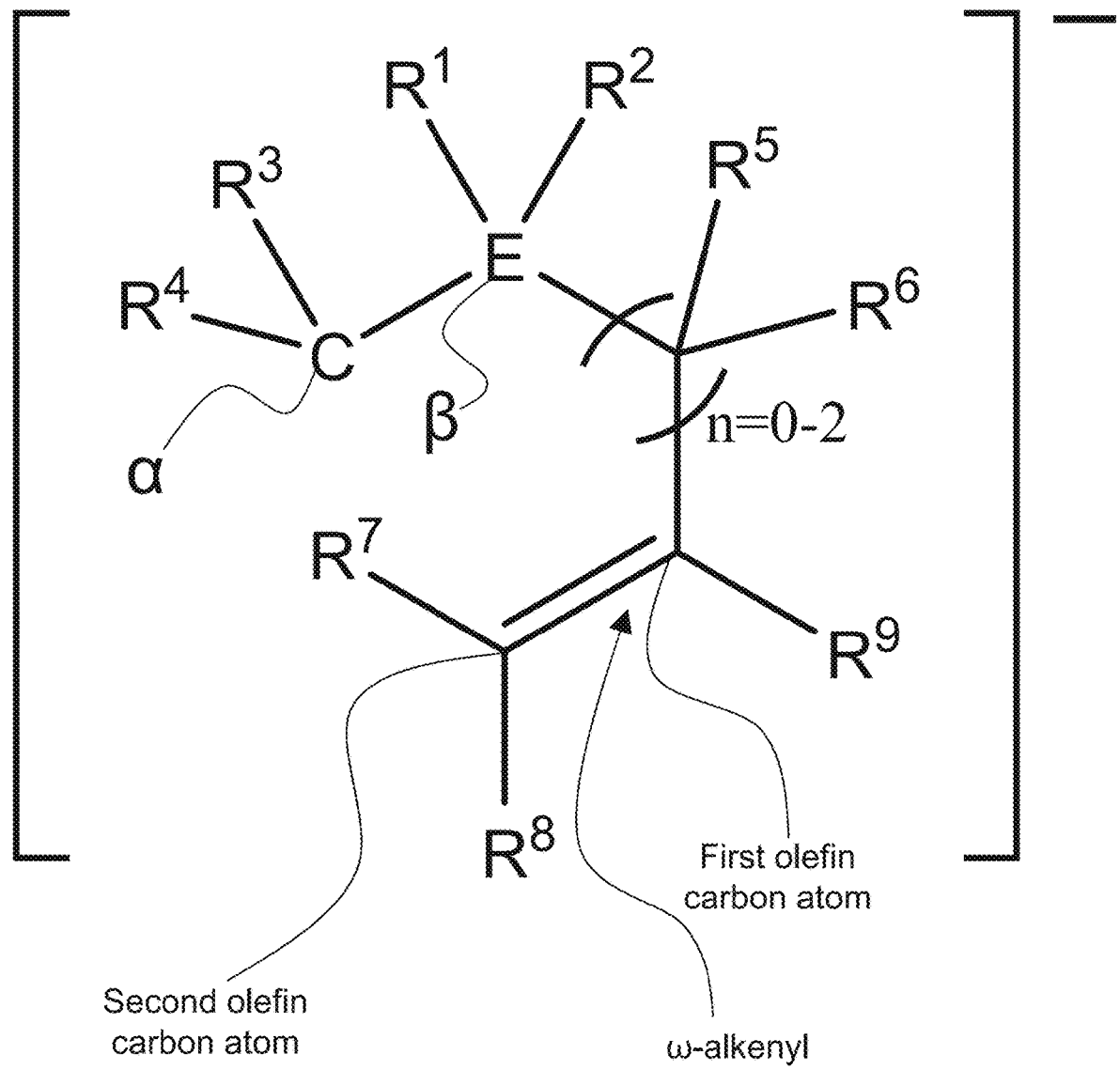

FIG. 11. Chemical structure drawing depicting a ligand characterized by formula FX2 of a metal-ligand complex corresponding to formula FX1, such as the metal-ligand complex of FIG. 2.

Figure 12:
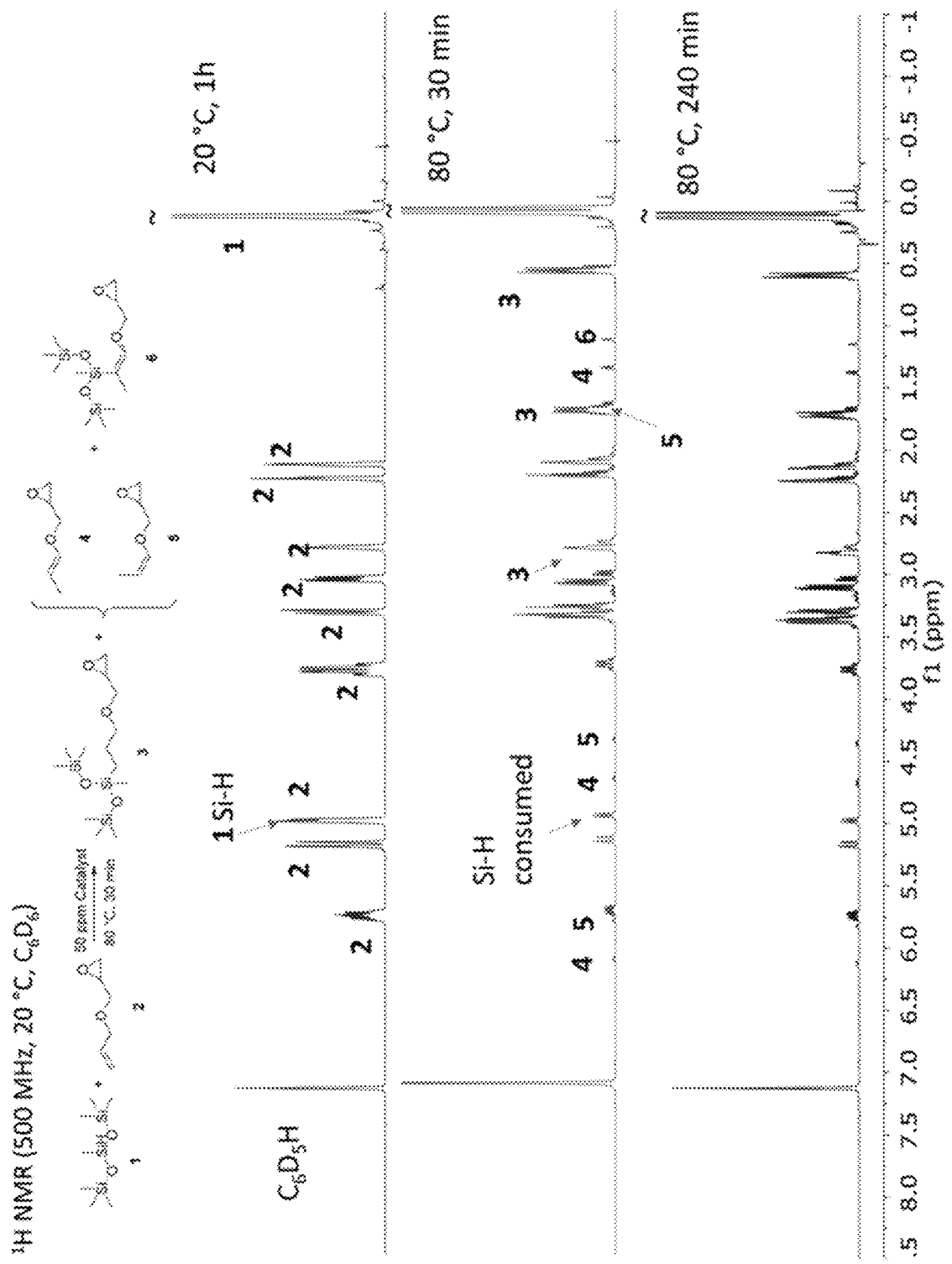

FIG. 12. $^1$H NMR spectra of aliquots of the reaction mixture taken at different stages of hydrosilylation reaction.

Figure 13:
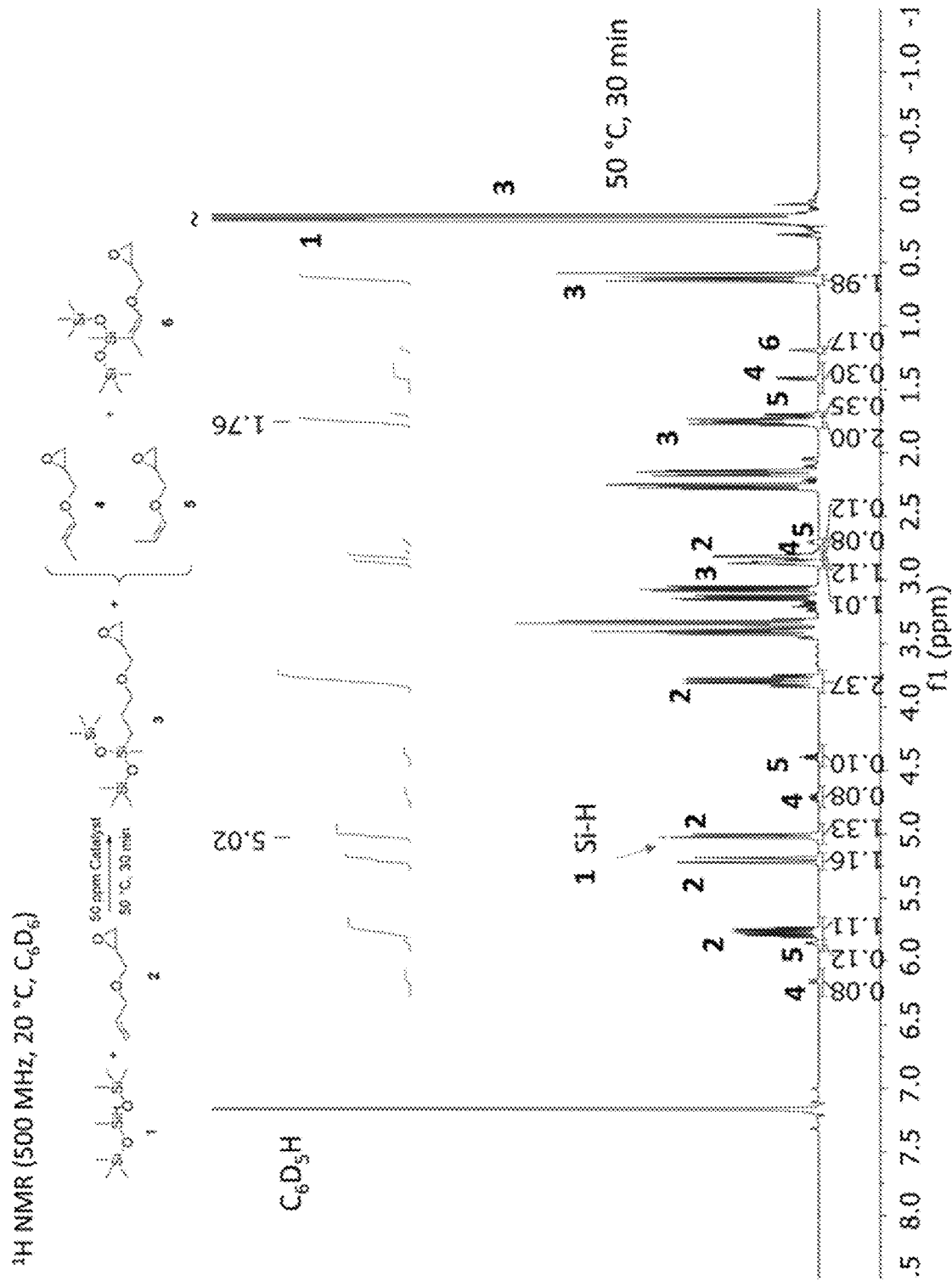

FIG. 13. $^1$H NMR spectrum of an aliquot of a reaction mixture after being heated under argon for 30 min at 50° C. The initial mixture contains 2 equiv. allyl glycidyl ether (0.59 mL), 1 equiv. HSiMe(OSiMe$_3$)$_2$ (MD'M) (0.69 mL), 50 ppm (per Si—H) of cis-bis($\eta^1,\eta^2$-2,2-dimethylpent-4-en-1-yl)platinum and benzene-$d_6$ (10 μL). Different species in the reaction mixture are assigned using the following numbering scheme: 1, HSiMe(OSiMe$_3$)$_2$(MD'M); 2, allyl glycidyl ether; 3, 1,1,1,3,5,5,5-heptamethyl-3-(3-(oxiran-2-ylmethoxy)propyl)trisiloxane; 4, (E)-2-((prop-1-en-1-yloxy)methyl)oxirane; 5, (Z)-2-((prop-1-en-1-yloxy)methyl)oxirane; 6, 1,1,1,3,5,5,5-heptamethyl-3-(1-(oxiran-2-ylmethoxy)prop-1-en-2-yl)trisiloxane isomers. The reaction progress was characterized by comparing the integration of the Si—H resonance of 1 (δ~5.0) with the integration of the SiCH$_2$CH$_2$CH$_2$ resonance (δ~1.76) of the product 3. The Si—H resonance overlaps with an olefinic C—H resonance of 2. The integration due to 2 can be subtracted based on other resonances of 2. NMR spectrum of this aliquot suggest that 85% MD'M reacted within 30 min at 50° C.

Figure 14:
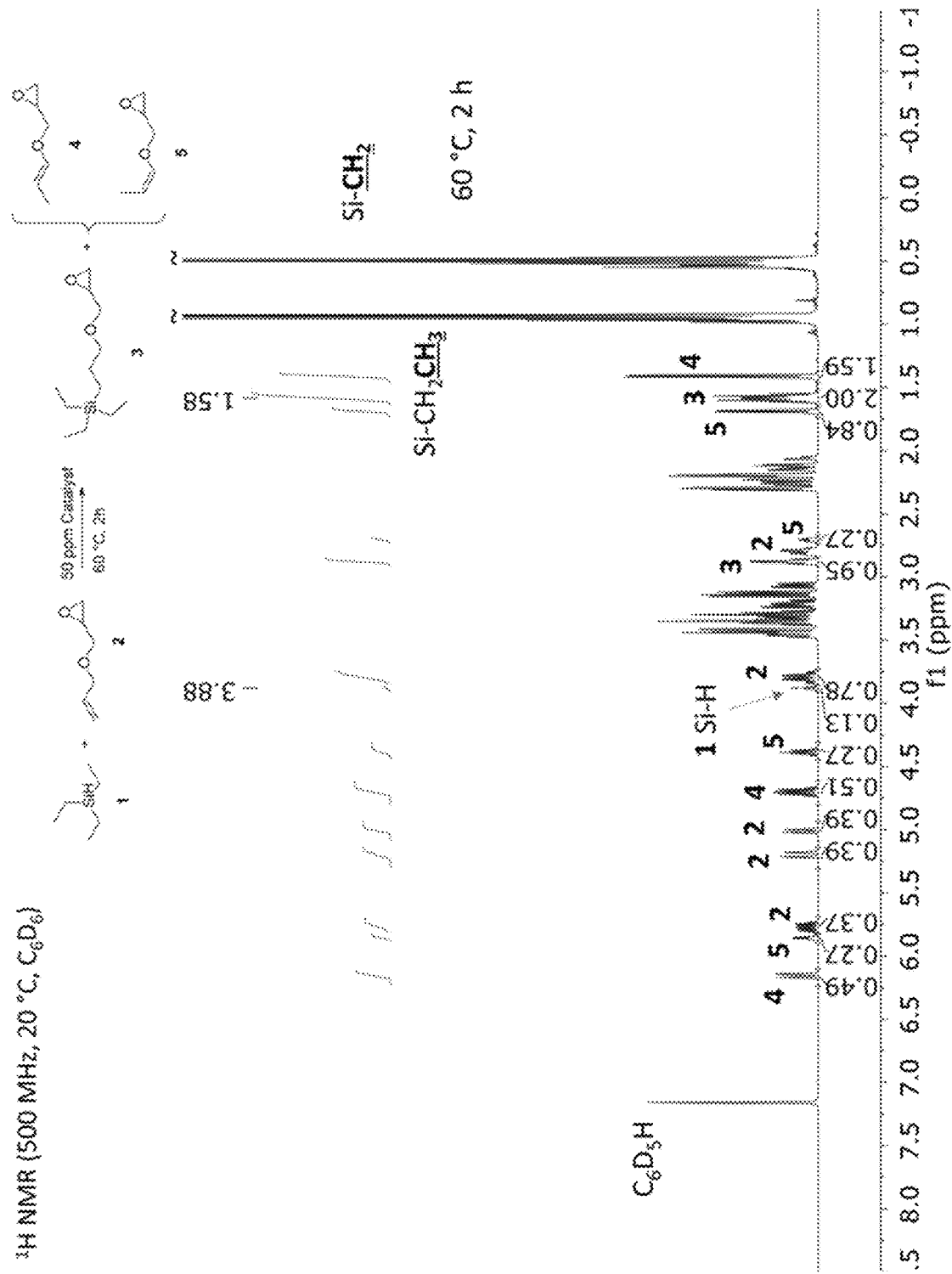

FIG. 14. $^1$H NMR spectrum of an aliquot of a reaction mixture after being heated under argon for 2 hours at 60° C. The initial mixture contains 2 equiv. allyl glycidyl ether (1.18 mL), 1 equiv. triethylsilane (0.80 mL), 50 ppm (per Si—H) of cis-bis($\eta^1,\eta^2$-2,2-dimethylpent-4-en-1-yl)platinum and benzene-$d_6$ (20 μL). Different species in the reaction mixture are assigned using the following numbering scheme: 1, triethyl silane; 2, allyl glycidyl ether; 3, triethyl (3-(oxiran-2-ylmethoxy)propyl)silane; 4, (E)-2-((prop-1-en-1-yloxy)methyl)oxirane; 5, (Z)-2-((prop-1-en-1-yloxy) methyl)oxirane. The reaction progress was calculated based on the integration of Si—H group of unreacted triethylsilane (δ 3.88) and the integration of the SiCH$_2$CH$_2$ resonance of product triethyl(3-(oxiran-2-ylmethoxy)propyl)silane. NMR spectrum of this aliquot suggest that 90% triethylsilane reacted within 2 hours at 60° C.

Figure 15:
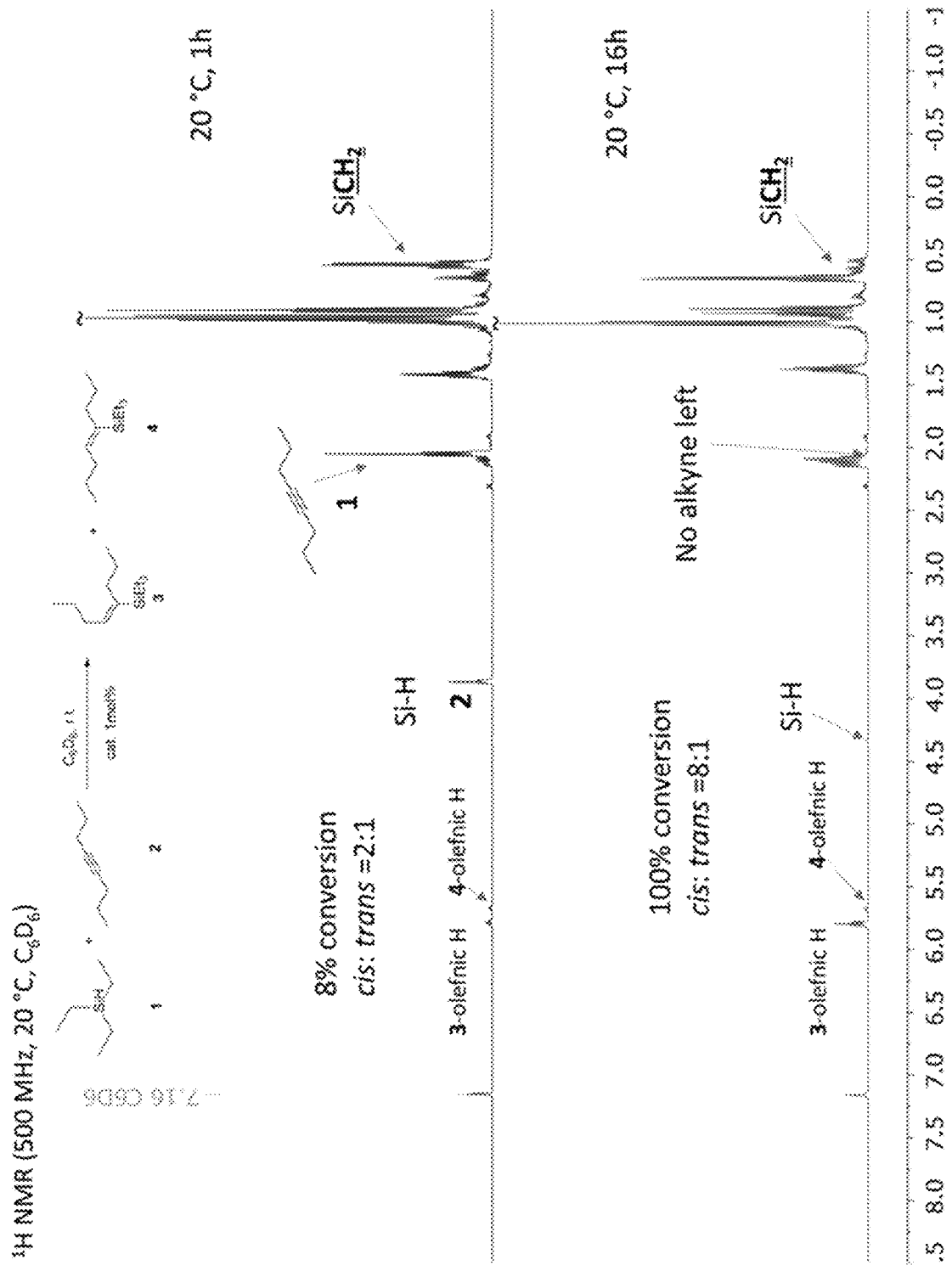

FIG. 15. $^1$H NMR spectra of aliquots of the reaction mixture taken at different stages of hydrosilylation reaction. The initial mixture contains 1 equiv. 4-octyne (55 mg), 1.1 equiv. triethylsilane (95 μL), 0.01 equiv. (per alkyne) of cis-bis($\eta^1,\eta^2$-2,2-dimethylpent-4-en-1-yl)platinum (1.8 mg) and benzene-$d_6$ (1.0 mL). Different species in the reaction mixture are assigned using the following numbering scheme: 1, triethyl silane; 2, 4-octyne; 3, (E)-triethyl(oct-4-en-4-yl)silane; 4, (Z)-triethyl(oct-4-en-4-yl)silane. The reaction progress was calculated based on the integration of CH$_2$—C≡C group of unreacted 4-octyne (δ 2.05) and the integration of the olefinic C—H resonance of products (δ~5.5). NMR spectrum of this aliquot suggest that ~100% 4-octyne reacted within 16 hours at 20° C.

Figure 16:
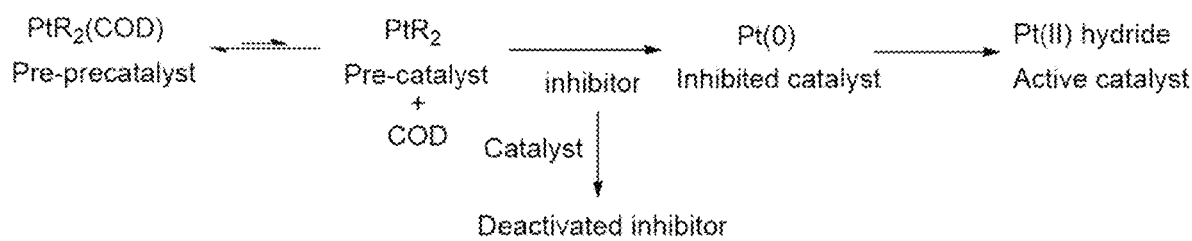

FIG. 16. Generation of the Pt$^{II}$ hydride catalyst from the pre-precatalyst. The inhibitor either inhibits the formation of Pt$^0$ species, or inhibits the Pt$^0$ species after they are formed.

Figure 17:
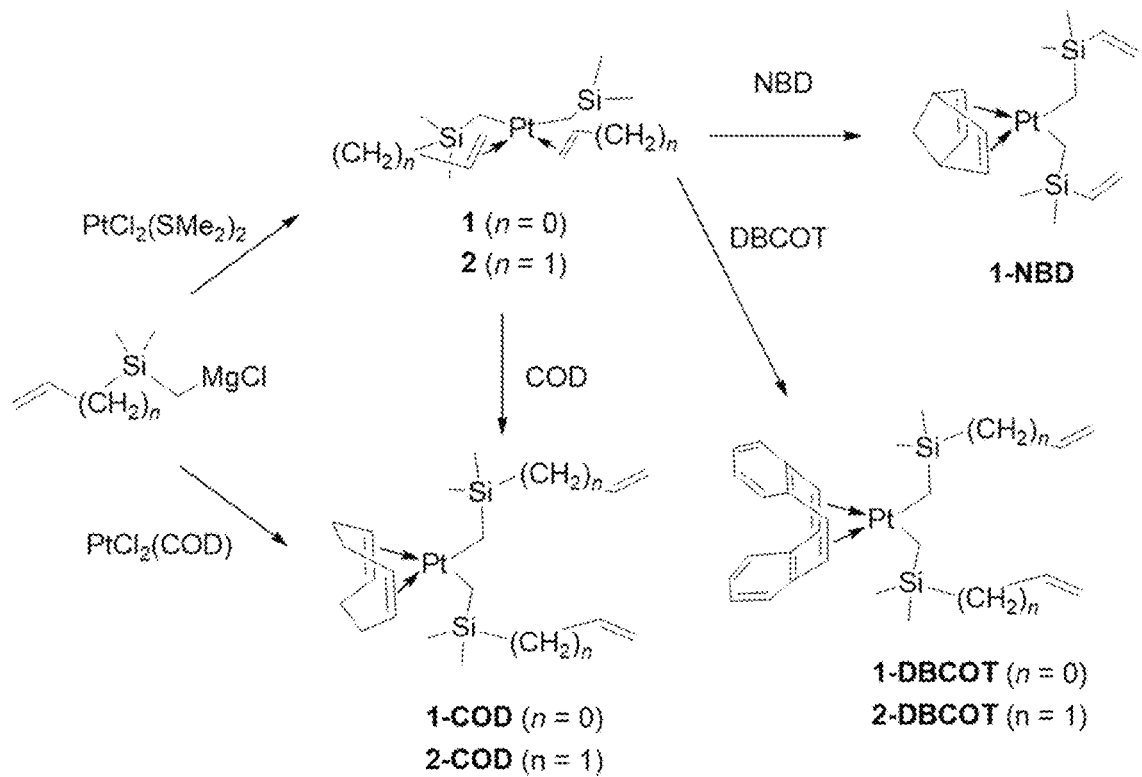

FIG. 17. Synthesis of Platinum(II) Alkyls.

Figure 18:
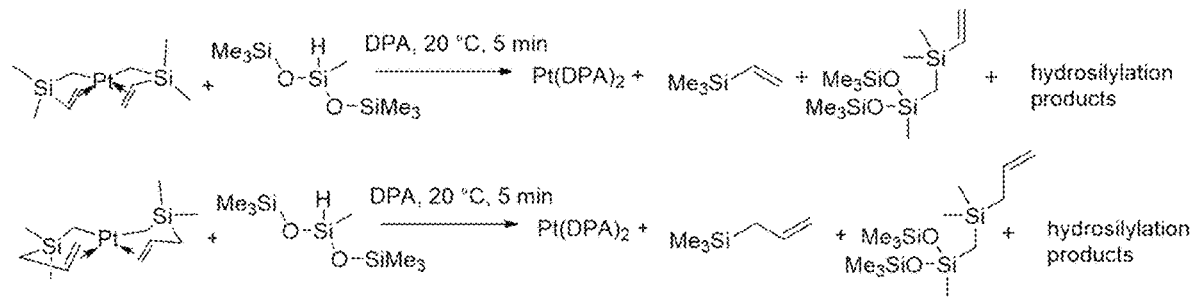

FIG. 18. Reaction products of PtR$_2$ complexes with MD'M in the presence of excess diphenylacetylene (DPA).

Figure 19:
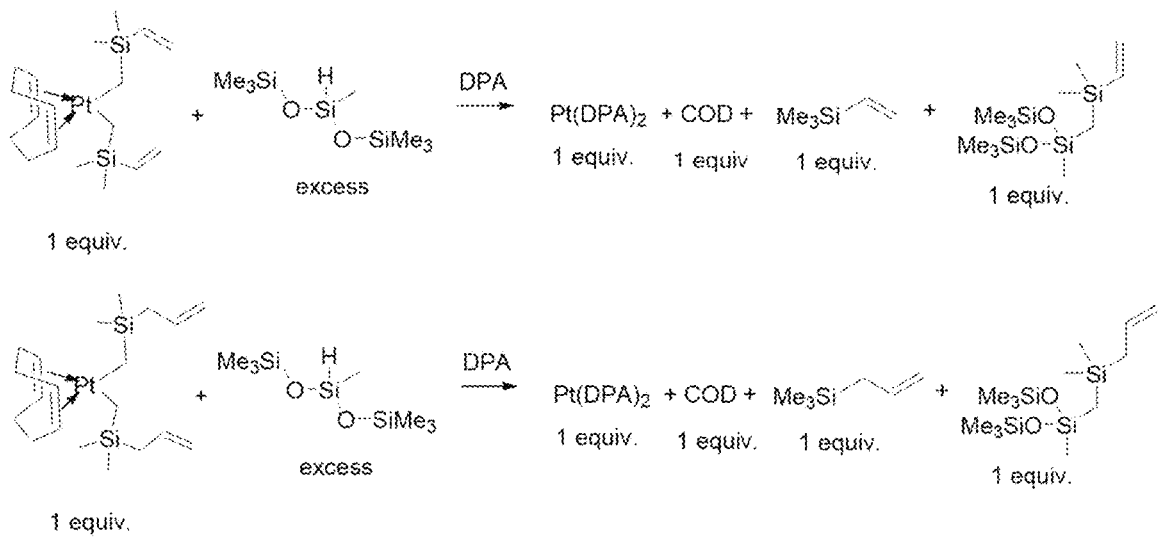

FIG. 19. Reaction products of COD adducts with MD'M in presence of excess diphenylacetylene (DPA).

Figure 20:
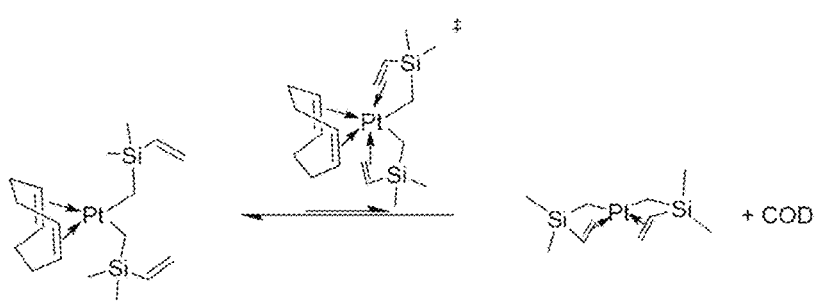

FIG. 20. Possible mechanism for COD dissociation in 1-COD.

Figure 21:
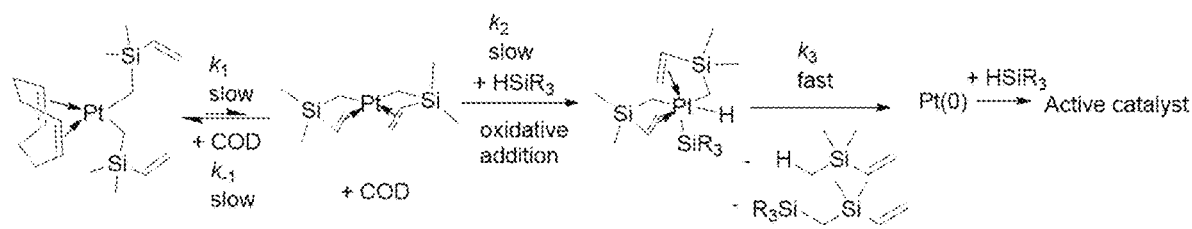

FIG. 21. Possible mechanism for 1-COD to convert to active catalyst.

Figure 22:
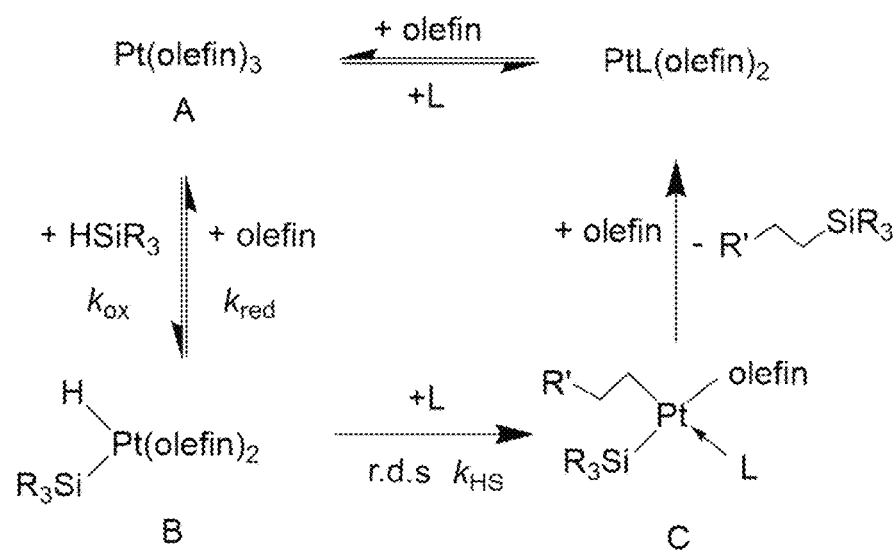

FIG. 22. Proposed mechanism for Pt catalyzed hydrosilylation.

Figure 23A:
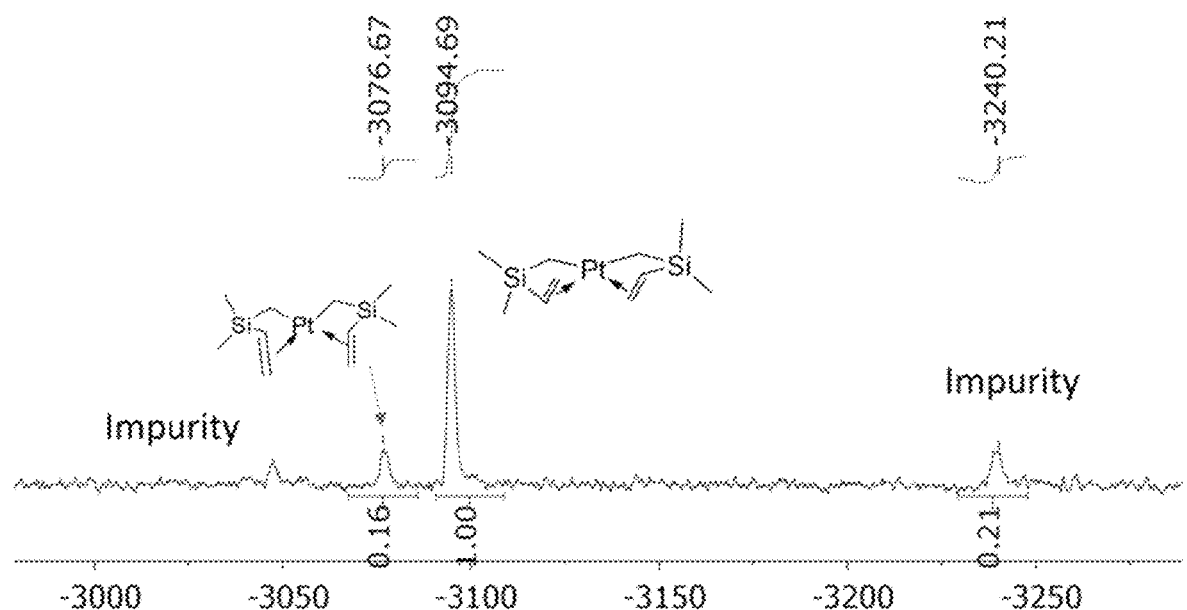
Figure 23B:
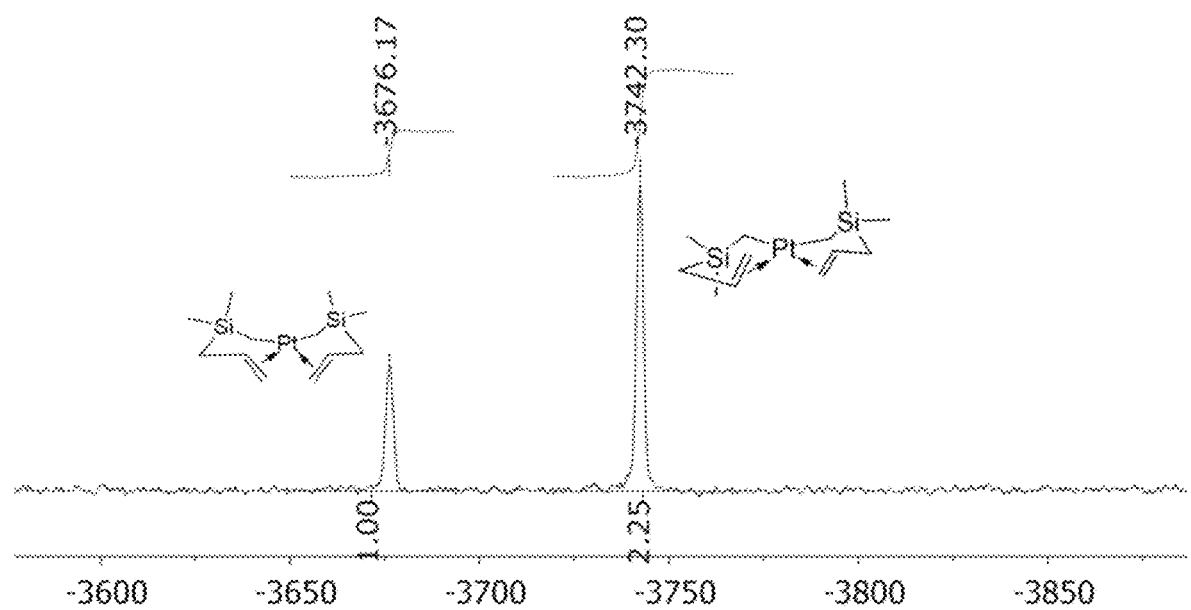

FIG. 23A. $^{195}$Pt{$^1$H} NMR spectrum of Pt(CH$_2$SiMe$_2$CH=CH$_2$)$_2$ (1) at 0° C. in toluene-$d_8$. FIG. 23B. $^{195}$Pt NMR spectrum of Pt(CH$_2$SiMe$_2$CH$_2$CH=CH$_2$)$_2$ (2) at 20° C. in toluene-$d_8$. For both compounds, two isomers ($C_2$ and $C_s$) exist in solution.

Figure 24A:
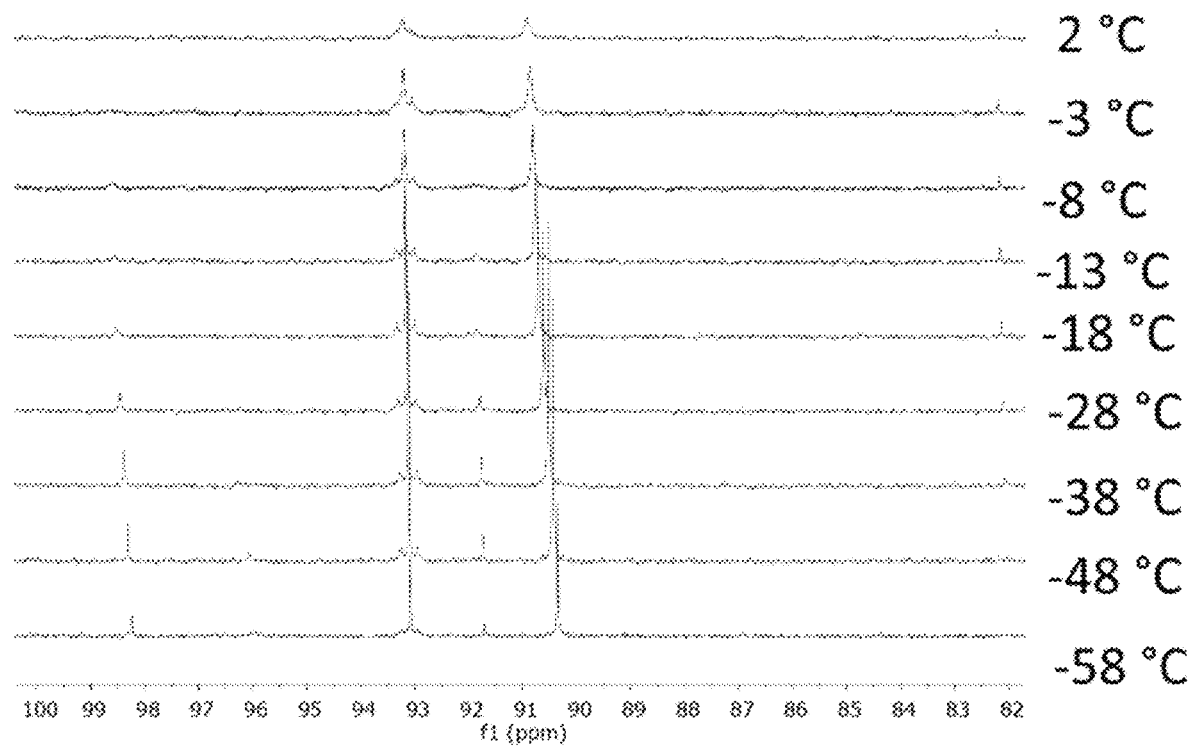
Figure 24B:
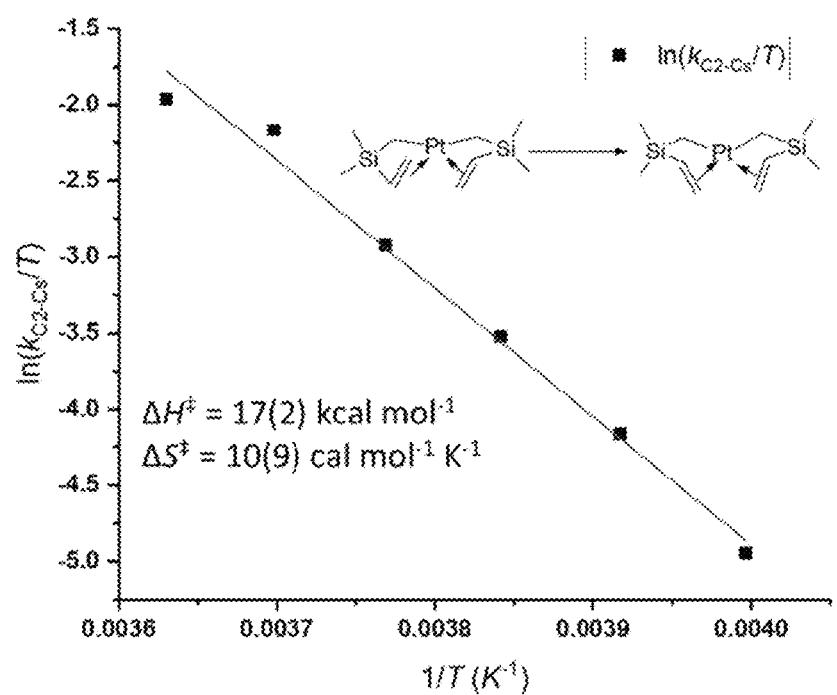
Figure 24C:
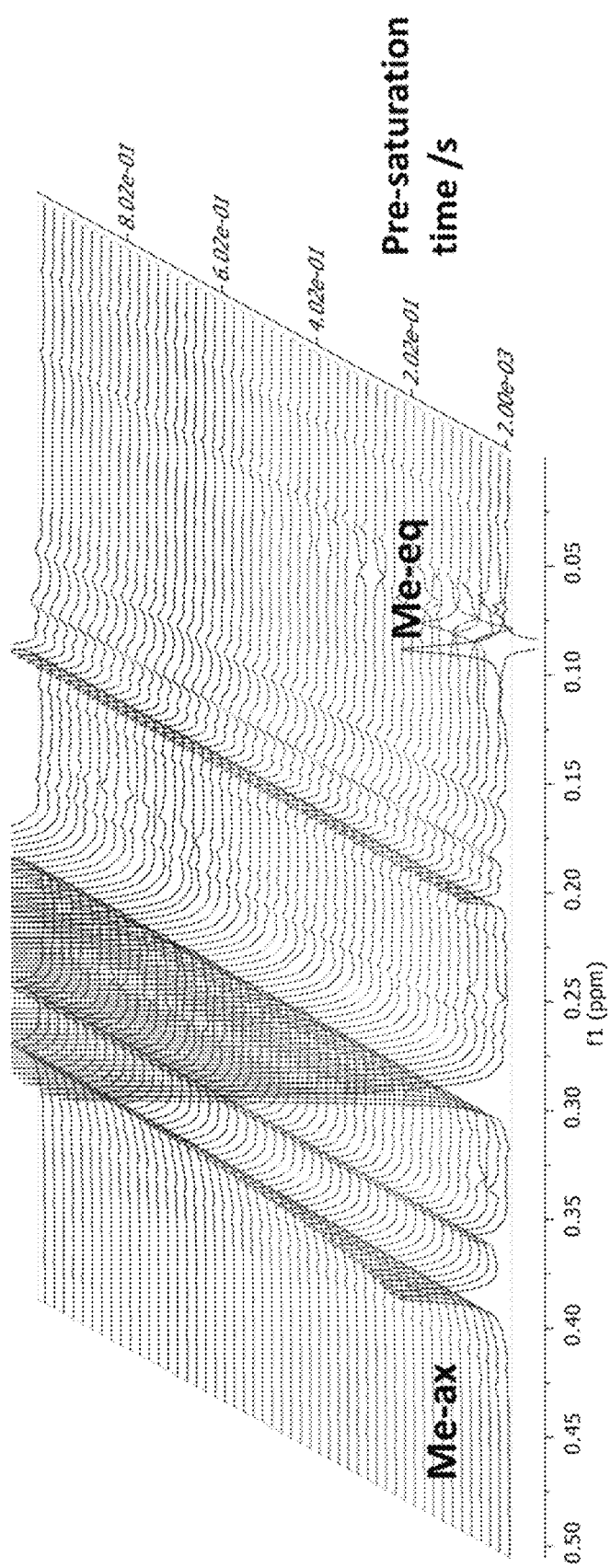

FIG. 24A. Variable temperature $^{13}$C{$^1$H} NMR spectra of the olefinic carbons of cis-Pt(CH$_2$SiMe$_2$CH=CH$_2$)$_2$ (1) in toluene-$d_8$. FIG. 24B. Eyring plot of the rate of the conversion of the $C_2$ isomer to $C_s$ isomer of 1 in toluene-$d_8$. FIG. 24C. Spin saturation transfer results at −18° C. showing decay of the axial methyl resonance of the $C_2$ isomer of 1 as a function of the pre-saturation time for irradiation of the equatorial methyl resonance.

Figure 25A:
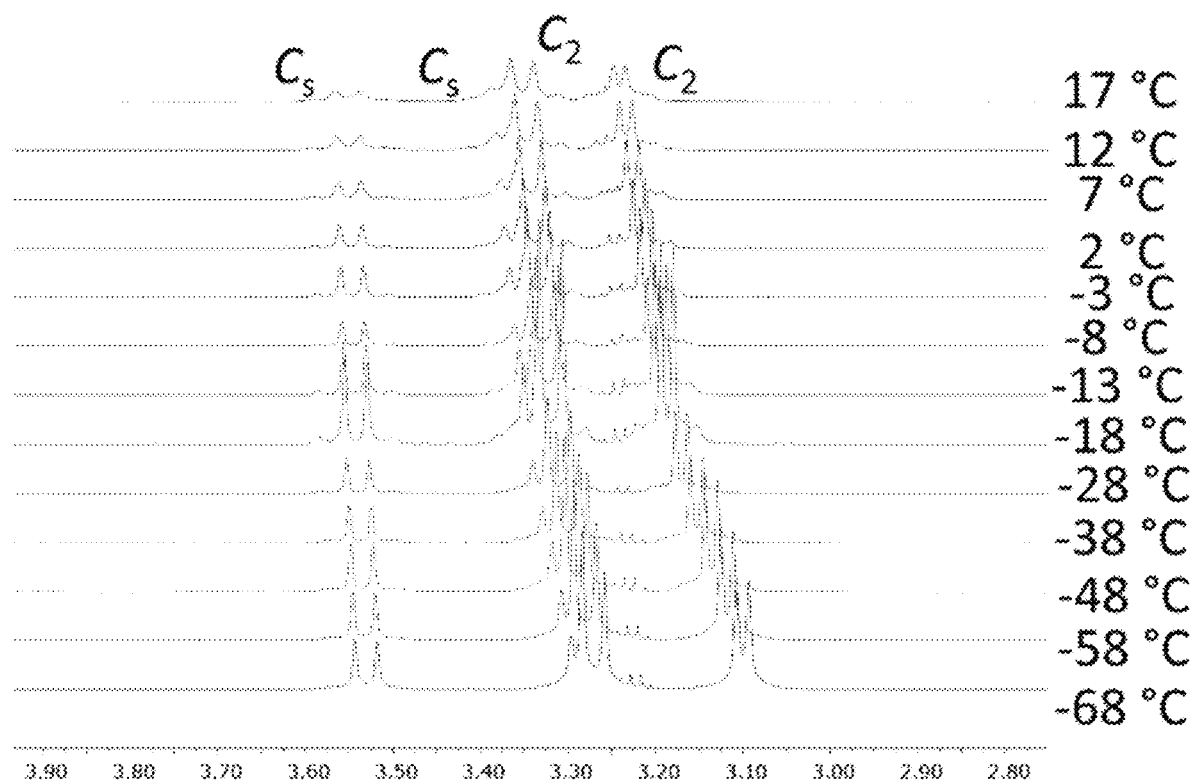
Figure 25B:
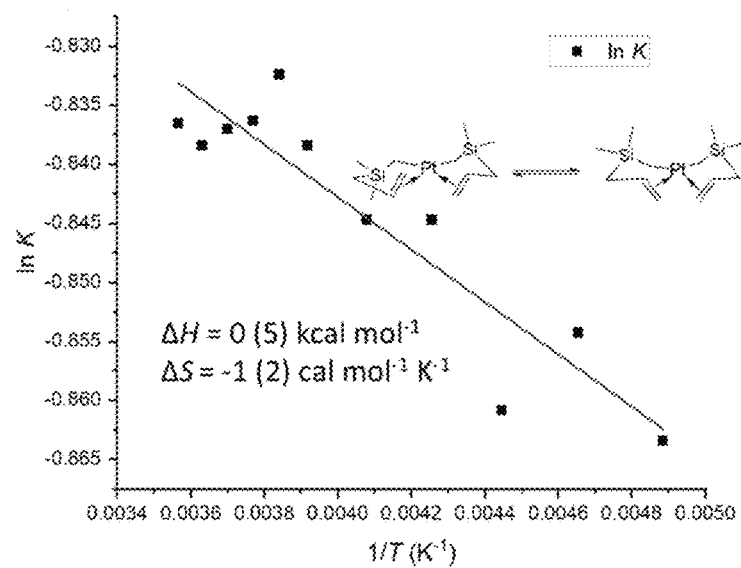
Figure 25C:
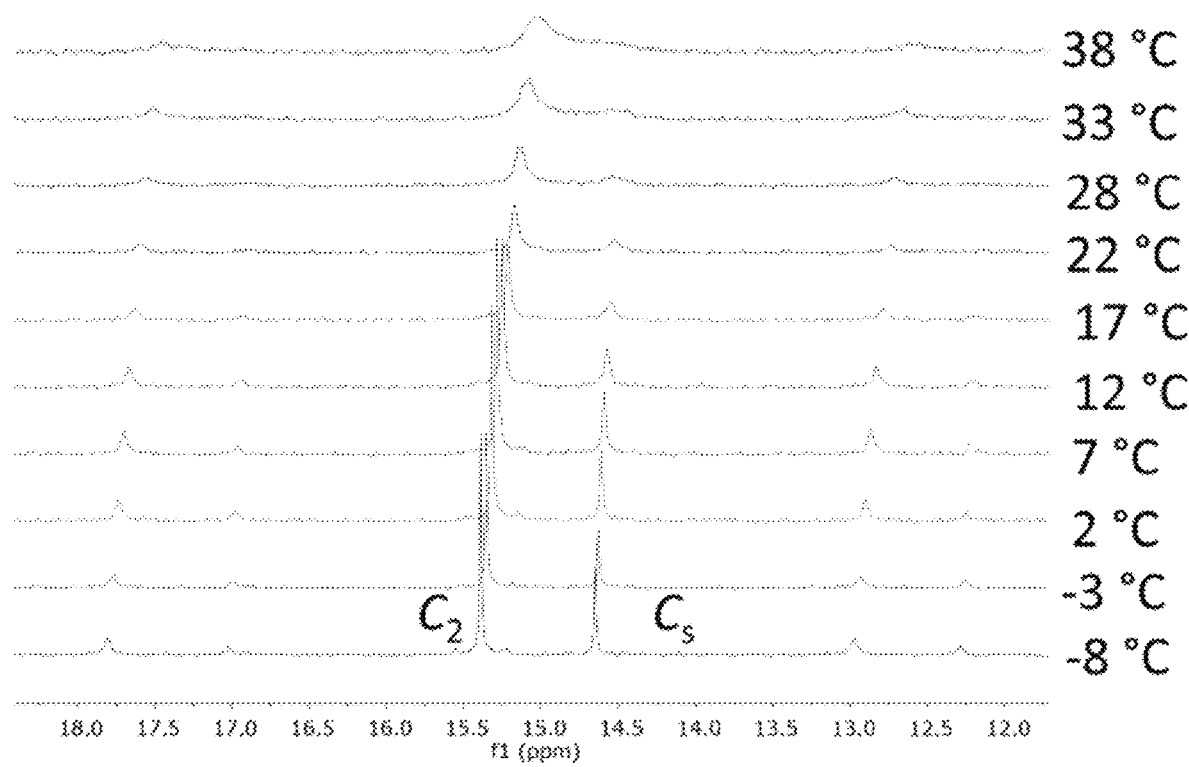
Figure 25D:
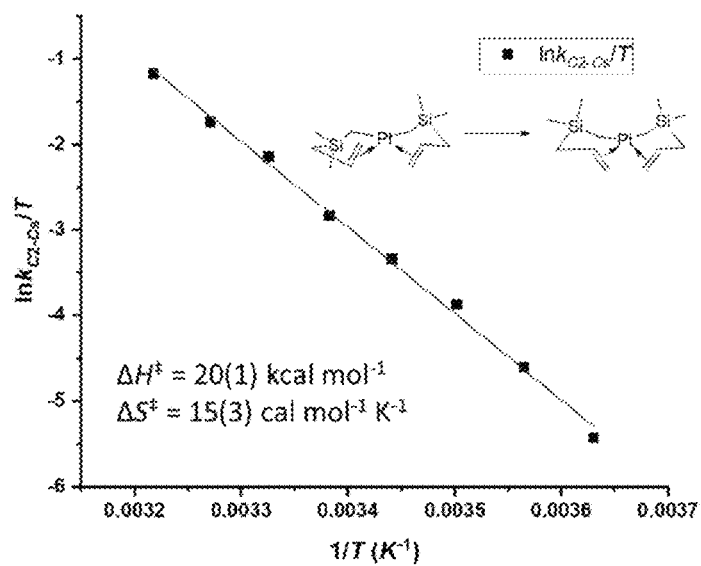

FIG. 25A. Variable temperature 1H NMR spectra of the olefinic protons of Pt(CH$_2$SiMe$_2$CH$_2$CH=CH$_2$)$_2$ (2) in toluene-$d_8$. FIG. 25B. van 't Hoff plot for isomerization of 2. FIG. 25C. VT-$^{13}$C{$^1$H} NMR spectra of α-CH$_2$ carbons of 2 in toluene-$d_8$. FIG. 25D. Eyring plot of the rate of the conversion of the $C_2$ isomer to $C_s$ isomer of 2 in toluene-$d_8$.

Figure 26:
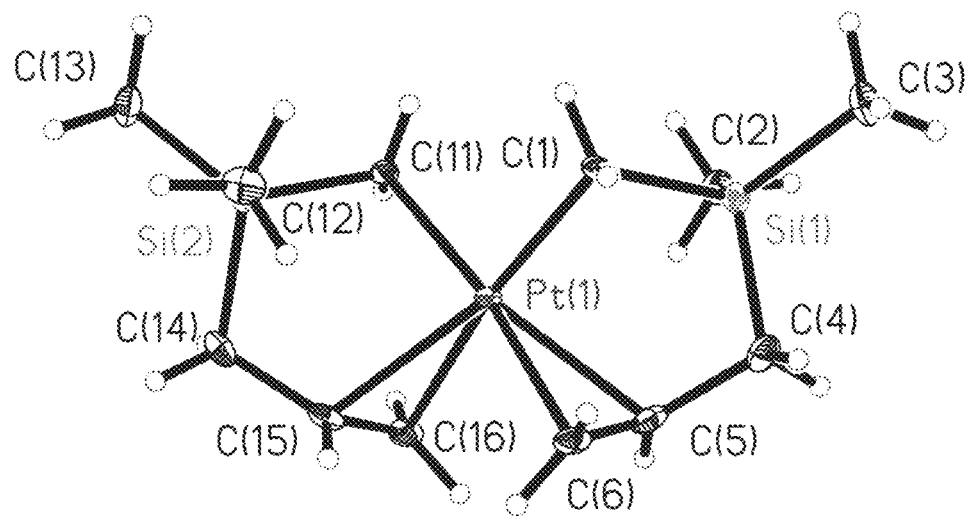

FIG. 26. Crystal structure of Pt(CH$_2$SiMe$_2$CH$_2$CH=CH$_2$)$_2$ (2). Ellipsoids are drawn at the 35% probability level.

Figure 27A:
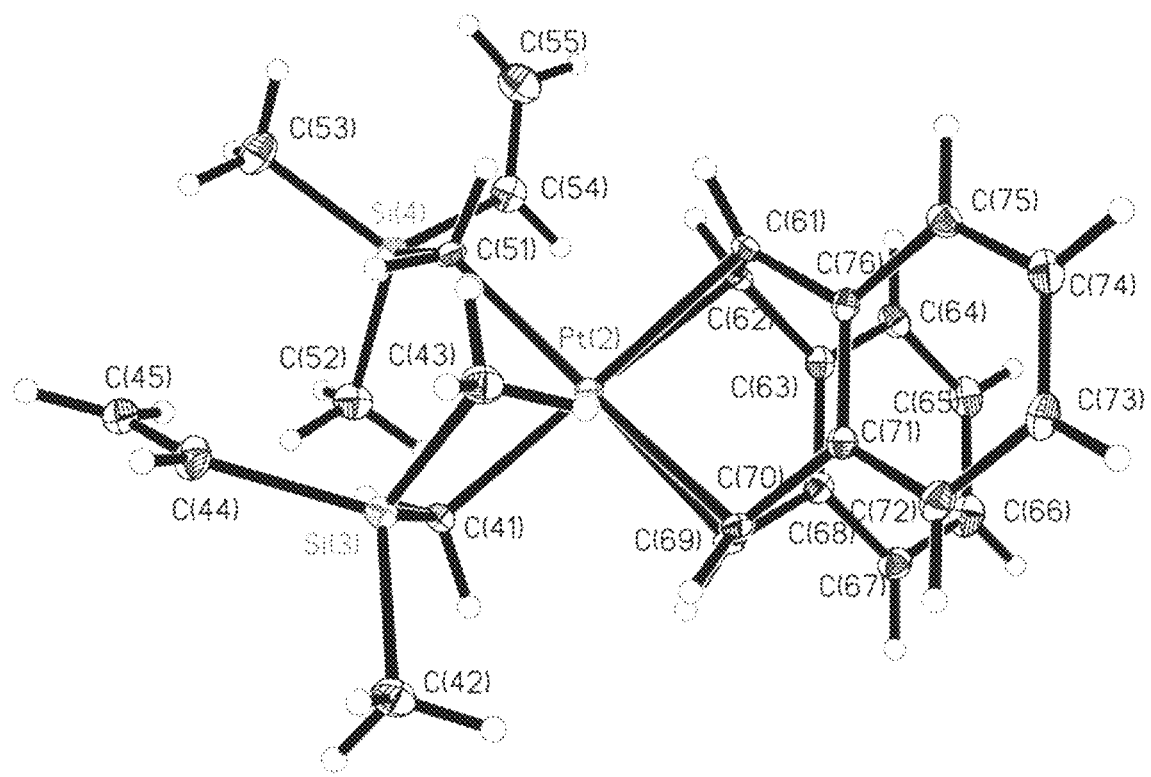
Figure 27B:
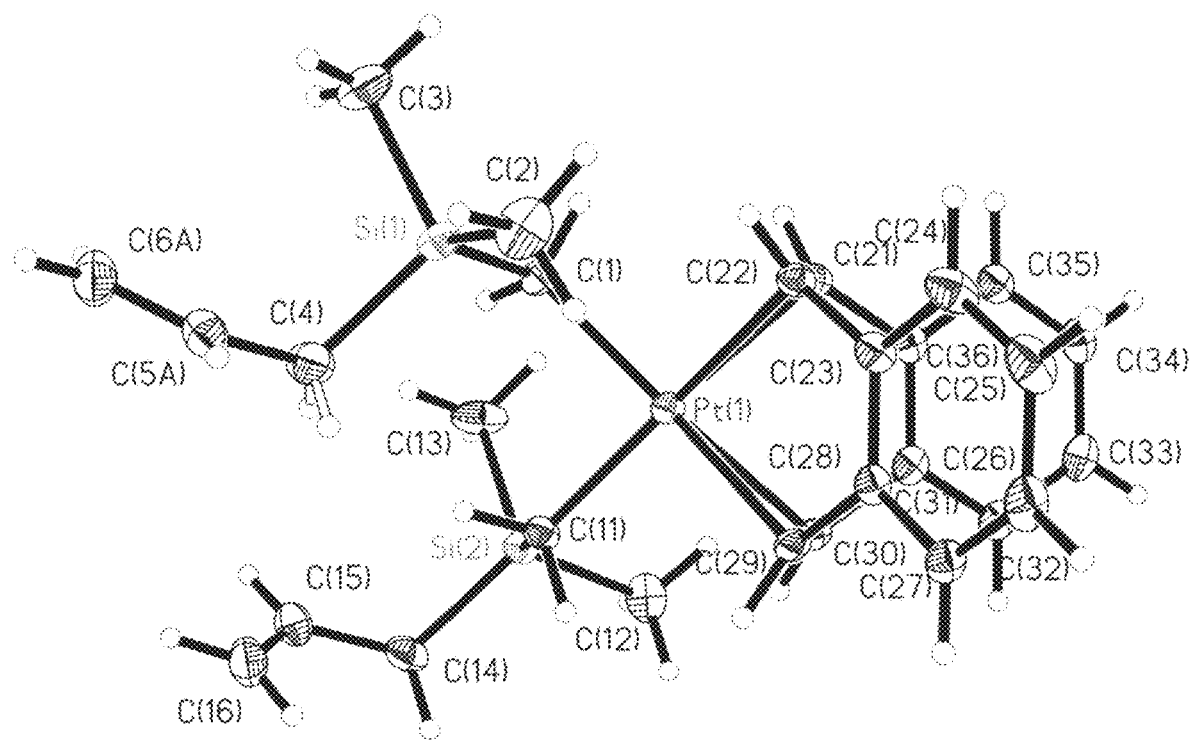

FIGS. 27A-27B. Crystal structures of (FIG. 27A) (DB-COT)Pt(CH$_2$SiMe$_2$CH=CH$_2$)$_2$ (1-DBCOT) and (FIG. 27B) (DBCOT)Pt(CH$_2$SiMe$_2$CH$_2$CH=CH$_2$)$_2$ (2-DBCOT). Ellipsoids are drawn at the 35% probability level.

Figure 28:

FIG. 28. Mixtures containing 1:1 (mol ratio) CH$_2$=CHSi(Me)$_2$(OSiMe$_2$)$_5$SiMe$_2$CH=CH$_2$ (M$^{Vi}$D$_5$M$^{Vi}$) and HSi(Me)$_2$(OSiMe$_2$)$_{100}$SiMe$_2$H (M'D$_{100}$M') with 5×10$^{-6}$ mol % (per Si—H) of added 1-COD after being kept at 80° C. (left) and 20° C. (right) for 24 h.

Figure 29:
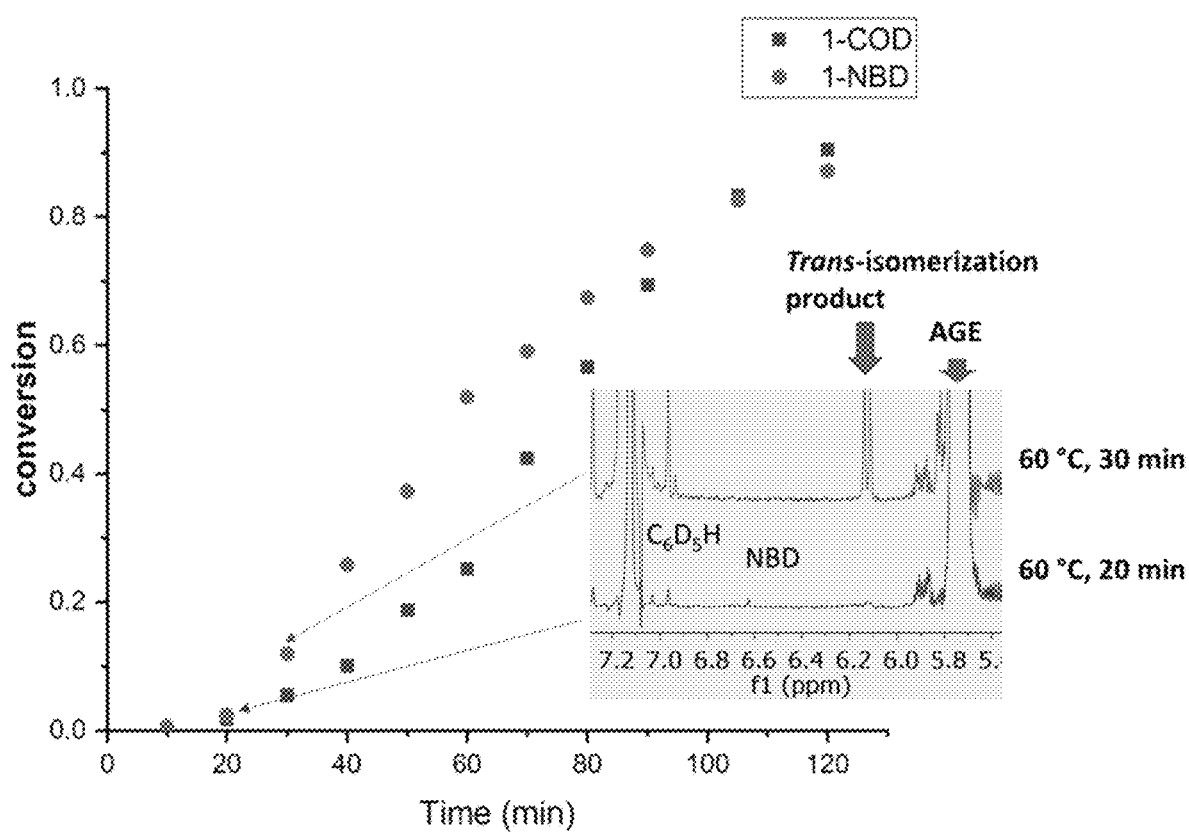

FIG. 29. Reaction profile of the hydrosilylation of AGE with triethylsilane in the presence of catalyst (either 1-COD or 1-NBD) at a mole ratio of 2:1:2×10$^{-5}$ at 60° C. For 1-NBD, 160 equiv/Pt of NBD are also present at t=0; the reaction takes off after the NBD is consumed.

Figure 30:
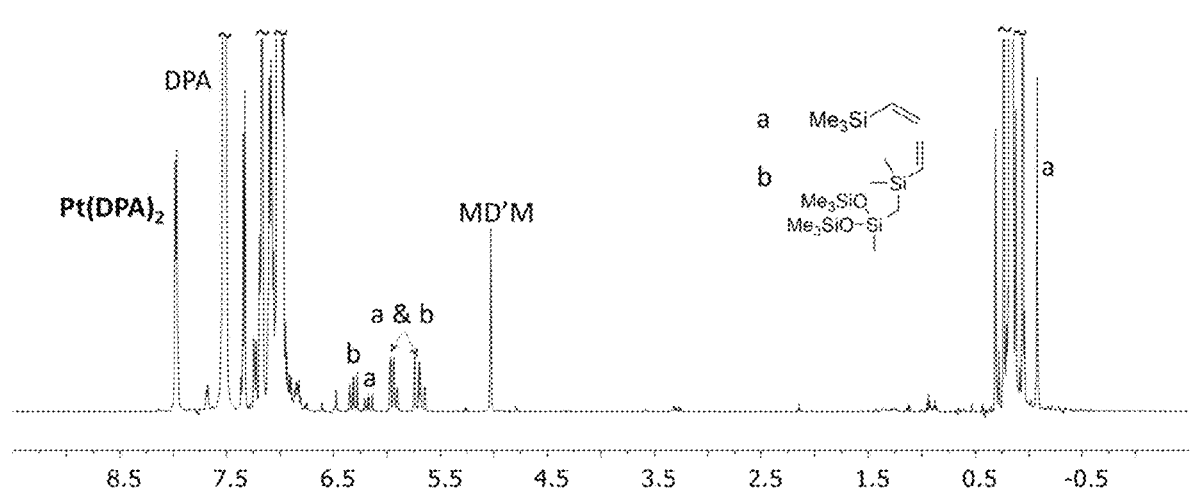

FIG. 30. $^1$H NMR spectra in C$_6$D$_6$ at 20° C. of the reaction of 1 with MD'M in the presence of a large excess of diphenylacetylene (DPA). All 1 reacted within 5 min, whereas Pt(DPA)$_2$, vinyltrimethylsilane (H—CH$_2$SiMe$_2$CH=CH$_2$, species a), and 3-((dimethyl(vinyl)silyl)methyl)-1,1,1,3,5,5,5-heptamethyltrisiloxane (R$_3$Si—CH$_2$SiMe$_2$CH=CH$_2$, species b) are generated.

Figure 31:
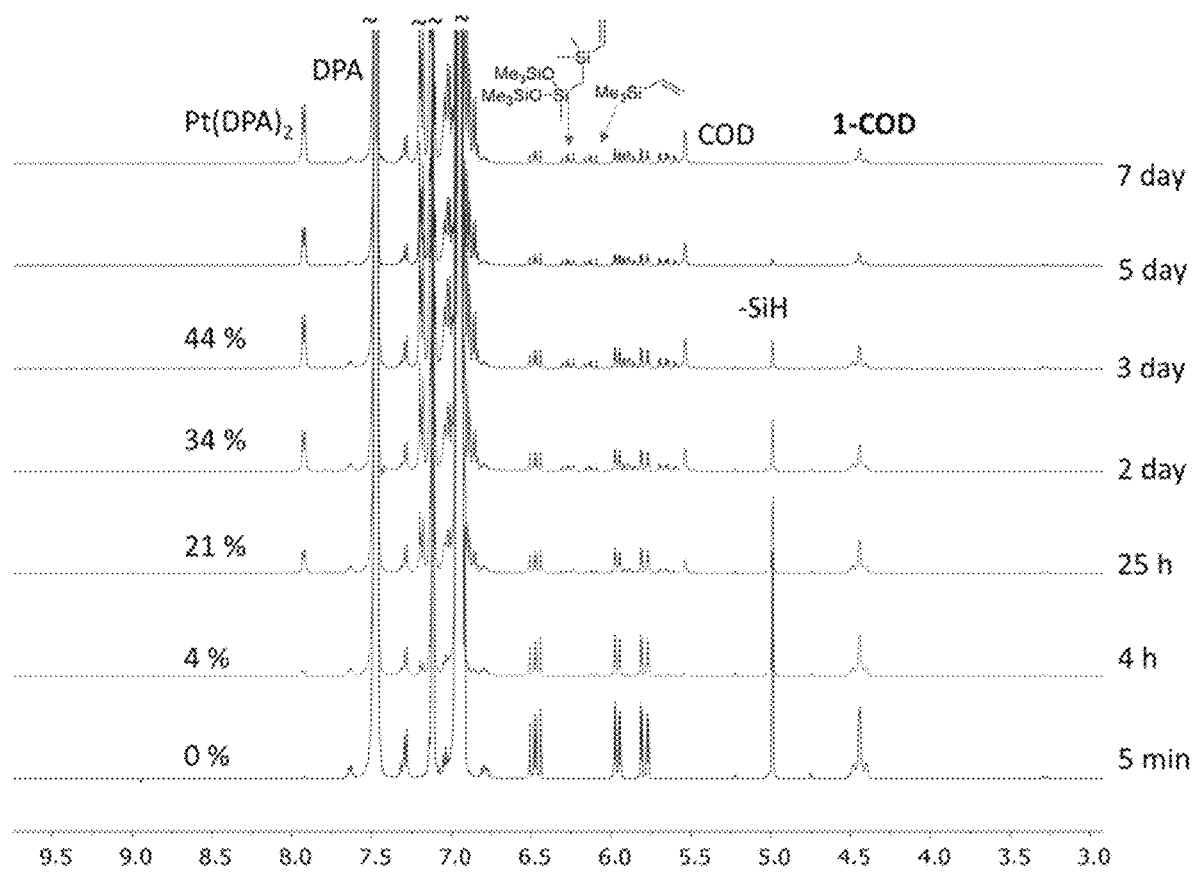

FIG. 31. $^1$H NMR spectra in C$_6$D$_6$ at 20° C. of the reaction of 1-COD with excess MD'M in the presence of large excess of diphenylacetylene (DPA); the reaction products are Pt(DPA)$_2$, vinyltrimethylsilane (H-L), 3-((dimethyl(vinyl)silyl)methyl)-1,1,1,3,5,5,5-heptamethyltrisiloxane (R$_3$Si-L), and COD. The percentage conversion of 1-COD to Pt(DPA)$_2$ (given at the left of the figure) matches well with the kinetics of COD dissociation from 1-COD. After 3 days of reaction, the majority of MD'M has been consumed by hydrosilylation of diphenylacetylene instead of reacting with 1-COD.

Figure 32A:
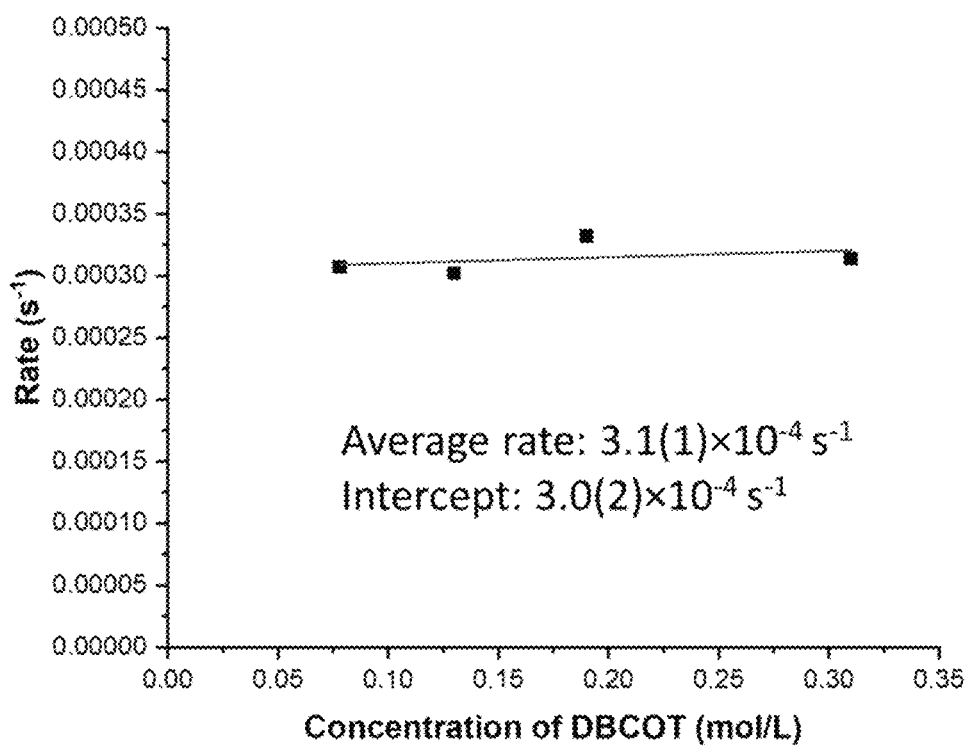
Figure 32B:
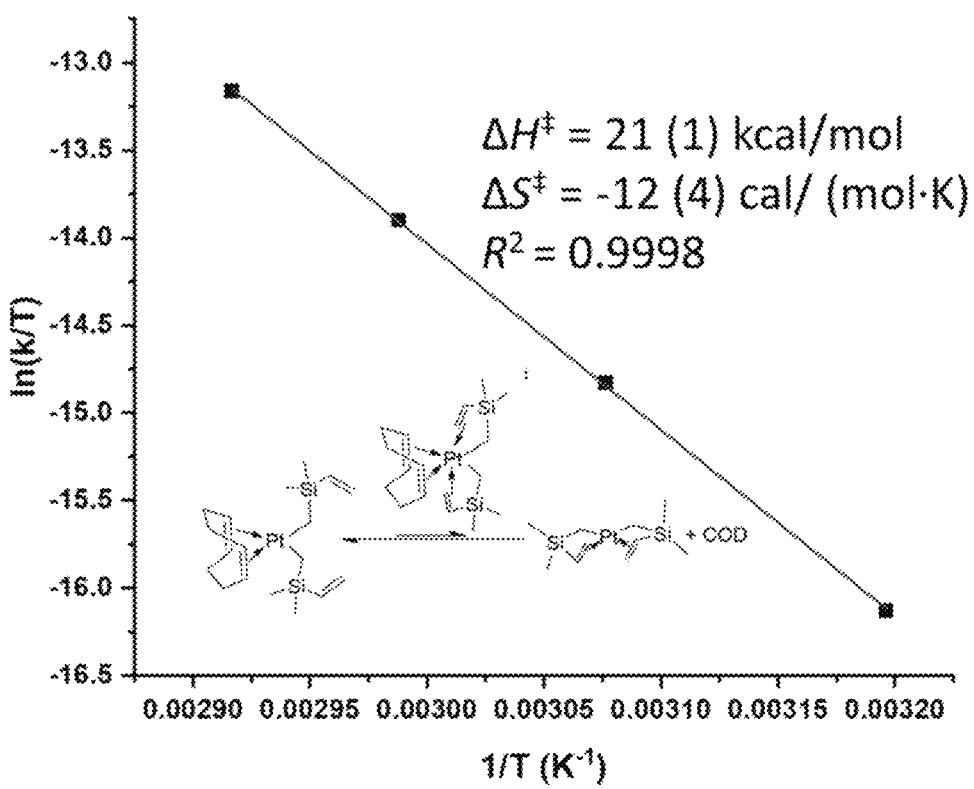

FIG. 32A. Rate of the ligand exchange reaction between 1-COD and DBCOT in benzene-d$_6$ as a function of the concentration of DBCOT at 62° C. The ligand exchange rate is independent of the concentration of DBCOT, suggesting a dissociative mechanism. FIG. 32B. Eyring plot for the ligand exchange reaction between 1-COD and DBCOT in benzene-d$_6$. The negative entropy of activation suggests that internal association of the alkenyl ligands leads to the dissociation of COD.

STATEMENTS REGARDING CHEMICAL COMPOUNDS AND NOMENCLATURE

In general, the terms and phrases used herein have their art-recognized meaning, which can be found by reference to standard texts, journal references and contexts known to those skilled in the art. The following definitions are provided to clarify their specific use in the context of the invention.

The term "ligand", as used herein, refers to a molecule or chemical group that is associated with a metal atom or metal ions. The term "associated" refers to a covalent bond, an ionic bond, a coordination bond, or any combination of these. In some embodiments, a ligand associated with a metal atom or metal ion refers to a ligand that is coordinated with (i.e., in a coordination bond with) the metal atom or metal ion. In some embodiments, a ligand associated with a metal atom or metal ion refers to a ligand that is ionically bonded to a metal atom or metal ion. In an example, the cyano groups in ferricyanide are directly associated with, or directly coordinated with, the central iron ion. A ligand may be unidentate or polydentate. Denticity refers to the number of coordination sites occupied by the ligand when associated to a metal atom or metal ion. Compounds, formulations, and methods of the invention may include, for example, unidentate, bidentate, tridentate, tetradentate or higher denticity ligands. An anionic ligand is a ligand having a negative charge. A cationic ligand is a ligand having a positive charge. A mono-anionic ligand is a ligand whose charge is −1. For example, the ligand 2,2-dimethylpent-4-en-1-yl (e.g., as in the complex cis-bis($\eta^1$,$\eta^2$-2,2-dimethylpent-4-en-1-yl)platinum) is a mono-anionic ligand. Each 2,2-dimethylpent-4-en-1-yl ligand in the complex cis-bis($\eta^1$,$\eta^2$-2,2-dimethylpent-4-en-1-yl)platinum is bidentate, where each 2,2-dimethylpent-4-en-1-yl ligand is independently coordinated to the Pt metal center at two coordination sites via a Pt—C sigma bond and a Pt-olefin pi bond. The term "charge" refers to a formal charge, a net or total charge of a chemical species. A ligand may be neutral, anionic, or cationic. A "neutral coordinating ligand" is a neutral ligand, whose formal charge is 0, that is associated with a metal atom or ion of the metal-ligand complex via a coordination bond.

The symbol eta or "$\eta$" refers to hapticity of a ligand. Hapticity refers to the coordination of a ligand to a metal center via an uninterrupted and contiguous series of atoms. The superscript on the symbol $\eta$ refers to the number of uninterrupted and contiguous atoms, in the ligand, that are involved in coordination to the metal center, of the metal-ligand complex. For example, a ferrocene metal-ligand complex contains two $\eta^5$-cyclopentadienyl ligands, each ligand coordinated to the metal (Fe) center via 5 uninterrupted and contiguous atoms. A ligand having non-contiguous atoms coordinated to the metal center may be represented with multiple hapticities, or multiple $\eta$ symbols. For example, the complex cis-bis($\eta^1$,$\eta^2$-2,2-dimethylpent-4-en-1-yl)platinum has two $\eta^1$,$\eta^2$-2,2-dimethylpent-4-en-1-yl ligands. The ligand $\eta^1$,$\eta^2$-2,2-dimethylpent-4-en-1-yl has a total of 3 atoms involved in coordination to the metal center, where two coordinating atoms (corresponding to the Pt-olefin pi bond) are contiguous and a third coordinating atom (corresponding to the Pt—C sigma bond) is not contiguous with respect to the other two coordinating atoms; in other words, two coordinating atoms are separated by at least one non-coordinating atom from the third coordinating atom.

Compounds and formulations, including complexes, precursors, and catalysts, and methods of the invention may include ligands that are Lewis acidic ligands or Lewis basic ligands in a metal-ligand complex. A "Lewis acid" refers to a chemical species, such as an atom, ion, functional group, or molecule, which contains an empty electron orbital which is capable of accepting an electron pair from a Lewis base. A "Lewis base" refers to a chemical species which contains a filled electron orbital containing an electron pair which is capable of forming a dative bond with a Lewis acid. As an illustrative example, boron trifluoride (BF$_3$) and certain transition metal cations, such as Pt$^{2+}$, may be Lewis acids. As an illustrative example, certain amines, such as NH$_3$, and halides, such as Cl$^-$, may be Lewis bases. The term "Lewis acidic" refers to a chemical species at least a portion of which is a Lewis acid. For example, the molecule BF$_3$ is Lewis acidic because the B in BF$_3$ is a Lewis acid. The term "Lewis basic" refers to a chemical species at least a portion of which is a Lewis base. For example, NH$_3$ may be Lewis basic because the N in NH$_3$ is a Lewis base.

The term "metal-ligand complex" refers to a chemical species that comprises a metal, which is a metal atom or a metal ion, where the metal is associated with at least one ligand. The metal atom or metal ion of the metal-ligand complex may be referred to as the "metal center" of the metal-ligand complex. A metal-ligand complex may also be referred to as a metal-coordination complex or a "complex,"

as used herein. A metal-ligand complex may be neutral with a formal charge of 0. A metal-ligand complex may have a positive or negative formal charge. An exemplary metal-ligand complex is cis-bis($\eta^1,\eta^2$-2,2-dimethylpent-4-en-1-yl) platinum, which is neutral (formal charge is 0) and which has an platinum ion as the central metal and two mono-anionic tridentate ligands (2,2-dimethylpent-4-en-1-yl). A metal-ligand complex may have one, two, three, four, or more ligands. A metal-ligand complex may have at least one charged ligand (ligand having non-zero formal charge) and at least one neutral ligand. In some embodiments, two or more ligands of a single metal-ligand complex may be associated with each other.

A "vapor-to-solid precursor" is, or comprises, a molecule that may undergo a vapor-to-solid decomposition reaction. In some embodiments, the term "vapor" refers to a gas, a vapor, and/or an aerosol. In some embodiments, the term "vapor" refers a gas-phase material (i.e., a gas or vapor) or a material otherwise dispersed in a vapor space (e.g., aerosol; e.g., liquid droplets sprayed or injected into a vapor space). The term "vapor space" refers to a volume that may be occupied by a gas, vapor, or aerosol. A vapor-to-solid decomposition refers to a reaction wherein a molecule or material in vapor-state forms one or more solid-state decomposition products. A vapor-to-solid decomposition reaction is for example, but not limited to, a disproportionation reaction. A vapor-to-solid decomposition reaction may result in at least one vapor-state product and at least one solid-state product. The term "vapor-state" refers to a molecule whose physical state of matter is as a gas, vapor, or aerosol. In some embodiments, the term "vapor-state" or "vapor-phase" refers to a molecule whose physical state is as a gas or vapor. The term "solid-state" or "solid-phase" refers to an atom, ion, compound, molecule, or combination of these, whose physical state of matter is as a solid. The solid-phase decomposition product of a vapor-to-solid precursor may contribute to formation of, i.e., is a substituent of, a solid material such as a film or nanostructure. A vapor-to-solid precursor may be suitable for chemical vapor deposition (CVD), atomic layer deposition (ALD), molecular beam epitaxy (MBE), physical vapor deposition (PVD), or any combination of these deposition processes. A vapor-to-solid precursor may be a chemical vapor deposition (CVD) precursor and/or an atomic layer deposition (ALD) precursor. CVD and ALD are exemplary vapor-to-solid deposition processes for deposition of a solid material from a vapor-phase precursor. Exemplary CVD processes include, but are not limited to, metal-organic CVD (MOCVD), plasma-enhanced CVD (PECVD), microwave plasma-assisted CVD (MWCVD or MPCVD), hot filament CVD (HFCVD), photo-initiated CVD (PICVD), laser CVD (LCVD), vapor-phase epitaxy (VPE), and atomic layer deposition (ALD). More than one vapor-to-solid precursor may be used, for example to deposit a solid material that comprises more than one type of metal. Decomposition of the vapor-to-solid precursor may involve reaction of the precursor with the substrate, or receiving surface thereof. The substrate may be exposed simultaneously and/or sequentially to a plurality of vapor-to-solid precursors to deposit a solid material. The term "vaporizer" refers to an element that may form a vapor of a precursor material, including, but not limited to, a bubbler, an atomizer, and an evaporator.

A "solid material" may be a film, a nanostructure, or a microstructure. A film may be a thin film. A film is optionally conformal. A film is optionally substantially continuous or discontinuous. A film is optionally substantially free of pinholes. In some embodiments, a film has a thickness selected from the range of 1 nm to 10 mm, 1 nm to 1 mm, 1 nm to 500 µm, 1 nm to 100 µm, 1 nm to 10 µm, 1 nm to 1 µm, 100 nm to 100 µm, or 1 µm to 100 µm. A nanostructure is a solid feature having at least one physical size dimension in the range of 1 nm to less than 1 µm. Relevant examples of a physical size dimension include: length, width, diameter, radius, volume-based diameter $$\left(2\sqrt[3]{\frac{3V}{4\pi}}\right),$$

area-based diameter $$\left(\sqrt[2]{\frac{4A}{\pi}}\right),$$

weight-based diameter $$\left(2\sqrt[3]{\frac{3W}{4\pi dg}}\right),$$

and hydrodynamic diameter; where V is nanostructure volume, A is nanostructure surface area, W is nanostructure weight, d is nanostructure density, and g is the gravitational constant. The nanostructure volume, area, weight, and area each may be an average property reflective of the nanostructure size distribution. Exemplary nanostructures include, but are not limited to, islands, pyramids, nanoparticles, nanotubes, and nanowires. A microstructure is a solid feature having whose physical size dimensions are in the range of 1 µm to 1000 µm. In some embodiments, a microstructure is a solid feature having whose physical size dimensions are in the range of 1 µm to 100 µm. Exemplary microstructures include, but are not limited to, islands. The solid material may be substantially amorphous or substantially crystalline. The solid material may have a combination of crystalline and amorphous regions. The solid material may be substantially compositionally homogenous. The solid material may be substantially compositionally heterogenous. The solid material may have regions that are substantially compositionally homogeneous and regions that are substantially compositionally heterogenous. A solid material may be a metal, a metal oxide, a metal nitride, a metal carbide, a metal boride, a metal sulfide, a metal phosphide, or a combination of these. A solid material may be an alloy, such as a metal alloy. A solid material deposited via decomposition of a metal-ligand complex comprises the metal atom or metal ion of the metal-ligand complex.

The expression "activating hydrosilylation" refers to one or more processes that initiate, trigger and/or increase the rate of a hydrosilylation process, such as a catalytic hydrosilylation reaction. In some methods, for example, a starting compound is contacted with a hydrosilylation reagent in the presence of a hydrosilylation catalyst under conditions that hydrosilylation either does not occur or hydrosilylation occurs at an initial rate such as a low initiate rate, whereupon the step of activating hydrosilylation of the starting compound initiates a catalytic hydrosilylation reaction or increases the rate of catalytic hydrosilylation between said starting compound and said hydrosilylation reagent. In some embodiments, hydrosilylation occurs at a lower rate (less than or equal to 1000 h$^{-1}$) prior to the step of activating hydrosilylation. In some embodiments, hydrosilylation occurs at a rate less than or equal to 700 turnovers h$^{-1}$, optionally less than or equal to 500 turnovers h$^{-1}$, optionally less than or equal to 100 turnovers h$^{-1}$ prior to the step of activation, optionally less than or equal to 50 turnovers h$^{-1}$ prior to the step of activation. In some embodiments, hydrosilylation occurs at a higher rate (e.g., by a factor equal to or greater than 10) upon the step of activating hydrosilylation. In some embodiments, said step of activating hydrosilylation results in catalytic hydrosilylation characterized by a large turnover number (e.g., greater than or equal to 1000; e.g., greater than or equal to 1000 over 1 hour of hydrosilylation). In some embodiments, activating hydrosilylation is achieved by providing energy to a solution containing said starting compound, said hydrosilylation and said hydrosilylation catalyst, for example, is thermal energy, radient energy, acoustic energy, mechanical energy, chemical energy, or any combination of these. In some embodiments, activating hydrosilylation is achieved by one or more processes selected from heating the solution, illuminating the solution with electromagnetic radiation, exposing the solution to a sheer force, exposing the solution to acoustic waves, chemical reactions, or any combination of these. In some methods, for example, the starting compound is contacted with a hydrosilylation reagent in the presence of a hydrosilylation catalyst and activated to trigger the initiation of catalytic hydrosilylation or to trigger an increase in the rate of catalytic hydrosilylation.

The term "thermolysis onset temperature" refers to a characteristic decomposition temperature at which a molecule (e.g., metal-ligand complex) thermally decomposes. The thermolysis temperature may be measured using thermogravimetric analysis (TGA), for example. In some embodiments, the characteristic decomposition temperature is the temperature corresponding to an inflection point in a plot of sample mass vs. temperature. An inflection point refers to a point on a continuously differentiable plane curve at which the curve crosses its tangent, that is, the curve changes from being concave (concave downward) to convex (concave upward), or vice versa. In some embodiments, a curve of sample mass vs. temperature (e.g., a TGA curve) is first smoothed before determining an inflection point. A curve of sample mass vs. temperature may have more than one inflection point. For example, more than one inflection point corresponds to more than one decomposition reactions, each having its own characteristic decomposition temperature. In some embodiments, the thermolysis onset temperature of a molecule is the lowest characteristic decomposition temperature of the molecule, corresponding to the first decomposition reaction as temperature is increased from a starting temperature (e.g., room temperature or 0° C.).

The term "thermally stable" refers to a property of a material such that the material is capable of not decomposing in response to a given temperature. The term "thermally stable" may refer to a property of a material such that the material is capable of not decomposing at a significant rate in response to a given temperature. A significant rate of decomposition may, for example, refer to a decomposition of at least 0.1% of the starting material mass per hour, at least 1% of the starting material mass per hour, or at least 10% of the starting material mass per hour; where decomposition may refer to change of the starting material into one or more other materials (e.g., a material decomposing into decomposition product(s); e.g., a metal-ligand complex decomposing into solid and vapor products). In an example, a material that is thermally stable at 100° C. is a material that does not thermally decompose at a significant rate when exposed to temperatures up to 100° C.

The term "normal temperature and pressure" or "NTP" refers to standard conditions defined as a temperature of 20° C. and an absolute pressure of 1 atm (14.696 psi, 101.325 kPa).

The term room temperature refers to a temperature of 20° C.

The terms "hydrosilylation" may also be conventionally referred to as hydrosilation, catalytic hydrosilation, or catalyst hydrosilylation. Generally, hydrosilylation refers to the process, reaction(s), or mechanism(s) by which Si— and H— bonds are added to a compound. Typically, hydrosilylation involves saturation of an unsaturated bond (e.g., double bond to single bond, triple bond to double bond, etc.) in a starting compound via addition of Si— and H— bonds across the respective bond of the starting material. Hydrosilylation may be described as adding R$_3$Si— (a silyl group) and H— (a hydride group) across an unsaturated bond thereby saturating said bond in a starting compound. Hydrosilylation is typically a catalytic process which requires, or is kinetically accelerated by, performing the reaction in the presence of a hydrosilylation catalyst. Optionally, a hydrosilylation precatalyst is used whereby activating, or triggering, the hydrosilylation precatalyst transforms the hydrosilylation precatalyst into a hydrosilylation catalyst. The hydrosilylation catalyst may then proceed to catalyze the hydrosilylation reaction. As such, the hydrosilylation reaction may be activated, or triggered, on demand. As used herein, activating and triggering a hydrosilylation reaction may be used interchangeably. For example, conversion may involve exposure of the hydrosilylation precatalyst to ultraviolet-light radiation and/or a co-reactant. A co-reactant may be a reagent that reduced or oxidizes the hydrosilylation precatalyst, optionally in the presence of ultraviolet-light radiation, thereby forming a hydrosilylation precatalyst as the product. In some embodiments, conversion of a hydrosilylation precatalyst may occur spontaneously.

As used herein, "silyl" refers to the functional group R$_3$Si—, where each R is independently a hydrogen, a halide (or, halo group), or a substituted or unsubstituted C$_1$-C$_6$ alkyl, C$_3$-C$_8$ cycloalkyl, C$_3$-C$_8$ heterocycloalkyl, C$_1$-C$_6$ haloalkyl, C$_6$-C$_{10}$ alkylaryl, C$_1$-C$_6$ alkoxy, C$_6$-C$_{10}$ aryl, C$_6$-C$_{10}$ heteroaryl, C$_2$-C$_8$ alkenyl, C$_2$-C$_8$ alkynyl, C$_1$-C$_6$ hydroxyl, C$_3$-C$_{10}$ arylene, C$_3$-C$_{10}$ heteroarylene, C$_2$-C$_{10}$ alkenylene, C$_3$-C$_{10}$ cycloalkenylene, C$_2$-C$_{10}$ alkynylene, or any combination thereof.

As used herein, "fluoroalkyl" refers to an alkyl group that is substituted with one or more fluoride groups. A fluoroalkyl group may be an alkyl group having one, two, or three hydrogens replaced with a fluoride. Trifluoromethyl (CF$_3$—) is an exemplary fluoroalkyl group. Fluoroalkyl groups are examples of haloalkyl groups.

The terms "non-aqueous solvent", "nonaqueous solvent", and "organic solvent" may be used interchangeably and refer to a non-water liquid in which may dissolve a solute, such as a metal-ligand complex. In some embodiments, the nonaqueous solvents is substantially nonpolar. In some embodiments, the nonaqueous solvent is an aprotic solvent. An aprotic solvent refers to a compound that donate a hydrogen (e.g., lacking a C—H or N—H bond, or lacking a labile H$^+$). The nonaqueous solvent may be a polar aprotic solvent. The non-aqueous solvent may include small amounts of water, such that the water is a solute or impurity dissolved in the nonaqueous solvent. The non-aqueous solvent may include small amounts of water but such that the predominant phase of the solution is the non-water liquid and the solute(s) remains substantially dissolved in the non-water (nonaqueous) phase. Exemplary non-aqueous solvents include, but are not limited to, hexane, pentane, nonane, decane, dodecane, tetradecane, octadecane, 1-octadecene, heptane, acetonitrile, acetone, butane, butanone, carbon tetrachloride, chlorobenzene, chloroform, cyclohexane, 1,2-dichloroethane, dichloromethane, diethylene glycol, 1,2-dimethylformamide, 1,2-dimethoxyethane, propylene carbonate, dimethylsulfoxide, 1,4-dioxane, ethanol, ethyl acetate, ethylene glycol, glycerin, hexamethylphosphoramide, hexamethylphosphorous triamide, nitromethane, petroleum ether, propanol, pyridine, triethyl amine, xylene, mesitylene, diethylether, tetrahydrofuran, benzene, toluene, and any mixture of two or more of these.

"Molecule" refers to a collection of chemically bound atoms with a characteristic composition. As used herein, a molecule can be neutral or can be electrically charged, such as singly charged and multiply charged ions.

"Substrate" refers to a material, layer or other structure having a surface, such as a receiving surface, that is capable of supporting a deposited material, such as a thin film structure or layer. Substrates may optionally have a receiving surface. The receiving surface may optionally have one or more features, such as nanosized or microsized recessed features including high aspect ratio features.

The term "shelf life" refers to a time duration for storage of a metal-ligand complex before a predetermined amount of the metal-ligand complex decomposes into other molecule(s) or compound(s). The predetermined amount may be 10 mol % or more, 20 mol % or more, 30 mol % or more, 40 mol % or more, 50 mol % or more, 60 mol % or more, or 70 mass % or more. The predetermined amount may be 10 mass % or more, 20 mass % or more, 30 mass % or more, 40 mass % or more, 50 mass % or more, 60 mass % or more, or 70 mass % or more. During the time duration of storage, the storage conditions (e.g., temperature, pressure, and atmosphere) may remain substantially unchanged. For example, the metal-ligand complex may be stored in a container held at room temperature, the container having a total pressure of 1 atm or a partial pressure of an inert gas of 1 atm. The atmosphere in the container may be a substantially a mixture of the metal-ligand complex and an inert gas. For example, the shelf life of a metal-ligand complex may be such that less than 10 mass % of said metal-ligand complex decomposes after two weeks when stored under approximately 1 atm of one or more inert gases at room temperature.

The term "inert gas" refers to a gas that is does not chemically and adversely react with a metal-ligand complex. For example, inert gases may include, but are not limited to, helium, argon, nitrogen, and combinations of these.

The term "substantially" refers to a property that is within 10%, within 5%, within 1%, or is equivalent to a reference property. The term "substantially equal", "substantially equivalent", or "substantially unchanged", when used in conjunction with a reference value describing a property or condition, refers to a value that is within 10%, within 5%, within 1%, or is equivalent to the provided reference value. For example, a temperature is substantially unchanged if it remains within 10%, within 5%, within 1%, or equal to a reference value, where the reference value may be a starting value. The term "substantially greater", when used in conjunction with a reference value describing a property or condition, refers to a value that is at least 2%, at least 5%, or at least 10% greater than the provided reference value. The term "substantially less", when used in conjunction with a reference value describing a property or condition, refers to a value that is at least 2%, at least 5%, or at least 10% less than the provided reference value.

As used herein, the term "group" may refer to a functional group of a chemical compound. Groups of the present compounds refer to an atom or a collection of atoms that are a part of the compound. Groups of the present invention may be attached to other atoms of the compound via one or more covalent bonds. Groups may also be characterized with respect to their valence state. The present invention may include groups characterized as monovalent, divalent, trivalent, etc. valence states.

As used herein, the term "substituted" refers to a compound wherein a hydrogen is replaced by another functional group, including, but not limited to: a halogen or halide, an alkyl, a cycloalkyl, an aryl, a heteroaryl, an acyl, an alkoxy, an alkenyl, an alkynyl, an alkylaryl, an arylene, a heteroarylene, an alkenylene, a cycloalkenylene, an alkynylene, a hydroxyl (—OH), a carbonyl (RCOR'), a sulfide (e.g., RSR'), a phosphate (ROP(=O)(OH)$_2$), an azo (RNNR'), a cyanate (ROCN), an amine (e.g., primary, secondary, or tertiary), an imine (RC(=NH)R'), a nitrile (RCN), a pyridinyl (or pyridyl), a diamine, a triamine, an azide, a diimine, a triimine, an amide, a diimide, or an ether (ROR'); where each of R and R' is independently a hydrogen or a substituted or unsubstituted alkyl group, aryl group, alkenyl group, or a combination of these. Optional substituent functional groups are also described below. In some embodiments, the term substituted refers to a compound wherein more than one hydrogen is replaced by another functional group, such as a halogen group.

As is customary and well known in the art, hydrogen atoms in chemical formulas are not always explicitly shown, for example, hydrogen atoms bonded to the carbon atoms of aromatic, heteroaromatic, and alicyclic rings are not always explicitly shown in chemical formulas. The structures provided herein, for example in the context of the description of chemical formulas and schematics and structures in the drawings, are intended to convey to one of reasonable skill in the art the chemical composition of compounds of the methods and compositions of the invention, and as will be understood by one of skill in the art, the structures provided do not indicate the specific positions and/or orientations of atoms and the corresponding bond angles between atoms of these compounds.

As used herein, the terms "alkylene" and "alkylene group" are used synonymously and refer to a divalent group derived from an alkyl group as defined herein. The invention may include compounds having one or more alkylene groups. Alkylene groups in some compounds function as linking and/or spacer groups. Compounds of the invention may have substituted and/or unsubstituted $C_1$-$C_{20}$ alkylene, $C_1$-$C_{10}$ alkylene and $C_1$-$C_6$ alkylene groups, for example, as one or more linking groups (e.g. $L^1$-$L^6$).

As used herein, the terms "cycloalkylene" and "cycloalkylene group" are used synonymously and refer to a divalent group derived from a cycloalkyl group as defined herein. The invention may include compounds having one or more cycloalkylene groups. Cycloalkyl groups in some compounds function as linking and/or spacer groups. Compounds of the invention may have substituted and/or unsubstituted $C_3$-$C_{20}$ cycloalkylene, $C_3$-$C_{10}$ cycloalkylene and $C_3$-$C_5$ cycloalkylene groups, for example, as one or more linking groups (e.g. $L^1$-$L^6$).

As used herein, the terms "arylene" and "arylene group" are used synonymously and refer to a divalent group derived from an aryl group as defined herein. The invention may include compounds having one or more arylene groups. In some embodiments, an arylene is a divalent group derived from an aryl group by removal of hydrogen atoms from two carbon atoms of an aromatic ring of the aryl group. Arylene groups in some compounds function as linking and/or spacer groups. Arylene groups in some compounds function as chromophore, fluorophore, aromatic antenna, dye and/or imaging groups. Compounds of the invention may include substituted and/or unsubstituted $C_3$-$C_{30}$ arylene, $C_3$-$C_{20}$ arylene, $C_3$-$C_{10}$ arylene and $C_1$-$C_5$ arylene groups, for example, as one or more linking groups (e.g. $L^1$-$L^6$).

As used herein, the terms "heteroarylene" and "heteroarylene group" are used synonymously and refer to a divalent group derived from a heteroaryl group as defined herein. The invention may include compounds having one or more heteroarylene groups. In some embodiments, a heteroarylene is a divalent group derived from a heteroaryl group by removal of hydrogen atoms from two intra-ring carbon atoms or intra-ring nitrogen atoms of a heteroaromatic or aromatic ring of the heteroaryl group. Heteroarylene groups in some compounds function as linking and/or spacer groups. Heteroarylene groups in some compounds function as chromophore, aromatic antenna, fluorophore, dye and/or imaging groups. Compounds of the invention may include substituted and/or unsubstituted $C_3$-$C_{30}$ heteroarylene, $C_3$-$C_{20}$ heteroarylene, $C_1$-$C_{10}$ heteroarylene and $C_3$-$C_5$ heteroarylene groups, for example, as one or more linking groups (e.g. $L^1$-$L^6$).

As used herein, the terms "alkenylene" and "alkenylene group" are used synonymously and refer to a divalent group derived from an alkenyl group as defined herein. The invention may include compounds having one or more alkenylene groups. Alkenylene groups in some compounds function as linking and/or spacer groups. Compounds of the invention may include substituted and/or unsubstituted $C_2$-$C_{20}$ alkenylene, $C_2$-$C_{10}$ alkenylene and $C_2$-$C_0$ alkenylene groups, for example, as one or more linking groups (e.g. $L^1$-$L^6$).

As used herein, the terms "cycloalkenylene" and "cycloalkenylene group" are used synonymously and refer to a divalent group derived from a cycloalkenyl group as defined herein. The invention may include compounds having one or more cycloalkenylene groups. Cycloalkenylene groups in some compounds function as linking and/or spacer groups. Compounds of the invention may include substituted and/or unsubstituted $C_3$-$C_{20}$ cycloalkenylene, $C_3$-$C_{10}$ cycloalkenylene and $C_3$-$C_5$ cycloalkenylene groups, for example, as one or more linking groups (e.g. $L^1$-$L^6$).

As used herein, the terms "alkynylene" and "alkynylene group" are used synonymously and refer to a divalent group derived from an alkynyl group as defined herein. The invention may include compounds having one or more alkynylene groups. Alkynylene groups in some compounds function as linking and/or spacer groups. Compounds of the invention may include substituted and/or unsubstituted $C_2$-$C_{20}$ alkynylene, $C_2$-$C_{10}$ alkynylene and $C_2$-$C_5$ alkynylene groups, for example, as one or more linking groups (e.g. $L^1$-$L^6$).

As used herein, the term "halo" refers to a halo group such as a fluoro (—F), chloro (—Cl), bromo (—Br), iodo (—I) or astato (—At). A "haloalkyl" refers to an alkyl group having a halo group, or a halogen-substituted alkyl group. Exemplary haloalkyl groups include, but are not limited to, trihalomethyl groups such as trifluoromethyl groups. The terms "halogen" and "halide" may be used interchangeably when referring to a halo group.

The term "heterocyclic" refers to ring structures containing at least one other kind of atom, in addition to carbon, in the ring. Examples of such heteroatoms include nitrogen, oxygen and sulfur. Heterocyclic rings include heterocyclic alicyclic rings and heterocyclic aromatic rings. Examples of heterocyclic rings include, but are not limited to, pyrrolidinyl, piperidyl, imidazolidinyl, tetrahydrofuryl, tetrahydrothienyl, furyl, thienyl, pyridyl, quinolyl, isoquinolyl, pyridazinyl, pyrazinyl, indolyl, imidazolyl, oxazolyl, thiazolyl, pyrazolyl, pyridinyl, benzoxadiazolyl, benzothiadiazolyl, triazolyl and tetrazolyl groups. Atoms of heterocyclic rings can be bonded to a wide range of other atoms and functional groups, for example, provided as substituents.

The term "carbocyclic" refers to ring structures containing only carbon atoms in the ring. Carbon atoms of carbocyclic rings can be bonded to a wide range of other atoms and functional groups, for example, provided as substituents.

The term "alicyclic ring" refers to a ring, or plurality of fused rings, that is not an aromatic ring. Alicyclic rings include both carbocyclic and heterocyclic rings.

The term "aromatic ring" refers to a ring, or a plurality of fused rings, that includes at least one aromatic ring group. The term aromatic ring includes aromatic rings comprising carbon, hydrogen and heteroatoms. Aromatic ring includes carbocyclic and heterocyclic aromatic rings. Aromatic rings are components of aryl groups.

The term "fused ring" or "fused ring structure" refers to a plurality of alicyclic and/or aromatic rings provided in a fused ring configuration, such as fused rings that share at least two intra ring carbon atoms and/or heteroatoms.

As used herein, the term "alkoxyalkyl" refers to a substituent of the formula alkyl-O-alkyl.

As used herein, the term "polyhydroxyalkyl" refers to a substituent having from 2 to 12 carbon atoms and from 2 to 5 hydroxyl groups, such as the 2,3-dihydroxypropyl, 2,3,4-trihydroxybutyl or 2,3,4,5-tetrahydroxypentyl residue.

As used herein, the term "polyalkoxyalkyl" refers to a substituent of the formula alkyl-(alkoxy)$_n$-alkoxy wherein n is an integer from 1 to 10, preferably 1 to 4, and more preferably for some embodiments 1 to 3.

Amino acids include glycine, alanine, valine, leucine, isoleucine, methionine, proline, phenylalanine, tryptophan, asparagine, glutamine, glycine, serine, threonine, serine, rhreonine, asparagine, glutamine, tyrosine, cysteine, lysine, arginine, histidine, aspartic acid and glutamic acid. Peptides are comprised of two or more amino-acid connected via peptide bonds.

Alkyl groups include straight-chain, branched and cyclic alkyl groups. Alkyl groups include those having from 1 to 30 carbon atoms. Alkyl groups include small alkyl groups having 1 to 3 carbon atoms. Alkyl groups include medium length alkyl groups having from 4-10 carbon atoms. Alkyl groups include long alkyl groups having more than 10 carbon atoms, particularly those having 10-30 carbon atoms. The term cycloalkyl specifically refers to an alky group having a ring structure such as ring structure comprising 3-30 carbon atoms, optionally 3-20 carbon atoms and optionally 2-10 carbon atoms, including an alkyl group having one or more rings. Cycloalkyl groups include those having a 3-, 4-, 5-, 6-, 7-, 8-, 9- or 10-member carbon ring(s) and particularly those having a 3-, 4-, 5-, 6-, or 7-member ring(s). The carbon rings in cycloalkyl groups can also carry alkyl groups. Cycloalkyl groups can include bicyclic and tricycloalkyl groups. Heterocycloalkyl groups are cycloalkyl groups comprising at least one other kind of atom, in addition to carbon, in the ring. Examples of such heteroatoms include nitrogen, oxygen and sulfur. Heterocycloalkyl rings include heterocyclic alicyclic rings and heterocyclic aromatic rings. Alkyl groups are optionally substituted. Substituted alkyl groups include among others those which are substituted with aryl groups, which in turn can be optionally substituted. Specific alkyl groups include methyl, ethyl, n-propyl, iso-propyl, cyclopropyl, n-butyl, s-butyl, t-butyl, cyclobutyl, n-pentyl, branched-pentyl, cyclopentyl, n-hexyl, branched hexyl, and cyclohexyl groups, all of which are optionally substituted. Substituted alkyl groups include fully halogenated or semihalogenated alkyl groups, such as alkyl groups having one or more hydrogens replaced with one or more fluorine atoms, chlorine atoms, bromine atoms and/or iodine atoms. Substituted alkyl groups include fully fluorinated or semifluorinated alkyl groups, such as alkyl groups having one or more hydrogens replaced with one or more fluorine atoms. An alkoxy group is an alkyl group that has been modified by linkage to oxygen and can be represented by the formula R—O and can also be referred to as an alkyl ether group. Examples of alkoxy groups include, but are not limited to, methoxy, ethoxy, propoxy, butoxy and heptoxy. Alkoxy groups include substituted alkoxy groups wherein the alky portion of the groups is substituted as provided herein in connection with the description of alkyl groups. As used herein MeO— refers to $CH_3O—$.

Alkenyl groups include straight-chain, branched and cyclic alkenyl groups. Alkenyl groups include those having 1, 2 or more double bonds and those in which two or more of the double bonds are conjugated double bonds. Alkenyl groups include those having from 2 to 20 carbon atoms. Alkenyl groups include small alkenyl groups having 2 to 3 carbon atoms. Alkenyl groups include medium length alkenyl groups having from 4-10 carbon atoms. Alkenyl groups include long alkenyl groups having more than 10 carbon atoms, particularly those having 10-20 carbon atoms. Cycloalkenyl groups include those in which a double bond is in the ring or in an alkenyl group attached to a ring. The term cycloalkenyl specifically refers to an alkenyl group having a ring structure, including an alkenyl group having a 3-, 4-, 5-, 6-, 7-, 8-, 9- or 10-member carbon ring(s) and particularly those having a 3-, 4-, 5-, 6- or 7-member ring(s). The carbon rings in cycloalkenyl groups can also carry alkyl groups. Cycloalkenyl groups can include bicyclic and tricyclic alkenyl groups. Alkenyl groups are optionally substituted. Substituted alkenyl groups include among others those which are substituted with alkyl or aryl groups, which groups in turn can be optionally substituted. Specific alkenyl groups include ethenyl, prop-1-enyl, prop-2-enyl, cycloprop-1-enyl, but-1-enyl, but-2-enyl, cyclobut-1-enyl, cyclobut-2-enyl, pent-1-enyl, pent-2-enyl, branched pentenyl, cyclopent-1-enyl, hex-1-enyl, branched hexenyl, cyclohexenyl, all of which are optionally substituted. Substituted alkenyl groups include fully halogenated or semihalogenated alkenyl groups, such as alkenyl groups having one or more hydrogens replaced with one or more fluorine atoms, chlorine atoms, bromine atoms and/or iodine atoms. Substituted alkenyl groups include fully fluorinated or semifluorinated alkenyl groups, such as alkenyl groups having one or more hydrogen atoms replaced with one or more fluorine atoms.

The term "olefin" refers to an alkene compound or an alkenyl group. For example, an olefin refers to the alkenyl group

For example, olefin refers to the alkenyl group

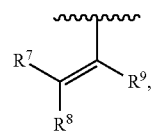

where each of $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof. A metal-olefin pi bond involves coordination of the metal atom or metal ion with the pi bond of the olefin. A metal-olefin pi bond involves donation of electron(s) in the pi-orbital(s) on the olefin to empty orbital(s) on the metal atom or metal ion. The metal-olefin pi bond may involve sharing of electrons in other metal orbital(s) with empty pi-antibonding orbital(s) on the olefin. The term "orbital" refers to a molecular orbital. A metal-olefin pi bond may be represented as

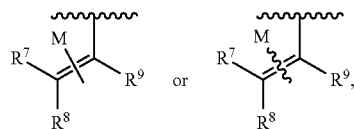

for example, where M is the metal atom or metal ion.

Aryl groups include groups having one or more 5-, 6- or 7-member aromatic rings, including heterocyclic aromatic rings. The term heteroaryl specifically refers to aryl groups having at least one 5-, 6- or 7-member heterocyclic aromatic rings. Aryl groups can contain one or more fused aromatic rings, including one or more fused heteroaromatic rings, and/or a combination of one or more aromatic rings and one or more nonaromatic rings that may be fused or linked via covalent bonds. Heterocyclic aromatic rings can include one or more N, O, or S atoms in the ring. Heterocyclic aromatic rings can include those with one, two or three N atoms, those with one or two O atoms, and those with one or two S atoms, or combinations of one or two or three N, O or S atoms. Aryl groups are optionally substituted. Substituted aryl groups include among others those which are substituted with alkyl or alkenyl groups, which groups in turn can be optionally substituted. Specific aryl groups include phenyl, biphenyl groups, pyrrolidinyl, imidazolidinyl, tetrahydrofuryl, tetrahydrothienyl, furyl, thienyl, pyridyl, quinolyl, isoquinolyl, pyridazinyl, pyrazinyl, indolyl, imidazolyl, oxazolyl, thiazolyl, pyrazolyl, pyridinyl, benzoxadiazolyl, benzothiadiazolyl, and naphthyl groups, all of which are optionally substituted. Substituted aryl groups include fully halogenated or semihalogenated aryl groups, such as aryl groups having one or more hydrogens replaced with one or more fluorine atoms, chlorine atoms, bromine atoms and/or iodine atoms. Substituted aryl groups include fully fluorinated or semifluorinated aryl groups, such as aryl groups having one or more hydrogens replaced with one or more fluorine atoms. Aryl groups include, but are not limited to, aromatic group-containing or heterocylic aromatic group-containing groups corresponding to any one of the following: benzene, naphthalene, naphthoquinone, diphenylmethane, fluorene, anthracene, anthraquinone, phenanthrene, tetracene, tetracenedione, pyridine, quinoline, isoquinoline, indoles, isoindole, pyrrole, imidazole, oxazole, thiazole, pyrazole, pyrazine, pyrimidine, purine, benzimidazole, furans, benzofuran, dibenzofuran, carbazole, acridine, acridone, phenanthridine, thiophene, benzothiophene, dibenzothiophene, xanthene, xanthone, flavone, coumarin, azulene or anthracycline. As used herein, a group corresponding to the groups listed above expressly includes an aromatic or heterocyclic aromatic group, including monovalent, divalent and polyvalent groups, of the aromatic and heterocyclic aromatic groups listed herein are provided in a covalently bonded configuration in the compounds of the invention at any suitable point of attachment. In embodiments, aryl groups contain between 5 and 30 carbon atoms. In embodiments, aryl groups contain one aromatic or heteroaromatic six-membered ring and one or more additional five- or six-membered aromatic or heteroaromatic ring. In embodiments, aryl groups contain between five and eighteen carbon atoms in the rings. Aryl groups optionally have one or more aromatic rings or heterocyclic aromatic rings having one or more electron donating groups, electron withdrawing groups and/or targeting ligands provided as substituents.

Arylalkyl groups are alkyl groups substituted with one or more aryl groups wherein the alkyl groups optionally carry additional substituents and the aryl groups are optionally substituted. The terms alkylaryl and arylalkyl may be used interchangeably. Specific alkylaryl groups are phenyl-substituted alkyl groups, e.g., phenylmethyl groups. Alkylaryl groups are alternatively described as aryl groups substituted with one or more alkyl groups wherein the alkyl groups optionally carry additional substituents and the aryl groups are optionally substituted. Specific alkylaryl groups are alkyl-substituted phenyl groups such as methylphenyl. Substituted arylalkyl groups include fully halogenated or semihalogenated arylalkyl groups, such as arylalkyl groups having one or more alkyl and/or aryl groups having one or more hydrogens replaced with one or more fluorine atoms, chlorine atoms, bromine atoms and/or iodine atoms.

As to any of the groups described herein which contain one or more substituents, it is understood that such groups do not contain any substitution or substitution patterns which are sterically impractical and/or synthetically non-feasible. Optional substitution of alkyl groups includes substitution with one or more alkenyl groups, aryl groups or both, wherein the alkenyl groups or aryl groups are optionally substituted. Optional substitution of alkenyl groups includes substitution with one or more alkyl groups, aryl groups, or both, wherein the alkyl groups or aryl groups are optionally substituted. Optional substitution of aryl groups includes substitution of the aryl ring with one or more alkyl groups, alkenyl groups, or both, wherein the alkyl groups or alkenyl groups are optionally substituted.

Optional substituents for any alkyl, alkenyl and aryl group includes substitution with one or more of the following substituents, among others:
halogen, including fluorine, chlorine, bromine or iodine;
pseudohalides, including —CN;

—COOR where R is a hydrogen or an alkyl group or an aryl group and more specifically where R is a methyl, ethyl, propyl, butyl, or phenyl group all of which groups are optionally substituted;
—COR where R is a hydrogen or an alkyl group or an aryl group and more specifically where R is a methyl, ethyl, propyl, butyl, or phenyl group all of which groups are optionally substituted;
—CON(R)$_2$ where each R, independently of each other R, is a hydrogen or an alkyl group or an aryl group and more specifically where R is a methyl, ethyl, propyl, butyl, or phenyl group all of which groups are optionally substituted; and where R and R can form a ring which can contain one or more double bonds and can contain one or more additional carbon atoms;
—OCON(R)$_2$ where each R, independently of each other R, is a hydrogen or an alkyl group or an aryl group and more specifically where R is a methyl, ethyl, propyl, butyl, or phenyl group all of which groups are optionally substituted; and where R and R can form a ring which can contain one or more double bonds and can contain one or more additional carbon atoms;
—N(R)$_2$ where each R, independently of each other R, is a hydrogen, or an alkyl group, or an acyl group or an aryl group and more specifically where R is a methyl, ethyl, propyl, butyl, phenyl or acetyl group, all of which are optionally substituted; and where R and R can form a ring which can contain one or more double bonds and can contain one or more additional carbon atoms;
—SR, where R is hydrogen or an alkyl group or an aryl group and more specifically where R is hydrogen, methyl, ethyl, propyl, butyl, or a phenyl group, which are optionally substituted; —SO$_2$R, or —SOR where R is an alkyl group or an aryl group and more specifically where R is a methyl, ethyl, propyl, butyl, or phenyl group, all of which are optionally substituted;
—OCOOR where R is an alkyl group or an aryl group;
—SO$_2$N(R)$_2$ where each R, independently of each other R, is a hydrogen, or an alkyl group, or an aryl group all of which are optionally substituted and wherein R and R can form a ring which can contain one or more double bonds and can contain one or more additional carbon atoms; and
—OR where R is H, an alkyl group, an aryl group, or an acyl group all of which are optionally substituted. In a particular example R can be an acyl yielding —OCOR" where R" is a hydrogen or an alkyl group or an aryl group and more specifically where R" is methyl, ethyl, propyl, butyl, or phenyl groups all of which groups are optionally substituted.

Specific substituted alkyl groups include haloalkyl groups, particularly trihalomethyl groups and specifically trifluoromethyl groups. Specific substituted aryl groups include mono-, di-, tri, tetra- and pentahalo-substituted phenyl groups; mono-, di-, tri-, tetra-, penta-, hexa-, and hepta-halo-substituted naphthalene groups; 3- or 4-halo-substituted phenyl groups, 3- or 4-alkyl-substituted phenyl groups, 3- or 4-alkoxy-substituted phenyl groups, 3- or 4-RCO-substituted phenyl, 5- or 6-halo-substituted naphthalene groups. More specifically, substituted aryl groups include acetylphenyl groups, particularly 4-acetylphenyl groups; fluorophenyl groups, particularly 3-fluorophenyl and 4-fluorophenyl groups; chlorophenyl groups, particularly 3-chlorophenyl and 4-chlorophenyl groups; methylphenyl groups, particularly 4-methylphenyl groups; and methoxyphenyl groups, particularly 4-methoxyphenyl groups.

Many of the molecules disclosed herein contain one or more ionizable groups. Ionizable groups include groups from which a proton can be removed (e.g., —COOH) or added (e.g., amines) and groups that can be quaternized (e.g., amines). All possible ionic forms of such molecules and salts thereof are intended to be included individually in the disclosure herein. With regard to salts of the compounds herein, one of ordinary skill in the art can select from among a wide variety of available counterions that are appropriate for preparation of salts of this invention for a given application. In specific applications, the selection of a given anion or cation for preparation of a salt can result in increased or decreased solubility of that salt.

The compounds of this invention can contain one or more chiral centers. Accordingly, this invention is intended to include racemic mixtures, diastereomers, enantiomers, tautomers and mixtures enriched in one or more stereoisomer. The scope of the invention as described and claimed encompasses the racemic forms of the compounds as well as the individual enantiomers and non-racemic mixtures thereof.

As to any of the above groups which contain one or more substituents, it is understood that such groups do not contain any substitution or substitution patterns which are sterically impractical and/or synthetically non-feasible.

In an embodiment, a composition, compound, complex, precursor, catalyst, or formulation of the invention, such as a metal-ligand complex or a vapor-to-solid precursor, is isolated or substantially purified. In an embodiment, an isolated or purified compound is at least partially isolated or substantially purified as would be understood in the art. In an embodiment, a substantially purified composition, compound, complex, or formulation of the invention has a chemical purity of 95%, optionally for some applications 99%, optionally for some applications 99.9%, optionally for some applications 99.99%, and optionally for some applications 99.999% pure.

DETAILED DESCRIPTION OF THE INVENTION

In the following description, numerous specific details of the devices, device components and methods of the present invention are set forth in order to provide a thorough explanation of the precise nature of the invention. It will be apparent, however, to those of skill in the art that the invention can be practiced without these specific details.

The compositions and methods now will be described more fully hereinafter with reference to the accompanying drawings, in which some, but not all embodiments of the invention are shown. Indeed, the invention may be embodied in many different forms and should not be construed as limited to the embodiments set forth herein, rather, these embodiments are provided so that this disclosure will satisfy applicable legal requirements.

Likewise, many modifications and other embodiments of the compositions and methods described herein will come to mind to one of skill in the art to which the invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

Unless defined otherwise, all technical and scientific terms used herein have the same meaning as commonly understood by one of skill in the art to which the invention pertains. Although any methods and materials similar to or equivalent to those described herein can be used in the practice or testing of the present invention, the preferred methods and materials are described herein.

Overview:

Disclosed herein is a new class of metal-ligand complexes. These metal-ligand complexes may comprise $\eta^1,\eta^2$-$\beta,\beta$-disubstituted-$\omega$-alkenyl ligands. These metal-ligand complexes may be useful for CVD or ALD formation of metal, metal oxides, metal nitrides, and other binary and higher-order metal containing phases on substrates, as well as to methods of making and using such precursor compounds. $\eta^1,\eta^2$-$\beta,\beta$-disubstituted-$\omega$-alkenyl ligands are defined here as organic groups in which a carbon atom at or near the end of a chain of four or more atoms forms a metal-carbon sigma bond ($\eta^1$ binding mode) and a carbon-carbon double bond at or near the other end of the chain of atoms coordinates to the metal in a pi fashion ($\eta^2$ binding mode). These ligands differ from allyl (also known as propenyl) type ligands in that at least one atom intervenes between the two places of attachment to the metal center.

FIG. 11 shows a chemical structure drawing corresponding to the ligands disclosed herein characterized by formula FX2 (see below). FIG. 11 identifies the carbon atom in the $\alpha$-position (carbon labeled 'C') and identifies the atom in the $\beta$-position (atom labeled 'E', which may be C or Si, for example). These ligands have substituents $R^1$ and $R^2$ at the $\beta$-positions. These ligands do not have a $\beta$-hydrogen (i.e., each of the functional groups $R^1$ and $R^2$ at the $\beta$-position is not a hydrogen). These ligands disclosed herein have advantages over compounds that lack the two substituents at the $\beta$-positions. For example, the ligand cis-bis(pent-4-en-1-yl), in cis-bis(pent-4-en-1-yl)platinum, lacks two substituents at the $\beta$-positions. The presence of the two substituents at the $\beta$-positions of the carbon chain prevents decomposition of the metal-ligand complex via beta hydrogen elimination, and increases the thermal stability of metal-ligand complex containing the ligand(s) disclosed herein, such as those characterized by formula FX2 (e.g., $\eta^1,\eta^2$-$\beta,\beta$-disubstituted-$\omega$-alkenyl ligands) compared to complexes with ligand(s) that lack substituents at the $\beta$-position(s) of the chain. For clarity of discussion below, FIG. 11 further identifies the carbon atom corresponding to the first olefin carbon atom and identifies the carbon atom corresponding to the second olefin carbon atom. Additionally, FIG. 11 identifies the $\omega$-alkenyl. In an embodiment, $\omega$ indicates that the double bond is located at or near the opposite end of the chain of atoms in ligand L, relative to the first, or $\alpha$ position. For example, $\omega$ is 4 (first olefin carbon is the $4^{th}$ carbon in the chain, where the count starts at the carbon labeled 'C') in 2,2-dimethylpent-4-en-1-yl.

In one aspect, the present invention may include methods for making metal-ligand complexes bearing at least one ligand characterized by formula FX2, which may be described as $\eta^1,\eta^2$-$\beta,\beta$-disubstituted-$\omega$-alkenyl ligands, and in another aspect the present invention relates to a method of depositing metal-containing layers or nanostructures on substrates by vaporizing metal-ligand complexes bearing $\eta^1,\eta^2$-$\beta,\beta$-disubstituted-$\omega$-alkenyl ligands and decomposing them, either in the absence or presence of other reactive gases, to form a film on a surface or other structure. Other aspects, features and embodiments of the invention will be more fully apparent from the discussion and claims presented herein.

The present invention may include methods for making neutral, volatile metal compounds bearing $\eta^1,\eta^2$-$\beta,\beta$-disubstituted-$\omega$-alkenyl ligands, which are useful for forming metal, metal oxides, metal nitrides, metal carbides, metal borides, and other binary and higher-order metal-containing thin films and nanostructures on substrates.

For example, the metal-ligand complexes disclosed herein are characterized by formula (FX1): $ML_xD_y$ (FX1), wherein: M is a metal; x is equal to the oxidation state of M; each D is independently a neutral coordinating ligand; y is zero or an integer selected from the range of 1 to 4; and each L is a mono-anionic ligand independently characterized by the formula FX2:

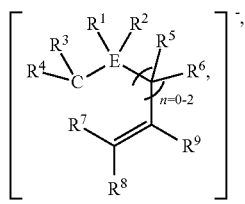
(FX2)

and wherein: n is 0, 1, or 2; each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and E is C or Si. In some embodiments of these metal-ligand complexes, at least one of $R^1$ and $R^2$ is not a fluoride (F—) or a trifluoromethyl ($CF_3$—) group. In some embodiments of these metal-ligand complexes, at least one of $R^1$ and $R^2$ is not a fluoride or a $C_1$-$C_6$ fluoroalkyl. In some embodiments of these metal-ligand complexes, each of both $R^1$ and $R^2$ is not a fluoride or a trifluoromethyl. In some embodiments of these metal-ligand complexes, each of both $R^1$ and $R^2$ is not a fluoride or a $C_1$-$C_6$ fluoroalkyl.

For example, the metal complexes disclosed herein are characterized by formula FX1:

$$ML_xD_y \qquad (FX1)$$

wherein:

M is a metal chosen from the group consisting of: Li, Be, Mg, Ca, Sr, Ba, Al, Sc, Ti, Zr, Hf, V, Nb, Ta, Cr, Mo, W, Mn, Re, Fe, Ru, Os, Co, Rh, Ir, Ni, Pd, Pt, Cu, Ag, Au, Zn, Ga, Sn, a lanthanide metal, or an actinide metal;

x is equal to the oxidation state of M;

each D is independently a neutral coordinating ligand; y is zero or an integer from 1 to 4; and each L is independently a $\eta^1,\eta^2$-$\beta,\beta$-disubstituted-$\omega$-alkenyl group that is characterized by the structure of formula FX2:

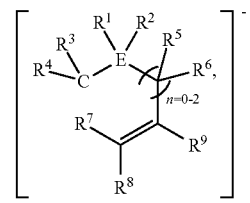
(FX2)

wherein:

n is 0, 1, or 2; $R_1$ and $R_2$ may be the same as or different from one another and each of $R_1$ and $R_2$ are selected from the group consisting of $C_1$-$C_6$ alkyl, $C_3$-$C_8$ cycloalkyl, haloalkyl, arylalkyl, alkoxy, $C_6$-$C_{10}$ aryl, substituted aryl, heteroaryl, silyl, alkenyl, alkynyl, and halogen; $R^3$, $R^4$, $R^5$, $R^6$, $R^7$, $R^8$, and $R^9$ may be the same as or different from one another and each of $R^3$, $R^4$, $R^5$, $R^6$, $R^7$, $R^8$, and $R^9$ are selected from the group consisting of H, $C_1$-$C_6$ alkyl, $C_3$-$C_8$ cycloalkyl, haloalkyl, arylalkyl, alkoxy, $C_6$-$C_{10}$ aryl, substituted aryl, heteroaryl, silyl, alkenyl, alkynyl, and halogen; $R_1$, $R_2$, $R^3$, $R^4$, $R^5$, $R^6$, $R^7$, $R^8$, and $R^9$ may be connected to each other by alkyl groups or fluoroalkyl groups; and E is C or Si. In some embodiments, at least one of groups $R^1$ and $R^2$ is not a fluoride or a trifluoromethyl group. In some embodiments, each of $R^1$ and $R^2$ is not a fluoride or a trifluoromethyl group.

In an embodiment, the ligand L characterized by formula FX2, n is 0, 1, or 2. In an embodiment, where n is 0, the ligand L is characterized by the formula FX2a:

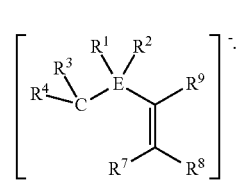
(FX2a)

In an embodiment, where n is 0 and L is characterized by FX2a, ligand L may be described as having atom E directly bonded to the first olefin carbon atom, and as being free of $R^5$ and $R^6$. In an embodiment, formula FX2 corresponds to formula FX2a when n is 0. In an embodiment, where n is 1, the ligand L is characterized by the formula FX2b:

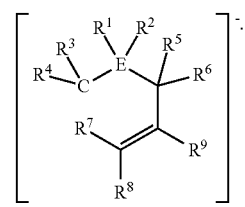
(FX2b)

In an embodiment, where n is 1 and L is characterized by FX2b, ligand L may be described as having one carbon atom separating atom E from the first olefin carbon atom along the chain, and as having $R^5$ and $R^6$ present, as shown in FX2b. In an embodiment, formula FX2 corresponds to formula FX2b when n is 1. In an embodiment, where n is 2, the ligand L is characterized by the formula FX2c:

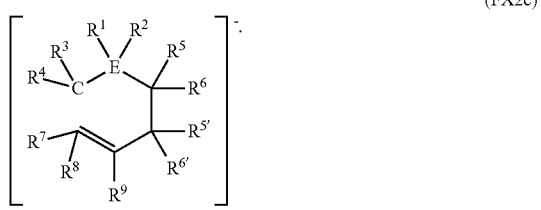
(FX2c)

In an embodiment, where n is 2 and L is characterized by FX2c, ligand L may be described as having atom E separated from the first olefin carbon by two carbon atoms along the chain. In an embodiment, when n is 2, $R^5$ and $R^{5'}$ may be the same or different, and $R^6$ and $R^{6'}$ may be the same or different. In an embodiment, each of $R^3$, $R^4$, $R^5$, $R^{5'}$, $R^6$, $R^{6'}$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof. In an embodiment, formula FX2 corresponds to formula FX2c when n is 2.

Preferred metals for M are Li, Mg, Al, Cr, Mo, W, Mn, Re, Fe, Ru, Os, Co, Rh, Ir, Ni, Pd, Pt, Cu, Ag, Au or Zn. The metal center M may be Li, Mg, Rh, Pt or Ir.

A small number of compounds bearing ligands resembling those of FX2 have been described previously. Examples include those reported by T. C. Flood, et al. (*J. Am. Chem. Soc.* 1984, 106, 6077), S. P. Ermer et al. (*Organometallics* 1993, 12, 2634), C. G. Brandow et al. (*Organometallics* 2001, 20, 4253), M. Bottrill et al. (*J. Chem. Soc., Dalton Trans.*, 1979, 0, 1671-1678), I. Omae (*Angew. Chem. Int. Ed. Engl.*, 1982, 21, 889-902), M. Green et al. (*J. Chem. Soc., Dalton Trans.*, 1975, 0, 1128-1137), and H. Lehmkuhl et al. (*J. Organomet. Chem.* 1981, 216(3), C41-C44). In some cases, for example, these compounds have at least one β-hydrogen and/or the number (i.e., x in FX1) of mono-anionic ligands resembling FX2 is not equal to the oxidation number of the metal center. Additionally, it was not conventionally recognized these metal-ligand complexes may be useful as CVD or ALD precursors, or more generally vapor-to-solid precursors.

The compounds characterized by formula FX1 may be prepared in a variety of suitable ways. One method to prepare the compounds characterized by formula FX1, for example, is adding $\eta^1,\eta^2$-β,β-disubstituted-ω-alkenyl magnesium bromide (a Grignard reagent) to a suitable starting material, such as a metal halide or a Lewis base adduct of a metal halide, followed by extracting or subliming the products from the reaction mixtures. Instead of a Grignard reagent, an organolithium reagent may be used in some embodiments.

The solvents that are suitable for preparation of the compounds of the present invention can be one or more of the followings: no solvent (solventless solid state reaction), ethers, polyethers, cyclic ethers, thioethers, amines (aliphatic or aromatic, primary, secondary, or tertiary), polyamines, nitriles, cyanates, isocyanates, thiocyanates, esters, aldehydes, toluene, saturated or unsaturated hydrocarbons (linear, branched, or cyclic), halogenated hydrocarbons, silylated hydrocarbons, amides or compounds containing combinations of any of the above functional groups, or mixtures of two or more of the above. In a preferred embodiment, the solvent system includes, for example, a solventless solid state reaction system, or a solution reaction employing either noncoordinating or coordinating solvents such as alkanes (e.g., pentane), ethers (e.g., diethylether), polyethers (e.g., 1,2-dimethoxyethane), cyclic ethers (e.g., tetrahydrofuran), aromatic solvents (e.g., toluene), or mixtures of two or more of the above.

The product can be isolated from the reaction mixture in many different ways including, for example, sublimation, distillation, or crystallization from a solution. Typically, highly pure product is isolated by repeated recrystallization or sublimation.

The ligands D that are suitable for use in the preparation of compounds characterized by formula FX1 include neutral ligands. Examples of such ligands include ethers ($R_2O$), amines ($R_3N$), nitriles (RCN), isonitriles (RNC), phosphines ($R_3P$), phosphites (($RO)_3P$), arsines ($R_3As$), stibenes ($R_3Sb$), sulfides (CS), monoalkenes (linear, branched, or cyclic), dienes (linear, branched, or cyclic), trienes (linear, branched, or cyclic), bicyclic alkenes, bicyclic dienes, bicyclic trienes, tricyclic dienes, tricyclic trienes, and alkynes, in which R groups are those made from one or more non-metal atoms. The R groups in the neutral ligands D are preferably selected from the group consisting of $C_1$-$C_6$ alkyl, $C_3$-$C_8$ cycloalkyl, haloalkyl, arylalkyl, $C_6$-$C_{10}$ aryl, substituted aryl, heteroaryl, acyl, silyl, alkenyl and alkynyl. In the neutral ligands D that contain more than two R groups, the R groups may be the same as or different from one another or may represent one hydrocarbon chain. Preferably, the neutral ligands D are selected from the groups of linear mono-ethers, linear polyethers, cyclic monoethers, cyclic polyethers, mono-amines, linear polyamines, cyclic monoamines, or cyclic polyamines. As a precursor compound for CVD or ALD of thin films, a complex characterized by formula FX1 with y=0 may be preferred, for example to afford the complex a desired volatility.

The metal complexes characterized by formula FX1 in the present invention may be decomposed on a substrate and form a layer containing one or more substances in the form of inorganic compounds including, for example, metal, metal oxides, metal nitrides, metal carbides, metal borides, or other binary and higher-order phases. A metal complex is preferably delivered and decomposed as a vapor in a metal organic chemical vapor deposition (MOCVD), molecular beam epitaxy (MBE), or atomic layer deposition (ALD) process.

The complexes characterized by formula FX1 may be used in CVD processes, in which vapors of precursor complexes are introduced onto the substrate on which decomposition of the precursor molecules occurs to afford metal-containing solid material, such as a thin film. Thicker films can be obtained by longer exposure of the surface to the precursor. The compounds characterized by formula FX1 may also be used in ALD processes, which involves sequential exposure of a surface to two or more gases, one of which may be a metal-containing precursor. In a typical ALD process, the first reactant is introduced onto the substrate to form a thin layer of the first reactant. The conditions are chosen such that the deposition of this layer is self-limiting, such that further exposure leads to no additional deposition. After excess unreacted first reactant and by products are pumped away, the second reactant is introduced onto the substrate. The second reactant reacts with the thin layer of the first reactant. Again the conditions are chosen such that the deposition of this second layer is self-limiting, such that further exposure leads to no additional deposition.

Then, the unreacted second reactants and byproducts from the surface reactions are pumped away. By repeating this cycle, the desired thickness of the films can be deposited.

An apparatus for deposition of layers from gaseous metal complexes is typically pressure tight and can be evacuated. Thus, deposition processes are typically carried out under reduced pressure and the metal complexes are transported into the apparatus as vapors. Inert or reactive carrier gases, or other gaseous co-reactants can also be introduced into the apparatus. Decomposition of the precursors on a substrate is conducted by known methods such as thermal decomposition, plasma, radiation-induced decomposition, or photolytic decomposition. The principles of processes and apparatus for deposition of films are well known in the art.

The vaporization of precursors may be carried out by conventional vaporization methods from solid precursors. The vaporization methods may also include the nebulization of solid precursors, where before the nebulization, solid precursors may be dissolved in organic solvents, including hydrocarbons such as decane, dodecane, tetradecane, toluene, xylene, and mesitylene, as well as ethers, esters, ketones, alcohols, or chlorinated hydrocarbons. The precursor solution may also be delivered onto a substrate by direct injection of the solutions. Carrier gas that is passed through or over the precursor may be used to enhance the vaporization of the precursor especially when higher precursor flux is needed.

The decomposition of metal complexes in CVD or ALD processes affords layers containing one or more metals on substrates. Metal or metal carbides are often deposited if the metal complexes are decomposed under inert condition in which no other vapor except the metal complex vapor or inert gas such as argon, or in which a reducatant such as hydrogen, methanol, ethanol, or hydroquinone is added. If the decomposition is carried out under oxidizing atmosphere in which gas molecules containing oxygen such as water, oxygen, ozone, carbon dioxide or nitrogen dioxide is present, metal oxides are formed. When amine species such as ammonia or hydrazine are used as gaseous coreactants, layers containing metals in the form of nitrides or carbonnitride are deposited. In one embodiment of the invention, the metal complexes in this invention may be used for making alloy or be used as dopants in small amounts in other phases: for example, the platinum compound characterized by formula FX1 may be used as the platinum source for Co—Cr—Pt alloy film.

The present invention will be further illustrated by the following non-limiting examples. The particular materials, amounts, conditions, and other details in these examples should not be construed to limit the scope of the present invention to their details. Without wishing to be bound by any particular theory, there may be discussion in these Examples of beliefs or understandings of underlying principles relating to the devices and methods disclosed herein. It is recognized that regardless of the ultimate correctness of any mechanistic explanation or hypothesis, an embodiment of the invention can nonetheless be operative and useful.

Example 1. Synthesis of (2,2-dimethylpent-4-en-1-yl)lithium

All experiments were carried out under vacuum or under argon by using standard Schlenk techniques. Solvents were distilled under nitrogen from sodium/benzophenone immediately before use.

A 100 mL Schleck flask was charged with a glass-coated stirring bar, lithium granules (4-10 mesh, trace metals grade, 3.0 g, 432 mmol), pentane (30 mL) and 5-bromo-4,4-dimethylpent-1-ene (6.0 g, 34 mmol); the latter was added in one portion. The mixture was stirred for 24 h at room temperature and then was cooled to −20° C. and diluted by slow addition of diethyl ether (30 mL). The mixture was stirred at −20° C. for 10 h, and then the solvent was removed at −20° C. The residue was extracted with pentane (2×25 mL). The yellow extract was filtered, concentrated to ca. 3 mL, and cooled to −78° C. The off-white solid was collected and washed with cold pentane (2×2 mL). A second crop can be obtained by concentrating the mother liquor and cooling to −78° C. Combined yield: 2.28 g, 65%. Anal. Calcd for $C_7H_{13}Li$: C, 80.7; H, 12.8. Found: C, 80.6; H, 12.4. $^1$H NMR (500 MHz, $C_6D_{12}$, 20° C.): δ −0.83 (br s, 2H, Li—CH$_2$), 1.06 (s, 6H, β-CMe$_2$), 2.04 (d, 2H, $^3J_{HH}$=7.4 Hz, γ-CH$_2$), 5.11 (d, 1H, $^3J_{HH}$=17.3 Hz, =CH$_2$), 5.17 (d, 1H, $^3J_{HH}$=10.0 Hz, =CH$_2$), 6.19 (m, 1H, —CH=). $^{13}$C NMR (500 MHz, $C_6D_{12}$, 20° C.): δ 32.76 (br s, Li—CH$_2$), 36.17 (s, Me), 38.81 (s, β-C), 52.80 (s, γ-CH$_2$), 116.87 (s, =CH$_2$), 142.92 (s, —CH=).

Figure 1:
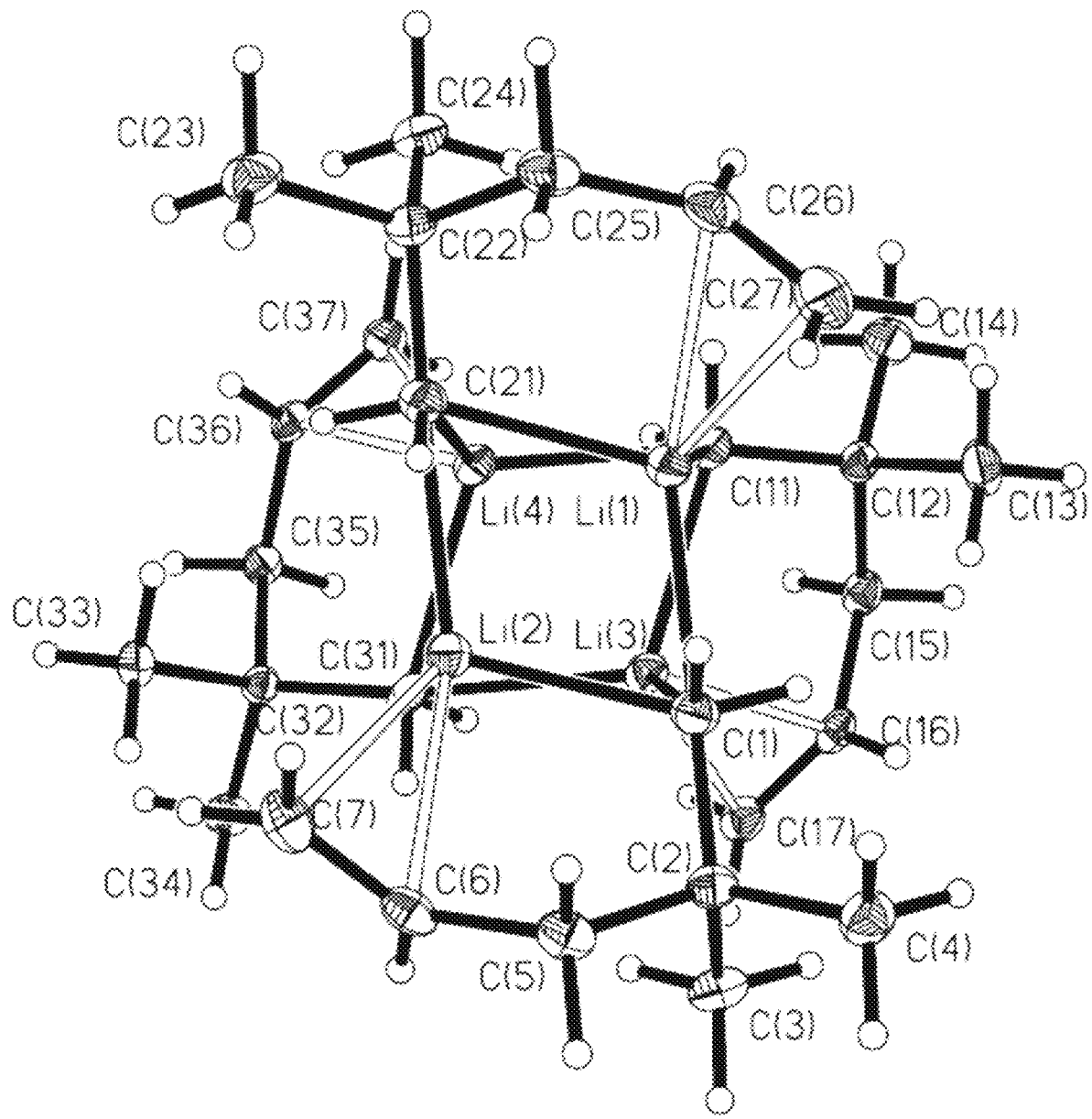
FIG. 1. Molecular structure of (2,2-dimethylpent-4-en-1-yl)lithium. Ellipsoids are drawn at the 35% probability level.

The crystal structure of (2,2-dimethylpent-4-en-1-yl) lithium shows (FIG. 1) that this compound is an unsolvated tetramer. The four lithium atoms form a distorted tetrahedron. The α-carbon atoms of the five-carbon chain are bound to the faces of the tetrahedron (i.e., they are triply bridging with respect to three lithium atoms) and the C=C double bonds at the ends of the chains each coordinate to a different lithium atom. Overall, the (2,2-dimethylpent-4-en-1-yl) lithium tetramer has approximate S4 symmetry.

Example 2. Synthesis of cis-bis($\eta^1,\eta^2$-2,2-dimethyl-but-3-en-1-yl)platinum A 100 mL Schleck flask was charged with a glass-coated stirring bar, lithium granules (4-10 mesh, trace metals grade, 3.0 g, 430 mmol), pentane (20 mL), and 4-bromo-3,3-dimethylbutene (6.0 g, 37 mmol); the latter was added in one portion. The mixture was stirred at room temperature for 12 h and then was cooled to −20° C. and diluted by slow addition of diethyl ether (20 mL). The mixture was stirred at −20° C. this temperature for 12 h. The solvent was removed at −20° C. and the residue was extracted with pentane (2×20 mL) to give a light yellow solution of (2,2-dimethylbut-3-en-1-yl)lithium. An aliquot of this solution was titrated to establish its concentration (0.22 M, 8.8 mmol, 29%).

A Schlenk flask was charged with (COD)PtCl$_2$ (0.15 g, 0.40 mmol) and diethyl ether (20 mL) and cooled to −78° C. To this mixture was added the lithium reagent (20 mL of a 0.22 M solution in pentane, 4.4 mmol). The mixture was stirred at −78° C. for 5 h and was warmed to −20° C. The solvent was slowly removed at −20° C., and to the residue was added pentane (2×20 mL). The solution was quenched at 0° C. with of H$_2$O (5 drops), and dried over Na$_2$SO$_4$ at 0° C. The mixture was then cooled to −78° C. and filtered, and the solvent was evaporated at −20° C. to give a brown oil. Pure product can be obtained by column chromatography using pentane as eluent. Slow evaporation of the solvent at −20° C. gives the title compound as a white solid, which melts at room temperature to form a light yellow oil. This compound can be stored indefinitely at −20° C. M.p.<−10° C. $^1$H NMR (400 MHz, $C_6D_6$, 20° C.): δ 0.97 (br s, 4H, Pt—CH$_2$), 1.11 (br s, 12 H, β-CMe$_2$), 3.45 (d, 2H, $^3J_{HH}$=8.8 Hz, =CH$_2$), 3.70 (d, 2H, $^3J_{HH}$=15.5 Hz, $^2J_{PtH}$=38.6 Hz, =CH$_2$), 4.42 (dd, 2H, $^3J_{HH}$=8.8 Hz, 15.5 Hz, $^2J_{PtH}$=40.6 Hz, —CH=). $^{13}$C NMR (101 MHz, $C_6D_6$, 20° C.): δ 5.60

(s, $^1J_{PtC}$=613.7 Hz, Pt—CH$_2$), 32.68 (s, $^3J_{PtC}$=42.6 Hz, Me), 37.83 (s, β-C), 74.95 (s, $^1J_{PtC}$=25.4 Hz, =CH$_2$), 99.80 (br s, —CH=).

The molecular structure of cis-bis($\eta^1$,$\eta^2$-2,2-dimethylbut-3-en-1-yl)platinum is similar to that of cis-bis($\eta^1$,$\eta^2$-2,2-dimethylpent-4-en-1-yl)platinum (see below) except that the ligand has one fewer carbon atom in the chain. The geometry about the Pt center is distorted square planar and the molecule has crystallographic C$_2$ symmetry.

Example 3. Synthesis of cis-bis($\eta^1$, $\eta^2$-2,2-dimethylpent-4-en-1-yl)platinum A 250 mL three-necked flask under argon was charged with magnesium turnings (4.0 g, 170 mmol), diethyl ether (20 mL), and 1,2-dibromoethane (9 drops). The mixture was heated to reflux for 12 h to activate the magnesium and then was treated with 5-bromo-4,4-dimethylpent-1-ene (4.25 g, 24.0 mmol), which was added in one portion. The mixture was heated to reflux for 12 h, and then the mixture was filtered. The solid was washed with diethyl ether (2×10 mL) and the washings were filtered and combined with the original filtrate to give a light yellow solution of (2,2-dimethylpent-4-en-1-yl)magnesium bromide. An aliquot of the solution was titrated to establish its concentration.

A Schlenk flask was charged with (COD)PtCl$_2$ (1.50 g, 3.99 mmol) and diethyl ether (20 mL), and cooled to 0° C. The resulting mixture was treated with the Grignard reagent (23 mL of a 0.41 M solution in diethyl ether; 9.4 mmol), and afterward was stirred for 2 h at 0° C. and then warmed to room temperature. The mixture was filtered, the solid residue was washed with diethyl ether (20 mL), and the washing was filtered and added to original filtrate. The solvent was removed from the filtrate under reduced pressure. The resulting slurry was extracted with pentane (2×20 mL) and the solvent was removed under vacuum. The resulting yellow oil was purified by silica gel column chromatography to obtain the title compound as a light yellow oil. The oil was recrystallized from ethanol at −20° C. to give the product as an air- and water-stable light yellow solid that easily melts to a liquid. Yield: 0.99 g, 64%. This compound can be stored indefinitely at −20° C. M.p. 19-20° C. Anal. Calcd for C$_{14}$H$_{26}$Pt: C, 43.2; H, 6.73.

Found: C, 43.0; H, 6.64. $^1$H NMR (400 MHz, C$_6$D$_6$, 20° C.): δ 1.18 (s, 6H, $^4J_{PtH}$=10.1 Hz, β-CMe$_2$ equatorial), 1.29 (s, 6H, β-CMe$_2$ axial), 1.47 (dd, $^2J_{HH}$=11.8 Hz, $^3J_{HH}$=9.1 Hz, 2 H, γ-CH$_2$ axial), 1.64 (d, $^2J_{HH}$=11.7 Hz, $^2J_{PtH}$=102.7 Hz, 2H, Pt—CH$_2$ axial), 1.47 (dd, $^2J_{HH}$=11.8 Hz, $^3J_{HH}$=4.4 Hz, 2 H, γ-CH$_2$ equatorial), 1.64 (d, $^2J_{HH}$=11.7 Hz, $^2J_{PtH}$=34.3 Hz, 2 H, Pt—CH$_2$ equatorial), 3.41 (d, 2H, $^3J_{HH}$=8.0 Hz, $^2J_{PtH}$=29.6 Hz, =CH$_2$), 3.60 (d, 2H, $^3J_{HH}$=14.7 Hz, $^2J_{PtH}$=39.5 Hz, =CH$_2$), 4.53 (m, 2H, —CH=). 13C NMR (101 MHz, C$_6$D$_6$, 20° C.): δ 32.05 (s, $^3J_{PtC}$=28.8 Hz, Me axial), 33.19 (s, $^3J_{PtC}$=99.8 Hz, Me equatorial), 43.38 (s, $^1J_{PtC}$=842.4 Hz, Pt—CH$_2$), 48.69 (s, γ-CH$_2$), 51.19 (s, β-C), 88.92 (s, $^1J_{PtC}$=29.3 Hz, =CH$_2$), 113.10 (s, $^1J_{PtC}$=16.0 Hz, —CH=).

The crystal structure of cis-bis($\eta^1$,$\eta^2$-2,2-dimethylpent-4-en-1-yl)platinum shows (FIG. 2) that this compound contains two bidentate $\eta^1$,$\eta^2$-2,2-dimethylpent-4-en-1-yl ligands bound to the platinum center by means of a Pt—C sigma bond at one end of the five-carbon chain and by a Pt-olefin pi bond at the other. The two sigma bonds are cis, and the molecule has approximate C$_2$ symmetry.

Example 4. Synthesis of cis-bis($\eta^1$,$\eta^2$-2,2-dimethylhex-5-en-1-yl)platinum The synthesis of this compound can be accomplished in a fashion similar to that of cis-bis($\eta^1$,$\eta^2$-2,2-dimethylpent-4-en-1-yl)platinum in example 2, except using 6-bromo-5,5-dimethylhex-1-ene instead of 5-bromo-4,4-dimethylpent-1-ene. The product is obtained as yellow crystals. M.p. 46-47° C. Anal. Calcd for C$_{16}$H$_{30}$Pt: C, 46.0; H, 7.24.

Found: C, 46.2; H, 6.91. $^1$H NMR (500 MHz, C$_6$D$_6$, 20° C.): δ 1.08 (br s, 6H, β-CMe$_2$ axial), 1.21 (br s, 6H, β-CMe$_2$ equatorial), 1.25 (br s, 2H, γ-CH$_2$), 1.61-1.82 (m, 4H, γ-CH$_2$ & δ-CH$_2$), 1.88 (d, $^2J_{HH}$=9 Hz, $^1J_{PtH}$=100.6 Hz, 2H, Pt—CH$_2$ axial), 2.16 (m, 2H, 5-CH$_2$), 1.64 (d, $^2J_{HH}$=9 Hz, $^1J_{PtH}$=62 Hz, 2 H, Pt—CH$_2$ equatorial), 3.40 (d, 2H, $^3J_{HH}$=8.9 Hz, $^2J_{PtH}$=34.0 Hz, =CH$_2$), 4.16 (m, 2H, —CH=), 4.32 (d, 2H, $^3J_{HH}$=15 Hz, =CH$_2$). $^{13}$C NMR (126 MHz, C$_6$D$_6$, 20° C.): δ 28.08 (br s, 5-CH$_2$), 28.96 (br s, $^3J_{PtC}$=23 Hz, Me axial), 37.37 (br s, $^3J_{PtC}$=21 Hz, γ-CH$_2$), 37.81 (s, $^3J_{PtC}$=98 Hz, Me equatorial), 40.10 (br s, β-C), 46.73 (s, $^1J_{PtC}$=860.3 Hz, Pt—CH$_2$), 82.99 (br s, =CH$_2$), 104.61 (br s, —CH=).

The molecular structure of cis-bis($\eta^1$,$\eta^2$-2,2-dimethylhex-4-en-1-yl)platinum is similar to that of cis-bis($\eta^1$, $\eta^2$-2,2-dimethylpent-4-en-1-yl)platinum except that the ligand has one more carbon atom in the chain. The geometry about the Pt center is distorted square planar and the molecule has crystallographic C$_2$ symmetry.

Example 5. Synthesis of [(1,2,5,6-η)-1,5-cyclooctadiene]($\eta^1$,$\eta^2$-2,2-dimethylpent-4-en-1-yl)iridium A Schlenk flask was charged with (COD)$_2$Ir$_2$Cl$_2$ (0.20 g, 0.30 mmol) and THF (20 mL) and cooled to −20° C. To the mixture was added dropwise a cooled (0° C.) solution of (2,2-dimethylpent-4-en-1-yl)lithium (0.089 g, 85 mmol) in pentane (5 mL). The mixture was stirred at −20° C. for 5 h over which time the solution color changed from yellow to red. The pentane was removed under vacuum at −20° C., and THF was removed under vacuum at room temperature. The resulting dark oil was dissolved in pentane (10 mL), the solution was cooled to −20° C., and methanol (~3 mL) was added slowly. Pentane was slowly evaporated at −20° C. under vacuum until the methanol layer turned dark red. This solution was cooled to −78° C. to give single crystals of the title compound as air sensitive dark red needles. The crystals melt at room temperature to form a dark red oil. M.p.<−10° C. HRMS (EI, m/e). Calcd: 398.15853. Found: 398.15781. $^1$H NMR (400 MHz, C$_6$D$_6$, 20° C.): δ 1.29 (s, 3H), 1.33 (s, 3H, 3-CMe$_2$), 1.61 (dd, $^2J_{HH}$=11.3 Hz, $^3J_{HH}$=11.3 Hz, 1H, γ-CH$_2$ axial), 1.74 (d, $^2J_{HH}$=12.4 Hz, 1H, Ir—CH$_2$ axial), 1.94 (dd, $^2J_{HH}$=12.6 Hz, $^4J_{HH}$=2.6 Hz, 1H, Ir—CH$_2$ equatorial), 2.54 (ddd, $^2J_{HH}$=11.8 Hz, $^3J_{HH}$=4.5 Hz, $^4J_{HH}$=2.6 Hz, 1H, γ-CH$_2$ equatorial), 1.57-2.15 (m, 8H, CH$_2$ of COD), 3.00 (m, 1H, CH of COD cis to CH=CH$_2$), 3.18 (d, 1H, $^3J_{HH}$=14.9 Hz, =CH$_2$), 3.50 (d, 1H, $^3J_{HH}$=8.9 Hz, =CH$_2$), 3.78 (m, 1H, CH of COD cis to CH=CH$_2$), 4.06 (m, 1H, CH of COD trans to CH=CH$_2$), 4.29 (m, 1H, CH of COD trans to CH=CH$_2$), 5.19 (m, 1H, —CH=). $^{13}$C NMR (101 MHz, CD, 20° C.): δ 30.20 (s, CH$_2$ of COD cis to CH=CH$_2$), 30.31 (s, Me), 31.96 (s, CH$_2$ of COD trans to CH=CH$_2$), 32.24 (s, CH$_2$ of COD cis to CH=CH$_2$), 32.44 (s, CH$_2$ of COD trans to CH=CH$_2$), 34.29 (s, Me), 52.93 (s, γ-CH$_2$) 55.47 (s, β-C), 63.41 (s, Ir—CH$_2$), 73.11 (s, CH of COD cis to CH=CH$_2$), 74.99 (s, CH of COD trans to CH=CH$_2$), 75.86 (s, CH of COD trans to CH=CH$_2$), 76.60 (s, CH of COD cis to CH=CH$_2$), 77.93 (s, =CH$_2$), 99.20 (s, —CH=).

Figure 3:
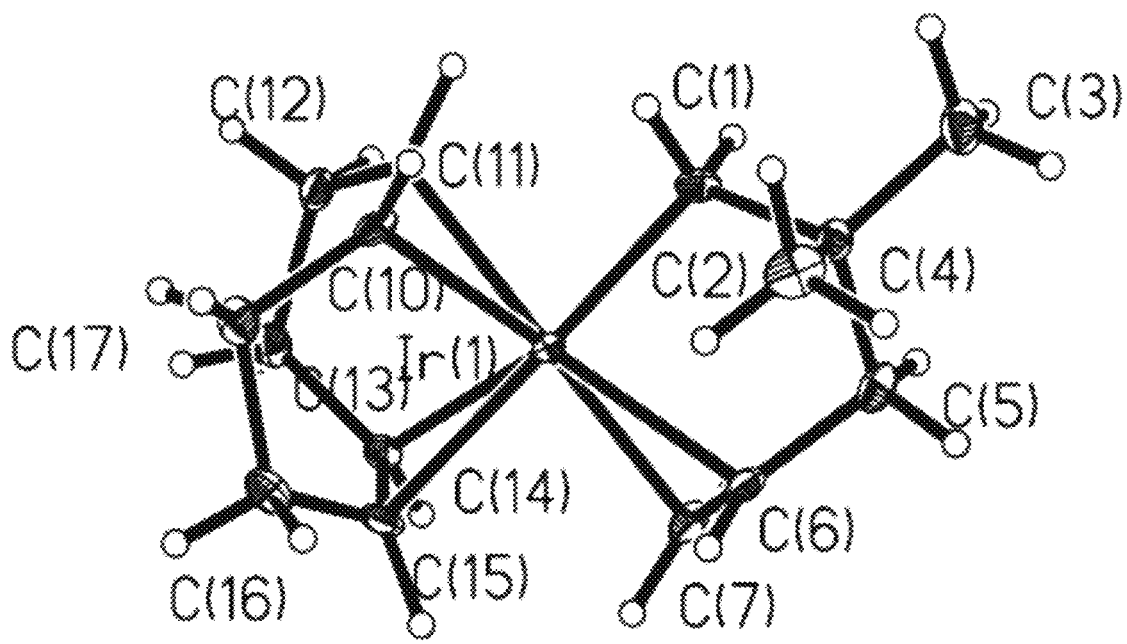
FIG. 3. Molecular structure of [(1,2,5,6-$\eta$)-1,5-cyclooctadiene]($\eta^1,\eta^2$-2,2-dimethylpent-4-en-1-yl)iridium. Ellipsoids are drawn at the 35% probability level.

The crystal structure of [(1,2,5,6-η)-1,5-cyclooctadiene]($\eta^1$,$\eta^2$-2,2-dimethylpent-4-en-1-yl)iridium shows (FIG. 3) that one $\eta^1$,$\eta^2$-2,2-dimethyl-pent-4-en-1-yl ligand is bound to each iridium center by means of the previously described

Example 6. Synthesis of [(1,2,5,6-η)-1,5-cyclooctadiene](η¹,η²-2,2-dimethylpent-4-en-1-yl)rhodium The synthesis of this compound can be accomplished similar to 20 that described for its iridium analog in example 5, except using (COD)$_2$Rh$_2$Cl$_2$ in place of (COD)$_2$Ir$_2$Cl$_2$. The product is an orange oil. MS (EI, m/e). Calcd: 308.3. Found: 308.3. $^1$H NMR (400 MHz, C$_6$D$_6$, 20° C.): δ 1.11 (dd, $^2J_{HH}$=10.3 Hz, $^4J_{HH}$=3.2 Hz, 1H, Rh—CH$_2$ equatorial), 1.20 (s, 3H, β-CMe$_2$), 1.40 (s, 3H, 3-CMe$_2$), 1.43 (d, $^2J_{HH}$=10.3 Hz, 1H, Rh—CH$_2$ axial), 1.70-2.30 (m, 10H, CH$_2$ of COD and γ-CH$_2$), 3.50 (m, 1H, CH of COD), 3.50 (d, 1H, $^3J_{HH}$=15.6 Hz, =CH$_2$), 3.50 (d, 1H, $^3J_{HH}$=8.7 Hz, $^4J_{HH}$=1.4 Hz, =CH$_2$), 4.09 (m, 1H, CH(COD)), 4.38 (m, 1H, CH of COD), 4.77 (m, 1H, CH of COD), 5.74 (m, 1H, —CH=).

Example 7. Synthesis of [(2,3,5,6-η)-bicyclo[2.2.1]Hepta-2,5-diene](η¹,η²-2,2-dimethyl-pent-4-en-1-yl)rhodium The synthesis of this compound can be accomplished similar to that described for its iridium analog in example 5, except using the norbornadiene compound (NBD)$_2$Rh$_2$Cl$_2$ in place of (COD)$_2$Ir$_2$Cl$_2$. The product was obtained as an orange oil. $^1$H NMR (400 MHz, C$_6$D$_6$, 20° C.): δ 0.81 (dd, $^2J_{HH}$=11.4 Hz, $^4J_{HH}$=2.5 Hz, 1 H, Rh—CH$_2$ equatorial), 1.17 (d, $^2J_{HH}$=11.8 Hz, 1H, Rh—CH$_2$ axial), 1.22 (s, 3H, 3-CMe$_2$), 1.35 (dt, 1 H, $^2J_{HH}$=7.8 Hz, $^3J_{HH}$=3.0 Hz, CH bridgehead of NBD), 1.39 (s, 3H, β-CMe$_2$), 1.46 (dt, 1 H, $^2J_{HH}$=7.8 Hz, $^3J_{HH}$=3.2 Hz, CH bridgehead of NBD), 1.58 (dd, $^2J_{HH}$=11.6 Hz, $^3J_{HH}$=11.6 Hz, 1H, γ-CH$_2$ axial), 2.48 (ddd, $^2J_{HH}$=11.8 Hz, $^3J_{HH}$=6 Hz, $^4J_{HH}$=3 Hz, 1H, γ-CH$_2$ equatorial), 3.03 (d, 1H, $^3J_{HH}$=15.9 Hz, =CH$_2$), 3.27 (br s, 1H, CH$_2$ of NBD), 3.28 (d, 1H, $^3J_{HH}$=9.1 Hz, =CH$_2$), 3.59 (br s, 1H, CH$_2$ of NBD), 3.98(m, 1 H CH of NBD), 4.06 (m, 1H, CH of NBD), 4.13 (m, 1H, CH of NBD), 4.57 (m, 1H, CH of NBD), 5.28 (m, 1H, —CH=).

Example 8. Properties of Compositions

Figure 4:
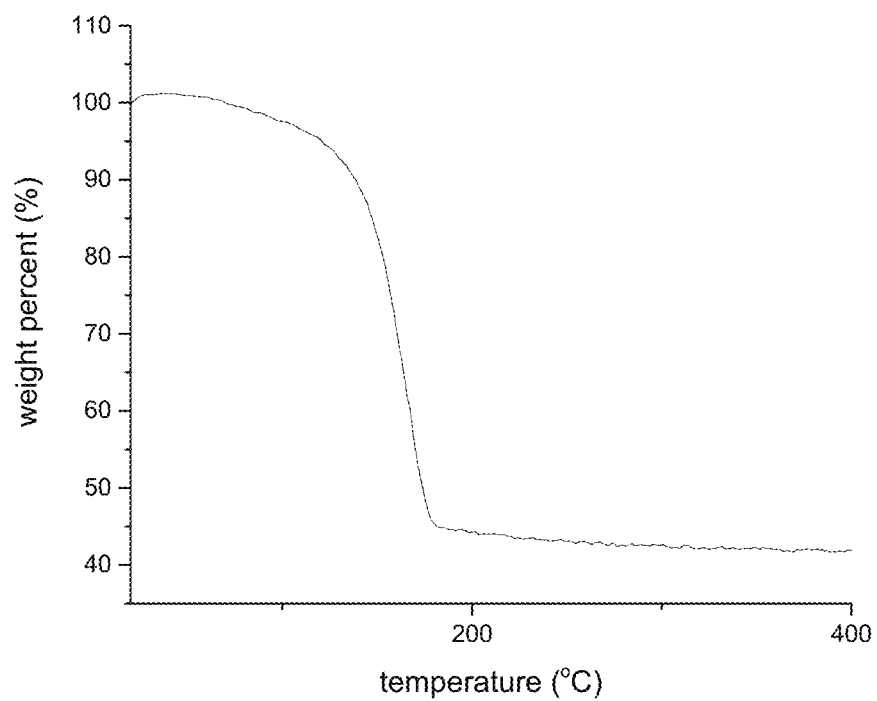
FIG. 4. Thermogravimetric analysis of cis-bis($\eta^1,\eta^2$-2,2-dimethylpent-4-en-1-yl)platinum. TGA pressure=1 atm $N_2$ (little evaporation should take place). Ramp rate=10°

FIG. 4 shows a thermogravimetric analysis of one embodiment of the present compositions, the new platinum compound cis-bis(η¹,η²-2,2-dimethylpent-4-en-1-yl)platinum. The results suggest that this should be an excellent CVD precursor. TGA pressure=1 atm N$_2$ (little evaporation should take place), ramp rate=10° C./min, onset temperature for thermolysis=144° C., final mass=45%, and Pt percentage in original compound=50%. FIG. 5 shows ~150 nm platinum film grown from cis-bis(η¹,η²-2,2-dimethylpent-4-en-1-yl)platinum on Si(100) under dynamic vacuum. The precursor reservoir was heated to 80° C., and the growth temperature was 250° C. FIG. 6, which shows the X-ray diffractogram of the platinum film in FIG. 5, indicating that the film contains nanocrystalline platinum. FIG. 7 shows that the film in FIG. 5 consists of platinum with some carbon impurity. The amount of carbon is comparable with that found for state-of-the-art platinum precursors in absence of a reactive gas (Thurier et al., *Coordination Chemistry Reviews* 2008, 252, 155-169; Schneider, et al., *Chemical Vapor Deposition* 2007, 13, 389-395; Maudez, et al., *Chemical Vapor Deposition* 2014, 20, 59-68). FIG. 8 shows the decomposition rate of cis-bis(η¹,η²-2,2-dimethylpent-4-en-1-yl)-platinum, which indicates that this compound more thermally stable than the 2,2-unmethylated analogue.

In summary, this data shows that, in one embodiment of the present invention, films containing platinum can be grown at 250° C. from the precursor cis-bis(η¹,η²-2,2-dimethylpent-4-en-1-yl)platinum.

Example 9: Exemplary Compositions, Formulations, and Methods (i) A metal ligand complex characterized by formula (FX1): ML$_x$D$_y$ (FX1); wherein: M is a metal chosen from the group consisting of Li, Be, Mg, Ca, Sr, Ba, Al, Sc, Ti, Zr, Hf, V, Nb, Ta, Cr, Mo, W, Mn, Re, Fe, Ru, Os, Co, Rh, Ir, Ni, Pd, Pt, Cu, Ag, Au, Zn, a lanthanide metal, and an actinide metal; x is equal to the oxidation state of M; D is a neutral coordinating ligand; y is zero or an integer from 1 to 4; and L is a η¹,η²-β,β-disubstituted-ω-alkenyl group that has the structure characterized by formula FX2:

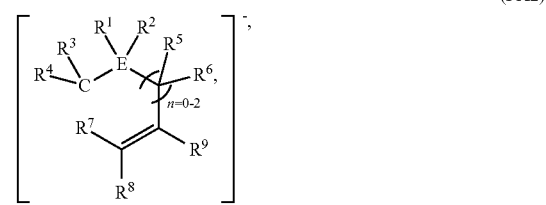

(FX2)

wherein, R$^1$ and R$^2$ may be the same as or different from one another and each of R$^1$ and R$^2$ are selected from the group consisting of C$_1$-C$_6$ alkyl, C$_3$-C$_8$ cycloalkyl, haloalkyl, arylalkyl, alkoxy, C$_6$-C$_{10}$ aryl, substituted aryl, heteroaryl, silyl, alkenyl, alkynyl, and halogen; R$^3$, R$^4$, R$^5$, R$^6$, R$^7$, R$^8$, and R$^9$ may be the same as or different from one another and selected from the group consisting of H, C$_1$-C$_6$ alkyl, C$_3$-C$_8$ cycloalkyl, haloalkyl, arylalkyl, alkoxy, C$_6$-C$_{10}$ aryl, substituted aryl, heteroaryl, silyl, alkenyl, alkynyl, and halogen; and E is C or Si.

(ii) Any metal ligand complex of this Example, wherein E is Si.

(iii) Any metal ligand complex of this Example, wherein R$^1$, R$^2$, R$^3$, R$^4$, R$^5$, R$^6$, R$^7$, R$^8$, and R$^9$ are connected to each other by alkyl groups or fluoroalkyl groups.

(iv) Any metal ligand complex of this Example, wherein the R$^1$ and R$^2$ are alkyl groups, fluoroalkyl groups or other non-metal atoms or groups; R$^3$, R$^4$, R$^5$, R$^6$, R, R$^8$, and R$^9$ are hydrogen, alkyl groups, fluoroalkyl groups or other non-metal atoms or groups, and wherein R$^1$, R$^2$, R$^3$, R$^4$, R$^5$, R$^6$, R$^7$, R$^8$, and R$^9$ are the same or different, and wherein R$^1$, R$^2$, R$^3$, R$^4$, R$^5$, R$^6$, R$^7$, R$^8$, and R$^9$ are connected to each other by alkyl groups or fluoroalkyl groups.

(v) Any metal ligand complex of this Example, wherein D is selected from the group consisting of 1,5-cyclooctadiene, bicyclo[2.2.1]hepta-2,5-diene, 1,5-hexadiene, ethylene, dibenzo[a,e]cyclooctene, N,N,N',N'-tetramethylethylenediamine, and acetonitrile.

(vi) Any metal ligand complex of this Example, herein M is selected from the group consisting of lithium, magnesium, rhodium, iridium, platinum, ruthenium, and osmium.

(vii) A substrate comprising a film or nanostructures comprising any metal ligand complex of this Example.

(viii) A method for depositing metal containing films or nanostructures, the method comprising vaporizing any metal ligand complex of this Example and decomposing the metal ligand complex on a substrate.

(ix) Any method of this Example, wherein the metal ligand complex is delivered and decomposed by chemical vapor deposition or atomic layer deposition.

Examples 10-12 provide experimental results demonstrating the use of metal-ligand complexes of the invention as hydrosilylation catalysts and precatalysts was experimentally evaluated. Experiments were carried out under argon using standard Schlenk techniques. The glassware was oven dried. HSiMe(OSiMe$_3$)$_2$ (MD'M) and triethylsilane (Oakwood) were stored over 3 Å molecular sieves. Allyl glycidyl ether (Sigma-aldrich), 4-octyne (Sigma-aldrich) and benzene-d$_6$ (Cambridge Isotope Laboratories) were obtained from commercial sources and used without purifications. The reaction progress was monitored by taking aliquots of the reaction mixtures, and immediately dissolve this mixture in benzene-d$_6$ to quench the reaction using dilution.

The Examples 10-12 show that cis-Bis($\eta^1$,$\eta^2$-2,2-dimethylpent-4-en-1-yl)platinum is a catalyst or a precatalyst for the hydrosilylation of alkene or alkynes. The rate of hydrosilylation reactions are relatively slow at 20° C. For example, while no reaction is observed for a mixture of allyl glycidyl ether and HSiMe(OSiMe$_3$)$_2$), with 50 ppm loading, for 1 h, a turnover number of 20000 can be reached for the same mixture within hours when activating, for example, by heating to above 50° C.

Example 10: Catalytic Hydrosilylation of Allyl Glycidyl Ether Using HSiMe(OSiMe$_3$)$_2$ (MD'M) as Silane Reagent and Cis-bis($\eta^1$,$\eta^2$-2,2-dimethylpent-4-en-1-yl)platinum (50 ppm) as Catalyst/Precatalyst at 20° C. and 80° C.

Under argon atmosphere, a solution of cis-bis($\eta^1$,$\eta^2$-2,2-dimethylpent-4-en-1-yl)platinum in benzene-d$_6$ (10 µL, 0.013 mmol/mL, 0.013 µmol) was added to a Schlenk tube containing allyl glycidyl ether (0.59 mL, 5.0 mmol) at 20° C. with stirring. To this mixture, MD'M (0.69 mL, 2.5 mmol) was added in one batch. While kept in dark, the mixture was left stirring at 20° C. An aliquot of the reaction mixture was taken out of the reaction mixture and immediately quenched by dissolved in benzene-d$_6$. The remaining mixture is activated by heating to a temperature of 80° C. or greater, while aliquots of the reaction mixture were taken out and dissolved in benzene-d$_6$ to monitor the reaction progress.

FIG. 12 provides $^1$H NMR spectra of aliquots of the reaction mixture taken at different stages of hydrosilylation reaction. The initial mixture contains 2 equiv. allyl glycidyl ether (0.59 mL), 1 equiv. HSiMe(OSiMe$_3$)$_2$ (MD'M) (0.69 mL), 50 ppm (per Si—H) of cis-bis($\eta^1$,$\eta^2$-2,2-dimethylpent-4-en-1-yl)platinum and benzene-d$_6$ (10 µL). Different species in the reaction mixture are assigned using the following numbering scheme: 1, HSiMe(OSiMe$_3$)$_2$(MD'M); 2, allyl glycidyl ether; 3, 1,1,1,3,5,5,5-heptamethyl-3-(3-(oxiran-2-ylmethoxy)propyl)trisiloxane; 4, (E)-2-((prop-1-en-1-yloxy)methyl)oxirane; 5, (Z)-2-((prop-1-en-1-yloxy)methyl)oxirane; 6, 1,1,1,3,5,5,5-heptamethyl-3-(1-(oxiran-2-ylmethoxy)prop-1-en-2-yl)trisiloxane isomers. The reaction progress was characterized by comparing the integration of the Si—H resonance of 1 (δ~5.0) with the integration of the SiCH$_2$CH$_2$CH$_2$ resonance (δ~1.76) of the product 3. The Si—H resonance overlaps with an olefinic C—H resonance of 2. The integration due to 2 can be subtracted based on other resonances of 2. NMR spectrum of this aliquot suggest that 100% MD'M reacted within 30 min at 80° C.

$^1$H NMR spectrum of these aliquots of the reaction mixtures in benzene-d$_6$ show that no observable reaction occurs when the mixture containing MD'M, allyl glycidyl ether and cis-bis($\eta^1$,$\eta^2$-2,2-dimethylpent-4-en-1-yl)platinum was kept at 20° C. for 1 h. When activated by heating to a temperature of 80° C. for 30 min under stir, $^1$H NMR spectrum of an aliquot of the reaction mixture suggest full conversion of the MD'M to the desired product 1,1,1,3,5,5,5-heptamethyl-3-(3-(oxiran-2-ylmethoxy)propyl)trisiloxane with >95% anti-Markovnikov selectivity. In all examples with allyl glycidyl ether, no markovnikov products was observed, except for some dehydrogenation hydrosilylation products. For 1 equiv. of triethyl(3-(oxiran-2-ylmethoxy)propyl)silane generated, in total 0.12 equiv. of olefin isomerization products (E)-2-((prop-1-en-1-yloxy)methyl)oxirane and (Z)-2-((prop-1-en-1-yloxy)methyl)oxirane was generated. 0.05 equiv. of dehydrogenation silylation product 1,1,1,3,5,5,5-heptamethyl-3-(1-(oxiran-2-ylmethoxy)prop-1-en-2-yl)trisiloxane isomers was also observed. Heating the reaction mixture at 80° C. for additional 210 min does not lead to further isomerization of unreacted allyl glycidyl ether or ring opening of epoxy groups.

Example 10 demonstrates the relatively slow reaction rate at 20° C. and rapid activation of Hydrosilylation reaction when heated. The slow rate 20° C. means that if this compound is used for curing of silicone, premature curing at the mixing stage can be suppressed. Example 10 also demonstrates the stability of the substrate in presence of catalyst/precatalyst.

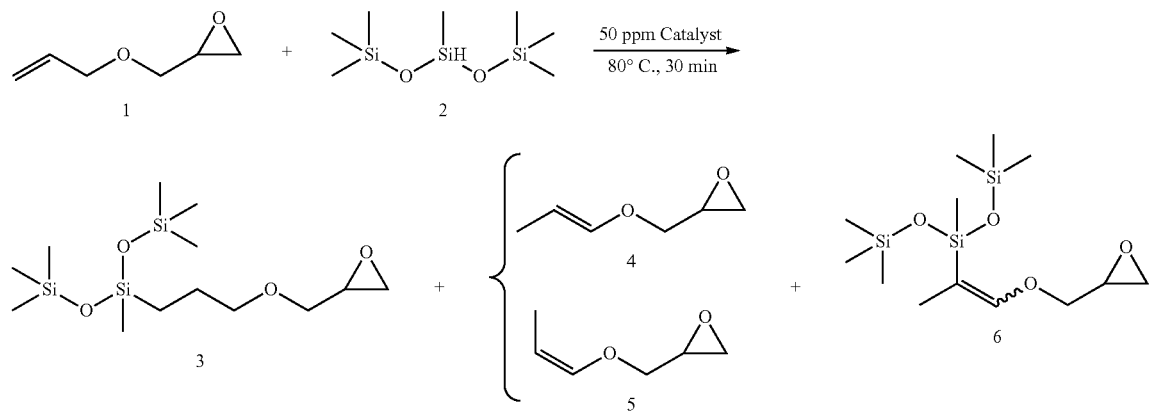

Example 11: Catalytic Hydrosilylation of Allyl Glycidyl Ether Using HSiMe(OSiMe$_3$)$_2$ (MD'M) as Silane Reagent and Cis-bis($\eta^1$,$\eta^2$-2,2-dimethylpent-4-en-1-yl)platinum (50 ppm) as Catalyst/Precatalyst at 50° C.

Under argon atmosphere at 20° C., a solution of cis-bis($\eta^1$,$\eta^2$-2,2-dimethylpent-4-en-1-yl)platinum in benzene-d$_6$ (10 µL, 0.013 mmol/mL, 0.013 µmol) was added to a Schlenk tube containing allyl glycidyl ether (0.59 mL, 5.0 mmol). The mixture was mixed by shaking, then to this mixture, MD'M (0.69 mL, 2.5 mmol) was added in one batch. No stir bar was added. The mixture was mixed by shaking, then activated by heating to a temperature of 50° C. for 30 min. An aliquot of the reaction mixture was taken out of the reaction mixture and immediately dissolved in benzene-d$_6$ to quench the reaction.

FIG. 13 provides $^1$H NMR spectrum of an aliquot of a reaction mixture after being heated under argon for 30 min at 50° C. The initial mixture contains 2 equiv. allyl glycidyl ether (0.59 mL), 1 equiv. HSiMe(OSiMe$_3$)$_2$ (MD'M) (0.69 mL), 50 ppm (per Si—H) of cis-bis($\eta^1$,$\eta^2$-2,2-dimethylpent-4-en-1-yl)platinum and benzene-d$_6$ (10 µL). Different species in the reaction mixture are assigned using the following numbering scheme: 1, HSiMe(OSiMe$_3$)$_2$(MD'M); 2, allyl glycidyl ether; 3, 1,1,1,3,5,5,5-heptamethyl-3-(3-(oxiran-2-ylmethoxy)propyl)trisiloxane; 4, (E)-2-((prop-1-en-1-yloxy)methyl)oxirane; 5, (Z)-2-((prop-1-en-1-yloxy)methyl)oxirane; 6, 1,1,1,3,5,5,5-heptamethyl-3-(1-(oxiran-2-ylmethoxy)prop-1-en-2-yl)trisiloxane isomers. The reaction progress was characterized by comparing the integration of the Si—H resonance of 1 (δ~5.0) with the integration of the SiCH$_2$CH$_2$CH$_2$ resonance (δ 1.76) of the product 3. The Si—H resonance overlaps with an olefinic C—H resonance of 2. The integration due to 2 can be subtracted based on other resonances of 2. NMR spectrum of this aliquot suggest that 85% MD'M reacted within 30 min at 50° C.

$^1$H NMR spectrum of the aliquot in benzene-d$_6$ of the reaction mixture support an interpretation that ~90% of triethyl silane was converted to the desired product 1,1,1,3,5,5,5-heptamethyl-3-(3-(oxiran-2-ylmethoxy)propyl)trisiloxane with >95% anti-Markovnikov selectivity. For 1 equiv. of triethyl(3-(oxiran-2-ylmethoxy)propyl)silane generated, in total 0.20 equiv. of olefin isomerization products (E)-2-((prop-1-en-1-yloxy)methyl)oxirane and (Z)-2-((prop-1-en-1-yloxy)methyl)oxirane was generated. 0.05 equiv. of dehydrogenation silylation product 1,1,1,3,5,5,5-heptamethyl-3-(1-(oxiran-2-ylmethoxy)prop-1-en-2-yl) trisiloxane isomers was also observed. Ring opening of epoxy groups was not observed.

Example 12: Catalytic Hydrosilylation of Allyl Glycidyl Ether Using Triethylsilane as Silane Reagent and cis-bis($\eta^1$,$\eta^2$-2,2-dimethylpent-4-en-1-yl)platinum (50 ppm Per Silane) as Catalyst or Precatalyst at 60° C.

Under Argon atmosphere at 20° C., a solution of cis-bis($\eta^1$,$\eta^2$-2,2-dimethylpent-4-en-1-yl)platinum in benzene-d$_6$ (20 µL, 0.013 mmol/mL, 0.026 µmol) was added to a Schlenk tube containing allyl glycidyl ether (1.18 mL, 10.0 mmol). The mixture was mixed by shaking, then to this mixture, triethylsilane (0.80 mL, 5.0 mmol) was added in one batch. No stir bar was added. The mixture was mixed by shaking, then activated by heating to a temperature of 60° C. for 2 hours. An aliquot of the reaction mixture was taken out of the reaction mixture and immediately dissolved in benzene-d$_6$ to quench the reaction.

FIG. 14 provides $^1$H NMR spectrum of an aliquot of a reaction mixture after being activated by heating under argon for 2 hours at a temperature of 60° C. The initial mixture contains 2 equiv. allyl glycidyl ether (1.18 mL), 1 equiv. triethylsilane (0.80 mL), 50 ppm (per Si—H) of cis-bis($\eta^1$,$\eta^2$-2,2-dimethylpent-4-en-1-yl)platinum and benzene-d$_6$ (20 µL). Different species in the reaction mixture are assigned using the following numbering scheme: 1, triethyl silane; 2, allyl glycidyl ether; 3, triethyl(3-(oxiran-2-ylmethoxy)propyl)silane; 4, (E)-2-((prop-1-en-1-yloxy)methyl)oxirane; 5, (Z)-2-((prop-1-en-1-yloxy)methyl)oxirane. The reaction progress was calculated based on the integration of Si—H group of unreacted triethylsilane (δ 3.88) and the integration of the SiCH$_2$CH$_2$ resonance of product triethyl(3-(oxiran-2-ylmethoxy)propyl)silane. NMR spectrum of this aliquot suggest that 90% triethylsilane reacted within 2 hours at 60° C.

$^1$H NMR spectrum of the aliquot of the reaction mixture in benzene-d$_6$ support an interpretation that ~90% of triethyl silane was converted to the desired product triethyl(3-(oxiran-2-ylmethoxy)propyl)silane with >95% anti-Markovnikov selectivity. For 1 equiv. of triethyl(3-(oxiran-2-ylmethoxy)propyl)silane generated, in total ~0.77 equiv. of olefin isomerization products (E)-2-((prop-1-en-1-yloxy)methyl)oxirane (0.50 equiv.) and (Z)-2-((prop-1-en-1-yloxy)methyl)oxirane (0.27 equiv.) was generated. Ring opening of epoxy groups were not observed.

Example 12 demonstrates that a likely broad scope of silanes can be used for hydrosilylation using the present catalyst/precatalyst.

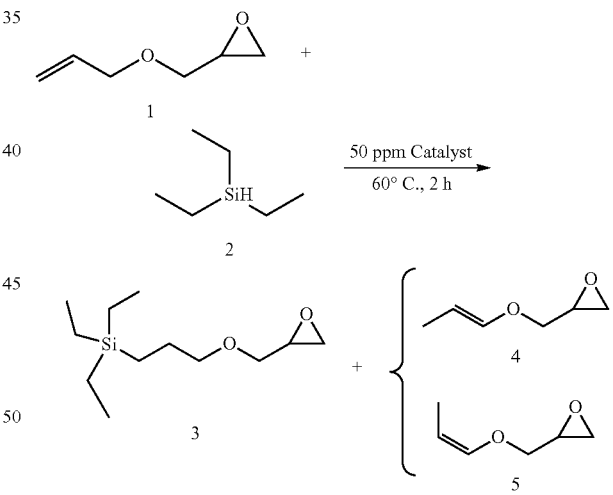

Example 13: Catalytic Hydrosilylation of 4-octyne Using Triethylsilane as Silane Reagent and cis-bis ($\eta^1$,$\eta^2$-2,2-dimethylpent-4-en-1-yl)platinum (50 ppm Per Silane) as Catalyst or Precatalyst at 20° C. in benzene-d$_6$ Under argon atmosphere, cis-bis($\eta^1$,$\eta^2$-2,2-dimethylpent-4-en-1-yl)platinum (1.8 mg, 4.6 µmol) and 4-octyne (55 mg, 0.5 mmol) was dissolved in benzene-d (1.0 mL). To this mixture, triethylsilane (95 µL, 0.6 mmol) was added in one batch at 20° C. with stirring. The mixture was left stirring at 20° C. in dark. The color of the mixture turns light yellow within 1 hour. Aliquots of the reaction mixture were taken out of the reaction mixture at different reaction times, and immediately quenched by dissolved in benzene-$d_6$.

FIG. 15. provides $^1$H NMR spectra of aliquots of the reaction mixture taken at different stages of hydrosilylation reaction. The initial mixture contains 1 equiv. 4-octyne (55 mg), 1.1 equiv. triethylsilane (95 μL), 0.01 equiv. (per alkyne) of cis-bis($\eta^1$,$\eta^2$-2,2-dimethylpent-4-en-1-yl)platinum (1.8 mg) and benzene-$d_6$ (1.0 mL). Different species in the reaction mixture are assigned using the following numbering scheme: 1, triethyl silane; 2, 4-octyne; 3, (E)-triethyl(oct-4-en-4-yl)silane; 4, (Z)-triethyl(oct-4-en-4-yl)silane. The reaction progress was calculated based on the integration of $\underline{CH_2}$—C—C group of unreacted 4-octyne (δ 2.05) and the integration of the olefinic C—H resonance of products (δ~5.5). NMR spectrum of this aliquot suggest that ~100% 4-octyne reacted within 16 hours at 20° C.

$^1$H NMR spectrum of these aliquots of the reaction mixtures in benzene-$d_6$ show that reaction slowly take place at 20° C. After 16 hours, full conversion of the alkyne was reached, and a mixture of products consists of a 8:1 ratio of (E)-triethyl(oct-4-en-4-yl)silane (cis-addition product) and (Z)-triethyl(oct-4-en-4-yl)silane (trans-addition product) was generated. However, the ratio between the cis and trans products changes with time. For example, when reaction was conducted for 1 hours at 20° C. (~8% conversion), the ratio between the cis and trans products is 2:1. The change of cis and trans ratio indicates a change of mechanism. We suggest that cis-bis($\eta^1$,$\eta^2$-2,2-dimethylpent-4-en-1-yl)platinum may be a catalyst itself, and it is also a pre-catalyst that can generate a more reactive catalyst with different selectivity.

Example 14 demonstrates that a likely broad scope of substrates can be used for hydrosilylation using the present catalyst/precatalyst. Example 14 also demonstrates that cis-bis($\eta^1$,$\eta^2$-2,2-dimethylpent-4-en-1-yl)platinum can be a precatalyst of a highly reactive catalyst.

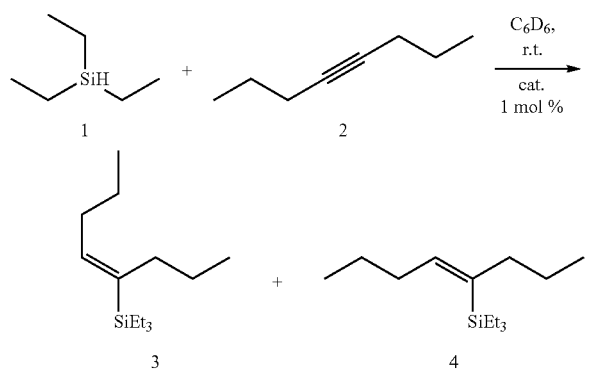

Example 15: Olefin Hydrosilylation with Slow-Release, Heat-Triggered Platinum(II) Dialkyl Catalysts Abstract: This example describe the synthesis, characterization, and catalytic hydrosilylation activity of platinum(II) dialkyl compounds of stoichiometry $PtR_2$, where R=$CH_2SiMe_2$(vinyl) (1) or $CH_2SiMe_2$(allyl) (2), and their 1,5-cyclooctadiene adducts $PtR_2$(COD), denoted 1-COD and 2-COD. This example also reports analogous studies of the related norbornadiene and dibenzo[a,e]cyclooctatetraene complexes 1-NBD, 1-DBCOT, and 2-DBCOT. The diolefin-free compounds 1 and 2, as well as 1-NBD and 2-DBCOT, are air- and water-sensitive, and decompose slowly at room temperature under argon; in contrast, both 1-COD and 2-COD are colorless liquids and 1-DBCOT is a pale yellow or colorless solid which are stable under ambient conditions. In 1 and 2, the ω-alkenyl ligands are bidentate chelates, whereas in the COD, NBD, and DBCOT adducts they are unidentate. At 20° C. and $0.5 \times 10^{-6}$-$5 \times 10^{-6}$ mol % catalyst loadings, 1-COD shows no hydrosilylation activity toward a number of olefin substrates even after several hours, but turnover numbers as high as 200,000 are seen after 4 h at 50° C. The amounts of isomerized (i.e., internal) olefins, olefin hydrogenation products, and dehydrogenative silylation products are comparable to or smaller than those seen for platinum(0) carbene catalysts. The high turnover numbers and the latent reaction kinetics seen for 1-COD make this compound a potentially useful precatalyst for injection molding or solvent-free hydrosilylation applications. This example further shows that addition of small amounts (0.1 mol % per silane) of a consumable olefin inhibitor such as norbornadiene (NBD) or 1,3-divinyl-1,1,3,3-tetramethyldisiloxane (DVTMS) significantly increases the latency while maintaining the fast rate of catalyst activation at the end of the latency period. The triggerable behavior, the high turnover number, and the high anti-Markovnikov selectivity is a result of 1-COD being a slow-release pre-catalyst that disfavors the formation of colloidal Pt, which is known to cause side reactions.

Introduction: Hydrosilylation reactions are widely employed in the production of functional polymers,[1-2] for applications such as automotive gaskets, paper release coatings, pressure sensitive adhesives, and injection molded parts.[3] One major challenge in making cross-linked silicone is to design catalyst systems that exhibit near-zero rates of hydrosilylation under ambient conditions, but very fast rates during the curing step.[1-2] In addition, because the catalysts generally cannot be removed after curing, low catalyst loadings are also required so as to reduce catalyst costs and to minimize color in the product. Several strategies have been adopted to achieve these goals, including the use of catalyst inhibitors, catalyst encapsulants, photogenerated catalysts, and dormant precatalysts; such systems are inactive until triggered by heat or light.[1-2] All these approaches have their limitations.

This example describes here our efforts to carry out triggerable hydrosilylation catalysis at low temperatures (≤100° C.) and low catalyst loadings, with near-zero catalytic activity at room temperature. Our approach is to employ an inert Pt compound which does not convert into an active catalyst[4] at room temperature (or does so very slowly) but converts quickly and efficiently when heated.

Included here are compounds of stoichiometry $PtR_2$(COD), which is a pre-catalyst ($PtR_2$) that is bound to a strongly coordinating inhibitor, in this case 1,5-cyclooctadiene (COD). For example, we chose the R groups to be vinyl- and allyl-substituted neosilyl groups, $CH_2SiMe_2CH=CH_2$ and $CH_2SiMe_2CH_2CH=CH_2$. The steric hindrance of these alkyl groups disfavors the reaction of $PtR_2$(COD) with silane,[5] but the presence of the terminal vinyl or allyl groups, these ligands can promote the conversion of the $PtR_2$(COD) compounds (in which the ligands are unidentate) into $PtR_2$ compounds (in which they are bidentate); the latter are highly reactive and efficiently convert into the actual catalyst.

Such an activation mechanism has several advantages: First, the relatively "slow-release" nature of catalyst generation reduces the concentration of active catalyst in solution, and thus disfavors association of the monomeric catalytic centers into colloidal Pt particles.[6] Second, the concentration of catalyst is low at the start of the catalysis, when the concentrations of the reactants are high, which allows a better control of the exotherm. Third, the multiple-step activation process allows further tuning of activation kinetics. For example, consumable inhibitors may be introduced to tune the catalyst activation processes and make the reaction autoinductive (in an autoinductive reaction, the reaction products increase the reactivity of the catalyst, rather than directly converting reactants to products),[7] so that the difference of reactivity between high temperature and low temperature in a given period of time can be further improved. Finally, whereas inhibitors are widely used in industry,[1] the effect of inhibition will be more effective in the present design because the target of the inhibitor is only a small fraction of the metal centers instead of the entire catalyst charge.

Accordingly, this example includes studies of compounds of stoichiometry PtR$_2$, where R is —CH$_2$SiMe$_2$CH=CH$_2$ (1) or —CH$_2$SiMe$_2$CH$_2$CH=CH$_2$ (2), and related PtR$_2$(COD) compounds where R is —CH$_2$SiMe$_2$CH=CH$_2$ (1-COD) or —CH$_2$SiMe$_2$CH$_2$CH=CH$_2$ (2-COD). The compound 1-COD is highly soluble in organic solvents and silicone oligomers, and is stable under ambient conditions. We also report the synthesis of the related norbornadiene complex 1-NBD and dibenzo[a,e]cyclooctatetraene complexes 1-DBCOT and 2-DBCOT.

Consistent with the discussion above, the conversion of 1-COD to an active hydrosilylation catalyst involves three steps (FIG. 16): (1) dissociation of the bound inhibitor (COD) from 1-COD to generate an unstable Pt$^{II}$ alkyl intermediate 1, (2) efficient conversion of the unstable Pt$^{II}$ alkyl intermediate 1 to the Pt$^0$ species, and (3) conversion of Pt$^0$ to a Pt$^{II}$ hydride[4] catalyst by reaction with silane. Addition of inhibitors can reduce the rate of step 2 or step 3, whereas generation of active catalyst consumes inhibitors, accelerates step 2 and step 3, and introduces autoinductive character in catalyst activation. We found that 1-COD is catalytically inactive for hydrosilylation over hours at ~20° C., whereas catalytic turnovers as high as 200,000 are at 50° C. over 30 min.

Results:

Synthesis of the Platinum Precatalysts.

Treatment of PtCl$_2$(SMe$_2$)$_2$ with two equiv of a dimethyl(vinyl)silylmethyl or dimethyl(allyl)silylmethyl Grignard reagent generates the new homoleptic platinum(II) compounds PtR$_2$, where R is —CH$_2$SiMe$_2$CH=CH$_2$ (1) or —CH$_2$SiMe$_2$CH$_2$CH=CH$_2$ (2). Compound 1 is a low melting, thermally-sensitive liquid that decomposes within a few hours at room temperature under argon; compound 2 is a low melting, thermally-sensitive solid that decomposes within a week at room temperature under argon.

Similar treatment of the 1,5-cyclooctadiene starting material PtCl$_2$(COD) gives related platinum(II) alkyls of stoichiometry PtR$_2$(COD) where R is —CH$_2$SiMe$_2$CH=CH$_2$ (1-COD) or —CH$_2$SiMe$_2$CH$_2$CH=CH$_2$ (2-COD). Both compounds are colorless liquids, stable towards air and water, and can be stored indefinitely at –20° C. in air. A TGA experiment shows that 1-COD decomposes thermally at ~100° C. As expected, the vinyl and allyl groups on silicon are coordinated to Pt in the PtR$_2$ compounds 1 and 2, but are not coordinated to Pt in the adducts 1-COD and 2-COD.

An alternative way to synthesize 1-COD is by treatment of the vinylic PtR$_2$ complex 1 with COD; 1 reacts similarly with dibenzo[a,e]cyclooctatetraene (DBCOT) to form 1-DBCOT and with norbornadiene to generate the adduct 1-NBD (FIG. 17). Unlike 1-COD or 1-DBCOT, however, 1-NBD is heat- and air-sensitive: it darkens in air within several minutes at room temperature. Similarly, treatment of the allylic PtR$_2$ compound 2 with DBCOT generates 2-DBCOT; solid samples of this latter compound are stable in air at –20° C. Unidentate olefins (such as cyclooctene), acyclic dienes (such as 1,3-divinyltetramethyldisiloxane), and alkynes (such as diphenylacetylene) do not form isolable adducts with 1.

Compounds 1-COD[8] and 1-NBD[9] have been described previously; the other compounds described here are new.

Crystal Structure of the PtR$_2$ Complex 2.

Single crystals of the PtR$_2$ compound 2 (whose Si atoms bear allyl groups) suitable for an X-ray diffraction study were grown by concentrating a pentane solution of 2 at –78° C. Crystal data are given in Table 1, and bond distances and angles are summarized in Table 2. Like its carbon analog Pt(CH$_2$CMe$_2$CH$_2$CH=CH$_2$)$_2$, 2$^C$, compound 2 is monomeric in the solid state (FIG. 26). The Pt center is attached to two ω-alkenyl ligands in which the α-carbon atom is sigma-bound to platinum ($\eta^1$) and the C=C bond at the other end of the chain is pi-bound ($\eta^2$). The C=C bond distance of 1.360(6) Å is similar to the 1.366(3) Å distance seen for 2$^C$; the distance is relatively long and suggests that the C=C bond is weakly coordinated to Pt. The Pt—C$_{olefin}$ distances to the methine and methylene carbon atoms in 2 are longer by 0.07 and 0.04 Å, respectively, compared to those in 2$^C$.

TABLE 1

| Crystallographic Data | | | |
|---|---|---|---|
| | 2 | 1-DBCOT | 2-DBCOT |
| formula | C$_{12}$H$_{26}$PtSi$_2$ | C$_{26}$H$_{34}$PtSi$_2$ | C$_{28}$H$_{38}$PtSi$_2$ |
| FW (g mol$^{-1}$) | 421.60 | 597.80 | 625.85 |
| λ (Å) | 0.71073 | 0.71073 | 0.71073 |
| Z (K) | 100 | 100 | 100 |
| crystal system | Tetragonal | Triclinic | Triclinic |
| space group | Pna2$_1$ | P$\bar{1}$ | P$\bar{1}$ |
| a (Å) | 13.8983 (3) | 10.9308 (5) | 11.0945 (2) |
| b (Å) | 11.0296 (2) | 11.8807 (5) | 13.4530 (3) |
| c (Å) | 20.5169 (5) | 19.6447 (8) | 19.6142 (4) |
| α (deg) | 90 | 85.3917 (12) | 102.1941 (5) |
| β (deg) | 90 | 105.3076 (10) | 105.3940 (5) |
| γ (deg) | 90 | 89.8408 (12) | 90.9984 (5) |
| V (Å$^3$) | 3145.09 (12) | 2508.12 (19) | 2750.39 (10) |
| Z | 8 | 4 | 4 |

TABLE 1-continued

Crystallographic Data

| | 2 | 1-DBCOT | 2-DBCOT |
|---|---|---|---|
| $\rho_{calc}$ (g cm$^{-3}$) | 1.781 | 1.583 | 1.511 |
| $\mu$ (mm$^{-1}$) | 9.05 | 5.70 | 5.20 |
| R(int) | 0.050 | 0.040 | 0.027 |
| abs corr method | multi-scan | numerical | numerical |
| min/max transm factors | 0.551/0.746 | 0.993/0.325 | 0.746/0.605 |
| data/restraints/params | 7849/1/358 | 12416/3/575 | 13652/12/608 |
| GOF on $F^2$ | 1.159 | 1.050 | 1.114 |
| $R_1$ [I > 2σ(I)]$^a$ | 0.0136 | 0.0251 | 0.0219 |
| $wR_2$ (all data)$^b$ | 0.0274 | 0.0505 | 0.0490 |
| max/min Δ$\rho_{electron}$ (eÅ$^{-3}$) | 0.40/−0.78 | 0.99/−1.46 | 1.68/−1.48 |

$^a R_1 = \Sigma ||F_o| - |F_c||/| \Sigma |F_o|.\ ^b wR_2 = [\Sigma w(F_o^2 - F_c^2)^2/\Sigma(F_o^2)^2]^{1/2}.$

TABLE 2

Selected Bond Distances for some PtR$_2$ and PtR$_2$(COD) complexes.$^a$

| | 2 | 2$^C$ | 3-COD$^{28}$ | 1-DBCOT | 2-DBCOT | 4 |
|---|---|---|---|---|---|---|
| Alkenyl C=C/Å | 1.360(6) | 1.366(3) | N/A | 1.328(5) | 1.315(6) | 1.374(5) |
| Pt—C$_\alpha$/Å | 2.065(4) | 2.058(2) | 2.070(8) | 2.068(3) | 2.056(5) | 2.077(3) |
| Pt—C$_{olefin}$$^b$/Å | 2.370(4) | 2.301(2) | N/A | N/A | N/A | 2.267(3) |
| Pt—C$_{olefin}$$^c$/Å | 2.266(4) | 2.250(2) | N/A | N/A | N/A | 2.258(3) |
| C$_\alpha$—Si$_\beta$/Å | 1.842(4) | 1.544(7) | 1.870 (10) | 1.873(3) | 1.864(4) | 1.870(3) |
| Si$_\beta$—C$_\gamma$/Å | 1.888(5) | 1.534(8) | 1.870 (10) | 1.876(4)$^e$ | 1.893(5) | 1.878(3) |
| C$_\gamma$—Si$_\delta$/Å | N/A | N/A | N/A | N/A | N/A | 1.856(3) |
| Pt—C$_\alpha$—Si$_\beta$° | 104.1(4) | 110.7(5) | 115.1(4) | 113(1) | 117(1) | 112.0(8) |
| C$_\alpha$—Si$_\beta$—C$_\gamma$ | 100.7(2) | 106.6(2) | — | 112(2) | 109(1) | 108.3(6) |

$^a$Some of the numbers given are averages over chemically-equivalent bonds.
$^b$Methine carbon,
$^c$Methylene carbon.
$^d$C$_\alpha$—C$_\beta$ or C$_\beta$—C$_\gamma$ bond.
$^e$Me—Si bond.

Some differences between the structure of 2 and that of the carbon analog 2$^C$ arise from the presence of the larger silicon atom. Owing to the larger bite size of the chelating ring, the C=C bonds are tilted by only 15° from being perpendicular to the Pt square plane (vs. 30° in 2$^C$). The C$_\alpha$—Si—C$_\gamma$ bond angle of 100.7(2)° in 2 is significantly smaller than the C$_\alpha$—C$_\beta$—C$_\gamma$ bond angle of 106.6(2)° in 2$^C$; the closing of this angle shows that the silicon atom accommodates more of the ring strain caused by the chelation of the ω-alkenyl ligand. For similar reasons, the Pt—C$_\alpha$—Si bond angle of 104.1(4)° in 2 is smaller than the Pt—C$_\alpha$—C$_\beta$ bond angle of 110.7(5)° in 2$^C$.

Interestingly, the Si—C bond distances in 2 are not all the same: with respect to the Si-Me bond distances of 1.872(5) Å, the Si—C$_\alpha$ distance of 1.842(4) Å is slightly shortened and the Si—C$_\gamma$ distance of 1.888(5) Å is slightly elongated. These changes in the Si—C$_\alpha$ and Si—C$_\gamma$ distances can be attributed to hyperconjugation effects. The Si—C$_\gamma$ bond and the C=C π bond of the allyl group are related by a torsion angle of 93°; therefore, the C=C π and π* orbitals are oriented so they can overlap with the Si—C$_\gamma$ σ and σ* orbitals. The resulting hyperconjugation (the β-silicon effect) lengthens the latter bond.[10-17] In 2, the hyperconjugation interaction may also stabilize the positive charge on the olefinic methine carbon atoms (induced by the unsymmetric coordination of the olefin to Pt).[18] For comparison, even longer (~1.895-1.930 Å) Si—CH$_2$ bonds β to a positively-charged π-system have been seen in several (trimethylsilylmethyl)pyridinium salts.[19-22]

In addition, the small Pt—C$_\alpha$—Si bond angle of 104° means that the Pt—C$_\alpha$ and C$_\alpha$—Si bonds are nearly perpendicular to one another. As a result, the Pt—C$_\alpha$ σ and σ* orbitals can mix with the C$_\alpha$—Si π and π* orbitals through an α-silicon effect,[23-26] so that the Si—C$_\alpha$ bond acquires partial double bond character. Taken together, the α- and β-silicon effects can be represented as follows, in which the hyperconjugated resonance form corresponds to a platinum (II) allyl/silene structure:

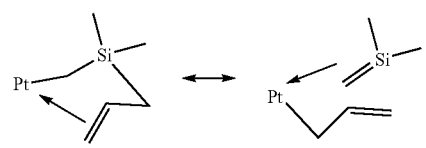

We believe these changes in the Si—C$_\alpha$ bond lengths are relevant to the chemical properties of 1, 2, and some related compounds.[27].

Crystal Structures of the Adducts 1-DBCOT and 2-DBCOT.

Single crystals of the dibenzo[a,e]cyclooctatetraene adducts 1-DBCOT and 2-DBCOT were grown from pentane at −20° C. and from its melt at 4° C., respectively. Crystal data are given in Table 1, and selected bond distances and angles are summarized in Table 2. X-ray crystallography shows that, in these two compounds, the C=C bonds are not coordinating to platinum and the alkyl groups are unidentate as expected (FIGS. 27A-27B). In the vinyl compound 1-DBCOT, the Si-Me and Si—CH$_2$ bond distances are all normal (1.870(10) Å), as is seen in the closely related compound Pt(CH$_2$SiMe$_3$)$_2$(COD).[28] In contrast, in the allyl compound 2-DBCOT, the Si—C bond distance of 1.893(5) Å is elongated as seen in 2, whereas the Si—Me (1.869(8) Å) and Si—$C_\alpha$ distances (1.864(4) Å) are normal. The elongation of Si—C bonds in both dimethyl(allyl)silylmethyl platinum compounds 2 and 2-DBCOT again are due to hyperconjugation[23] between the C═C bond and the Si—$C_\gamma$ bond: in the crystal structure of both 2 and 2-DBCOT, the Si—$C_\gamma$ bonds are both essentially perpendicular to the allyl plane. The Pt—$C_\alpha$—Si bond angle of 117(1)° in 2-DBCOT is similar to those of 112(2)° 1-DBCOT in and 115.1(4)° in 3-COD. These large angles, and the absence of the shortening of Si—$C_\alpha$ bond, are consistent with the conclusion that a α-silicon effect is operating in 1, 2, and some related compounds.[27]

Solution Properties of the $PtR_2$ Compounds 1 and 2.

In solution, the $PtR_2$ compounds 1 and 2 both exhibit two resonances in the $^{195}$Pt NMR spectra, which are present in a ~7:1 ratio for the Si-vinyl complex 1 and ~2:1 ratio for the Si-allyl complex 2 (FIGS. 23A-23B). This phenomenon is consistent with our previous observations for the carbon analogs, in which there are two isomers in solution, one of $C_2$ symmetry and one of $C_s$ symmetry. In the carbon analogs of these compounds, the minor $C_s$ isomer is more stable if the chain is short (four atoms, so that the two olefin groups are far apart) or long (six atoms, so that the two olefinic groups can orient perpendicular to the Pt square plane). For intermediate chain lengths, the $C_s$ isomer is disfavored because the chains are long enough for the two olefin groups to clash sterically, but not long enough for them to twist into the perpendicular conformation.

alkenes, and the absence of Pt—H or Pt—C couplings to these atoms, clearly show that—unlike the $PtR_2$ compounds 1 and 2—the terminal C═C bonds in the ω-alkenyl ligands are not coordinated to Pt. As seen in other $Pt^{II}$ alkyls, there are long-range $^3J_{PtC}$ couplings[35-36] of ca. 30 Hz to the vinyl Si—CH═ carbon in 1-COD, the allylic Si—$CH_2$ carbon in 2-COD, and to the Si-Me carbon atoms in both compounds.

Unlike their carbon analogs $Pt(CH_2CMe_2CH═CH_2)_2$ (COD) and $Pt(CH_2CMe_2-CH_2CH═CH_2)_2$(COD), which readily release COD in solution and form the COD-free $PtR_2$ compounds,[29] 1-COD and 2-COD are stable in solution and very little (<5%) of the bound COD ligands are dissociated at room temperature. The higher binding strength of COD to 1 and 2 relative to their carbon analogs may be ascribed in part to the reduced steric size of unidentate $CH_2SiR_3$ vs. $CH_2CR_3$ groups, although electronic factors such as the lower trans influence[8,37] of unidentate $CH_2SiR_3$ vs. $CH_2CR_3$ groups may also play a role. For comparison, the thermodynamic parameters for the dissociation of COD from the carbon analog $Pt(CH_2CMe_2CH═CH_2)_2$(COD) are ΔH=5±1 kcal/mol and ΔS=29±5 cal/(mol·K).[29]

Like their COD analogues, the DBCOT compounds 1-DBCOT and 2-DBCOT show little dissociation of DBCOT. In contrast, 1-NBD partially dissociates in benzene-$d_6$ at room temperature to form 1 and NBD (see SI); this behavior that probably is related to the higher air and thermal sensitivity of 1-NBD compared to 1-COD. The stability of 1-NBD can be increased by adding excess NBD

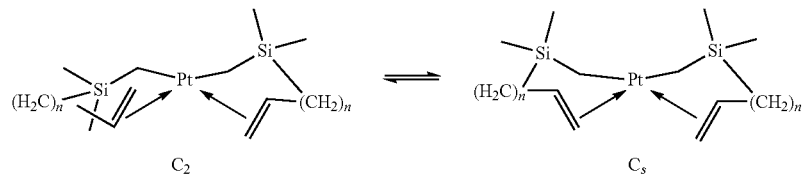

$C_2$          $C_s$

Relative to the carbon analog $2^C$, the larger bite angle for the ligands in 2 enables the olefin C═C vector to orient more nearly perpendicular to the Pt square plane. This difference reduces the steric clashing between the olefinic groups in 2, which makes the energies of the $C_2$ and $C_s$ isomers more similar: the $C_2$:$C_s$ ratio is 2:1 for 2 vs. >100:1 for $2^C$. In contrast, the larger bite angle for the ligands in 1 vs. $1^C$ brings the two olefinic groups closer to one another so that they interact more strongly and make the energies of the $C_2$ and $C_s$ isomers more different: the $C_2$:$C_s$ ratio is 7:1 for 1 vs. 2:1 for $1^C$.

Solution Properties of the $PtR_2$(COD), $PtR_2$(NBD), and $PtR_2$(DBCOT) Compounds.

For the $PtR_2$(diene) compounds, the similarity of the olefinic $^1$H and $^{13}$C NMR chemical shifts to those of free to disfavor the dissociation: a solution of 1-NBD is indefinitely stable in air at −20° C. in the presence of 160 equiv of NBD.

The bonding strengths of these three dienes to the $PtR_2$ fragment can be assessed from their trans influence as deduced from the $^1J_{PtC}$ coupling constant for α-$CH_2$ carbon of the alkyl groups (Table 3). This coupling constant, which increases in the order of 1-DBCOT (694.9 Hz)<1-COD (704.9 Hz)<1-NBD (748.8 Hz), suggests that the Pt-diene bonding strength decreases in the same order, with the bonding to DBCOT and COD being similar and much stronger than to NBD.

TABLE 3

Selected $^1$H and $^{13}$C NMR data for the alkenyl ligands in 1, 2, 1-COD, 1-NBD, and 2-COD.

|  | $1^a$ | $2^b$ | 1-COD$^c$ | 1-NBD$^c$ | 1-DBCOT$^c$ | 2-COD$^c$ | 2-DBCOT$^c$ |
|---|---|---|---|---|---|---|---|
| $^1$H δ (α-$CH_2$) | 1.30, 0.18 | 1.44, 0.68 | 1.18 | 1.31 | 1.36 | 1.08 | 1.29 |
| $^1$H $^2J_{PtH}$ α-$CH_2$/Hz | 71, 90 | 37, 102 | 92.9 | 102.2 | 93.0 | 93.4 | 93.6 |
| $^1$H δ (—CH═) | 4.23 | 4.74 | 6.52 | 6.52 | 6.49 | 6.07 | 6.04 |
| $^1$H δ (═$CH_2$) | 4.27, 3.58 | 3.31$^d$, 3.51 | 6.00, 5.84 | 6.02, 5.85 | 5.95, 5.79 | 5.03 | 5.00 |
| $^1$H $^3J_{HH}$ (olefinic)/Hz | 18.0, 11.2 | 16$^d$, 8.6 | 20.2, 14.5 | 20.2, 14.5 | 20.3, 14.5 | multiplet | multiplet |
| $^{13}$C δ (α-$CH_2$) | −0.79 | 15.68 | 11.75 | 14.89 | 20.25 | 11.52 | 19.83 |
| $^{13}$C $^1J_{PtC}$ (α-$CH_2$)/Hz | 557 | 726 | 704.9 | 748.8 | 694.9 | 706.5 | 694.0 |

TABLE 3-continued

Selected $^1$H and $^{13}$C NMR data for the alkenyl ligands in 1, 2, 1-COD, 1-NBD, and 2-COD.

| | 1[a] | 2[b] | 1-COD[c] | 1-NBD[c] | 1-DBCOT[c] | 2-COD[c] | 2-DBCOT[c] |
|---|---|---|---|---|---|---|---|
| $^{13}$C δ (—CH=) | 90.44 | 114.05 | 144.60 | 144.64 | 143.87 | 136.97 | 136.66 |
| $^{13}$C δ (=CH$_2$) | 93.10 | 83.05 | 128.94 | 129.22 | 129.58 | 112.29 | 112.61 |
| $^{13}$C $^1J_{PtC}$ (—CH=)/Hz | ~8 | 15 | 27.0[e] | 29.6[e] | 24[e] | 0 | 0 |
| $^{13}$C $^1J_{PtC}$ (=CH$_2$)/Hz | 46 | 49 | 0 | 0 | 0 | 0 | 0 |

[a]For the major (C$_2$) isomer in toluene-d$_8$ at −50° C.
[b]For the major (C$_2$) isomer in toluene-d$_8$ at −30° C.
[c]In benzene-d$_6$ at room temperature.
[d]Overlaps with a resonance from the minor isomer.
[e]This is a three-bond coupling ($^3J_{PtC}$).

The binding of dienes to Pt in the Si-allyl compounds 2-COD and 2-DBCOT is weaker than it is in the Si-vinyl counterparts compounds 1-COD and 1-DBCOT: when dissolved in benzene-d$_6$ solution, both 2-COD and 2-DBCOT slowly releases diene to form traces of 2 over several hours. This behavior is consistent with the higher stability of 2 compared to 1 as a result of the smaller ring strain.

Comparison of Hydrosilylation Activities of the PtR$_2$(COD) Compounds.

To begin our hydrosilylation studies, we first compared the ability of three PtR$_2$(COD) compounds to catalyze the same two hydrosilylation reactions. The three compounds are:

Pt(CH$_2$SiMe$_2$CH=CH$_2$)$_2$(COD) (1-COD)
Pt(CH$_2$SiMe$_2$CH$_2$CH=CH$_2$)$_2$(COD) (2-COD)
Pt(CH$_2$SiMe$_3$)$_2$(COD) (3-COD)

The compound 3-COD[28] was chosen in order to determine whether the vinyl and allyl groups in 1-COD and 2-COD play an important role.

All three compounds were assessed for their ability to catalyze the hydrosilylation of allyl glycidyl ether (AGE) with two silanes: HSiEt$_3$ and HSiMe(OSiMe$_3$)$_2$ (MD'M). In a preliminary trial, two equiv of olefin were used unless otherwise specified, so as to ensure full conversion of the silane. Catalyst loadings were 5×10$^{-5}$ mol % Pt unless otherwise specified. The reactions were all conducted without solvent (i.e., neat).

The results are summarized in Table 4. At room temperature, all three precatalysts show essentially no activity after 1 h. At higher temperatures, however, 1-COD and 2-COD are highly active: the reaction of the silane with AGE to hydrosilylated products is complete within 2 h at 60° C. for HSiEt$_3$, and within 4 h at 50° C. for MD'M. In contrast, 3-COD is essentially inactive: the conversion of HSiEt$_3$ to hydrosilylated products is only 12% complete after 2 h at 60° C. This result shows that the Si-vinyl and Si-allyl groups in 1-COD and 2-COD facilitate the generation of the active catalyst, most likely by assisting in the dissociation of the COD ligands, which we know occurs in solution.

TABLE 4

Hydrosilylation of allyl glycidyl ether (AGE) with Pt(CH$_2$SiMe$_2$CH=CH$_2$)$_2$(COD) (1-COD), Pt(CH$_2$SiMe$_2$CH$_2$CH=CH$_2$)$_2$(COD) (2-COD), and Pt(CH$_2$SiMe$_3$)2(COD) (3-COD) as the precatalyst.

| Catalyst | Silane | Mol olefin/mol silane | Cat loading (10$^{-6}$ mol %) | Temp (° C.) | Conversion of silane |
|---|---|---|---|---|---|
| 1-COD | HSiEt$_3$ | 2 | 50 | 17 | NR after 1 h |
| 2-COD | HSiEt$_3$ | 2 | 50 | 17 | NR after 1 h |
| 3-COD | HSiEt$_3$ | 2 | 50 | 17 | NR after 1 h |
| 1-COD | HSiEt$_3$ | 2 | 50 | 60 | 82% after 1 h, 99% after 2 h |
| 2-COD | HSiEt$_3$ | 2 | 50 | 60 | 64% after 1 h, 99% after 2 h |
| 3-COD | HSiEt$_3$ | 2 | 50 | 60 | 12% after 2 h |
| 1-COD | MD'M | 2 | 50 | 17 | <5% after 24 h |
| 1-COD | MD'M | 1 | 50 | 17 | NR after 30 min, 4% after 4 h, 100% after 24 h |
| 2-COD | MD'M | 2 | 50 | 17 | NR after 30 min, 5% after 4 h, 48% after 24 h |
| 1-COD | MD'M | 2 | 50 | 50 | 47% after 30 min, 100% after 4 h |
| 2-COD | MD'M | 2 | 50 | 50 | 71% after 30 min, 100% after 4 h |
| 1-COD | MD'M | 2 | 5 | 50 | 62% after 30 min, 100% after 4 h |
| 2-COD | MD'M | 2 | 5 | 50 | ~NR after 30 min, 10% after 4 h, 13% after 24 h |

Of these three compounds, 1-COD has the longest latency under ambient conditions, and is the most catalytically active at lower loadings: for hydrosilylation of AGE and MD'M at 50° C. and 5 ppm loadings, the conversion is 100% complete after 4 h for 1-COD but only 10% complete for 2-COD. In addition, 1-COD shows excellent regioselectivity for anti-Markovnikov products, and generates almost no olefin hydrogenation or isomerization products, as we will discuss in more detail in the next section.

Substrate Scope for Hydrosilylation Catalysis by 1-COD.

We find that 1-COD catalyzes the hydrosilylation of a wide variety of olefins at moderate temperatures (50-80° C.), whereas very little catalysis occurs at room temperature over 4 h; the standard conditions used were neat (no solvent), a catalyst loading of $5\times10^{-6}$ mol % (per Si—H bond), and 2 equiv. of olefin per silane to ensure full conversion of silane and minimize effects due to isomerization of the olefin (Table 5). Reactions were also carried out with 1 equiv. of olefin per silane to study the reaction behavior under conditions likely to be employed commercially (Table 6).

TABLE 5

Hydrosilylation of different olefin substrates with MD'M and 1-COD.

| Olefin substrate[a] | Cat. loading ($10^{-6}$ mol %) | Temp (° C.) | Conversation after reaction time of | | | selectivity |
|---|---|---|---|---|---|---|
| | | | 30 min | 4 h | 24 h | |
| allyl glycidyl ether | 5 | 50 | 47% (1 h) | >99% | >99% | 5/1[c] |
| allyl glycidyl ether | 5 | 80 | 98% | >99% | >99% | 7.7/1[c] |
| vinylcyclohexene oxide | 5 | 50 | 79% | >99% | >99% | >20/1[c] |
| 1-octene | 5 | 17 | 0% | 3% | 11% | — |
| 1-octene | 5 | 50 | 51% | 95% | 99% | >20:1[c] |
| 1-octene | 5 | 80 | 97% | >99% | >99% | >20:1[c] |
| 2-methyl-3-butyn-2-ol | 5 | 50 | 0% | 0% | <2% | — |
| 2-methyl-3-butyn-2-ol | 50 | 50 | 3% | 12% | 33% | 2/1[b] |
| 2-methyl-3-butyn-2-ol | 5 | 80 | 6% | 24% | 40% | 2/1[b] |
| allyl methacrylate | 5 | 50 | 0% | 24% | 51% | 1.4/1[d] |
| allyl methacrylate | 50 | 50 | 23% | 97% | 99% | 1.4/1[d] |
| vinyl Si(OMe)$_3$ | 5 | 50 | 0% | 12% | 12% | 7.5/1[b] |

TABLE 5-continued

Hydrosilylation of different olefin substrates with MD'M and 1-COD.

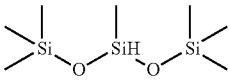

| Olefin substrate[a] | Cat. loading (10⁻⁶ mol %) | Temp (° C.) | Conversation after reaction time of | | | selectivity |
|---|---|---|---|---|---|---|
| | | | 30 min | 4 h | 24 h | |
| 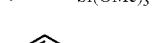 Si(OMe)₃ | 50 | 50 | 1% | 69% | 69% | 7.3/1[b] |
| 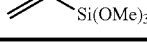 Si(OMe)₃ | 5 | 80 | 13% | 73% | 73% | 7.5/1[b] |

[a]Two equiv. of olefin per silane used unless otherwise specified.
[b]Ratio of anti-Markovnikov to Markovnikov hydrosilylation product.
[c]Ratio of anit-Markovnikov hydrosilylation product to internal olefin isomerization products; the Markovnikov hydrosilylation product is not formed.
[d]Ratio of anti-Markovnikov hydrosilylation product to the allyloxy silyldealkylation product 1,1,1,3,5,5,5-heptamethyltrisiloxan-3-yl methacrylate, which is generated along with propene; the Markovnikov hydrosilylation product is not formed.
[e]1 equiv. olefin per silane used.

TABLE 6

Solvent free hydrosilylation of different substrates with MD'M (1 equiv.) and 1-COD (5 × 10⁻⁶ mol % loading).

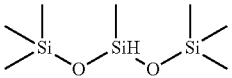

| Olefin substrate | Mol olefin/ mol silane | Temp (° C.) | Conversation after reaction time of | | | Isolated yield | specificity |
|---|---|---|---|---|---|---|---|
| | | | 30 min | 4 h | 24 h | | |
|  | 1 | 17 | 0.8% | 7% | 47% | — | — |
| 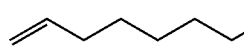 | 2 | 17 | 0 | 3% | 11% | — | — |
| 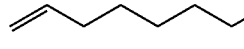 | 1 | 80 | 98%[a] | 98% | — | 93% | >20:1[c] |
|  | 2 | 80 | 97% | — | — | — | — |
| 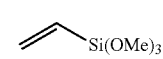 Si(OMe)₃ | 1 | 17 | 0 | 0.3% | 0.5% | — | — |
| 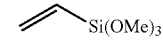 Si(OMe)₃ | 1 | 80 | 11% | 78% | 94% | 89% | 8.0:1[b] |
| 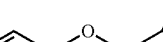 Si(OMe)₃ | 2 | 80 | 13% | 73% | 92% | — | — |
| 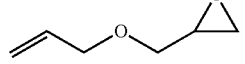 | 1 | 80 | 88%[a] | — | — | 83% | >20:1[c] |

[a]Full conversation of olefin starting material; 2% of the olefin isomerizes to form internal olefins.
[b]Ratio of the anti-Markovnikov to Markovnikov hydrosilylation products.
[c]Ratio of anti-Markovnikov hydrosilylation product to internal olefin isomerization products; the Markovnikov hydrosilylation product is not formed.

With MD'M as the silane, the catalyst is active for the hydrosilylation of allyl glycidyl ether (AGE), vinylcyclohexene oxide (VCE), 1-octene, vinyltrimethoxysilane (VTMOS), and allyl methylmethacrylate (AMA). The reaction mixtures remain colorless even at full conversion.

The high viscosity of oligomeric and polymeric samples does not significantly affect the reactivity of 1-COD. When $5 \times 10^{-5}$ mol % Pt (per Si—H) of 1-COD is added to a 1:1 mixture of $CH_2$=$CHSiMe_2(OSiMe_2)_5SiMe_2CH$=$CH_2$ ($M^{Vi}D_5M^{Vi}$) and $HSiMe_2(OSiMe_2)_{100}SiMe_2H$ ($M'D_{100}M'$), at room temperature there is no sign of reaction after 24 h, and only 30% conversion of silane is observed after 7 days. When the mixture is heated to 80° C., however, the reaction goes to completion in 4 h. At full completion, there is no coloration due to colloidal Pt (FIG. 28). The product polymer has a number-average molecular weight $M_n$ of 146 kD, a weight-average molecular weight Mw of 275 kD and polydispersity index PDI of 1.88.

Unlike the results typically seen for the industry-standard Karstedt's catalyst, olefin reduction or isomerization products are nearly absent, and the anti-Markovnikov selectivity and yield of the hydrosilylation products seen for 1 are comparable to or better than those reported for Pt NHC complexes,[38–39] and at much lower Pt loadings. The tendency of Karstedt's catalyst to form significant amounts of isomerization and/or reduction products is thought to be caused by multinuclear or colloidal platinum(0) species; the small amounts of these products and the absence of coloration[38] suggest that formation of colloidal Pt species is inhibited in this $PtR_2(COD)$ system.

For some olefins such as AGE, only the anti-Markovnikov hydrosilylation product is formed; the Markovnikov product is not seen because the relevant platinum alkyl intermediate undergoes rapid β-H elimination instead,[4] so that the internal olefin is the only other product generated.

Compared to reactions with 2 equiv. of olefin per silane, using 1 equiv. of olefin reduces the latency for the more reactive olefin substrates (1-octene or other aliphatic olefin substrates) at room temperature, but the less reactive substrates still show very long latency (Table 6). We will show that we can take advantage of the low reactivity of certain substrates to improve the latency of more reactive olefins.

For the alkyne dimethyl ethynylcarbinol (DMEC),[1] the conversions are slower. β-Alkynol species such as DMEC are known inhibitors of platinum-based hydrosilylation catalysts.[40]

The ease of synthesis and use, heat triggerable behavior, high catalytic activity and good anti-Markovnikov selectivity of 1-COD suggest that this compound would be useful for applications such as liquid injection molding and solvent-free hydrosilylation reactions.

Kinetics of Hydrosilylation Catalysis by 1-COD.

To further understand the catalytic mechanism, we carried out a time-dependent study of the hydrosilylation of AGE and triethylsilane by 1-COD at 60° C. with an olefin:silane: catalyst mole ratio of $2:1:2 \times 10^{-5}$. The reaction is characterized by an induction period: less than 5% conversion of silane has occurred after 20 min, but shortly thereafter the reaction accelerates quickly. The reaction rate reaches a maximum at 70 minutes, at which time 40% of the silane has been converted, then slows due to consumption of reactants. The reaction reaches >90% conversion of silane after 120 min. Overall, the curve describing the concentration of hydrosilylation products as a function of time has a sigmoidal shape (FIG. 29). These results indicate that 1-COD itself is not a hydrosilylation catalyst, but instead is a pre-catalyst.

Mechanism of Catalyst Activation.

The active species in $Pt^{II}$-catalyzed hydrosilylation reactions are believed to be molecular $Pt^0$ species, which convert into $Pt^{II}$ silyl/hydride intermediates by non-rate determining oxidative addition of silane.[4] The conversion of 1-COD to a $Pt^0$ species could occur either by thermal decomposition, or by reaction with silane. To distinguish these possibilities, we heated a mixture of 1-COD and olefin (2 equiv. per silane) for 2 h at 75° C. (conditions under which the hydrosilylation reaction reaches competition if silane is present). The solution was then cooled to 20° C.; subsequent addition of silane and heating to 60° C. results in a catalytic rate that is identical to that seen without the preheating step. This finding, which is consistent with TGA data that indicate that 1-COD does not decompose thermally up to ~100° C., suggests that thermal decomposition of 1-COD is not the principal mechanism by which catalyst activation occurs.

The finding that 1-COD is a better hydrosilylation catalyst than the trimethylsilyl compound 3-COD suggests that the terminal C=C bonds in 1-COD are crucial for catalyst activation. One possibility is that terminal the C=C bonds facilitate the dissociation of COD to generate the highly reactive $PtR_2$ compound 1, and that 1 converts to the catalytically active $Pt^0$ species. The latter step could take place in two ways: by thermolysis of 1, or by reaction of 1 with the silane employed in the hydrosilylation catalysis. Independent studies show that activation does not occur by thermolysis of 1 because this reaction is very slow at room temperature; in contrast, the reaction of 1 with silane occurs readily at room temperature. We describe the latter reaction in the next section.

Reaction Between $PtR_2$ Compounds and Silanes.

Treatment of a solution of 1 in benzene-$d_6$ at 20° C. with 3 equiv of the silane $SiHMe(OSiMe_3)_2$ (MD'M) in the presence of excess diphenylacetylene (DPA) results in full conversion of 1 into $Pt(DPA)_2$ within 5 min. The organic byproducts (FIG. 30) consist of vinyltrimethylsilane, (H—$CH_2SiMe_2CH$=$CH_2$, 3-(dimethyl(vinyl)silylmethyl)-1,1,1,3,5,5,5-heptamethyltrisiloxane, $(Me_3SiO)_2MeSi$—$CH_2SiMe_2CH$=$CH_2$, and the hydrosilylation products of these two compounds. The two vinylsilane products can be viewed as being generated by the addition of an H atom or a $SiMe(OSiMe_3)_2$ group from MD'M, respectively, to the $CH_2SiMe_2CH$=$CH_2$ ligands of 1. Similar products were seen upon treatment of 2 with MD'M under the same conditions: $PtL_2$ is rapidly converted to $Pt(DPA)_2$, L-H, and L-$SiR_3$ within minutes. (FIG. 18)

The major organic products, L-H and L-$SiR_3$, suggest that the silane adds oxidatively to the $PtL_2$ species, after which the ligands L eliminate reductively to form a molecular $Pt^0$ species. Oxidative addition of silane was also previously reported to be the catalyst activation mechanism for $Pt(COD)(C≡CR)_2$ complexes.[2]

Addition of MD'M to the COD adducts 1-COD and 2-COD at 20° C. in the presence of excess diphenylacetylene (DPA) also generates 1 equiv each of $Pt(DPA)_2$, L-H, and L-$SiR_3$ (FIG. 31), but at a much slower rate. For example, for 1-COD, no reaction is observed in 10 min, and the yield to $Pt(DPA)_2$ is only 4% after 4 h, and 43% after 3 days. The slow rate of the conversion of 1-COD to $Pt^0$ is consistent with the relative catalytic inactivity of 1-COD at room temperature, and also with the hypothesis that the reaction of 1-COD with silane is the mechanism of catalyst activation. Quantitative analysis of reaction products using $^1H$ NMR spectrum suggest that reaction between MD'M and the COD adduct generates 1 equiv. each of $Pt(DPA)_2$, COD, L-H and L-$SiR_3$.

Kinetics of COD Dissociation.

We have shown that the conversion of 1-COD to molecular $Pt^0$ species occurs by reaction with silane. This step, however, is unlikely to the rate determining step for activation of the catalyst because it is fast at room temperature whereas catalyst activation requires heating. Because 3-COD is essentially inert despite being sterically less hindered than 1-COD, it is unlikely that silane reacts directly with 1-COD. As a result, we suggest that the generation of 1 from 1-COD is the rate determining step for the catalysis. The dissociation of COD would significantly reduce the steric hindrance around the Pt center and should accelerate the reaction with silane.

To better understand the COD dissociation process, we investigated the ligand substitution reaction between 1-COD and dibenzo[a,e]cyclooctatetraene, DBCOT. We find that, at 80° C., the reaction between 1-COD and 2 equiv. of DBCOT to form 1-DBCOT and COD reaches equilibrium within 15 min, the equilibrium constant for this exchange reaction is 1.3. The rate of ligand exchange is consistent with the kinetics of catalytic hydrosilylation reaction and the measured equilibrium constant is consistent with the relative bonding strength deduced from NMR studies.

To show that the ligand exchange between 1-COD and DBCOT is indeed initiated by dissociation of COD (not association of DBCOT), we studied the rate of conversion from 1-COD to 1-DBCOT as a function of the concentration of DBCOT. At 60° C. in benzene-$d_6$, the first order rate constant is independent of the concentration of DBCOT (FIGS. 32A-32B) clearly showing that the mechanism does not involve association of DBCOT before the rate determining step.

Fitting of the rate of COD dissociation at four different temperatures between 39.7 and 69.7° C. to the Eyring equation gives $\Delta H^{\ddagger}=21\pm1$ kcal mol$^{-1}$ and $\Delta S^{\ddagger}=-12\pm4$ cal mol$^{-1}$ K$^{-1}$. The negative entropy of activation suggests that the mechanism is associative. We suggest that the association of the C=C bonds in the alkenyl ligands to Pt is the rate determining step for COD dissociation. In all, the evidence demonstrates that the chelating complex 1 must be generated as a key intermediate in the catalysis.

The measured rate constant for COD dissociation matches well with the kinetics for catalyst activation. Extrapolating the Eyring plot gives a rate constant of $2.9\times10^{-6}$ s$^{-1}$ at 20° C., which corresponds to a 4% conversion in 4 h, 23% conversion in 25 h, and a $t_{1/2}$ of ~3 days. These numbers match well with those observed for the reaction between 1-COD and MD'M, for which the conversion percentages after 4 h, 25 h and 3 days were 4%, 21%, and 44%, respectively (FIG. 31). We also calculate that at 80° C. the $t_{1/2}$ is approximately 7 min. This value also matches well with the observed fast initiation of hydrosilylation reaction at this temperature.

The COD-DBCOT exchange rate for 2-COD is somewhat slower (Table 7), which is consistent with its slower rate of catalyst activation when heated. Fitting to Eyring equation gives $\Delta H^{\ddagger}=23\pm2$ kcal mol$^{-1}$ and $\Delta S^{\ddagger}=-6\pm5$ cal mol$^{-1}$·K$^{-1}$ for COD-DBCOT exchange.

TABLE 7

Rate of substitution of COD in 1-COD and 2-COD with DBCOD.

| T/° C. | Exchange rate (1-COD)/s$^{-1}$ | Exchange rate (2-COD)/s$^{-1}$ |
|---|---|---|
| 69.7 | $6.6 \times 10^{-4}$ | $4.1 \times 10^{-4}$ |
| 61.5 | $3.1 \times 10^{-4}$ | $1.6 \times 10^{-4}$ |
| 51.9 | $1.2 \times 10^{-5}$ | $5.2 \times 10^{-5}$ |
| 39.7 | $3.1 \times 10^{-5}$ | $1.4 \times 10^{-5}$ |

Kinetics of Catalyst Activation.

The above results show that 1-COD can be converted to a catalytically active molecular $Pt^0$ species by a three step process: (1) slow dissociation of the bound COD from 1-COD to generate an unstable $Pt^{II}$ alkyl intermediate 1. This step is slow and rate determining. (2) Fast oxidative addition of silane to the $Pt^{II}$ alkyl intermediate 1 to form a $Pt^{IV}$ silyl/hydride intermediate. (3) Fast reductive elimination of L-H and L-SiR$_3$ from the $Pt^{IV}$ silyl/hydride intermediate to form a molecular $Pt^0$ species (where L is the alkenyl ligand). Steps 2 and step 3 are highly efficient and lead to essentially quantitative conversion from 1 to $Pt^0$ species. The molecular $Pt^0$ species can be converted to a $Pt^{II}$ hydride[4] catalyst by reaction with silane, which is suggested to be a fast reaction.[4]

Applying static state assumption to the unstable $Pt^{II}$ alkyl intermediate 1, we can obtain the rate of catalyst activation as: rate=$k_1 k_2$[1-COD]/($k_{-1}+k_2$).

Thus, for a certain hydrosilylation reaction, without changing the loading of precatalyst, the rate of pre-precatatlyst activation can be tuned by changing $k_1$ (e.g., by changing COD to another diene), by changing $k_{-1}$ (e.g., by changing the amount of added COD), and also by changing $k_2$ (e.g., by adding an inhibitor to inhibit the coordination of silane). Alternatively, one can also use existing inhibition strategies, which are used for Karstedt's catalyst, to further inhibit the conversion of the $Pt^0$ species to a $Pt^{II}$ hydride.

Influence of Diene on Hydrosilylation: Hydrosilylation Activity of 1-NBD.

Further described here is the catalytic activity of the norbornadiene adduct 1-NBD, because NBD binds much more weakly than COD to Pt; furthermore, unlike COD, which remains mostly unreacted during hydrosilylation reaction because of rapid β-H elimination,[4] NBD can be consumed by hydrosilylation as a result of its higher ring strain. As a result, unlike COD, which poisons catalysis, NBD can be added in relatively large excess amount, and the latency of 1-NBD may be tuned by addition of different amounts of NBD.

The compound 1-NBD is thermally unstable at room temperature in the absence of excess NBD due to the facile dissociation to form free 1, making it a pre-catalyst with little latency. However, we find that this compound is stable for months at −20° C. in the presence of a large excess of this olefin. Thus, we carried out a time-dependent study of the hydrosilylation of AGE and triethylsilane at 60° C. The olefin:silane:catalyst mole ratio was 2:1:2×10$^{-5}$, and 160 equiv/Pt of NBD was present at t=0. We find that, under these conditions, there is a 20 min induction period, during which little hydrosilylation of AGE takes place. However, during this period, the concentration of free NBD is falling because it is being hydrosilylated. Interestingly, when the excess NBD disappears from the solution, the induction period ends and the reaction rate begins to accelerate quickly. The overall result is that distinctly sigmoidal reaction kinetics are observed for 1-NBD (FIG. 28). Relative to catalysis by 1-COD, the catalytic rate accelerates more quickly for 1-NBD after the induction period ends. Presumably, this difference arises because NBD is a weaker ligand for Pt, and because, unlike other cyclic olefins which do not undergo hydrosilation due to rapid β-H elimination,[4] NBD can be consumed by hydrosilylation as a result of its higher ring strain.

Influence of Inhibitors.

Described elsewhere herein is that the latency at room temperature is much shorter for aliphatic olefin substrates than it is for vinylsilanes. In order to increase the latency of the more reactive aliphatic olefins, less reactive olefins may be used as consumable inhibitors. When triggered by heat, these less reactive olefins can be rapidly consumed by hydrosilylation, and eventually their inhibitory effect disappears. As a result, this strategy can result in non-linear autoinductive kinetics for catalyst activation. Indeed, with 0.1 mol % (per silane) of added NBD or 1,3-divinyl-1,1,3,3-tetramethyldisiloxane (DVTMS), rapid conversion can still be reached at 80° C., while the latency increased from <0.5 h to >4 h at room temperature (Table 8). It is likely that these strongly coordinating inhibitors function either by inhibiting the reaction between silane and 1, or they stabilize the Pt⁰ intermediate and slow the reaction with silane (see next section). Because the Pt⁰ is generated in situ from a slow release catalyst, the concentration of Pt⁰ is much smaller compared to catalytic reactions that employ Karstedt's catalyst, so only a very small amount of an inhibitor is needed to induce latency.

Kühn et al. measured the rate law for hydrosilylation of norbornene and 1-octene with trichlorosilane and Karstedt's catalyst.[4] For hydrosilylation of the strongly coordinating olefin norbornene, the reaction is first order in catalyst, zeroth order in olefin, and first order in silane. For hydrosilylation of the weakly coordinating olefin 1-octene, the reaction is first order in catalyst, inverse first order in olefin, and second order in silane.

Consistent with previous reports,[4] we suggest that the resting state of the catalyst is a Pt⁰-olefin complex, A. This Pt⁰ olefin complex reacts with silane to establish a fast pre-equilibrium with the Pt$^{II}$ silyl/hydride species B, and the rate determining step is the subsequent transfer, via a 5-coordinate intermediate,[40] of hydride to a bound olefin to give the Pt$^{II}$ silyl/alkyl species C. Without wishing to be bound by any particular theory, we can explain the different rate laws seen for different olefins by proposing that the species L, which binds to Pt to generate the 5-coordinate intermediate, is in some cases the olefin, but in other cases (i.e. for more weakly-binding olefins) the silane (FIG. 22).

Without wishing to be bound by any particular theory, we can show this as follows. If we apply the steady state assumption to B, we have:

$$[B]=k_{ox}[A][HSiR_3]/(k_{red}[\text{olefin}]+k_{HS}[L])$$

Because species A is the resting state, [A]=[Pt]. So, the concentration of intermediate B is:

TABLE 8

Hydrosilylation of 1-octene with MD'M (1 equiv.) and 1-COD (5 × 10⁻⁶ mol %) with 0.1 mol % added inhibitors. Both inhibitors increase the latency at room temperature without affecting the reactivity.

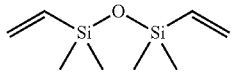

| | Temp | β/α | Conversation after reaction time of | | | RT for 24 h, |
|---|---|---|---|---|---|---|
| Inhibitor added | (° C.) | ratio | 30 min | 4 h | 24 h | then at 80° C. |
| none | 17 | >20:1$^a$ | 0.8% | 7% | 47% | 88% in 30 min |
| none | 80 | >20:1$^a$ | 98% | — | — | — |
| 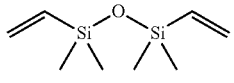 | 17 | — | 0% | 0 | 4% | 85% in 30 min |
|  | 80 | >22:1$^a$ | 93% | — | — | — |
| NBD | 17 | >22:1$^a$ | 0% | 0% | 37% | 88% in 30 min |
| NBD | 80 | >22:1$^a$ | 98% | — | — | — |

$^a$Ratio of anti-Markovnikov hydrosilylation product to internal olefin isomerization products; the Markovnikov hydrosilylation product is not formed.

Comment on Mechanism of Hydrosilylation, Reactivity of Different Olefins, and Role of Soluble Inhibitors.

Goddard et al. suggest that the inhibitors commonly used in industrial hydrosilylation processes are not soluble in the reaction medium, and that the inhibition is conducted by a heterogeneous fashion.[40] In our case, however, the inhibitors are clearly soluble in the reaction media, thus an explanation for the lower reactivity of the more strongly binding olefins, and the fact that they react before the more reactive substrates, must reflect the different coordinating abilities of the olefin substrates.

$$[B]=k_{ox}[A][HSiR_3]/(k_{red}[\text{olefin}]+k_{HS}[L])$$

And the rate of reaction is:

$$r=k_{HS}[L][B]=k_{HS}k_{ox}[A][HSiR_3][L]/(k_{red}[\text{olefin}]+k_{HS}[L])$$

For a strongly coordinating olefin substrate (such as norbornene), the ligand L is likely to be the olefin. Replacing [L] with [olefin], we have:

$$r = k_{HS}k_{ox}[A][HSiR_3][L]/(k_{red}[\text{olefin}] + k_{HS}[\text{olefin}])$$

$$= k_{HS}k_{ox}[Pt][HSiR_3]/(k_{red} + k_{HS})$$

In this case, the reaction is first order in catalyst, zeroth order in olefin, and first order in silane.

In contrast, for weakly coordinating olefins, when oxidative addition of silane is clearly fast, and hydride transfer is rate determining, $k_{red}[\text{olefin}] \gg k_{HS}[L]$, and the rate of hydrosilylation can be written as:

$$r = k_{HS}[L][B] = k_{HS}K[L][Pt][HSiR_3]/[\text{olefin}]$$

where $k_{HS}$ is the rate constant of hydrosilylation, and $K = k_{ox}/k_{red}$. Furthermore, for a weakly coordinating substrate (such as 1-octene), the ligand L is likely to be silane is more likely to coordinate to B. If we replace L with [HSiR$_3$], we have:

$$r = k_{HS}K[Pt][HSiR_3]^2/[\text{olefin}]$$

In this case, the reaction is first order in catalyst, inverse first order in olefin and second order in silane.

For a given solution containing the same amount of olefin and silane and same loading of catalyst, neglecting isomerization, at each time, the rate law is independent of the concentration of reactants and catalyst, and depends only on the rate constant:

$$r = k[Pt][HSiR_3] = k[Pt][\text{olefin}]$$

As a result, the lower reactivity for the strongly coordinating olefins can only result from the smaller k. It is hard to rationalize the difference of $k_{HS}$ for different substrates (we think this parameter is influenced more by the nature of the silane). The most likely explanation is the existence of strongly coordinating olefins stabilizes the molecular Pt$^0$ species,[6] reduces $k_{ox}/k_{red}$, and consequently reduces the rate of hydrosilylation of these substrates.

Without wishing to be bound by any particular theory, this mechanism also explains why more strongly coordinating olefins react first: the strongly coordinating olefins will preferably bind to Pt$^0$ to form the olefin complex A, and as a result they will be selectively consumed first.

For the activation of 1-COD, we also point out that strongly coordinating olefins can react with intermediate 1 and lead to inhibition of catalyst activation.

Summary.

The platinum(II) ω-alkenyl complexes cis-Pt(CH$_2$SiMe$_2$CH=CH$_2$)$_2$ (1), cis-Pt(CH$_2$SiMe$_2$CH$_2$CH=CH$_2$)$_2$ (2), Pt(CH$_2$SiMe$_2$CH=CH$_2$)$_2$(COD) (1-COD), Pt(CH$_2$SiMe$_2$CH$_2$CH=CH$_2$)$_2$(COD) (2-COD), and Pt(CH$_2$SiMe$_2$CH=CH$_2$)$_2$(NBD) (1-NBD) have been synthesized. In 1 and 2 the ω-alkenyl ligands are chelating to Pt, whereas in the COD and NBD adducts the ω-alkenyl ligands are unidentate. In solution, the C=C bonds in 1 and 2 reversibly decomplex with rates that are fast on the NMR time scale. Unlike the COD adducts, which can be stored indefinitely in air at −20° C., 1 and 2 are sensitive towards air, water, and heat.

1-COD, 1-NBD, and 2-COD show high activity for the hydrosilylation of a variety of olefin substrates when triggered by heat. Specifically, 1-COD shows no reactivity for hours for a number of substrates at 20° C., but turnover numbers as high as 200,000 are seen at 50° C. after 4 h for reactive olefins, with a product selectivity comparable to that seen for molecular platinum(0) carbene compounds. The absence of coloration and the excellent anti-Markovnikov selectivity suggest that the formation of colloidal platinum is suppressed.

We find that the conversion of 1-COD to molecular Pt$^0$ species follows a three step process: (1) slow dissociation of the bound COD from 1-COD to generate an unstable Pt$^{II}$ alkyl intermediate 1. This step is slow and rate determining. (2) Fast oxidative addition of silane to the Pt$^{II}$ alkyl intermediate 1 to form a Pt$^{IV}$ silyl/hydride intermediate. (3) Fast reductive elimination of L-H and L-SiR$_3$ from the Pt$^{IV}$ silyl/hydride intermediate to form a molecule Pt$^0$ species (where L is the alkenyl ligand). Step 1 is very slow at room temperature, but the rate increases exponentially at higher temperatures. Steps 2 and 3 are highly efficient, lead to essentially quantitative generation of active Pt$^0$ catalyst, but of the generation of this active catalyst is gradual owing to the slow release nature of step 1. We also show that the latency of the catalysis can be increased by addition of consumable inhibitors to make the catalyst activation auto-inductive.

The high turnover number and good selectivity can be attributed to the slow-release nature of 1-COD as a pre-precatalyst. Compared to adding unstable Pt$^0$ all at once, the lower concentration of Pt$^0$ in solution at the beginning of the catalysis inhibits the formation of unwanted colloidal Pt and reduces side reactions. Moreover, the slow release nature also significantly reduces the amount of inhibitor needed to suppress premature curing.

The compound 1-COD is stable under ambient conditions and is easy to make; as a hydrosilylation catalyst, it is almost inactive at room temperature but converts to an active catalyst at 80° C. The catalyst has a wide substrate scope and excellent anti-Markovnikov selectivity with minimal formation of side products such as isomerized olefins. The heat-triggered activity 1-COD makes this compound potentially useful as a catalyst to make cross-linked silicone polymers for applications such as injection molding. The high reactivity, low catalyst loading and good anti-Markovnikov selectivity make it also useful for solvent-free hydrosilylation reactions.

Experimental Section: All experiments of this Example were carried out in a vacuum or under argon using standard Schlenk techniques unless otherwise specified. All glassware was oven dried before use. Solvents (pentane, diethyl ether) were distilled under nitrogen from sodium/benzophenone immediately before use. dibenzo[a,e]cyclooctatetraene,[46] PtCl$_2$(1,5-cyclooctadiene),[47] cis/trans-PtCl$_2$(SMe$_2$)$_2$,[48] and PtCl$_2$(1,5-hexadiene)[49] were prepared as described elsewhere. The silanes HSiMe(OSiMe$_3$)$_2$ (MD'M) and HSiEt$_3$ (Oakwood) were stored over 3 Å molecular sieves. The following starting materials were obtained from commercial sources (Sigma-Aldrich unless otherwise specified) and used as received: Me$_2$S, norbornadiene, diphenylacetylene (Aldrich), K$_2$PtCl$_4$ (Pressure Chemical), (chloromethyl)dimethyl(vinyl)silane (Alfa-Aesar), (chloromethyl)dimethyl(allyl)silane (Alfa-Aesar), allyl glycidyl ether, 1-octene, vinyltriethoxysilane, allyl methacrylate, 2-methyl-3-butyn-2-ol, 3-vinyl-7-oxabicyclo[4.1.0]heptane (Oakwood). SilicaFlash@P60 silica gel was purchased from SiliCycle. Benzene-d$_6$ and toluene-d$_8$ were purchased from Cambridge Isotope Laboratories in 1-mL ampoules; for studies of the water-sensitive compounds 1 and 2, these NMR solvents were distilled under argon from sodium/benzophenone.

Elemental analyses were performed by the University of Illinois Microanalytical Laboratory; combustion aids were used to obtain satisfactory carbon analyses. FTIR spectra were acquired on a Thermo Nicolet IR200 spectrometer as neat liquids or as mineral oil mulls between KBr plates, and processed using the OMNIC™ software package with automatic baseline corrections. The 1D $^1$H and $^{13}$C NMR data were recorded on a Varian Inova 400 spectrometer at 9.39 T, a Varian Inova 500 spectrometer at 11.74 T, a Varian Inova 600 spectrometer at 14.09 T, or a Bruker Avance III HD spectrometer equipped with a 5-mm BBFO CryoProbe at 11.74 T. The $^1$H-$^1$H NOE data and the $^{195}$Pt NMR data were recorded on a Varian Inova 600 spectrometer at 14.09 T. Chemical shifts are reported in δ units (positive shifts to higher frequency) relative to TMS ($^1$H, $^{13}$C), set by assigning appropriate shifts to residual solvent signals, or to an external standard of aqueous 1.0 M K$_2$PtCl$_6$ ($^{195}$Pt) by sample replacement. X-ray crystallographic data were collected by the staff of the G. L. Clark X-ray Laboratory at the University of Illinois. GC-MS spectra were collected on a GC/MS system (Agilent Inc, Palo Alto, Calif., USA) consisting of an Agilent 7890 gas chromatograph, an Agilent 5975 mass selective detector, and a HP 7683B autosampler by the staff of the Roy J. Carver Biotechnology Center at the University of Illinois. Peaks were evaluated using the AMDIS 2.71 program (NIST, Gaithersburg, Md., USA) and identified with the aid of the libraries NIST08 (NIST, MD, USA) and W8N08 (Palisade Corporation, NY, USA). Dynamic TGA data were collected on a Cahn TherMax 500 TGA instrument.

[Dimethyl(vinyl)silylmethyl]magnesium Chloride.[8]

A mixture of magnesium turnings (1.00 g, 41.1 mmol), diethyl ether (20 mL), and 1,2-dibromoethane (5 drops) was heated to reflux for 2 h and then was treated with (chloromethyl)dimethyl(vinyl)silane (0.90 g, 6.7 mmol) in one portion. The mixture was heated to reflux for a further 12 h, and then was filtered. The solid residue was extracted with diethyl ether (10 mL) and the extract was filtered. The filtrates were combined to give a light yellow solution, which was used in the next step. Yield: 25 mL of a 0.21 M solution (78%).

[Dimethyl(allyl)silylmethyl]magnesium Chloride

This compound was made as described for the compound above except starting from (chloromethyl)dimethyl(allyl) silane (0.80 g, 5.4 mmol) and magnesium (1.50 g, 61.7 mmol). Yield: 28 mL of a 0.08 M solution (41%).

cis-Bis[η$^1$,η$^2$-dimethyl(vinyl)silylmethyl]platinum (II), 1

To a suspension of cis/trans-PtCl$_2$(SMe$_2$)$_2$ (0.16 g, 0.42 mmol) in diethyl ether (20 mL) at −80° C. was added [dimethyl(vinyl)silylmethyl]magnesium chloride (10 mL of a 0.10 M solution in diethyl ether; 1.2 mmol) with vigorous stirring over 1 min. The mixture was stirred at −80° C. for 10 min and then was warmed to room temperature and stirred for an additional 2 h. The mixture was filtered, and the solid was extracted with pentane (2×10 mL). The filtrate and the filtered extract were combined and then the solvent was removed under vacuum. The oil was passed rapidly through a silica gel column (~10 cm long) using pentane as the eluent, and the UV-active eluate was collected in an argon-flushed Schlenk tube. The solvent was immediately evaporated to give a yellow oil. Yield: 98 mg (60%). LRMS (EI). Calcd for C$_{10}$H$_{22}$Si$_2$Pt, 393.1. Found 393.1. $^1$H NMR (600 MHz, C$_7$D$_8$, 20° C.): δ 4.2-4.5 (m, 4 H, —CH═ and ═CH$_2$), 3.77 (br, 2H, ═CH$_2$), ~1.25 (br, 2H, Pt—CH$_2$), 0.33 (br, 6H, SiMe$_2$), 0.10 (br, 6H, SiMe$_2$). $^{195}$Pt{$^1$H} NMR (129 MHz, C$_7$D$_8$, 0° C.): δ−3707 (s, minor isomer), −3725 (s, major isomer); these two peaks have an intensity ratio of 1:7.6. Compound 1 can also be made from PtCl$_2$(1,5-hexadiene).

Separate NMR peaks can be seen for the two isomers of 1 at low temperatures: Major (C$_2$) isomer: $^1$H NMR (600 MHz, C$_7$D$_8$, −50° C.): δ 4.27 (dd, $^2J_{HH}$=3.2 Hz, $^3J_{HH}$=18.0 Hz, 2 H, ═CH$_2$), 4.23 (dd, $^3J_{HH}$=18.0, 11.2 Hz, 2 H, —CH═), 3.58 (dd, $^2J_{HH}$=3.3 Hz, $^3J_{HH}$=11.0 Hz, $^2J_{PtH}$~23 Hz, 2 H, ═CH$_2$), 1.30 (d, $^2J_{HH}$=12.7 Hz, $^2J_{PtH}$=71 Hz, 2 H, Pt—CH$_2$), 0.38 (s, 6H, SiMe$_2$), 0.18 (d, $^2J_{HH}$=12 Hz, $^2J_{PtH}$=90 Hz, 2 H, Pt—CH$_2$), 0.06 (s, 6H, SiMe$_2$). $^{13}$C{$^1$H} NMR (151 MHz, C$_7$D$_8$, −50° C.): δ 93.10 (s, J$_{PtC}$=46 Hz, ═CH$_2$), 90.44 (s, J$_{PtC}$<15 Hz, —CH═), 8.01 (s, $^3J_{PtC}$=31 Hz, SiMe$_2$), −0.79 (s, $^1J_{PtC}$=557 Hz, Pt—CH$_2$), −0.88 (s, SiMe$_2$).

Minor (C$_s$) isomer: $^1$H NMR (600 MHz, C$_7$D$_8$, −50° C.): δ 4.16 (d, "J$_{HH}$"=7.2 Hz, 4 H, ═CH$_2$ and —CH═), 3.87 ("t", "J$_{HH}$"=7.3 Hz, 2 H, ═CH$_2$), 1.24 (d, $^2J_{HH}$=13 Hz, 2 H, Pt—CH$_2$), 0.36 (s, 6H, SiMe$_2$), 0.09 (s, 6H, SiMe$_2$), −0.04 (d, $^2J_{HH}$=13 Hz, 2 H, Pt—CH$_2$). $^{13}$C{$^1$H} NMR (151 MHz, C$_7$D$_8$, −50° C.): δ 98.32 (s, —CH═), 91.73 (s, ═CH$_2$), 8.42 (s, SiMe$_2$), 1.59 (s, SiMe$_2$), 0.53 (s, Pt—CH$_2$).

cis-Bis[η$^1$,η$^2$-dimethyl(allyl)silylmethyl]platinum (II), 2

To a suspension of cis/trans-PtCl$_2$(SMe$_2$)$_2$ (0.30 g, 0.76 mmol) in diethyl ether (20 mL) at 0° C. was added [dimethyl(vinyl)silylmethyl]magnesium chloride (6.7 mL of a 0.26 M solution in diethyl ether; 1.7 mmol) dropwise with vigorous stirring over 5 min. The mixture was stirred at 0° C. for 2 h and then was stirred at room temperature for 3 h. The solvent was removed under vacuum, and the residue was extracted with pentane (2×20 mL). The extracts were filtered, combined, concentrated to ca. 0.5 mL, and cooled −80° C. to give the product as colorless crystals. Yield: 0.14 g (44%). Anal. Calcd for C$_{12}$H$_{26}$PtSi$_2$: C, 34.2; H, 6.22. Found: C, 33.8; H, 6.18. HRMS (EI). Calcd for C$_{12}$H$_{26}$Si$_2$Pt, 421.1221. Found 421.1214. $^{195}$Pt{$^1$H} NMR (129 MHz, C$_7$D$_8$, 20° C.): δ−3676 (s, C$_s$ isomer), −3742 (s, C$_2$ isomer); these two peaks have an intensity ratio of 1:2.2.

Major (C$_2$) isomer: $^1$H NMR (600 MHz, C$_7$D$_8$, 20° C.): δ 4.81 (m, 2H, —CH═), ~3.37 (m, overlaps with minor isomer, 2 H, ═CH$_2$), 3.26 (d, $^3J_{HH}$=8.3 Hz, J$_{PtH}$=32 Hz, 2 H, ═CH$_2$), 1.37 (m, overlaps with minor isomer, 2 H, Pt—CH$_2$), 1.27 (br, overlaps with minor isomer, 4 H, allyl CH$_2$), 0.63 (d, $^2J_{HH}$=11.7 Hz, $^2J_{PtH}$=104 Hz, 2 H, Pt—CH$_2$), 0.27 (br, 6H, SiMe$_2$), 0.16 (br, 6H, SiMe$_2$). $^{13}$C{$^1$H} NMR (151 MHz, C$_7$D$_8$, 20° C.): δ 114.22 (br, —CH═), 83.36 (s, J$_{PtC}$=50 Hz, ═CH$_2$), 22.09 (s, allyl CH$_2$), 15.54 (br, $^1J_{PtC}$=732 Hz, Pt—CH$_2$), 3.29 (s, $^3J_{PtC}$=68 Hz, SiMe$_2$), 1.88 (s, SiMe$_2$).

Minor (C$_s$) isomer: $^1$H NMR (600 MHz, C$_7$D$_8$, 20° C.): δ 4.57 (m, 2H, —CH═), 3.56 (d, $^3J_{HH}$~15 Hz, 2 H, ═CH$_2$), 3.38 (overlaps with major isomer, ═CH$_2$), 1.36-1.20 (m, overlaps with major isomer, 6 H, Pt—CH$_2$ and allyl CH$_2$), 0.84 (br, $^2J_{HH}$=12 Hz, $^2J_{PtH}$=110 Hz, 2 H, Pt—CH$_2$), 0.19 (br, 6H, SiMe$_2$), ~0.16 (br, overlaps with major isomer, 6 H, SiMe$_2$). $^{13}$C{$^1$H} NMR (151 MHz, C$_7$D$_8$, 20° C.): δ 110.72 (br, —CH═), 84.21 (br, ═CH$_2$), 22.43 (s, allyl CH$_2$), 15.54 (br, $^1J_{PtC}$=699 Hz, Pt—CH$_2$), 4.13 (s, $^3J_{PtC}$=68 Hz, SiMe$_2$), 1.68 (s, SiMe$_2$).

Sharp NMR peaks can be seen for the two isomers at low temperatures: Major (C$_2$) isomer: $^1$H NMR (500 MHz, C$_7$D$_8$, −30° C.): δ 4.74 (m, 2H, —CH═), 3.31 (d, overlaps with minor isomer, $^3J_{HH}$~16 Hz, $^2J_{PtH}$=30 Hz, 2 H, ═CH$_2$), 3.51 (d, $^3J_{HH}$=8.6 Hz, $^2J_{PtH}$=30 Hz, 2 H, ═CH$_2$), 1.44 (d, $^2J_{HH}$=12 Hz, $^2J_{PtH}$=37 Hz, 2 H, Pt—CH$_2$), 1.27 (d, J$_{HH}$=7.3 Hz, 4 H, allyl CH$_2$), 0.68 (d, $^2J_{HH}$=11.8 Hz, $^2J_{PtH}$=102.3 Hz, 2 H, Pt—CH$_2$), 0.34 (s, 6H, SiMe$_2$), 0.21 (s, 6H, SiMe$_2$). $^{13}$C{$^1$H} NMR (126 MHz, C$_7$D$_8$, −30° C.): δ 114.05 (s, $^1J_{PtC}$=15 Hz, —CH=), 83.05 (s, $^1J_{PtC}$=49 Hz, =CH$_2$), 21.70 (s, allyl CH$_2$), 15.68 (s, $^1J_{PtC}$=726 Hz, $^1J_{SiC}$=51.6 Hz, Pt—CH$_2$), 3.36 (s, $^3J_{PtC}$=69 Hz, SiMe$_2$), 1.97 (s, $^3J_{PtC}$~10 Hz, SiMe$_2$).

Minor (C$_s$) isomer: $^1$H NMR (500 MHz, C$_7$D$_8$, −30° C.): δ 4.47 (m, 2H, —CH=), 3.54 (d, $^3J_{HH}$=15 Hz, $^2J_{PtH}$=34 Hz, 2 H, =CH$_2$), 3.34 (d, overlaps with major isomer, $^3J_{HH}$~10 Hz, $^2J_{PtH}$~30 Hz, 2 H, =CH$_2$), 1.35 (dd, J$_{HH}$~14 Hz, 7 Hz, J$_{PtH}$ cannot be identified due to overlapping with Pt—CH$_2$ of minor isomer, 4 H, allyl CH$_2$), 1.33 (d, overlaps with δ 1.35 resonance of minor isomer, $^2J_{HH}$~13 Hz, $^2J_{PtH}$~58 Hz, 2 H, Pt—CH$_2$), 1.23 (dd, J$_{HH}$=14 Hz, 5 Hz, 4 H, allyl CH$_2$), 0.91 (d, $^2J_{HH}$=12.5 Hz, $^2J_{PtH}$=109 Hz, 2 H, Pt—CH$_2$), 0.30 (s, 6H, Me), 0.22 (s, 6H, SiMe$_2$). $^{13}$C{$^1$H} NMR (126 MHz, C$_7$D$_8$, −30° C.): δ 110.28 (s, $^1J_{PtC}$=25 Hz, —CH=), 83.83 (s, $^1J_{PtC}$=53 Hz, =CH$_2$), 21.70 (s, allyl CH$_2$, J$_{PtC}$=13 Hz), 14.88 (s, $^1J_{PtC}$=712 Hz, $^1J_{SiC}$=51.6 Hz, Pt—CH$_2$), 4.19 (s, $^3J_{PtC}$=58 Hz, SiMe$_2$), 1.33 (s, SiMe$_2$). $^{195}$Pt{$^1$H} NMR (129 MHz, C$_6$D$_6$, 20° C.): δ−3489.

Bis[η$^1$-dimethyl(vinyl)silylmethyl](1,5-cyclooctadiene)platinum(II), 1-COD.[8]

To a suspension of (COD)PtCl$_2$ (0.25 g, 0.67 mmol) in diethyl ether (20 mL) at 0° C. was added [dimethyl(vinyl)silylmethyl]magnesium chloride (7.0 mL of a 0.21 M solution in diethyl ether; 1.5 mmol) dropwise with vigorous stirring. The mixture was stirred at 0° C. for 1 h and then was warmed to room temperature and further stirred at room temperature for 3 h. The mixture was filtered, and the solid was extracted with diethyl ether (20 mL). The filtrate and the filtered extract were combined and then the solvent was removed under vacuum. The resulting slurry was extracted with pentane (2×20 mL). The extracts were filtered, combined, quenched with water (5 drops), and dried over magnesium sulfate. Pentane was removed on rotary evaporator, and the product was purified by silica gel column chromatography using pentane as eluent. Removal of the solvent from the eluate gave the product as a colorless oil. Yield: 0.16 g (64%). Anal. Calcd for C$_{18}$H$_{34}$Si$_2$Pt: C, 43.1; H, 6.83. Found: C, 42.8; H, 6.95. Mp. ca. −20° C. $^1$H NMR (500 MHz, C$_6$D$_6$, 20° C.): δ 6.52 (dd, $^3J_{HH}$=20.2 Hz, 14.5 Hz, 2 H, SiCH=), 6.00 (dd, $^3J_{HH}$=14.5 Hz, $^2J_{HH}$=4.0 Hz, 2 H, =CH$_2$), 5.84 (dd, $^3J_{HH}$=20.2 Hz, $^2J_{HH}$=4.0 Hz, 2 H, =CH$_2$), 4.49 (m, J$_{PtH}$=40.4 Hz, 4 H, CH of COD), 1.86 (m, 4H, CH$_2$ of COD), 1.65 (m, 4H, CH$_2$ of COD), 1.18 (s, $^2J_{PtH}$=92.9 Hz, $^2J_{SiH}$=7.2 Hz, 4 H, Pt—CH$_2$), 0.38 (s, 12H, SiMe$_2$). $^{13}$C{$^1$H} NMR (126 MHz, C$_6$D$_6$, 20° C.): δ 144.60 (s, $^3J_{PtC}$=27.0 Hz, SiCH=), 128.94 (s, =CH$_2$), 97.68 (s, J$_{PtC}$=64.3, CH of COD), 29.91 (s, CH$_2$ of COD), 11.75 (s, $^1J_{PtC}$=704.9 Hz, Pt—CH$_2$), 1.86 (s, $^3J_{PtC}$=31.3 Hz, SiMe$_2$). $^{195}$Pt{$^1$H}NMR (129 MHz, C$_6$D$_6$, 20° C.): δ−3489. Our $^1$H NMR chemical shifts differed by 0.25 ppm from those the literature;[8] we suspect that the latter were not properly referenced.

Bis[η$^1$-dimethyl(vinyl)silylmethyl](norbornadiene)platinum(II), 1-NBD.[9]

A solution of 1 was prepared in situ by treating a suspension of PtCl$_2$(1,5-hexadiene) (0.15 g, 0.39 mmol) in diethyl ether (20 mL with [dimethyl(vinyl)silylmethyl]magnesium chloride (3.7 mL of a 0.21 M solution in diethyl ether, 0.78 mmol). The resulting solution of 1 was added to norbornadiene (ca. 1 mL). The excess solvent and norbornadiene were removed under vacuum at room temperature, and the residue was purified by silica gel column chromatography with pentane as the eluent. Removal of the pentane gave the product as a colorless oil, which gradually turns brown when exposed to air. Yield: 0.13 g (68%). $^1$H NMR (500 MHz, C$_6$D$_6$, 20° C.): δ 6.52 (dd, $^3J_{HH}$=20.3 Hz, 14.5 Hz, 2 H, SiCH=), 6.02 (dd, $^3J_{HH}$=14.5 Hz, $^2J_{HH}$=4.0 Hz, 2 H, =CH$_2$), 5.85 (dd, $^3J_{HH}$=20.2 Hz, $^2J_{HH}$=4.0 Hz, 2 H, =CH$_2$), 4.58 ("t", "J$_{HH}$"=2.2 Hz, J$_{PtH}$=40.7 Hz, 4 H, —CH= of NBD), 3.27 (m, 2H, bridge head CH of NBD), 0.98 (t, $^3J_{HH}$=3.2 Hz, 2 H, CH$_2$ of NBD), 1.31 (s, $^2J_{PtH}$=102.2 Hz, 4 H, Pt—CH$_2$), 0.36 (s, 12H, SiMe$_2$). $^{13}$C{$^1$H} NMR (126 MHz, C$_6$D$_6$, 20° C.): 144.64 (s, $^3J_{PtC}$=29.7 Hz, SiCH=), 129.22 (s, =CH$_2$), 85.24 (s, J$_{PtC}$=54.3 Hz, CH of NBD), 72.66 (s, J$_{PtC}$=52.4 Hz, CH$_2$ of NBD), 48.86 (s, J$_{PtC}$=40.9 Hz, bridgehead CH of NBD), 14.89 (s, $^1J_{PtC}$=748.8 Hz, Pt—CH$_2$), 1.86 (s, $^1J_{SiC}$=50.7 Hz, $^3J_{PtC}$=34.2 Hz, SiMe$_2$).

Bis[η$^1$-dimethyl(vinyl)silylmethyl](dibenzo[a,e]cyclooctatetraene)platinum(II),1-DBCOT A solution of 1 was prepared in situ by treating a suspension of PtCl$_2$(SMe$_2$) (0.19 g, 0.48 mmol) in pentane (20 mL) with [dimethyl(vinyl)silylmethyl]magnesium chloride (2.0 mL of a 0.55 M solution in diethyl ether, 1.1 mmol) in diethyl ether (20 mL)]. The solution of 1 was cooled to ° C. and added to dibenzo[a,e]cyclooctatetraene (0.10 g, 0.49 mmol) at room temperature. After the mixture had been stirred at 20° C. for 30 min, all the solid dissolved and a light yellow solution formed. The pentane was removed under vacuum, and the product was purified by silica gel column chromatography, eluting first with pentane to remove excess DBCOT, and then with diethyl ether to elute the product. The light yellow solution containing the product was evaporated to dryness on a rotary evaporator and resulting yellow oil was recrystallized from pentane (~0.1 mL) at −20° C. to give the product as light yellow crystals. Yield: 33.4 mg (12%). Anal. Calcd for C$_{26}$H$_{34}$Si$_2$Pt: C, 52.24; H, 5.73. Found: C, 52.69; H, 5.65. HRMS (EI). Calcd for C$_{21}$H$_{23}$SiPt [M-C$_5$H$_{11}$Si]$^+$, 498.1217. Found 498.1216. Mp. ca. 71-72° C. $^1$H NMR (500 MHz, C$_6$D$_6$, 20° C.): δ 6.66-6.76 (AA'BB' m, 8 H, aromatic CH), 6.49 (dd, $^3J_{HH}$=20.2, 14.5 Hz, 2 H, SiCH=), 5.95 (dd, $^3J_{HH}$=14.5, $^2J_{HH}$=3.9 Hz, 2 H, =CH$_2$), 5.79 (dd, $^3J_{HH}$=20.3, $^2J_{HH}$=4.0 Hz, 2 H, =CH$_2$), 5.55 (m, J$_{PtH}$=34.0 Hz, 4 H, olefinic CH of DBCOT), 1.36 (s, $^2J_{PtH}$=93.0 Hz, 4 H, Pt—CH$_2$), 0.38 (s, 12H, SiMe$_2$). $^{13}$C{$^1$H} NMR (126 MHz, C$_6$D$_6$, 20° C.): 143.87 (s, $^3J_{PtC}$=24 Hz, SiCH=), 140.72 (s, quaternary C of DBCOT), 129.58 (s, =CH$_2$), 127.08 (s, aromatic CH of DBCOT), 126.95 (s, aromatic CH of DBCOT), 99.73 (s, J$_{PtC}$=54.9 Hz, olefinic CH of DBCOT), 20.25 (s, $^1J_{PtC}$=694.9 Hz, Pt—CH$_2$), 1.59 (s, $^3J_{PtC}$=28.0 Hz, SiMe$_2$). The product contains traces of aromatic impurities.

Bis[η$^1$-dimethyl(allyl)silylmethyl](1,5-cyclooctadiene)platinum(II), 2-COD This compound was prepared from (COD)PtCl$_2$ (0.35 g, 0.98 mmol) [dimethyl(allyl)silylmethyl]magnesium chloride (0.08 M, 27 mL, 2.2 mmol) according to the procedure for 1-COD, and was isolated as colorless oil. Yield: 0.32 g (62%). Anal. Calcd for C$_{20}$H$_{38}$Si$_2$Pt: C, 45.3; H, 7.23. Found: C, 45.2; H, 7.34. Mp. ca. −20° C. HRMS (EI). Calcd for C$_{19}$H$_{34}$Si$_2$Pt (M-CH$_4^+$), 513.1847. Found 513.1854. $^1$H NMR (500 MHz, $C_6D_6$, 20° C.): δ 6.07 (m, 2H, allyl —CH=), 5.03 (m, 4H, allyl=$CH_2$), 4.44 (m, $J_{PtH}$=40.6 Hz, 4 H, CH of COD), 1.85 (m, 4H, $CH_2$ of COD), 1.64 (m, 4H, $CH_2$ of COD), 1.75 (dt, $^3J_{HH}$=8.1 Hz, $^4J_{HH}$=2.4 Hz, 4 H, allyl Si$CH_2$), 1.08 (s, $^2J_{PtH}$=93.4 Hz, 4 H, Pt—$CH_2$), 0.28 (s, 12H, Si$Me_2$). $^{13}C\{^1H\}$ NMR (126 MHz, $C_6D_6$, 20° C.): 136.97 (s, allyl —CH=), 112.29 (s, =$CH_2$), 97.55 (s, $J_{PtC}$=64.0, CH of COD), 29.92 (s, $CH_2$ of COD), 28.29 (s, $^3J_{PtC}$=34.6 Hz, allyl Si$CH_2$), 11.52 (s, $^1J_{PtC}$=706.5 Hz, Pt—$CH_2$), 1.39 (s, $^3J_{PtC}$=26.4 Hz, $^1J_{SiC}$=50.1 Hz, Si$Me_2$). $^{195}Pt\{^1H\}$ NMR (129 MHz, $C_6D_6$, 20° C.): δ–3495.

Bis[η$^1$-dimethyl(allyl)silylmethyl](dibenzo[a,e]cyclooctatetraene)platinum(II),2-DBCOT This compound was prepared from $PtCl_2(SMe_2)$ (0.13 g, 0.33 mmol), [dimethyl(allyl)silylmethyl]magnesium chloride (3.0 mL of a 0.26 M solution in diethyl ether, 0.78 mmol) and DBCOT (61 mg, 0.30 mmol) according to the procedure for 1-DBCOT, and was obtained as yellow oil. Yield: 130 mg (63%). HRMS (EI). Calcd for $C_{27}H_{24}Si_2Pt$ [M-$CH_4$]$^+$, 609.18601. Found 609.18471. Mp. ca. 5° C. $^1H$ NMR (500 MHz, $C_6D_6$, 20° C.): δ 6.64-6.76 (AA'BB' m, 8 H, aromatic CH), 6.04 (m, 2H, allyl —CH=), 5.52 (m, $J_{PtH}$=32.5 Hz, 4 H, olefinic CH of DBCOT), 5.00 (m, 4H, allyl=$CH_2$), 1.77 (dt, $^3J_{HH}$=8.1 Hz, $^4J_{HH}$=2.4 Hz, 4 H, allyl Si$CH_2$), 1.29 (s, $^2J_{PtH}$=93.6 Hz, 4 H, Pt—$CH_2$), 0.28 (s, 12H, Si$Me_2$). $^{13}C\{^1H\}$ NMR (126 MHz, $C_6D_6$, 20° C.): 140.65 (s, quaternary C of DBCOT), 136.66 (s, allyl —CH=), 127.19 (s, aromatic CH of DBCOT), 126.95(s, aromatic CH of DBCOT), 112.61 (s, =$CH_2$), 99.73 (s, $J_{PtC}$=55.5 Hz, olefinic CH of DBCOT), 27.91 (s, $^3J_{PtC}$=37.7 Hz, allyllic Si$CH_2$), 19.83 (s, $^1J_{PtC}$=694.0 Hz, Pt—$CH_2$), 1.43 (s, Me). The product contains traces of pentane and silicone[50] impurities.

Hydrosilylation Reactions: General Protocol.

The following is a typical procedure. To allyl glycidyl ether (0.59 mL, 5.0 mmol) was added bis[η$^1$-dimethyl(vinyl)silylmethyl](1,5-cyclooctadiene)platinum(II) (10 μL of a 0.0012 M solution in benzene-$d_6$, 1.2×10$^{-5}$ mmol). After the mixture had been homogenized by shaking, MD'M (0.69 mL, 2.5 mmol) was added in one batch. The mixture was shaken again and then heated at 50° C. Aliquots of the reaction mixture were removed at reaction times of 30 min, 4 h, and 24 h; the aliquots were immediately dissolved in benzene-$d_6$ to quench the reaction. The progress of the reaction was monitored by comparing the $^1H$ NMR integral of the residual Si—H resonance with those of the hydrosilylation products.

Hydrosilylation Reactions: Solvent Free Conditions.

Caution: hydrosilylation reactions are highly exothermic. For neat (solventless) reactions on the scale described below, reactive substrates such as AGE can cause an exotherm of 15° C.; larger exotherms will occur at larger scales. The following is a typical procedure. To 1-octene (1.57 mL, 10.0 mmol) was added bis[η$^1$-dimethyl(vinyl)silylmethyl](1,5-cyclo-octadiene)platinum(II), 1-COD, (40 μL of a 0.0012 M solution in benzene-$d_6$, 5×10$^{-5}$ mmol). After the mixture was homogenized by shaking, MD'M (2.76 mL, 10 mmol) was added in one batch. The mixture was shaken again and then heated at 80° C. Aliquots of the reaction mixture were removed at reaction times of 30 min, 4 h, and 24 h; the aliquots were immediately dissolved in benzene-$d_6$ to quench the reaction. The progress of the reaction was monitored by comparing the $^1H$ NMR integral of the residual Si—H resonance with those of the hydrosilylation products. After the reaction was complete, all volatile material was removed by sparging with dry air for 24 h. Because of the very low loading of platinum, the products remained colorless and no further purification was needed.

Kinetics of Hydrosilylation Reactions.

To allyl glycidyl ether (1.18 mL, 10.0 mmol) was added a solution of 1-COD (15 μL of a 0.008 M solution in benzene-$d_6$, 1.2×10$^{-4}$ mmol). The mixture was homogenized by shaking, and to it was added triethylsilane (0.80 mL, 5.0 mmol). The mixture was again shaken, and then placed in circulating oil bath preheated to 60° C. At different reaction times, aliquots of the reaction mixture were taken out of the reaction mixture, and immediately dissolved in benzene-$d_6$ in an NMR tube; the NMR tube was immediately cooled to –78° C. to quench the reaction. The progress of the reaction was monitored by comparing the NMR integration of the residual Si—H resonance with the resonances of the hydrosilylation products.

The same procedure was used to measure the hydrosilylation reactions catalyzed by 1-NBD (2.3×10$^{-4}$ mmol), stabilized by addition of 160 equiv. of NBD.

Reaction Between $PtR_2$ and MD'M.

A solution of 1 (0.012 mmol) in pentane (0.25 mL) was evaporated to dryness under vacuum. The residue was cooled to –80° C., and dry benzene-$d_6$ (0.65 mL) and diphenylacetylene (44.0 mg, 0.25 mmol) were added. The mixture was warmed to room temperature, the diphenylacetylene was dissolved with the aid of the stir bar, and MD'M (0.01 mL, ~0.04 mmol) was added with vigorous stirring. The mixture was transferred to an NMR tube and a $^1H$ NMR spectrum was collected within 5 min of addition of silane. The reaction products were identified from $^1H$ NMR and GC-MS data. The reaction between 2 and MD'M was conducted in the same way.

Reaction Between $PtR_2COD$ and MD'M.

1-COD and 2-COD are stable toward air and water, so the reaction was conducted in air. Diphenylacetylene (44.0 mg, 0.25 mmol), 1-COD (6.0 mg, 0.012 mmol), and benzene-$d_6$ (1 mL) were mixed in a vial. To this solution was added MD'M (0.01 mL, ~0.04 mmol), and the solution was mixed and transferred to an NMR tube with a Pasteur pipette. The reaction was monitored by $^1H$ NMR spectroscopy over the course of a week. The reaction of 2-COD with MD'M was conducted in the same way.

Reaction Between $PtR_2COD$ and MD'M.

A stock solution of 1-COD (15.0 mg, 0.030 mmol) in benzene-$d_6$ (1 mL) was prepared, and 100 μL of this solution was treated with a solution containing the desired amount of DBCOT (between 1 and 20 equiv.) in benzene-$d_6$ (650 μL). The resulting solution was quickly mixed and transferred to an NMR tube, and immediately inserted into the NMR spectrometer that had been equilibrated to desired temperature. The sample was allowed to equilibrate in the probe temperature for 5 min, and then $^1H$ NMR spectra were acquired at desired time intervals; a recycle delay of 5 s was used to ensure quantitative analysis. The concentration of 1-COD was monitored by the integration of the olefinic COD resonance.

References Associated with Example 15

1. Troegel, D.; Stohrer, J., Recent Advances and Actual Challenges in Late Transition Metal Catalyzed Hydrosilylation of Olefins from an Industrial Point of View. *Coord. Chem. Rev.* 2011, 255, 1440-1459.
2. Jagadeesh, M. N.; Thiel, W.; Köhler, J.; Fehn, A., Hydrosilylation with Bis(alkynyl)(1,5-cyclooctadiene)

platinum Catalysts: A Density Functional Study of the Initial Activation. *Organometallics* 2002, 21, 2076-2087.
3. Lewis, L. N. S., J.; Gao, Y.; Colborn, R. E.; Hutchins, G, Platinum Catalysts Used in the Silicones Industry. Their Synthesis and Activity in Hydrosilylation. *Platinum Metals Rev.* 1997, 41, 66-75.
4. Meister, T. K.; Riener, K.; Gigler, P.; Stohrer, J.; Herrmann, W. A.; Kuhn, F. E., Platinum Catalysis Revisited—Unraveling Principles of Catalytic Olefin Hydrosilylation. *ACS Catal.* 2016, 6, 1274-1284.
5. Roy, A. K.; Taylor, R. B., The First Alkene-Platinum-Silyl Complexes:
Lifting the Hydrosilation Mechanism Shroud with Long-Lived Precatalytic Intermediates and True Pt Catalysts. *J. Am. Chem. Soc.* 2002, 124, 9510-9524.
6. Stein, J.; Lewis, L. N.; Gao, Y.; Scott, R. A., In Situ Determination of the Active Catalyst in Hydrosilylation Reactions Using Highly Reactive Pt(0) Catalyst Precursors. *J. Am. Chem. Soc.* 1999, 121, 3693-3703.
7. Plasson, R.; Brandenburg, A.; Jullien, L.; Bersini, H., Autocatalyses. *J. Phys. Chem. A* 2011, 115, 8073-8085.
8. Kelly, R. D.; Young, G. B., Synthesis and Spectroscopic Characteristics of Bis(ethenyldimethylsilylmethyl)platinum(II) Complexes Containing Tertiary Phosphine Ligands. *Polyhedron* 1989, 8, 433-445.
9. Kelly, R. D.; Brent Young, G., Synthesis and Spectroscopic Characteristics of Bis(ethenyldimethylsilylmethyl) platinium(II) Complexes Containing Nitrogen Donor Ligands. *J. Organomet. Chem.* 1989, 361, 123-138.
10. General Stereoelectronic Trends—Donors, Acceptors, and Chameleons. In *Stereoelectronic Effects*, pp 62-96.
11. Weidner, U.; Schweig, A., Theory and application of photoelectron spectroscopy: V. The nature of bonding in vinyl- and allylsilanes: The effects of σ-π (hyperconjugation) and pπ-dπ conjugation in these compounds. *J. Organomet. Chem.* 1972, 39, 261-266.
12. White, J., Reactivity and Ground State Effects of Silicon in Organic Chemistry. *Aust. J. Chem.* 1995, 48, 1227-1251.
13. Lambert, J. B., Tetrahedron report number 273: The interaction of silicon with positively charged carbon. *Tetrahedron* 1990, 46, 2677-2689.
14. Lambert, J. B.; Zhao, Y.; Emblidge, R. W.; Salvador, L. A.; Liu, X.; So, J.-H.; Chelius, E. C., The β Effect of Silicon and Related Manifestations of σ Conjugation. *Acc. Chem. Res.* 1999, 32, 183-190.
15. Stereoelectronic Effects of the Group 4 Metal Substituents in Organic Chemistry. In *Top. Stereochem.*, pp 137-200.
16. Traylor, T. G.; Hanstein, W.; Berwin, H. J.; Clinton, N. A.; Brown, R. S., Vertical stabilization of cations by neighboring .sigma. bonds. General considerations. *J. Am. Chem. Soc.* 1971, 93, 5715-5725.
17. σ-π Conjugation: occurrence and magnitude.
18. Chianese, A. R.; Lee, S. J.; Gagné, M. R., Electrophilic Activation of Alkenes by Platinum(II): So Much More Than a Slow Version of Palladium(II). *Angew. Chem. Int. Ed.* 2007, 46, 4042-4059.
19. Happer, A.; N. G, J.; Pool, B.; White, J., Carbon-silicon hyperconjugation: X-ray structural study of N-methyl-4-trimethylsilylmethylpyridinium triflate. *J. Organomet. Chem.* 2002, 659, 10-14.
20. Hassall, K.; Lobachevsky, S.; Schiesser, C. H.; White, J. M., Carbon-Silicon Hyperconjugation and Strain-Enhanced Hyperconjugation: Structures of N-Methyl 2- and 4-tert-Butyldimethylsilylmethyl Pyridinium Cations. *Organometallics* 2007, 26, 1361-1364.
21. Hassall, K.; Lobachevsky, S.; White, J. M., Comparison of Carbon-Silicon Hyperconjugation at the 2- and 4-Positions of the N-Methylpyridinium Cation. *J. Org. Chem* 2005, 70, 1993-1997.
22. Hassall, K.; Schiesser, C. H.; White, J. M., Solution and Solid-State Structure of 2- and 4-Bis(trimethylsilyl)methylpyridinium Cations. *Organometallics* 2007, 26, 3094-3099.
23. Wierschke, S. G.; Chandrasekhar, J.; Jorgensen, W. L., Magnitude and origin of the .beta.-silicon effect on carbenium ions. *J. Am. Chem. Soc.* 1985, 107, 1496-1500.
24. Brinkman, E. A.; Berger, S.; Brauman, J. I., .alpha.-Silyl-Substituent Stabilization of Carbanions and Silyl Anions. *J. Am. Chem. Soc.* 1994, 116, 8304-8310.
25. Wetzel, D. M.; Brauman, J. I., Quantitative measure of .alpha.-silyl carbanion stabilization. The electron affinity of (trimethylsilyl)methyl radical. *J. Am. Chem. Soc.* 1988, 110, 8333-8336.
26. Larson, G. L., *Advances in Silicon Chemistry*. JAI Press: 1996.
27. Ankianiec, B. C.; Christou, V.; Hardy, D. T.; Thomson, S. K.; Young, G. B., Mechanisms of Thermolytic Rearrangement of cis-Bis(silylmethyl)platinum(II) Complexes: b-Carbon Transfer Predominates over Hydrogen Transfer. *J. Am. Chem. Soc.* 1994, 116, 9963-9978.
28. Wyrwa, R.; Poppitz, W.; Gorls, H., Massenspektrometrische und Röntgenstrukturanalytische Untersuchungen an Komplexen des Typs (COD)PtX2 (X=Cl, Br, I, CH3, CH2CMe3, CH2SiMe3). *Z. Anorg. A/g. Chem.* 1997, 623, 649-653.
29. Liu, S.; Zhang, Z. V.; Gray, D.; Zhu, L.; Abelson, J. R.; Girolami, G. S. University of Illinois, Urbana, Il. Unpublished work, 2019.
30. Stoebenau, E. J.; Jordan, R. F., Nonchelated Alkene and Alkyne Complexes of d0 Zirconocene Pentafluorophenyl Cations. *J. Am. Chem. Soc.* 2006, 128, 8638-8650.
31. Carpentier, J.-F.; Wu, Z.; Lee, C. W.; Strömberg, S.; Christopher, J. N.; Jordan, R. F., d0 Metal Olefin Complexes. Synthesis, Structures, and Dynamic Properties of (C5R5)2Zr(OCMe2CH2CH2CH=CH2)+ Complexes: Models for the Elusive (C5R5)2Zr(R)(Olefin)+ Intermediates in Metallocene-Based Olefin Polymerization Catalysis. *J. Am. Chem. Soc.* 2000, 122, 7750-7767.
32. Carpentier, J.-F.; Maryin, V. P.; Luci, J.; Jordan, R. F., Solution Structures and Dynamic Properties of Chelated d0 Metal Olefin Complexes {η5:η1-C5R4SiMe2NtBu}Ti(OCMe2CH2CH2CH=CH2)+ (R=H, Me): Models for the {η5:η1-C5R4SiMe2NtBu}Ti(R')(olefin)+ Intermediates in "Constrained Geometry" Catalysts. *J. Am. Chem. Soc.* 2001, 123, 898-909.
33. Casey, C. P.; Carpenetti, D. W., Measurement of Barriers for Alkene Dissociation and for Inversion at Zirconium in a d0 Zirconium-Alkyl-Alkene Complex. *Organometallics* 2000, 19, 3970-3977.
34. Casey, C. P.; Carpenetti, D. W.; Sakurai, H., Models for Intermediates in Metallocene-Catalyzed Alkene Polymerization: Alkene Dissociation from Cp2Zr[η1,η2-CH2Si(CH3)2CH2CH=CH2][B(C6F5)4]. *Organometallics* 2001, 20, 4262-4265.
35. Reactions of the organoplatinum complex [Pt(cod) (neoSi)Cl] (neoSi=trimethylsilylmethyl) with the non-coordinating anions SbF6- and BPh4-.
36. Thomson, S. K.; Young, G. B., Thermolytic Rearrangement of cis-Bis(phosphine)bis((trimethylsilyl)methyl) platinum(II) Complexes via b-Alkyl Transfer. *Organometallics* 1989, 8, 2068-2070.

37. Chisholm, M. H.; Clark, H. C.; Manzer, L. E.; Stothers, J. B.; Ward, J. E. H., Carbon-13 Nuclear Magnetic Resonance Studies of Organometallic Compounds. VII. 1,5-Cyclooctadieneplatinum(II) Derivatives. *J. Am. Chem. Soc.* 1975, 97, 721-727.
38. Markó, I. E.; Stérin, S.; Buisine, O.; Mignani, G.; Branlard, P.; Tinant, B.; Declercq, J.-P., Selective and Efficient Platinum(0)-Carbene Complexes As Hydrosilylation Catalysts. *Science* 2002, 298, 204.
39. Dierick, S.; Vercruysse, E.; Berthon-Gelloz, G.; Markó, I. E., User-Friendly Platinum Catalysts for the Highly Stereoselective Hydrosilylation of Alkynes and Alkenes. *Chem. Eur. J.* 2015, 21, 17073-17078.
40. Faglioni, F.; Blanco, M.; Goddard, W. A.; Saunders, D., Heterogeneous Inhibition of Homogeneous Reactions: Karstedt Catalyzed Hydrosilylation. *J. Phys. Chem. B* 2002, 106, 1714-1721.
41. Whitesides, G. M.; Hackett, M.; Brainard, R. L.; Lavalleye, J. P. P. M.; Sowinski, A. F.; Izumi, A. N.; Moore, S. S.; Brown, D. W.; Staudt, E. M., Suppression of Unwanted Heterogeneous Platinum(0)-Catalyzed Reactions by Poisoning with Mercury(0) in Systems Involving Competing Homogeneous Reactions of Soluble Organoplatinum Compounds: Thermal Decomposition of Bis (triethylphosphine)-3,3,4,4-tetramethylplatinacyclopentane. *Organometallics* 1985, 4, 1819-1830.
42. Tagge, C. D.; Simpson, R. D.; Bergman, R. G.; Hostetler, M. J.; Girolami, G. S.; Nuzzo, R. G., Synthesis of a Novel Volatile Platinum Complex for Use in CVD and a Study of the Mechanism of Its Thermal Decomposition in Solution. *J. Am. Chem. Soc.* 1996, 118, 2634-2643.
43. Lewis, L. N.; Colborn, R. E.; Grade, H.; Bryant, G. L.; Sumpter, C. A.; Scott, R. A., Mechanism of Formation of Platinum(0) Complexes Containing Silicon-Vinyl Ligands. *Organometallics* 1995, 14, 2202-2213.
44. Chalk, A. J.; Harrod, J. F., Homogeneous Catalysis. II. The Mechanism of the Hydrosilation of Olefins Catalyzed by Group VIII Metal Complexes. *J. Am. Chem. Soc.* 1965, 87, 16-21.
45. Seeman, J. I., Effect of conformational change on reactivity in organic chemistry. Evaluations, applications, and extensions of Curtin-Hammett Winstein-Holness kinetics. *Chem. Rev.* 1983, 83, 83-134.
46. Franck, G.; Brill, M.; Helmchen, G., Dibenzo[a,e]cyclooctene: Multi-gram Synthesis of a Bidentate Ligand. *Org. Synth.* 2012, 89, 55-65.
47. McDermott, J. X.; White, J. F.; Whitesides, G. M., Thermal Decomposition of Bis(phosphine)platinum(II) Metallocycles. *J. Am. Chem. Soc.* 1976, 98, 6521-6528.
48. Hill, G. S.; Irwin, M. J.; Levy, C. J.; Rendina, L. M.; Puddephatt, R. J.; Andersen, R. A.; Mclean, L., Platinum (II) Complexes of Dimethyl Sulfide. *Inorg. Synth.* 2007, 32, 149-153.
49. Jensen, K. A., Platinum Compounds of Alkadienes (Diolefins). *Acta Chem. Scand.* 1953, 7, 866-868.
50. Fulmer, G. R.; Miller, A. J. M.; Sherden, N. H.; Gottlieb, H. E.; Nudelman, A.; Stoltz, B. M.; Bercaw, J. E.; Goldberg, K. I., NMR Chemical Shifts of Trace Impurities: Common Laboratory Solvents, Organics, and Gases in Deuterated Solvents Relevant to the Organometallic Chemist. *Organometallics* 2010, 29, 2176-2179.
51. Reich, H. J., WinDNMR: Dynamic NMR Spectra for Windows. *J. Chem. Educ.* 1995, 72, 1086.
52. *Nuts*, Acorn NMR Inc.: 2012.
53. https://www.chem.wisc.edu/areas/reich/windnmrhlp/index.htm (accessed June 10th).
54. Ammann, C.; Meier, P.; Merbach, A., A Simple Multinuclear NMR Thermometer. *J. Magn. Reson.* 1982, 46, 319-321.
55. Morse, P. M.; Spencer, M. D.; Wilson, S. R.; Girolami, G. S., A Static α-CH•••M Interaction Observable by NMR Spectroscopy: Synthesis of the Chromium(II) Alkyl [Cr2 (CH2SiMe3)62-] and its Conversion to the Unusual 'Windowpane' Bis(metallacycle) Complex [Cr(κ2CC'—CH2SiMe2CH2)22-]. *Organometallics* 1994, 13, 1646-1655.
56. Dickinson, P. W. Trispyrazolylborate and Tetramethylcyclopentadienyl Osmium Chemistry: Toward Methane Coordination Complexes. University of Illinois at Urbana-Champaign, Urbana, II, 2005.
57. Gross, C. L.; Girolami, G. S., Metal-Alkane Complexes. Rapid Exchange of Hydrogen Atoms between Hydride and Methyl Ligands in [(C5Me5)Os(dmpm)(CH3)H+]. *J. Am. Chem. Soc.* 1998, 120, 6605-6606.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

As used herein and in the appended claims, the singular forms "a", "an", and "the" include plural reference unless the context clearly dictates otherwise. Thus, for example, reference to "a cell" includes a plurality of such cells and equivalents thereof known to those skilled in the art. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individual or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

Certain molecules disclosed herein may contain one or more ionizable groups [groups from which a proton can be removed (e.g., —COOH) or added (e.g., amines) or which can be quaternized (e.g., amines)]. All possible ionic forms of such molecules and salts thereof are intended to be included individually in the disclosure herein. With regard to salts of the compounds herein, one of ordinary skill in the art can select from among a wide variety of available counterions those that are appropriate for preparation of salts of this invention for a given application. In specific applications, the selection of a given anion or cation for preparation of a salt may result in increased or decreased solubility of that salt.

Where used, a bond represented by " ᔕᔕᔕ " (a squiggly or wavy line) refers to a bond having any angle or geometry, such as in the case of a chemical species exhibiting stereochemistry such as chirality. For example, the compound characterized by formula (FX100):

(FX100)

may correspond to one or more compounds, such as those characterized by the formulas (FX100a), (FX100b), (FX100c), and (FX100d):

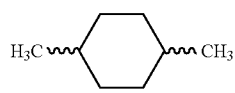

(FX100a)

(FX100b)

(FX100c)

-continued

(FX100d)

It must also be noted that a bond represented as a non-wavy or non-squiggly line, such as a "-", may exhibit more than one stereochemical configuration, such as chirality. In other words, the compound characterized by formula (FX100e):

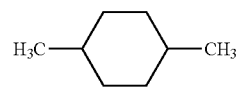

(FX100e)

may correspond to one or more compounds, such as those characterized by the formulas (FX100a), (FX100b), (FX100c), and (FX100d).

Every composition, formulation, catalyst, precursor, complex, combination thereof, or method described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, reagents, synthetic methods, purification methods, analytical methods, assay methods, and methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A method for catalytic hydrosilylation of a starting compound, said method comprising steps of:
   contacting said starting compound with a hydrosilylation reagent in the presence of a hydrosilylation catalyst comprising a metal-ligand complex or a hydrosilylation precatalyst comprising said metal-ligand complex; and
   activating hydrosilylation of said starting compound; and
   wherein said metal-ligand complex comprises at least one ligand and is characterized by formula (FX1):

$$ML_xD_y \quad (FX1),$$

where:
   M is a metal selected from the group consisting of Li, Be, Mg, Ca, Sr, Ba, Al, Sc, Ga, Sn, Ti, Zr, Hf, V, Nb, Ta, Cr, Mo, W, Mn, Re, Fe, Ru, Os, Co, Rh, Ir, Ni, Pd, Pt, Cu, Ag, Au, Zn, a lanthanide metal, and an actinide metal;
   x is equal to the oxidation state of M;
   each D is independently a neutral coordinating ligand;
   y is zero or an integer selected from the range of 1 to 4; and
   each L is a mono-anionic ligand independently characterized by the formula FX2:

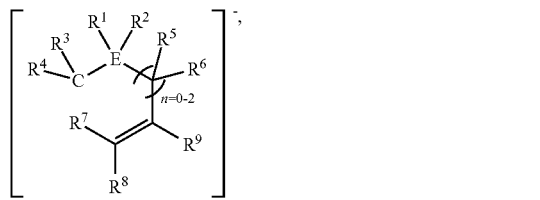

(FX2)

where:
   each $R^1$ and $R^2$ is independently selected from the group consisting of a halide and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof;
   each of $R^3$, $R^4$, $R^5$, $R^6$, $R^7$, $R^8$, and $R^9$ is independently selected from the group consisting of a hydrogen, a halide, and a substituted or unsubstituted $C_1$-$C_6$ alkyl, $C_3$-$C_8$ cycloalkyl, $C_3$-$C_8$ heterocycloalkyl, $C_1$-$C_6$ haloalkyl, $C_6$-$C_{10}$ alkylaryl, $C_1$-$C_6$ alkoxy, $C_6$-$C_{10}$ aryl, $C_6$-$C_{10}$ heteroaryl, silyl, $C_2$-$C_8$ alkenyl, $C_2$-$C_8$ alkynyl, $C_1$-$C_6$ hydroxyl, $C_3$-$C_{10}$ arylene, $C_3$-$C_{10}$ heteroarylene, $C_2$-$C_{10}$ alkenylene, $C_3$-$C_{10}$ cycloalkenylene, $C_2$-$C_{10}$ alkynylene, or any combination thereof; and
   E is C or Si.

2. The method of claim 1, wherein said step of activating initiates a catalytic hydrosilylation reaction between said starting compound and said hydrosilylation reagent; or wherein said step of activating increases the rate of a catalytic hydrosilylation reaction between said starting compound and said hydrosilylation reagent.

3. The method of claim 1, wherein said step of activating results in catalytic hydrosilylation characterized by a turn-over number greater than or equal to 1000.

4. The method of claim 1, wherein said step of activating is carried out for a time period selected from the range of 1 second to 24 hours.

5. The method of claim 1, wherein said starting compound, said hydrosilylation, and said hydrosilylation catalyst or said hydrosilylation precatalyst are provided in a solution, wherein said step of activating comprising providing energy to the solution.

6. The method of claim 5, further comprising stopping the step of providing energy to the solution and/or removing energy from said solution after said hydrosilation of said starting compound.

7. The method of claim 1, wherein said step of activating comprises increasing the temperature of said starting compound and said hydrosilylation reagent in the presence of said hydrosilylation catalyst or said hydrosilylation precatalyst.

8. The method of claim 1 comprising a step of converting said hydrosilylation precatalyst to said hydrosilylation catalyst.

9. The method of claim 1, wherein M is selected from the group consisting of, Be, Mg, Ca, Sr, Ba, Al, SC, Ga, Sn, Ti, Zr, Hf, V, Nb, Ta, Cr, Mo, W, Mn, Re, Fe, Ru, Os, Co, Rh, Ir, Ni, Pd, Pt, Cu, Ag, Au, Zn, a lanthanide metal, and an actinide metal.

10. The method of claim 1, wherein M is coordinated with each L via metal-carbon sigma bond and a metal-olefin pi bond.

11. The method of claim 1, wherein y is 0.

12. The method of claim 1, wherein said metal-ligand complex is selected from the group consisting of (2,2-dimethylpent-4-en-1-yl)lithium, cis-bis($\eta^1$,$\eta^2$-2,2-dimethyl-but-3-en-1-yl)platinum, cis-bis($\eta^1$,$\eta^2$-2,2-dimethylpent-4-en-1-yl)platinum, cis-bis($\eta^1$,$\eta^2$-2,2-dimethylhex-5-en-1-yl)platinum, [(1,2,5,6-$\eta$)-1,5-cyclooctadiene]($\eta^1$,$\eta^2$-2,2-dimethylpent-4-en-1-yl)iridium, [(1,2,5,6-$\eta$)-1,5-cyclooctadiene]($\eta^1$,$\eta^2$-2,2-dimethylpent-4-en-1-yl) rhodium, and [(2,3,5,6-$\eta$)-bicyclo[2.2.1]hepta-2,5-diene] ($\eta^1$,$\eta^2$-2,2-dimethyl-pent-4-en-1-yl)rhodium.

13. The method of claim 1, wherein said metal-ligand complex is characterized by the formula FX3:

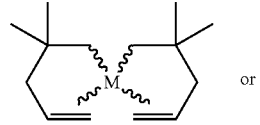

(FX3a)

or

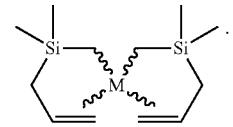

(FX3b)

14. The method of claim 1, wherein said starting compound has one or more carbon-carbon double bonds or carbon-carbon triple bonds; and wherein said hydrosilylation reagent has at least one Si—H bond.

15. The method of claim 1, wherein said hydrosilylation catalyst or said hydrosilylation precatalyst is provided at a concentration greater than or equal to $0.1 \times 10^{-6}$ mol %.

16. The method of claim 1, comprising a step of activating said hydrosilylation precatalyst.

17. The method of claim 1, wherein the step of activating comprises converting the hydrosilylation precatalyst to the hydrosilylation catalyst; wherein said starting compound is contacted with said hydrosilylation reagent in the presence of said hydrosilylation precatalyst.

18. The method of claim 17, wherein the step of activating hydrosilylation is performed in the presence of a hydrosilylation inhibitor; wherein the hydrosilylation inhibitor is chemically bound to the hydrosilylation precatalyst; and wherein the step of converting comprises dissociating the hydrosilylation inhibitor from the hydrosilylation precatalyst, chemically consuming the hydrosilylation inhibitor, decomposing the hydrosilylation inhibitor, and/or deactivating the hydrosilylation inhibitor.

19. The method of claim 1, wherein the step of activating hydrosilylation is performed in the presence of a hydrosilylation inhibitor; and wherein the hydrosylilation inhibitor increases a latency of the hydrosilylation compared to the hydrosilylation without the hydrosilylation inhibitor.

20. The method of claim 1, wherein y is an integer selected from the range of 1 to 4.

21. The method of claim 1, wherein said starting compound is contacted with said hydrosilylation reagent in the presence of said hydrosilylation precatalyst.

22. The method of claim 1, wherein said starting compound is contacted with said hydrosilylation reagent in the presence of said hydrosilylation catalyst.

\* \* \* \* \*